(12) United States Patent
Sasada et al.

(10) Patent No.: US 9,929,359 B2
(45) Date of Patent: Mar. 27, 2018

(54) COMPOSITION AND LIGHT EMITTING DEVICE USING THE SAME

(71) Applicant: Sumitomo Chemical Company, Limited, Tokyo (JP)

(72) Inventors: Toshiaki Sasada, Ibaraki (JP); Makoto Anryu, Osaka (JP); Seiichirou Yokoya, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 59 days.

(21) Appl. No.: 14/905,144

(22) PCT Filed: Jul. 14, 2014

(86) PCT No.: PCT/JP2014/069124
§ 371 (c)(1),
(2) Date: Jan. 14, 2016

(87) PCT Pub. No.: WO2015/008851
PCT Pub. Date: Jan. 22, 2015

(65) Prior Publication Data
US 2016/0164008 A1    Jun. 9, 2016

(30) Foreign Application Priority Data
Jul. 17, 2013  (JP) ................................. 2013-148230
Apr. 18, 2014  (JP) ................................. 2014-086132

(51) Int. Cl.
*C09K 11/06*   (2006.01)
*H01L 51/00*   (2006.01)
*H01L 51/50*   (2006.01)

(52) U.S. Cl.
CPC ......... *H01L 51/0085* (2013.01); *C09K 11/06* (2013.01); *H01L 51/0035* (2013.01); *H01L 51/0039* (2013.01); *H01L 51/0043* (2013.01); *C09K 2211/1007* (2013.01); *C09K 2211/1014* (2013.01); *C09K 2211/1029* (2013.01); *C09K 2211/1059* (2013.01); *C09K 2211/185* (2013.01); *H01L 51/5016* (2013.01); *H01L 51/5056* (2013.01); *H01L 51/5072* (2013.01)

(58) Field of Classification Search
CPC .............. C09K 11/06; C09K 2211/185; H10L 51/0085; H10L 51/0087
See application file for complete search history.

(56) References Cited

U.S. PATENT DOCUMENTS

| 2007/0196690 A1 | 8/2007 | Ikemizu et al. |
| 2007/0196691 A1 | 8/2007 | Ikemizu et al. |
| 2007/0207340 A1 | 9/2007 | Taka et al. |
| 2008/0100199 A1 | 5/2008 | Sekine et al. |
| 2013/0193840 A1* | 8/2013 | Soga ...................... C09K 11/06 313/504 |
| 2013/0200349 A1 | 8/2013 | Soga et al. |
| 2013/0277617 A1 | 10/2013 | Pan et al. |
| 2014/0175415 A1 | 6/2014 | Steudel et al. |
| 2014/0306203 A1* | 10/2014 | Akino ................. H01L 51/0085 257/40 |
| 2014/0374727 A1* | 12/2014 | Akino ................... C09K 11/06 257/40 |

FOREIGN PATENT DOCUMENTS

| JP | 2003231692 A | 8/2003 |
| JP | 2004014155 A | 1/2004 |
| JP | 2005093098 A | 4/2005 |
| JP | 2005100881 A | 4/2005 |
| JP | 2006096697 A | 4/2006 |
| JP | 2006188673 A | 7/2006 |
| JP | 2007184348 A | 7/2007 |
| JP | 2008174499 A | 7/2008 |
| JP | 2012151266 A | 8/2012 |
| JP | 2013147551 A | 8/2013 |
| JP | 2014148663 A | 8/2014 |
| WO | 02066552 A1 | 8/2002 |
| WO | 03103341 A1 | 12/2003 |
| WO | 2004020504 A1 | 3/2004 |
| WO | 2004101707 A1 | 11/2004 |
| WO | 2005032216 A1 | 4/2005 |
| WO | 2007097149 A1 | 8/2007 |
| WO | 2011141714 A1 | 11/2011 |
| WO | 2012084114 A1 | 6/2012 |
| WO | 2012153082 A1 | 11/2012 |
| WO | 2013088959 A1 | 6/2013 |
| WO | WO 2013/108700 | * 7/2013 |

OTHER PUBLICATIONS

Extended Search Report dated Feb. 15, 2017 in EP Application No. 14826600.0.
Lo et al, "Solution-Processible Phosphorescent Blue Dendrimers Based on Biphenyl-Dendrons and Fac-tris (phenyltriazolyl)iridium (III) Cores," Advanced Functional Materials, Vo. 18, pp. 3080-3090 (2008).
Ko et al, "Multi-layer Organic Light-Emitting Diodes Processed from Solution Using Phosphorescent Dendrimers in a Polymer Host," Organic Electronics, vol. 11, pp. 1005-1009 (2010).
Huang et al, "Highly Branched Green Phosphorescent Tris-Cyclometalated Iridium (III) Complexes for Solution-Processed Organic Light-Emitting Diodes," Organic Electronics, vol. 10, pp. 594-606 (2009).
Office Action dated Aug. 26, 2016 in CN Application No. 201480040127.4.
International Search Report and Written Opinion dated Oct. 28, 2014 in International Application No. PCT/JP2014/069124.

(Continued)

*Primary Examiner* — C Melissa Koslow
(74) *Attorney, Agent, or Firm* — Panitch Schwarze Belisario & Nadel LLP

(57) ABSTRACT

A composition is provided containing a first phosphorescent compound (DB) having an emission spectrum whose maximum peak wavelength is from 400 nm to less than 480 nm and having a dendron and a second phosphorescent compound (DGR) having an emission spectrum whose maximum peak wavelength is from 480 nm to less than 680 nm and having a dendron.

11 Claims, No Drawings

(56) References Cited

OTHER PUBLICATIONS

Office Action dated Jul. 7, 2015 in JP Application No. 2015501986.
Office Action dated Oct. 20, 2015 in JP Application No. 2015-501986.
Office Action dated May 19, 2017 in CN Application No. 201480040127.4.
Office Action dated Nov. 27, 2017 in CN Application No. 201480040127.4.

* cited by examiner

COMPOSITION AND LIGHT EMITTING DEVICE USING THE SAME

CROSS-REFERENCE TO RELATED APPLICATION

This application is a Section 371 of International Application No. PCT/JP2014/069124, filed Jul. 14, 2014, which was published in the Japanese language on Jan. 22, 2015, under International Publication No. WO 2015/008851 A1, and the disclosure of which is incorporated herein by reference.

TECHNICAL FIELD

The present invention relates to a composition and a light emitting device using the same.

BACKGROUND ART

Light emitting devices such as an organic electroluminescent device (organic EL device) and the like can be preferably used for applications such as a display and the like because of properties such as high luminescent efficiency, driving at low voltage and the like, and are recently attracting attention. As the material used in a light emitting layer of the light emitting device, for example, compositions containing a blue phosphorescent compound, a green phosphorescent compound and a red phosphorescent compound as represented below are suggested (Patent document 1). Here, the blue phosphorescent compound, the green phosphorescent compound and the red phosphorescent compound are a phosphorescent compound having no dendron.

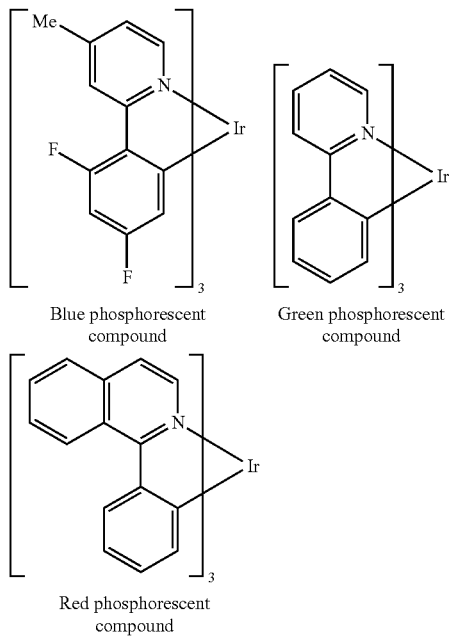

Blue phosphorescent compound    Green phosphorescent compound

Red phosphorescent compound

PRIOR ART DOCUMENT

Patent Document

Patent document 1: Japanese Patent Application Laid-Open No. 2004-14155

SUMMARY OF THE INVENTION

Problem to be Solved by the Invention

However, a light emitting device produced by using the above-described composition has not necessarily sufficient luminance life.

Then, the present invention has an object of providing a compound which is useful for production of a light emitting device excellent in luminance life. Further, the present invention has an object of providing a light emitting device obtained by using the composition.

Means for Solving the Problem

In a first aspect, the present invention provides a composition comprising a phosphorescent compound having an emission spectrum the maximum peak wavelength of which is between 400 nm or more and less than 480 nm and having a dendron (DB) and a phosphorescent compound having an emission spectrum the maximum peak wavelength of which is between 480 nm or more and less than 680 nm and having a dendron (DGR).

In a second aspect, the present invention provides a composition comprising a phosphorescent compound having an emission spectrum the maximum peak wavelength of which is between 400 nm or more and less than 480 nm and having a dendron (DB) and two or more phosphorescent compounds having an emission spectrum the maximum peak wavelength of which is between 480 nm or more and less than 680 nm (GR).

In a third aspect, the present invention provides a composition further comprising a polymer compound comprising a constituent unit represented by the formula (Y):

$$-\!\!-\!\!Ar^{Y1}\!\!-\!\!- \quad\quad (Y)$$

[wherein, $Ar^{Y1}$ represents an arylene group, a divalent heterocyclic group or a divalent group in which at least one arylene group and at least one divalent heterocyclic group are bonded directly, and these groups may have a substituent.].

In a fourth aspect, the present invention provides a composition further comprising a compound represented by the formula (H-1):

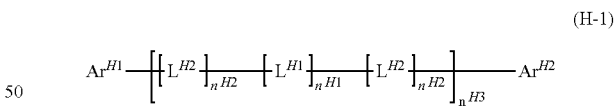

(H-1)

[wherein, $Ar^{H1}$ and $Ar^{H2}$ each independently represent an aryl group or a monovalent heterocyclic group, and these groups may have a substituent.

$n^{H1}$ and $n^{H2}$ each independently represent 0 or 1. When there are a plurality of $n^{H1}$, they may be the same or different. The plurality of $n^{H2}$ may be the same or different.

$n^{H3}$ represents an integer of 0 or more.

$L^{H1}$ represents an arylene group, a divalent heterocyclic group or a group represented by $-[C(R^{H11})_2]_{n^{H11}}-$, and these groups may have a substituent. When there are a plurality of $L^{H1}$, they may be the same or different.

$n^{H11}$ represents an integer of 1 or more and 10 or less. $R^{H11}$ represents a hydrogen atom, an alkyl group, an alkoxy group, an aryl group or a monovalent heterocyclic group, and these groups may have a substituent. A plurality of $R^{H11}$ may be the same or different and may be combined together to form a ring together with carbon atoms to which they are attached.

$L^{H2}$ represents a group represented by —N(-$L^{H21}$-$R^{H21}$)—.

When there are a plurality of $L^{H2}$, they may be the same or different.

$L^{H21}$ represents a single bond, an arylene group or a divalent heterocyclic group, and these groups may have a substituent. $R^{H21}$ represents a hydrogen atom, an alkyl group, an aryl group or a monovalent heterocyclic group, and these groups may have a substituent.].

In a fifth aspect, the present invention provides a light emitting device obtained by using the above-described composition.

Effect of the Invention

According to the present invention, a composition which is useful for production of a light emitting device excellent in luminance life can be provided. Further, according to the present invention, a light emitting device obtained by using the composition can be provided.

MODES FOR CARRYING OUT THE INVENTION

Preferable embodiments of the present invention will be illustrated in detail below.
<Explanation of Common Term>

Terms commonly used in the present specification described below have the following meanings unless otherwise stated.

Me represents a methyl group, Et represents an ethyl group, i-Pr represents an isopropyl group, n-Bu represents a n-butyl group, and t-Bu represents a tert-butyl group.

In the present specification, a hydrogen atom may be a deuterium atom.

"Polymer compound" denotes a polymer having molecular weight distribution and having a polystyrene-equivalent number average molecular weight of $1 \times 10^3$ to $1 \times 10^8$. The total amount of constituent units contained in the polymer compound is 100 mol %.

A polymer compound may be any of a block copolymer, a random copolymer, an alternate copolymer and a graft copolymer, and may also be another form.

An end group of a polymer compound is preferably a stable group because if a polymerization active group remains intact at the end, when the polymer compound is used for fabrication of a light emitting device, the light emitting property or luminance life may possibility lower. This end group is preferably a group having a conjugated bond to the main chain, and includes groups bonding to an aryl group or a monovalent heterocyclic group via a carbon-carbon bond.

"Low molecular weight compound" denotes a compound having no molecular weight distribution and having a molecular weight of $1 \times 10^4$ or less.

"Constituent unit" denotes a unit structure found once or more in a polymer compound.

"Alkyl group" may be any of linear, branched or cyclic. The number of carbon atoms of the linear alkyl group is, not including the number of carbon atoms of a substituent, usually 1 to 50, preferably 3 to 30, more preferably 4 to 20. The number of carbon atoms of the branched or cyclic alkyl groups is, not including the number of carbon atoms of a substituent, usually 3 to 50, preferably 3 to 30, more preferably 4 to 20.

The alkyl group may have a substituent, and examples thereof include a non-substituted alkyl group such as a methyl group, an ethyl group, a n-propyl group, an isopropyl group, a n-butyl group, an isobutyl group, a tert-butyl group, a n-pentyl group, an isoamyl group, 2-ethylbutyl group, a n-hexyl group, a cyclohexyl group, a n-heptyl group, a cyclohexylmethyl group, a cyclohexylethyl group, a n-octyl group, a 2-ethylhexyl group, a 3-n-propylheptyl group, a n-decyl group, a 3,7-dimethyloctyl group, a 2-ethyloctyl group, a 2-n-hexyl-decyl group, a n-dodecyl group and the like; and a substituted alkyl group such as a trifluoromethyl group, a pentafluoroethyl group, a perfluorobutyl group, a perfluorohexyl group, a perfluorooctyl group, a 3-phenyl-propyl group, a 3-(4-methylphenyl)propyl group, a 3-(3,5-di-n-hexylphenyl)propyl group, a 6-ethyloxyhexyl group and the like.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group may have a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, an alkoxy group, an aryl group, a fluorine atom or the like.

"Alkoxy group" may be any of linear, branched or cyclic. The number of carbon atoms of the linear alkoxy group is, not including the number of carbon atoms of a substituent, usually 1 to 40, preferably 4 to 10. The number of carbon atoms of the branched or cyclic alkoxy groups is, not including the number of carbon atoms of a substituent, usually 3 to 40, preferably 4 to 10.

The alkoxy group may have a substituent, and examples thereof include a methoxy group, an ethoxy group, a n-propyloxy group, an isopropyloxy group, a n-butyloxy group, an isobutyloxy group, a tert-butyloxy group, a n-pentyloxy group, a n-hexyloxy group, a cyclohexyloxy group, a n-heptyloxy group, a n-octyloxy group, a 2-ethylhexyloxy group, a n-nonyloxy group, a n-decyloxy group, a 3,7-dimethyloctyloxy group and a lauryloxy group.

The number of carbon atoms of "Aryloxy group" is, not including the number of carbon atoms of a substituent, usually 6 to 60, preferably 7 to 48.

The aryloxy group may have a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, an alkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole, dibenzophosphole and the like, and a compound in which an aromatic ring is condensed to the heterocyclic ring even if the heterocyclic ring itself shows no aromaticity such as phenoxazine, phenothiazine, dibenzoborole, dibenzosilole, benzopyran and the like.

The number of carbon atoms of the monovalent heterocyclic group is, not including the number of carbon atoms of a substituent, usually 2 to 60, preferably 4 to 20.

The monovalent heterocyclic group may have a substituent, and examples thereof include a thienyl group, a pyrrolyl group, a furyl group, a pyridyl group, a piperidyl group, a quinolyl group, an isoquinolyl group, a pyrimidyl group, a triazinyl group, and groups obtained by substituting a hydrogen atom in these groups with an alkyl group, an alkoxy group or the like.

"Halogen atom" denotes a fluorine atom, a chlorine atom, a bromine atom or an iodine atom.

"Amino group" may have a substituent, and a substituted amino group is preferable. The substituent which an amino group has is preferably an alkyl group, an aryl group or a monovalent heterocyclic group.

The substituted amino group includes, for example, a dialkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" denotes the above-described alkyl group having 2 or more carbon atoms in which a direct bond between any adjacent two carbon atoms is substituted by a double bond. The alkenyl group may be any of linear or branched. The number of carbon atoms of the linear alkenyl group, not including the number of carbon atoms of the substituent, is usually 2 to 30, preferably 3 to 20, more preferably 4 to 10. The number of carbon atoms of the branched alkenyl group, not including the number of carbon atoms of the substituent, is usually 3 to 30, preferably 4 to 20, more preferably 5 to 10.

The alkenyl group may have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, a 1-methylethenyl group, and these groups having a substituent.

"Alkynyl group" denotes the above-described alkyl group having 2 or more carbon atoms in which a direct bond between any adjacent two carbon atoms is substituted by a triple bond. The alkynyl group may be any of linear or branched. The number of carbon atoms of the alkynyl group, not including the number of carbon atoms of the substituent, is usually 2 to 20, preferably 3 to 20, more preferably 4 to 10. The number of carbon atoms of the branched alkynyl, not including the number of carbon atoms of the substituent, is usually 4 to 30, preferably 4 to 20, more preferably 5 to 10.

The alkynyl group may have a substituent, and examples thereof include an ethynyl group, a 1-propynyl group, a 2-propynyl group, a 2-butynyl group, a 3-butynyl group, a 3-pentynyl group, a 4-pentynyl group, a 1-hexenyl group, a 5-hexenyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group may have a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

(A-1)

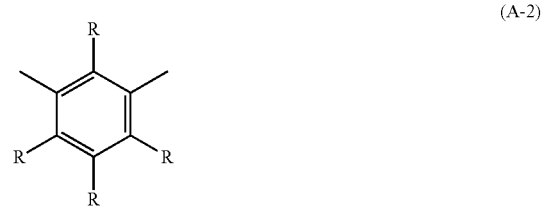

(A-2)

(A-3)

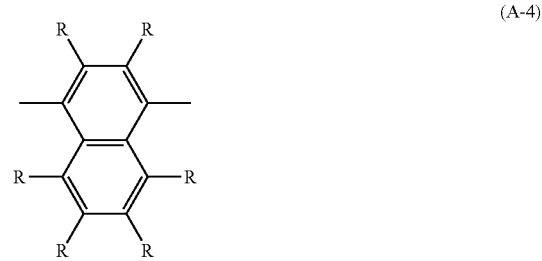

(A-4)

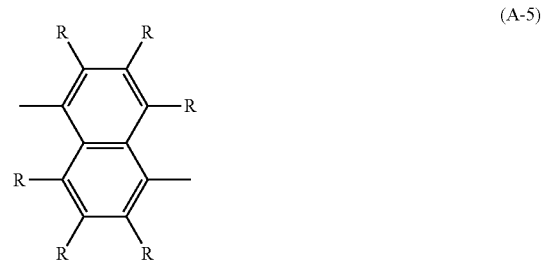

(A-5)

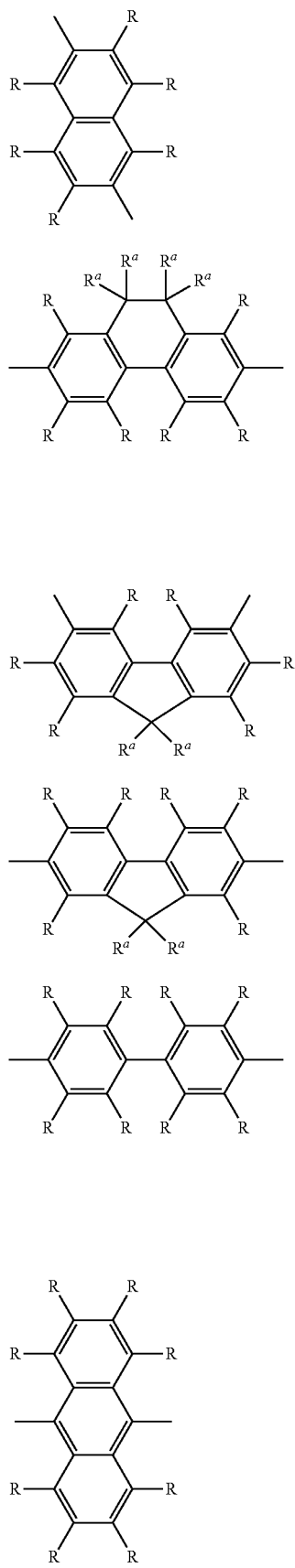
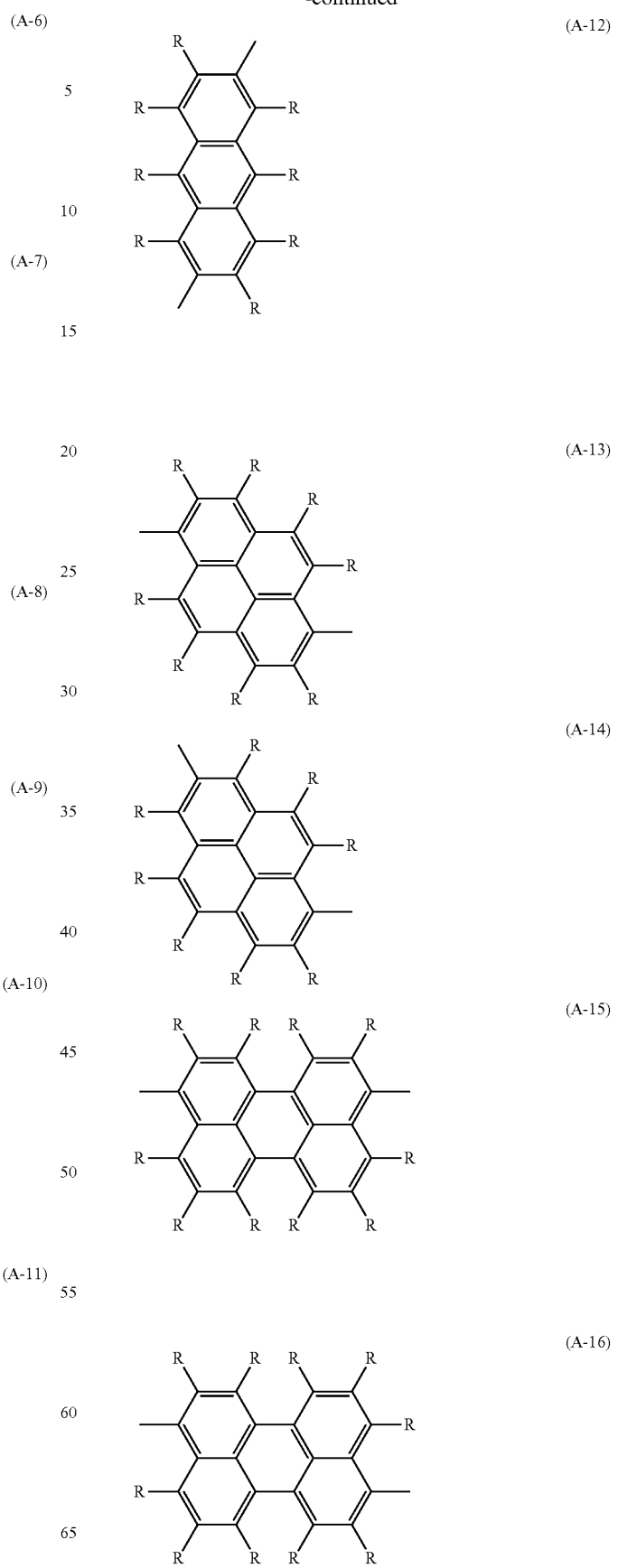

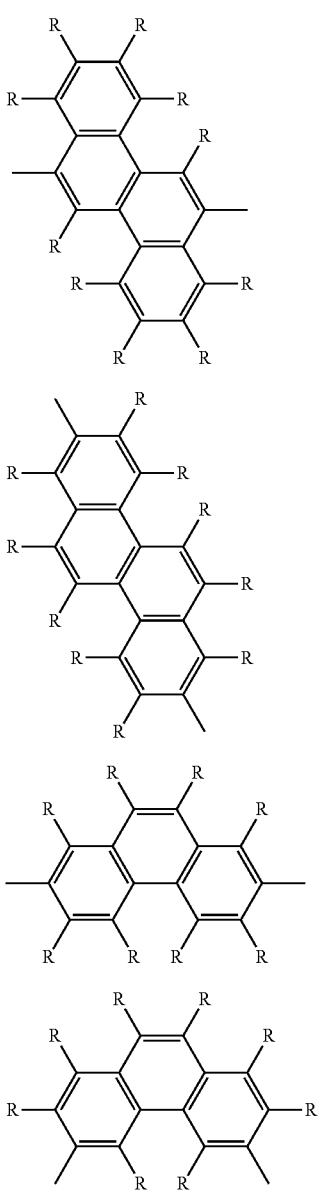

(A-17)

(A-18)

(A-19)

(A-20)

[wherein, R and $R^a$ each independently represent a hydrogen atom, an alkyl group, an aryl group or a monovalent heterocyclic group. A plurality of R and $R^a$ each may be the same or different, and a plurality of $R^a$ may be combined together to form a ring together with carbon atoms to which they are attached.].

The number of carbon atoms of the divalent heterocyclic group is, not including the number of carbon atoms of a substituent, usually 2 to 60, preferably 3 to 30, more preferably 4 to 15.

The divalent heterocyclic group may have a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (A-21) to (A-54). The divalent heterocyclic group includes groups obtained by linking a plurality of these groups.

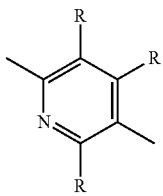

(A-21)

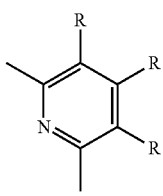

(A-22)

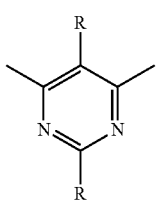

(A-23)

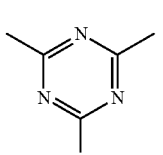

(A-24)

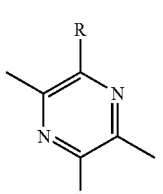

(A-25)

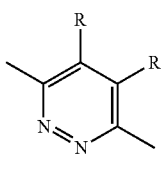

(A-26)

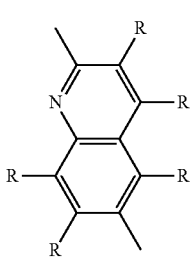

(A-27)

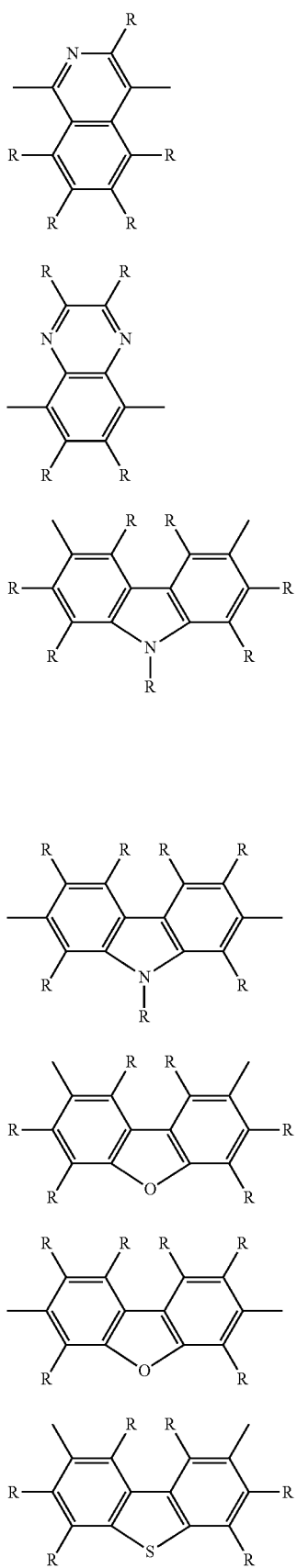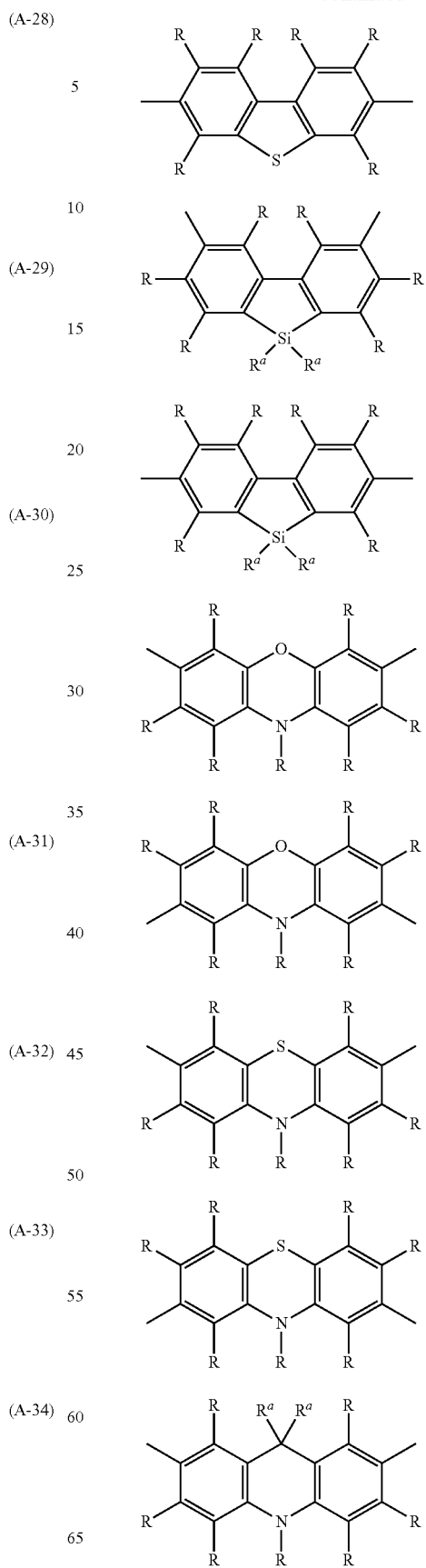

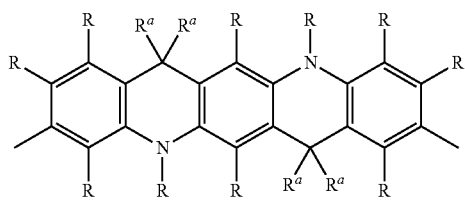 (A-43)
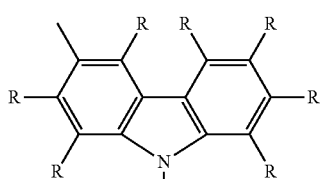 (A-53)
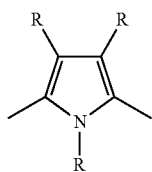 (A-44)
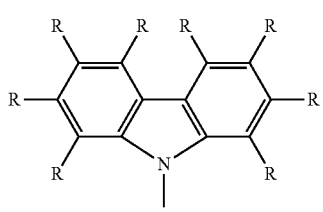 (A-54)
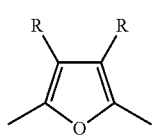 (A-45)
[wherein, R and $R^a$ represent the same meaning as described above.].
"Crosslink group" is a group capable of generating a new bond by subjecting it to a heat treatment, an ultraviolet irradiation treatment, a radical reaction and the like, preferably is a group represented by the formula (B-1), (B-2), (B-3), (B-4), (B-5), (B-6), (B-7), (B-8), (B-9), (B-10), (B-11), (B-12), (B-13), (B-14), (B-15), (B-16) or (B-17).
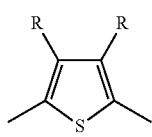 (A-46)
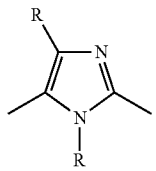 (A-47)
 (B-1)
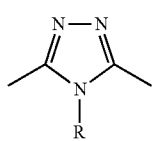 (A-48)
 (B-2)
 (B-3)
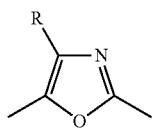 (A-49)
 (B-4)
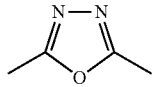 (A-50)
 (B-5)
 (B-6)
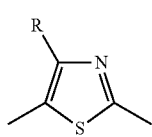 (A-51)
 (B-7)
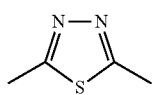 (A-52)

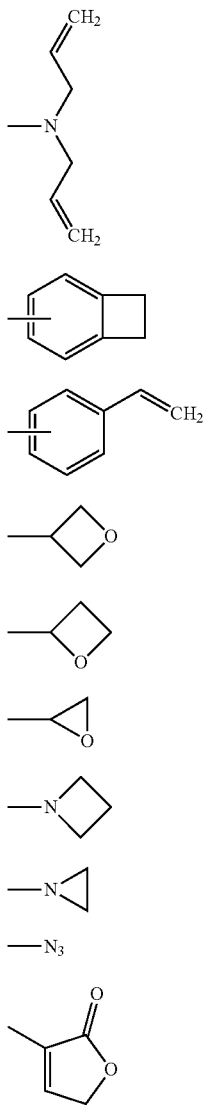

[wherein, these groups may have a substituent.].

"Substituent" represents a halogen atom, a cyano group, an alkyl group, an aryl group, a monovalent heterocyclic group, an alkoxy group, an aryloxy group, an amino group, a substituted amino group, an alkenyl group, an alkynyl group or a crosslink group.

<Phosphorescent Compound>

"Phosphorescent compound" denotes a compound showing a phosphorescent property, preferably is a metal complex showing emission from the triplet excited state. This metal complex showing emission from the triplet excited state has a central metal atom and a ligand.

As the central metal atom, exemplified are metal atoms having an atomic number of 40 or more, showing a spin-orbital interaction with the complex, and capable of causing intersystem crossing between the singlet state and the triplet state. Exemplified as the metal atom are a ruthenium atom, a rhodium atom, a palladium atom, an iridium atom and a platinum atom.

As the ligand, exemplified are neutral or anionic monodentate ligands or neutral or anionic polydentate ligands forming at least one bond selected from the group consisting of a coordinate bond and a covalent bond between it and the central metal atom. As the bond between the central metal atom and the ligand, exemplified are a metal-nitrogen bond, a metal-carbon bond, a metal-oxygen bond, a metal-phosphorus bond, a metal-sulfur bond and a metal-halogen bond. The polydentate ligand denotes usually a bidentate or more and hexadentate or less ligand.

The phosphorescent compounds are available from Aldrich, Luminescence Technology Corp., American Dye Source and the like.

As the obtaining method other than the above-described means, known methods described in literatures such as "Journal of American Chemical Society, Vol. 107, 1431-1432 (1985)", "Journal of American Chemical Society, Vol. 106, 6647-6653 (1984)", International Publication WO 2011/024761, International Publication WO 2002/44189, JP-A No. 2006-188673 and the like can also be used to produce the phosphorescent compounds.

The emission spectrum maximum peak of the phosphorescent compound can be evaluated by dissolving the phosphorescent compound in an organic solvent such as xylene, toluene, chloroform, tetrahydrofuran and the like to prepare a dilute solution (about $1\times10^{-6}$ to $1\times10^{-3}$ wt %) and measuring the PL spectrum of the dilute solution at room temperature. The organic solvent for dissolving the phosphorescent compound is preferably xylene.

<Dendron>

"Dendron" is a group having a regular dendritic branched structure having a branching point at an atom or ring. The phosphorescent compound having a dendron as a partial structure (called a phosphorescent compound having a dendron in some cases) includes, for example, structures described in literatures such as International Publication WO 02/067343, JP-A No. 2003-231692, International Publication WO 2003/079736, International Publication WO 2006/097717 and the like.

The dendron is preferably a group represented by the formula (Dend-A) or (Dend-B).

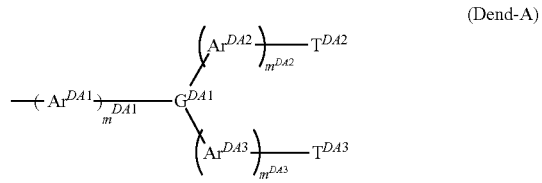

(Dend-A)

[wherein $m^{DA1}$, $m^{DA2}$ and $m^{DA3}$ each independently represent an integer of 0 or more.

$G^{DA1}$ represents a nitrogen atom, an aromatic hydrocarbon group or a heterocyclic group, and these groups may have a substituent.

$Ar^{DA1}$, $Ar^{DA2}$ and $Ar^{DA3}$ each independently represent an arylene group or a divalent heterocyclic group, and these groups may have a substituent. When there are a plurality of $Ar^{DA1}$, $Ar^{DA2}$ and $Ar^{DA3}$, each of them may be the same or different.

$T^{DA2}$ and $T^{DA3}$ each independently represent an aryl group or a monovalent heterocyclic group, and these groups may have a substituent.].

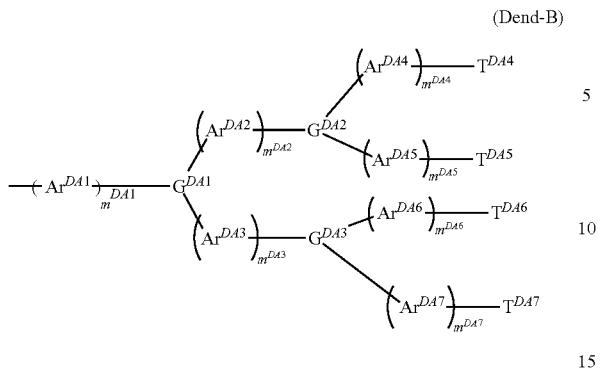
(Dend-B)

[wherein $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA1}$, $G^{DA2}$ and $G^{DA3}$ each independently represent a nitrogen atom, an aromatic hydrocarbon group or a heterocyclic group, and these groups may have a substituent.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups may have a substituent. When there are a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ each of them may be the same or different.

$T^{DA4}$, $T^{DA5}$, $T^{DA6}$ and $T^{DA7}$ each independently represent an aryl group or a monovalent heterocyclic group, and these groups may have a substituent.].

$m^{DA1}$, $m^{DA2}$, $m^{DA3}$, $m^{DA4}$, $m^{DA5}$, $m^{DA6}$ and $m^{DA7}$ represent usually an integer of 10 or less, preferably an integer of 5 or less, more preferably 0 or 1, further more preferably 0.

It is preferable that $m^{DA2}$ and $m^{DA3}$ are the same integer.

It is preferable that $m^{DA4}$, $m^{DA5}$, $m^{DA6}$ and $m^{DA7}$ are the same integer.

It is more preferable that $m^{DA2}$, $m^{DA3}$, $m^{DA4}$, $m^{DA5}$, $m^{DA6}$ and $m^{DA7}$ are the same integer, and it is further more preferable that $m^{DA1}$, $m^{DA2}$, $m^{DA3}$, $m^{DA4}$, $m^{DA5}$, $m^{DA6}$ and $m^{DA7}$ are the same integer.

$G^{DA1}$, $G^{DA2}$ and $G^{DA3}$ are preferably a group obtained by removing from a benzene ring, a pyridine ring, a pyrimidine ring, a triazine ring or a carbazole ring three hydrogen atoms linking directly to a carbon atom or a nitrogen atom constituting the ring unless otherwise stated, and these groups may have a substituent.

The substituent which $G^{DA1}$, $G^{DA2}$ and $G^{DA3}$ may have is preferably an alkyl group, an alkoxy group, an aryl group or a monovalent heterocyclic group.

$G^{DA1}$ is more preferably a group represented by the formulae (GDA-11) to (GDA-16), further preferably a group represented by the formula (GDA-11), (GDA-14) or (GDA-15), unless otherwise stated.

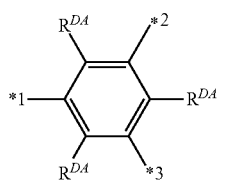
(GDA-11)

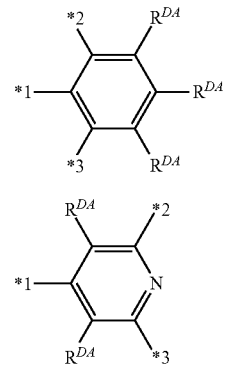
(GDA-12)

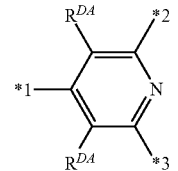
(GDA-13)

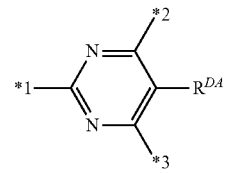
(GDA-14)

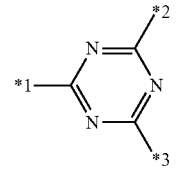
(GDA-15)

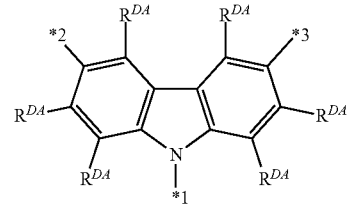
(GDA-16)

[wherein,

*1, *2 and *3 each represent a linkage to $Ar^{DA1}$, $Ar^{DA2}$ and $Ar^{DA3}$.

$R^{DA}$ represents a hydrogen atom, an alkyl group, an alkoxy group, an aryl group or a monovalent heterocyclic group, and these groups may have a substituent. When there are a plurality of $R^{DA}$, they may be the same or different.].

$G^{DA2}$ is more preferably a group represented by the formulae (GDA-21) to (GDA-26), further preferably a group represented by the formula (GDA-21), (GDA-24) or (GDA-25).

$G^{DA3}$ is more preferably a group represented by the formulae (GDA-31) to (GDA-36), further preferably a group represented by the formula (GDA-31), (GDA-34) or (GDA-35).

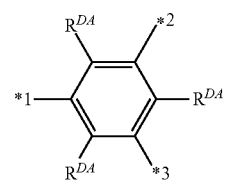
(GDA-21)

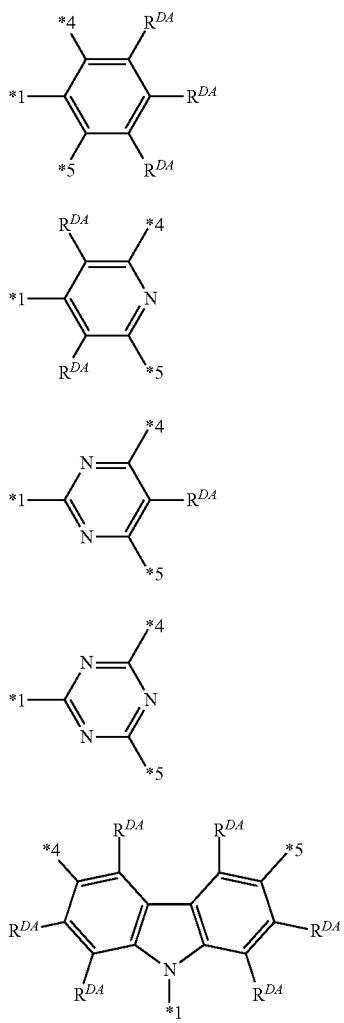

(GDA-22)
(GDA-23)
(GDA-24)
(GDA-25)
(GDA-26)

[wherein

*2, *4 and *5 each represent a linkage to $Ar^{DA2}$, $Ar^{DA4}$ and $Ar^{DA5}$.

$R^{DA}$ represents the same meaning as described above.].

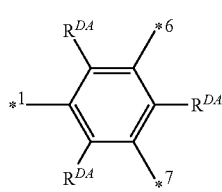

(GDA-31)

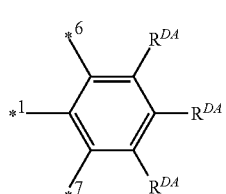

(GDA-32)

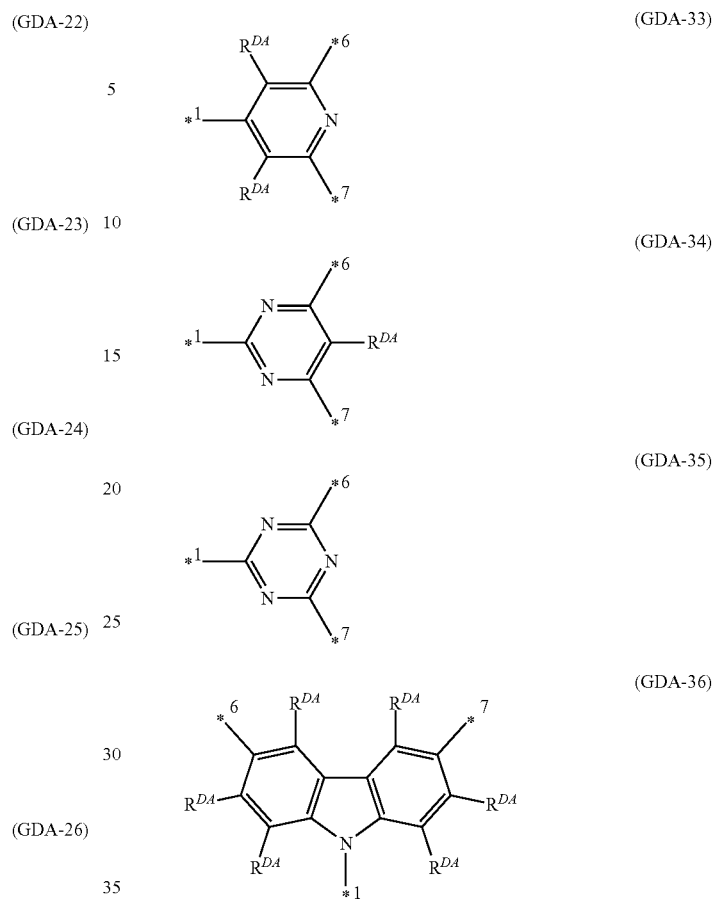

(GDA-33)
(GDA-34)
(GDA-35)
(GDA-36)

[wherein

*3, *6 and *7 each represent a linkage to $Ar^{DA3}$, $Ar^{DA6}$ and $Ar^{DA7}$.

$R^{DA}$ represents the same meaning as described above.].

$R^{DA}$ is preferably a hydrogen atom, an alkyl group or an alkoxy group, more preferably a hydrogen atom or an alkyl group, and these groups may have a substituent.

It is preferable that $G^{DA2}$ and $G^{DA3}$ are the same, and it is more preferable that $G^{DA1}$, $G^{DA2}$ and $G^{DA3}$ are the same.

$Ar^{DA1}$, $Ar^{DA2}$, $Ar^{DA3}$, $Ar^{DA4}$, $Ar^{DA5}$, $Ar^{DA6}$ and $Ar^{DA7}$ represent preferably a phenylene group, a fluorenediyl group, a carbazolediyl group, a dibenzofurandiyl group, a pyridinediyl group, a pyrimidinediyl group or a triazinediyl group, more preferably a phenylene group, a fluorenediyl group or a carbazolediyl group unless otherwise stated, and these groups may have a substituent.

The substituent which $Ar^{DA1}$, $Ar^{DA2}$, $Ar^{DA3}$, $Ar^{DA4}$, $Ar^{DA5}$, $Ar^{DA6}$ and $Ar^{DA7}$ may have is preferably an alkyl group, an aryl group, a monovalent heterocyclic group or an alkoxy group, more preferably an alkyl group, an aryl group or a monovalent heterocyclic group, and these groups may further have a substituent.

It is further preferable that $Ar^{DA1}$, $Ar^{DA2}$, $Ar^{DA3}$, $Ar^{DA4}$, $Ar^{DA5}$, $Ar^{DA6}$ and $Ar^{DA7}$ are groups represented by the formulae (ArDA-1) to (ArDA-3).

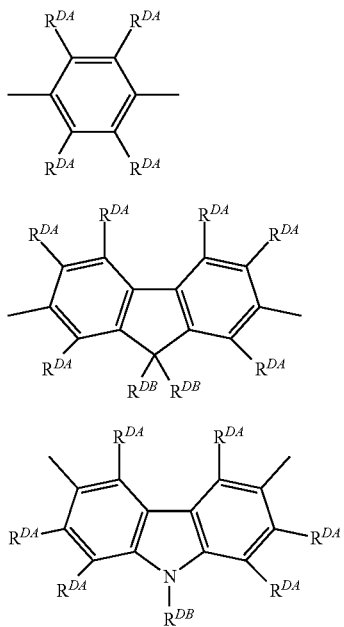

(ArDA-1)
(ArDA-2)
(ArDA-3)

[wherein
$R^{DA}$ represents the same meaning as described above.

$R^{DB}$ represents a hydrogen atom, an alkyl group, an aryl group or a monovalent heterocyclic group, and these groups may have a substituent. When there are a plurality of $R^{DB}$, they may be the same or different.].

$R^{DB}$ is preferably an alkyl group, an aryl group or a monovalent heterocyclic group, more preferably an aryl group or a monovalent heterocyclic group, further more preferably an aryl group.

It is preferable that $Ar^{DA2}$ and $Ar^{DA3}$ are the same group.

It is preferable that $Ar^{DA4}$, $Ar^{DA5}$, $Ar^{DA6}$ and $Ar^{DA7}$ are the same group.

It is more preferable that $Ar^{DA2}$, $Ar^{DA3}$, $Ar^{DA4}$, $Ar^{DA5}$, $Ar^{DA6}$ and $Ar^{DA7}$ are the same group, and it is further more preferable that $Ar^{DA1}$, $Ar^{DA2}$, $Ar^{DA3}$, $Ar^{DA4}$, $Ar^{DA5}$, $Ar^{DA6}$ and $Ar^{DA7}$ are the same group.

$T^{DA2}$, $T^{DA3}$, $T^{DA4}$, $T^{DA5}$, $T^{DA6}$ and $T^{DA7}$ are preferably groups represented by the formulae (TDA-1) to (TDA-3), more preferably groups represented by the formula (TDA-1).

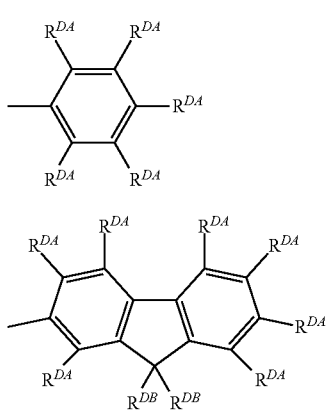

(TDA-1)
(TDA-2)

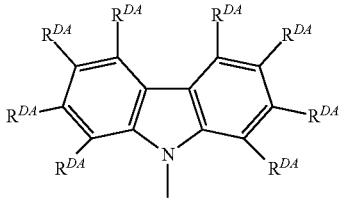

(TDA-3)

[wherein $R^{DA}$ and $R^{DB}$ represent the same meaning described above.].

It is preferable that $T^{DA2}$ and $T^{DA3}$ are the same group.

It is preferable that $T^{DA4}$, $T^{DA5}$, $T^{DA6}$ and $T^{DA7}$ are the same group.

The group represented by the formula (Dend-A) is preferably a group represented by the formulae (Dend-A1) to (Dend-A4).

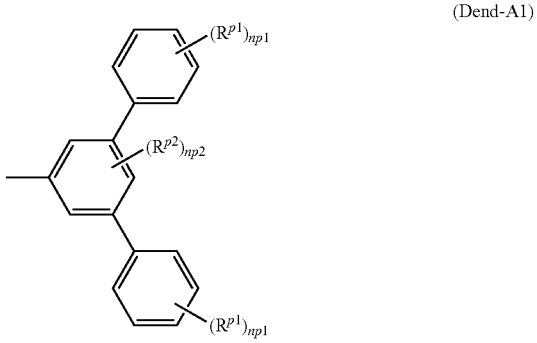

(Dend-A1)

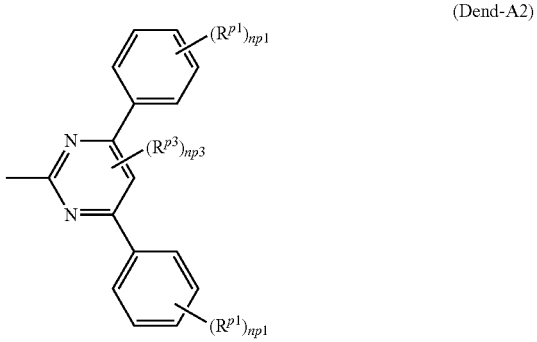

(Dend-A2)

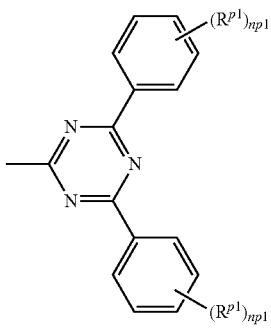

(Dend-A3)

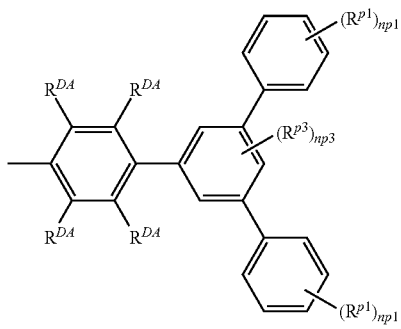
(Dend-A4)

[wherein

R^{DA} represents the same meaning as described above.

$R^{p1}$, $R^{p2}$ and $R^{p3}$ each independently represent an alkyl group, an alkoxy group or halogen atom. When there are a plurality of $R^{p1}$ and $R^{p2}$, each of them may be the same or different.

np1 represents an integer of 0 to 5, np2 represents an integer of 0 to 3, and np3 represents 0 or 1. A plurality of np1 may be the same or different.].

The group represented by the formula (Dend-B) is preferably a group represented by the formulae (Dend-B1) to (Dend-B3).

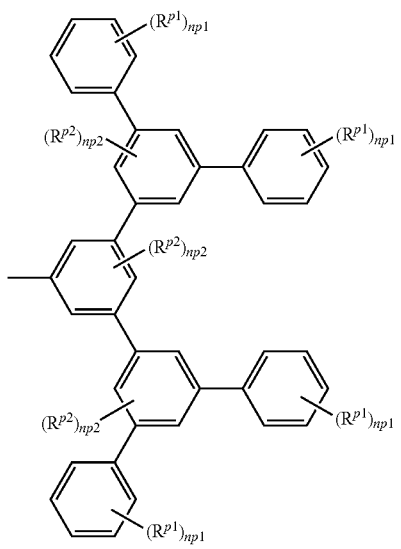
(Dend-B1)

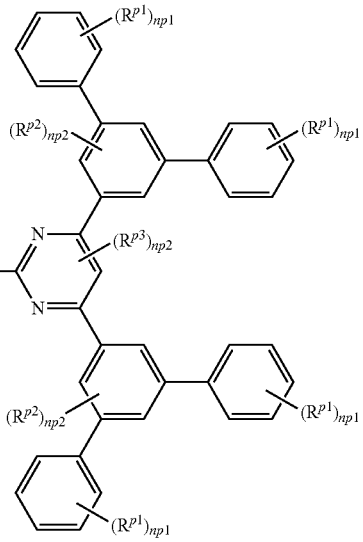
(Dend-B2)

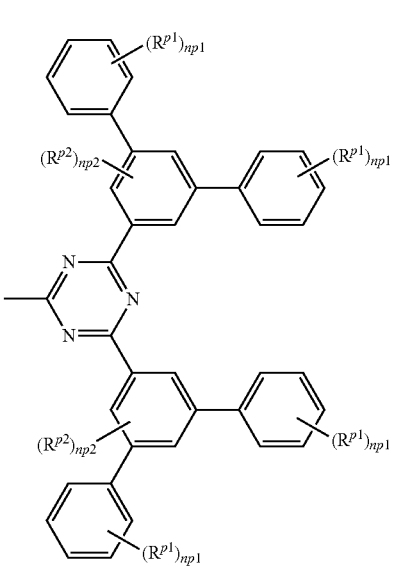
(Dend-B3)

[wherein $R^{p1}$, $R^{p2}$, $R^{p3}$, np1, np2 and np3 represent the same meaning as described above.].

np1 is preferably 0 or 1, more preferably 1. np2 is preferably 0 or 1, more preferably 0. np3 is preferably 0.

$R^{p1}$, $R^{p2}$ and $R^{p3}$ are preferably alkyl groups.

As the dendron, groups represented by the formulae (Dend-A-1) to (Dend-A-20) and (Dend-B-1) to (Dend-B-8) are exemplified, and groups represented by the formulae (Dend-A-1) to (Dend-A-18) and (Dend-B-1) to (Dend-B-8) are preferable.

TABLE 1
| formula | $m^{DA1}$ | $Ar^{DA1}$ | $G^{DA1}$ | $m^{DA2}, m^{DA3}$ | $Ar^{DA2}, Ar^{DA3}$ | $T^{DA2}, T^{DA3}$ |
|---|---|---|---|---|---|---|
| (Dend-A-1) | 0 | — | 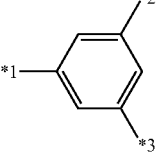 | 0 | — |  |
| (Dend-A-2) | 1 |  | 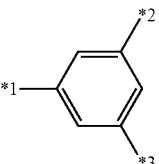 | 0 | — | 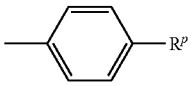 |
| (Dend-A-3) | 1 | 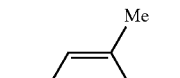 | 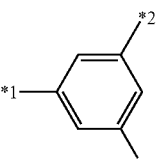 | 0 | — | 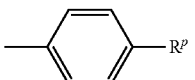 |
| (Dend-A-4) | 1 | 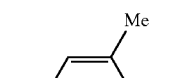 | 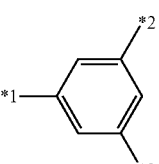 | 0 | — | 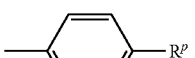 |
| (Dend-A-5) | 1 | 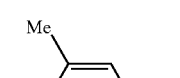 | 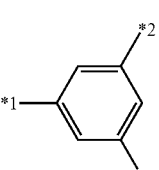 | 0 | — | 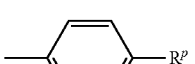 |
| (Dend-A-6) | 0 | — | 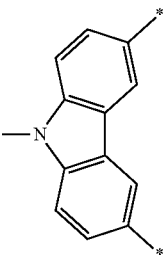 | 0 | — | 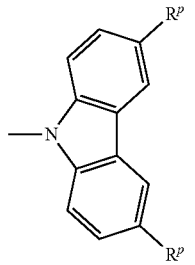 |
| (Dend-A-7) | 1 |  | 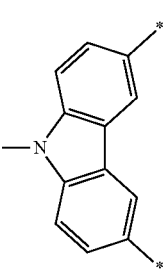 | 0 | — | 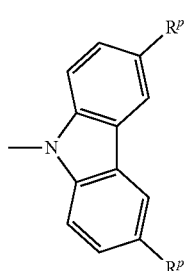 |
| (Dend-A-8) | 0 | — | nitrogen atom | 0 | — | 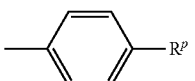 |

TABLE 2
| formula | $m^{DA1}$ | $Ar^{DA1}$ | $G^{DA1}$ | $m^{DA2}, m^{DA3}$ | $Ar^{DA2}, Ar^{DA3}$ | $T^{DA2}, T^{DA3}$ |
|---|---|---|---|---|---|---|
| (Dend-A-9) | 1 |  | nitrogen atom | 0 | — |  |
| (Dend-A-10) | 0 | — | 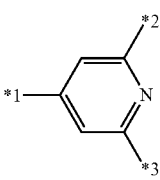 | 0 | — |  |
| (Dend-A-11) | 1 |  | 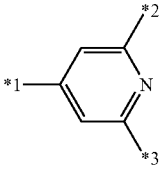 | 0 | — | 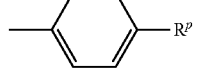 |
| (Dend-A-12) | 0 | — | 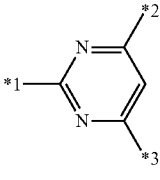 | 0 | — | 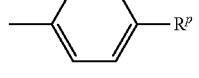 |
| (Dend-A-13) | 1 |  | 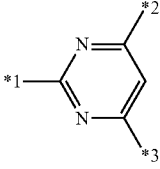 | 0 | — |  |

TABLE 2-continued
| formula | $m^{DA1}$ | $Ar^{DA1}$ | $G^{DA1}$ | $m^{DA2}, m^{DA3}$ | $Ar^{DA2}, Ar^{DA3}$ | $T^{DA2}, T^{DA3}$ |
|---|---|---|---|---|---|---|
| (Dend-A-14) | 0 | — | 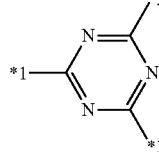 | 0 | — | 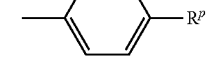 |
| (Dend-A-15) | 1 | 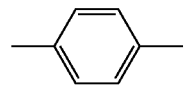 | 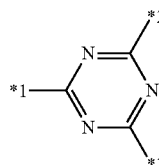 | 0 | — | 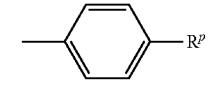 |
| (Dend-A-16) | 0 | — | 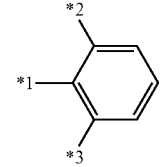 | 0 | — | 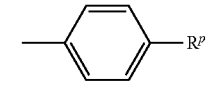 |
| (Dend-A-17) | 1 | 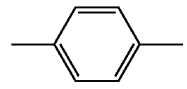 | 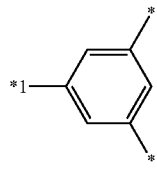 | 1 | 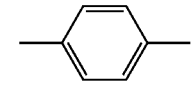 | 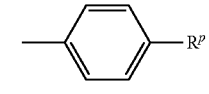 |
| (Demd-A-18) | 1 | 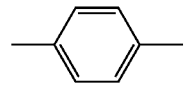 | nitrogen atom | 1 | 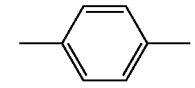 | 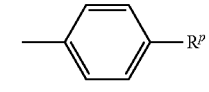 |
TABLE 3
| formula | $m^{DA1}$ | $Ar^{DA1}$ | $G^{DA}$ | $m^{DA2}, m^{DA3}$ | $Ar^{DA2}, Ar^{DA3}$ | $T^{DA}$ |
|---|---|---|---|---|---|---|
| (Dend-A-19) | 1 | | | 0 | — | |
| (Dend-A-20) | 1 | | | 0 | — | |

[wherein, *1, *2 and *3 represent the same meaning as described above.].
(Dend-B-1)
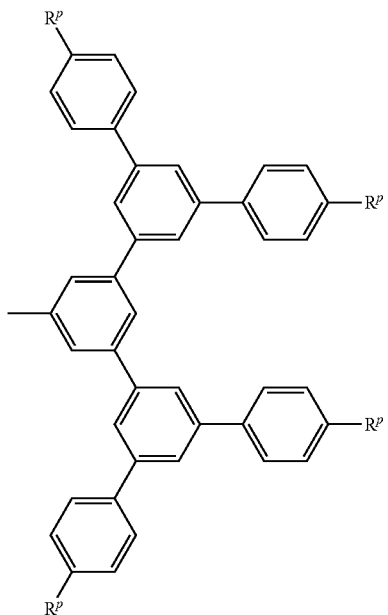
(Dend-B-2)
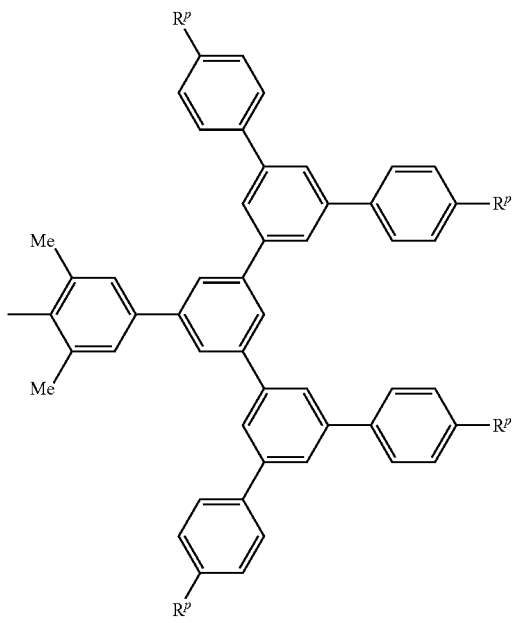
(Dend-B-3)
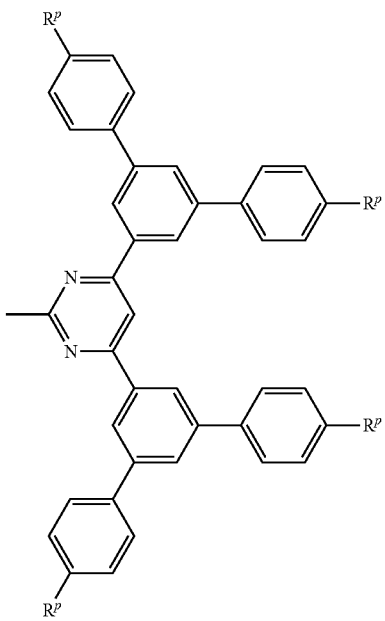
(Dend-B-4)
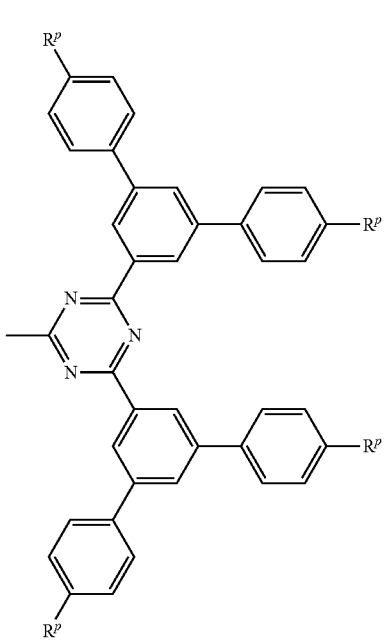

(Dend-B-5)

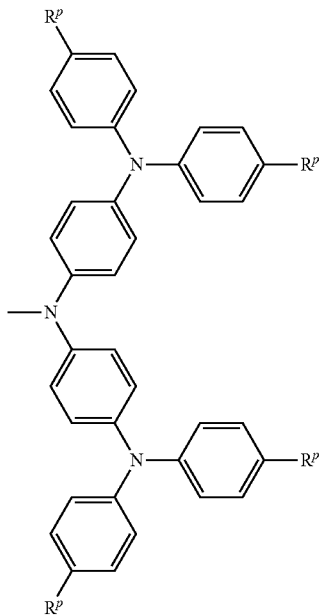

(Dend-B-7)

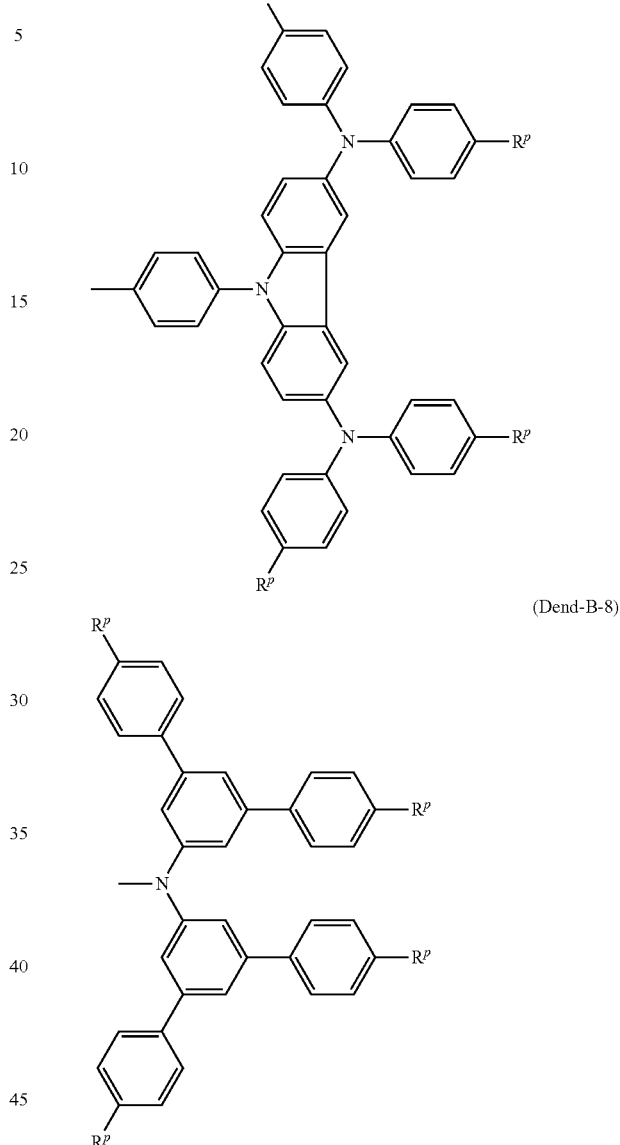

(Dend-B-8)

(Dend-B-6)

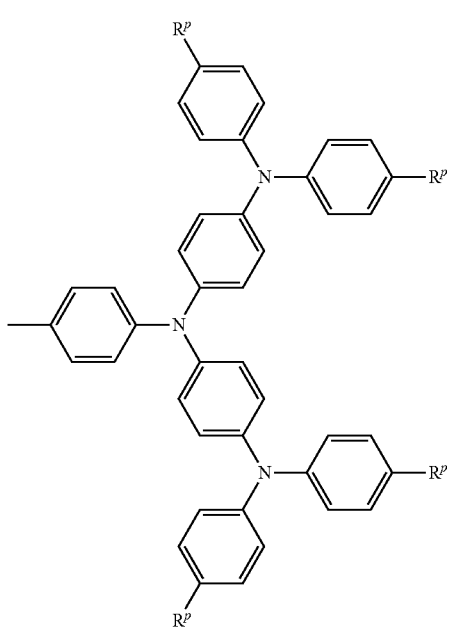

$R^p$ represents a hydrogen atom, an alkyl group or an alkoxy group. A plurality of $R^p$ may be the same or different.

$R^p$ represents preferably a hydrogen atom or an alkyl group. The alkyl group represented by $R^p$ is preferably a methyl group, a tert-butyl group, a n-hexyl group, a 2-ethylhexyl group or a group represented by the formula (Rp-1), more preferably a tert-butyl group or a group represented by the formula (Rp-1). The alkoxy group represented by $R^p$ is preferably a 2-ethylhexyloxy group.

(Rp-1)

<Phosphorescent Compound (DB)>

The phosphorescent compound (DB) contained in the composition of the present invention is a phosphorescent compound having an emission spectrum the maximum peak wavelength of which is between 400 nm or more and less than 480 nm and having a dendron.

The phosphorescent compound (DB) is preferably a phosphorescent compound represented by the formula (1):

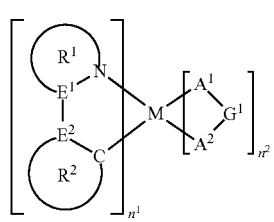

(1)

[wherein,

M represents a ruthenium atom, a rhodium atom, a palladium atom, an iridium atom or a platinum atom.

$n^1$ represents an integer of 1 or more, $n^2$ represents an integer of 0 or more, and $n+n^2$ is 2 or 3. $n^1+n^2$ is 3 when M is a ruthenium atom, a rhodium atom or an iridium atom, while $n^1+n^2$ is 2 when M is a palladium atom or a platinum atom.

$E^1$ and $E^2$ each independently represent a carbon atom or a nitrogen atom, provided that at least one of $E^1$ and $E^2$ is a carbon atom.

The ring $R^1$ represents a 5-membered or 6-membered aromatic heterocyclic ring, and the ring may have a substituent. When there are a plurality of substituents, they may be the same or different and may be combined together to form a ring together with atoms to which they are attached. When there are a plurality of rings $R^1$, they may be the same or different. $E^1$ is a carbon atom when the ring $R^1$ is a 6-membered aromatic heterocyclic ring.

The ring $R^2$ represents a 5-membered or 6-membered aromatic hydrocarbon ring or a 5-membered or 6-membered aromatic heterocyclic ring, and these rings may have a substituent. When there are a plurality of substituents, they may be the same or different and may be combined together to form a ring together with atoms to which they are attached. When there are a plurality of the rings $R^2$, they may be the same or different. $E^2$ is a carbon atom when the ring $R^2$ is a 6-membered aromatic heterocyclic ring.

The substituent which the ring $R^1$ may have and the substituent which the ring $R^2$ may have may be combined together to form a ring together with atoms to which they are attached.

At least one ring selected from the group consisting of the ring $R^1$ and the ring $R^2$ has a dendron. The ring $R^2$ has an electron attracting group when the ring $R^1$ is a 6-membered aromatic heterocyclic ring.

$A^1$-$G^1$-$A^2$ represents an anionic bidentate ligand, and $G^1$ represents an atomic group constituting a bidentate ligand together with $A^1$ and $A^2$. $A^1$ and $A^2$ each independently represent a carbon atom, an oxygen atom or a nitrogen atom and may be a carbon atom, an oxygen atom or a nitrogen atom constituting the ring. When there are a plurality of $A^1$-$G^1$-$A^2$, they may be the same or different.].

$E^1$ and $E^2$ are preferably a carbon atom.

M is preferably an iridium atom or a platinum atom, more preferably an iridium atom since then the luminance life of a light emitting device obtained by using the composition of the present invention is more excellent.

When M is a ruthenium atom, a rhodium atom or an iridium atom, $n^1$ is preferably 2 or 3, more preferably 3.

When M is a palladium atom or a platinum atom, $n^1$ is preferably 2.

The ring $R^1$ is preferably a 5-membered or 6-membered aromatic heterocyclic ring having 1 or more and 4 or less nitrogen atoms as the constituent atom, more preferably a 5-membered aromatic heterocyclic ring having 2 or more and 3 or less nitrogen atoms as the constituent atom or a 6-membered aromatic heterocyclic ring having 1 or more and 2 or less nitrogen atoms as the constituent atom, further preferably a pyridine ring, a pyrimidine ring, a diazole ring or a triazole ring, particularly preferably a diazole ring or a triazole ring, especially preferably an imidazole ring or a triazole ring, and these rings may have a substituent.

The ring $R^2$ is preferably a 6-membered aromatic hydrocarbon ring or a 5-membered or 6-membered aromatic heterocyclic ring, more preferably a 6-membered aromatic hydrocarbon ring or a 6-membered aromatic heterocyclic ring, further preferably a benzene ring, a naphthalene ring, a phenanthrene ring, a pyridine ring, a diazabenzene ring or a triazine ring, particularly preferably a benzene ring, a pyridine ring or a pyrimidine ring, and these rings may have a substituent.

"At least one ring selected from the group consisting of the ring $R^1$ and the ring $R^2$ has a dendron" denotes that a part or all of hydrogen atoms linking directly to a carbon atom or a hetero atom constituting at least one ring among the plurality of rings are substituted with a dendron. For example, when there are a plurality of the rings $R^1$ and the rings $R^2$ (namely, when $n^1$ is 2 or 3) in the formula (1), it may be permissible that at least one ring of the plurality of the rings $R^1$ and the plurality of the rings $R^2$ has a dendron.

The number of the dendron which at least one ring of the rings $R^1$ and the rings $R^2$ has is usually 1 or more and 5 or less, and since synthesis of the phosphorescent compound is easy, preferably 1 or more and 3 or less, more preferably 1 or 2, further preferably 1.

When the dendron which at least one ring of the rings $R^1$ and the rings $R^2$ has is a group represented by the formula (Dend-A) or (Dend-B) and when $m^{DA1}$ is an integer of 1 or more, $Ar^{DA1}$ linking to the ring $R^1$ and/or the ring $R^2$ is preferably a phenylene group which may have a substituent, more preferably a group represented by the formula (ArDA-1).

When the dendron which at least one ring of the rings $R^1$ and the rings $R^2$ has is a group represented by the formula (Dend-A) or (Dend-B) and when $m^{DA1}$ is 0, $G^{DA1}$ linking to the ring $R^1$ and/or the ring $R^2$ is preferably a group obtained by removing from a benzene ring which may have a substituent three hydrogen atoms linking directly to a carbon atom constituting the ring, more preferably a group represented by the formula (GDA-11) or (GDA-12), further preferably a group represented by the formula (GDA-11).

The dendron which at least one ring of the rings $R^1$ and the rings $R^2$ has is preferably a group represented by the formula (Dend-A1), (Dend-A4) or (Dend-B1), more preferably a group represented by the formula (Dend-A1) or (Dend-B1), further preferably a group represented by the formula (Dend-A1).

When M is a ruthenium atom, a rhodium atom or an iridium atom, the number of the dendron which the phosphorescent compound represented by the formula (1) has is usually 1 or more and 15 or less, and since synthesis of the phosphorescent compound represented by the formula (1) is easy, preferably 1 or more and 9 or less, more preferably 2 or more and 6 or less.

When M is a palladium atom or a platinum atom, the number of the dendron which the phosphorescent compound represented by the formula (1) has is usually 1 or more and 9 or less, and since synthesis of the phosphorescent compound represented by the formula (1) is easy, preferably 1 or more and 6 or less, more preferably 2 or more and 4 or less.

When the ring $R^1$ is a 6-membered aromatic heterocyclic ring, the number of the electron attracting group which the ring R has is usually 1 or more and 10 or less, and since synthesis of the phosphorescent compound represented by the formula (1) is easy, preferably 2 or more and 5 or less, more preferably 2 or 3.

"Electron attracting group" includes, for example, a group represented by $—C(=X^{11})—R^{11}$, a halogen atom, an alkyl group having a halogen atom as a substituent, a cyano group and a nitro group, preferably a fluorine atom, an alkyl group having a fluorine atom as a substituent, or a cyano group, more preferably a fluorine atom or an alkyl group having a fluorine atom as a substituent.

$R^{11}$ represents a hydrogen atom, an alkyl group, an aryl group, a monovalent heterocyclic group, an alkoxy group, an aryloxy group or a substituted amino group, and these groups may have a substituent.

$X^{11}$ represents a group represented by $=N—R^{12}$, an oxygen atom or a sulfur atom, preferably an oxygen atom.

$R^{12}$ represents a hydrogen atom, an alkyl group, an aryl group or a monovalent heterocyclic group, preferably an alkyl group, an aryl group or a monovalent heterocyclic group, and these groups may have a substituent.

"The alkyl group having a halogen atom as a substituent" denotes a group in which at least one hydrogen atom among hydrogen atoms which an alkyl group has is substituted by a halogen atom. The halogen atom is preferably a fluorine atom.

The alkyl group having a fluorine atom includes, for example, a trifluoromethyl group, a pentafluoroethyl group, a perfluorobutyl group, a perfluorohexyl group and a perfluorooctyl group, preferably a trifluoromethyl group.

The substituent which the ring $R^1$ and the ring $R^2$ may have is preferably an alkyl group, an aryl group, a monovalent heterocyclic group, an alkoxy group or an aryloxy group, more preferably an alkyl group, an aryl group or a monovalent heterocyclic group, further preferably an alkyl group or an aryl group, and these groups may further have a substituent. When there are a plurality of the substituents which the ring $R^1$ and the ring $R^2$ may have, they may be the same or different, and may be combined together to form a ring together with atoms to which they are attached.

The anionic bidentate ligand represented by $A^1$-$G^1$-$A^2$ includes, for example, ligands represented by the following formulae.

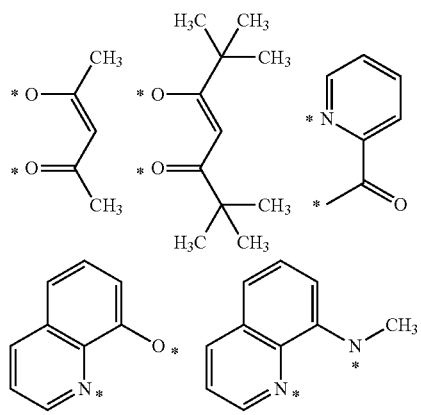

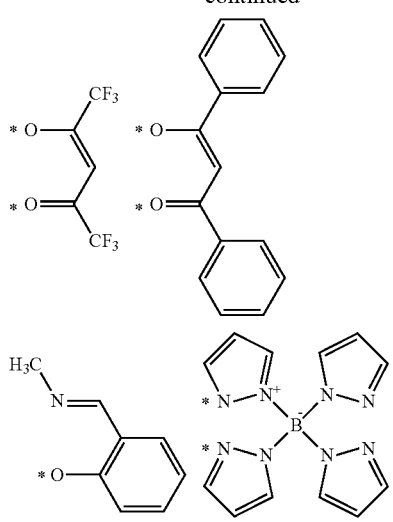

[wherein * represents a position linking to M or M described later.].

The anionic bidentate ligand represented by $A^1$-$G^1$-$A^2$ may be a ligand described below. Here, the anionic bidentate ligand represented by $A^1$-$G^1$-$A^2$ is different from the ligand of which number is defined by the subscript $n^1$.

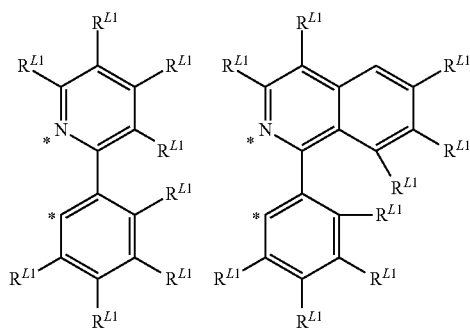

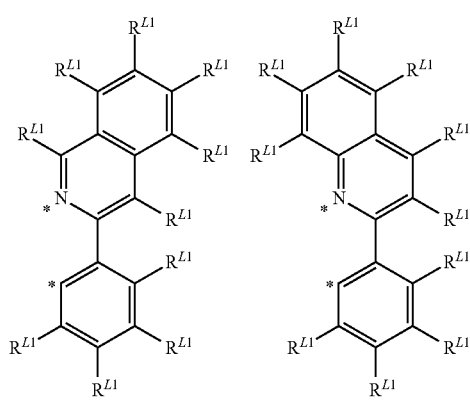

-continued

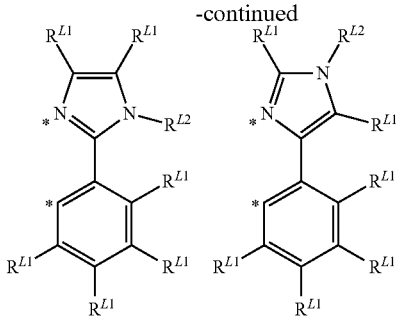

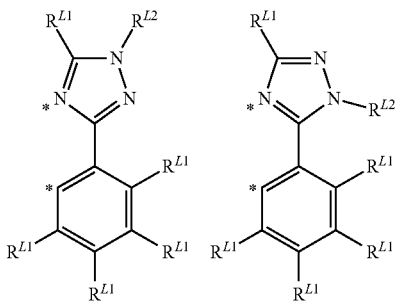

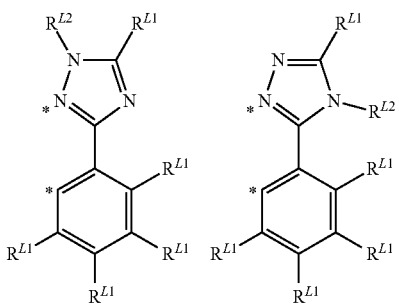

[wherein,
* represents the same meaning as described above.

$R^{L1}$ represents a hydrogen atom, an alkyl group, an aryl group, a monovalent heterocyclic group or a halogen atom, and these groups may have a substituent. A plurality of $R^{L1}$ may be the same or different.

$R^{L2}$ represents an alkyl group, an aryl group, a monovalent heterocyclic group or a halogen atom, and these groups may have a substituent.].

$R^{L1}$ is preferably a hydrogen atom, an alkyl group, an aryl group or a fluorine atom, and these groups may have a substituent.

$R^{L2}$ is preferably an alkyl group or an aryl group, and these groups may have a substituent.

The phosphorescent compound represented by the formula (1) is preferably a phosphorescent compound represented by the formula (1-A):

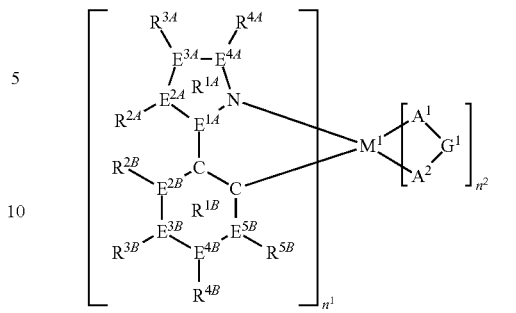

[wherein,
$n^1$, $n^2$ and $A^1$-$G^1$-$A^2$ represent the same meaning as described above.

$M^1$ represents an iridium atom or a platinum atom.

$E^{1A}$, $E^{2A}$, $E^{3A}$, $E^{4A}$, $E^{2B}$, $E^{3B}$, $E^{4B}$ and $E^{5B}$ each independently represent a nitrogen atom or a carbon atom. When there are a plurality of $E^{1A}$, $E^{2A}$, $E^{3A}$, $E^{4A}$, $E^{2B}$, $E^{3B}$, $E^{4B}$ and $E^{5B}$, each of them may be the same or different. When $E^{2A}$, $E^{3A}$ and $E^{4A}$ are nitrogen atoms, $R^{2A}$, $R^{3A}$ and $R^{4A}$ may be either present or not present. When $E^{2B}$, $E^{3B}$, $E^{4B}$ and $E^{5B}$ are nitrogen atoms, $R^{2B}$, $R^{3B}$, $R^{4B}$ and $R^{5B}$ are not present.

$R^{2A}$, $R^{3A}$, $R^{4A}$, $R^{2B}$, $R^{3B}$, $R^{4B}$ and $R^{5B}$ each independently represent a hydrogen atom, an alkyl group, an alkoxy group, an aryl group, an aryloxy group, a monovalent heterocyclic group or a halogen atom, and these groups may have a substituent. When there are a plurality of $R^{2A}$, $R^{3A}$, $R^{4A}$, $R^{2B}$, $R^{3B}$, $R^{4B}$ and $R^{5B}$, each of them may be the same or different. $R^{2A}$ and $R^{3A}$, $R^{3A}$ and $R^{4A}$, $R^{2A}$ and $R^{2B}$, $R^{2B}$ and $R^{3B}$, $R^{3B}$ and $R^{4B}$, and $R^{4B}$ and $R^{5B}$ each may be combined together to form a ring together with atoms to which they are attached.

At least one selected from the group consisting of $R^{2A}$, $R^{3A}$, $R^{4A}$, $R^{2B}$, $R^{3B}$, $R^{4B}$ and $R^{5B}$ is a dendron.

The ring $R^{1A}$ represents a triazole ring or a diazole ring constituted of a nitrogen atom, $E^{1A}$, $E^{2A}$, $E^{3A}$ and $E^{4A}$.

The ring $R^{1B}$ represents a benzene ring, a pyridine ring or a pyrimidine ring constituted of two carbon atoms, $E^{2B}$, $E^{3B}$, $E^{4B}$ and $E^{5B}$.].

$M^1$ is preferably an iridium atom.

When the ring $R^{1A}$ is a triazole ring, it is preferable that any two of $E^{2A}$, $E^{3A}$ and $E^{4A}$ are a nitrogen atom, it is more preferable that $E^{2A}$ and $E^{3A}$ are a nitrogen atom.

When the ring $R^{1A}$ is a diazole ring, it is preferable that $E^{2A}$ or $E^{3A}$ is a nitrogen atom, it is more preferable that $E^{2A}$ is a nitrogen atom.

The ring $R^{1A}$ is preferably a triazole ring.

When $E^{2A}$ is a nitrogen atom and when $R^{2A}$ is present, $R^{2A}$ is preferably an alkyl group, an aryl group or a monovalent heterocyclic group, more preferably an alkyl group or an aryl group, and these groups may have a substituent. It is preferable that the aryl group and the monovalent heterocyclic group are a dendron.

When $E^{2A}$ is a carbon atom, $R^{1A}$ is preferably a hydrogen atom, an alkyl group, an aryl group or a monovalent heterocyclic group, more preferably a hydrogen atom, an alkyl group or an aryl group, further preferably a hydrogen atom or an alkyl group, and these groups may have a substituent. It is preferable that the aryl group and the monovalent heterocyclic group are a dendron.

When $E^{3A}$ is a nitrogen atom and when $R^{3A}$ is present, $R^{3A}$ is preferably an alkyl group, an aryl group or a monovalent heterocyclic group, more preferably an alkyl group or an aryl group, and these groups may have a substituent. It is preferable that the aryl group and the monovalent heterocyclic group are a dendron.

When $E^{3A}$ is a carbon atom, $R^{3A}$ is preferably a hydrogen atom, an alkyl group, an aryl group or a monovalent heterocyclic group, more preferably a hydrogen atom, an alkyl group or an aryl group, further preferably a hydrogen atom or an alkyl group, and these groups may have a substituent. It is preferable that the aryl group and the monovalent heterocyclic group are a dendron.

When $E^{4A}$ is a nitrogen atom and when $R^{4A}$ is present, $R^{3A}$ is preferably an alkyl group, an aryl group or a monovalent heterocyclic group, more preferably an alkyl group or an aryl group, and these groups may have a substituent. It is preferable that the aryl group and the monovalent heterocyclic group are a dendron.

When $E^{4A}$ is a carbon atom, $R^{4A}$ is preferably a hydrogen atom, an alkyl group, an aryl group or a monovalent heterocyclic group, more preferably a hydrogen atom, an alkyl group or an aryl group, further preferably a hydrogen atom or an alkyl group, and these groups may have a substituent. It is preferable that the aryl group and the monovalent heterocyclic group are a dendron.

When the ring $R^{1B}$ is a pyridine ring, it is preferable that at least one of $E^{3B}$, $E^{4B}$ and $E^{5B}$ is a nitrogen atom, it is more preferable that $E^{3B}$ is a nitrogen atom.

When the ring $R^{1B}$ is a diazabenzene ring, it is more preferable that any two of $E^{3B}$, $E^{4B}$ and $E^{5B}$ are a nitrogen atom, it is further preferable that $E^{3B}$ and $E^{5B}$ are a nitrogen atom.

The ring $R^{1B}$ is preferably a benzene ring.

$R^{2B}$, $R^{3B}$, $R^{4B}$ and $R^{5B}$ are preferably a hydrogen atom, an alkoxy group, an alkyl group, an aryl group, a monovalent heterocyclic group or a fluorine atom, more preferably a hydrogen atom, an alkyl group or an aryl group, and these groups may have a substituent. It is preferable that the aryl group and the monovalent heterocyclic group are a dendron.

When at least one selected from the group consisting of $R^{2A}$, $R^{3A}$, $R^{4A}$, $R^{2B}$, $R^{3B}$, $R^{4B}$ and $R^{5B}$ is a dendron and when there are a plurality of $R^{2A}$, $R^{3A}$, $R^{4A}$, $R^{2B}$, $R^{3B}$, $R^{4B}$ and $R^{5B}$ (namely, when $n^1$ is 2 or 3), it may be permissible that at least one of the plurality of $R^{2A}$, $R^{3A}$, $R^{4A}$, $R^{2B}$, $R^{3B}$, $R^{4B}$ and $R^{5B}$ is a dendron.

It is preferable that at least one of $R^{2A}$, $R^{3A}$, $R^{4A}$, $R^{3B}$ and $R^{4B}$ is a dendron, and it is more preferable that at least one of $R^{2A}$, $R^{3A}$, $R^{3B}$ and $R^{4B}$ is a dendron.

$R^{5B}$ is preferably a hydrogen atom.

The preferable range of the number of the dendron which the phosphorescent compound represented by the formula (1-A) has is the same as the preferable range of the number of the dendron which the phosphorescent compound represented by the formula (1) has.

When the dendron which at least one ring of the rings $R^{1A}$ and the rings $R^{1B}$ has is a group represented by the formula (Dend-A) or (Dend-B) and when $m^{DA1}$ is 0, $G^{DA1}$ linking to the ring $R^{1A}$ and/or the ring $R^{1B}$ is preferably a group obtained by removing from a benzene ring which may have a substituent three hydrogen atoms linking directly to a carbon atom constituting the ring, more preferably a group represented by the formula (GDA-11) or (GDA-12), further preferably a group represented by the formula (GDA-11).

When the dendron which at least one ring of the rings $R^{1A}$ and the rings $R^{1B}$ has is a group represented by the formula (Dend-A) or (Dend-B) and when $m^{DA1}$ is an integer of 1 or more, $Ar^{DA1}$ linking to the ring $R^{1A}$ and/or the ring $R^{1B}$ is preferably a phenylene group which may have a substituent, more preferably a group represented by the formula (ArDA-1).

The dendron which at least one ring of the rings $R^{1A}$ and the rings $R^{1B}$ has is preferably a group represented by the formula (Dend-A1), (Dend-A4) or (Dend-B1), more preferably a group represented by the formula (Dend-A1) or (Dend-B1), further preferably a group represented by the formula (Dend-A1).

The phosphorescent compound represented by the formula (1-A) is preferably a phosphorescent compound represented by the formulae (1-A1) to (1-A3), more preferably a phosphorescent compound represented by the formulae (1-A1) to (1-A2), further preferably a phosphorescent compound represented by the formula (1-A1).

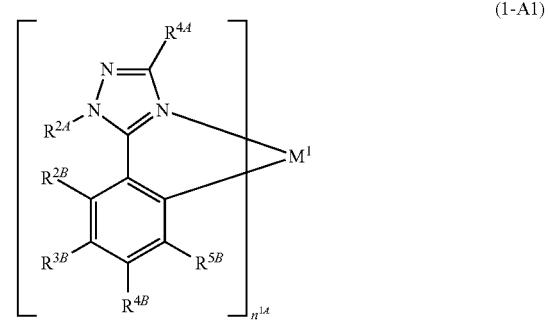

(1-A1)

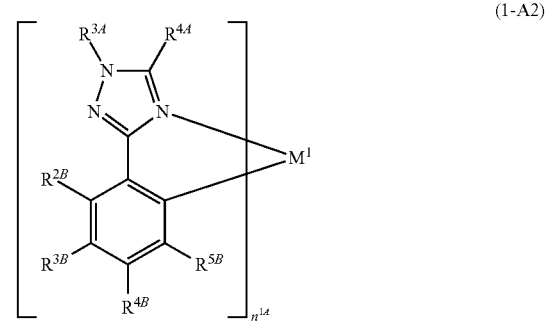

(1-A2)

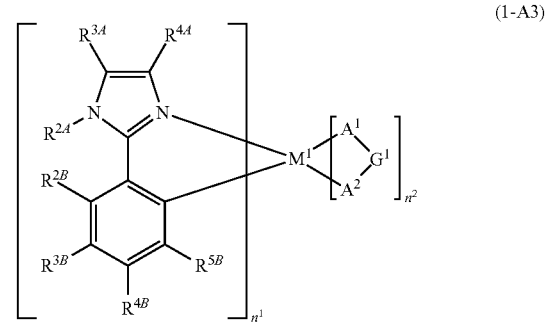

(1-A3)

[wherein, $M^1$, $R^{2A}$, $R^{3A}$, $R^{4A}$, $R^{2B}$, $R^{3B}$, $R^{4B}$, $R^{5B}$, $n^1$ and $n^2$ represent the same meaning as described above.

$n^{1A}$ is 2 or 3, and $n^{1A}$ is 3 when $M^1$ is iridium, while $n^{1A}$ is 2 when $M^1$ is platinum.].

The phosphorescent compound represented by the formula (1-A1) includes, for example, phosphorescent compounds represented by the formulae (1-A1-1) to (1-A1-22), preferably phosphorescent compounds represented by the formulae (1-A1-1) to (1-A1-17).

TABLE 4

| formula | $M^1$ | $n^{1A}$ | $R^{2A}$ | $R^{4A}$ | $R^{2B}$ | $R^{3B}$ | $R^{4B}$ | $R^{5B}$ |
|---|---|---|---|---|---|---|---|---|
| (1-A1-1) | Ir | 3 | Me | n-$C_3H_7$ | H | formula (Dend-A-1) | H | H |
| (1-A1-2) | Ir | 3 | Me | n-$C_3H_7$ | H | formula (Dend-A-1) | F | H |
| (1-A1-3) | Ir | 3 | Me | n-$C_3H_7$ | H | formula (Dend-A-1) | $CF_3$ | H |
| (1-A1-4) | Ir | 3 | Me | n-$C_3H_7$ | H | formula (Dend-A-5) | H | H |
| (1-A1-5) | Ir | 3 | Me | n-$C_3H_7$ | H | H | formula (Dend-A-4) | H |
| (1-A1-6) | Ir | 3 | formula (Dend A-1) | n-$C_3H_7$ | H | H | H | H |
| (1-A1-7) | Ir | 3 | formula (Dend-A-1) | n-$C_3H_7$ | H | H | $CF_3$ | H |
| (1-A1-8) | Ir | 3 | formula (Dend-B-1) | n-$C_3H_7$ | H | H | H | H |
| (1-A1-9) | Ir | 3 | formula (Dend-A-3) | n-$C_3H_7$ | H | H | H | H |
| (1-A1-10) | Ir | 3 | formula (Dend-A-4) | n-$C_3H_7$ | H | H | H | H |
| (1-A1-11) | Ir | 3 | formula (Dend-A-5) | n-$C_3H_7$ | H | H | H | H |
| (1-A1-12) | Ir | 3 | formula (Dend-A-1) | n-$C_3H_7$ | H | H | formula (Dend-A-1) | H |
| (1-A1-13) | Ir | 3 | formula (Dend-A-5) | n-$C_3H_7$ | H | formula (Dend-A-5) | H | H |
| (1-A1-14) | Ir | 3 | formula (Dend-A-3) | n-$C_3H_7$ | H | formula (Dend-A-5) | H | H |
| (1-A1-15) | Ir | 3 | Me | formula (Dend-A-1) | H | H | H | H |
| (1-A1-16) | Pt | 2 | Me | n-$C_3H_7$ | H | formula (Dend-A-1) | H | H |
| (1-A1-17) | Pt | 2 | formula (Dend-A-1) | n-$C_3H_7$ | H | H | H | H |

TABLE 5

| formula | $M^1$ | $n^{1A}$ | $R^{2A}$ | $R^{4A}$ | $R^{2B}$ | $R^{3B}$ | $R^{4B}$ | $R^{5B}$ |
|---|---|---|---|---|---|---|---|---|
| (1-A1-18) | Ir | 3 | Me | n-$C_3H_7$ | H | formula (Dend-B-1) | H | H |
| (1-A1-19) | Ir | 3 | Me | n-$C_3H_7$ | H | formula (Dend-B-2) | H | H |
| (1-A1-20) | Ir | 3 | formula (Dend-B-2) | n-$C_3H_7$ | H | H | H | H |
| (1-A1-21) | Ir | 3 | ![trimethylphenyl structure] | n-$C_3H_7$ | H | formula (Dend-A-1) | H | H |
| (1-A1-22) | Pt | 2 | Me | n-$C_3H_7$ | H | formula (Dend-B-1) | H | H |

The phosphorescent compound represented by the formula (1-A2) includes, for example, phosphorescent compounds represented by the formulae (1-A2-1) to (1-A2-15).

TABLE 6

| formula | $M^1$ | $n^{1A}$ | $R^{3A}$ | $R^{4A}$ | $R^{2B}$ | $R^{3B}$ | $R^{4B}$ | $R^{5B}$ |
|---|---|---|---|---|---|---|---|---|
| (1-A2-1) | Ir | 3 | n-$C_6H_{13}$ | n-$C_3H_7$ | H | formula (Dend-A-1) | H | H |
| (1-A2-2) | Ir | 3 | 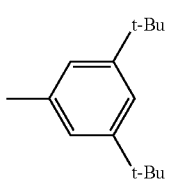 | n-$C_3H_7$ | H | formula (Dend-A-1) | H | H |
| (1-A2-3) | Ir | 3 | 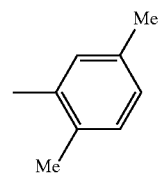 | n-$C_3H_7$ | H | formula (dend-A-1) | H | H |
| (1-A2-4) | Ir | 3 | 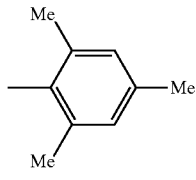 | n-$C_3H_7$ | H | formula (Dend-A-1) | H | H |
| (1-A2-5) | Ir | 3 | formula (Dend-A-1) | n-$C_3H_7$ | H | H | H | H |
| (1-A2-6) | Ir | 3 | formula (Dend-A-1) | n-$C_3H_7$ | H | H | $CF_3$ | H |
| (1-A2-7) | Ir | 3 | formula (Dend-A-1) | n-$C_3H_7$ | H | H | F | H |
| (1-A2-8) | Ir | 3 | formula (Dend-A-1) | n-$C_3H_7$ | H | t-Bu | H | H |
| (1-A2-9) | Ir | 3 | formula (Dend-A-1) | n-$C_3H_7$ | H | 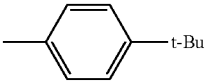 | H | H |
| (1-A2-10) | Ir | 3 | formula (Dend-A-1) | n-$C_3H_7$ | H | formula (Dend-A-5) | H | H |
| (1-A2-11) | Ir | 3 | formula (Dend-A-1) | n-$C_3H_7$ | H | 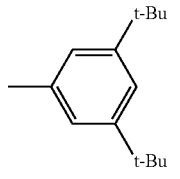 | H | H |
| (1-A2-12) | Ir | 3 | formula (Dend-A-1) | n-$C_3H_7$ | H | H | formula (Dend-A-1) | H |
| (1-A2-13) | Ir | 3 | formula (Dend-A-1) | n-$C_3H_7$ | H | formula (Dend-A-1) | H | H |
| (1-A2-14) | Pt | 2 | Me | n-$C_3H_7$ | H | formula (Dend-A-1) | H | H |
| (1-A2-15) | Pt | 2 | formula (Dend-A-1) | n-$C_3H_7$ | H | H | H | H |

The phosphorescent compound represented by the formula (1-A3) includes, for example, phosphorescent compounds represented by the formulae (1-A3-1) to (1-A3-19).

TABLE 7

| formula | $M^1$ | $n^1$ | $R^{2A}$ | $R^{3A}$ | $R^{4A}$ | $R^{2B}$ | $R^{3B}$ | $R^{4B}$ | $R^{5B}$ | $n^2$ | $A^1$-$G^1$-$A^2$ |
|---|---|---|---|---|---|---|---|---|---|---|---|
| (1-A3-1) | Ir | 3 | Me | H | H | H | formula (Dend-A-1) | H | H | 0 | — |
| (1-A3-2) | Ir | 3 | Me | H | H | H | H | formula (Dend-A-4) | H | 0 | — |
| (1-A3-3) | Ir | 3 | Me | n-$C_3H_7$ | n-$C_3H_7$ | H | formula (Dend-A-5) | H | H | 0 | — |
| (1-A3-4) | Ir | 3 | 2,3,5-trimethylphenyl (Me, Me, Me) | H | H | H | formula (Dend-A-1) | H | H | 0 | — |
| (1-A3-5) | Ir | 3 | 3,5-dimethyl-4-(n-$C_6H_{13}$)phenyl | H | H | H | formula (Dend-A-1) | H | H | 0 | — |
| (1-A3-6) | Ir | 3 | 3,5-di-t-Bu-phenyl | H | H | H | H | formula (Dend-A-5) | H | 0 | — |
| (1-A3-7) | Ir | 3 | 3,5-di-i-Pr-biphenyl-yl | H | H | H | formula (Dend-A-1) | H | H | 0 | — |
| (1-A3-8) | Ir | 3 | 2,6-dimethylphenyl (Me, Me) | H | H | H | formula (Dend-A-19) | H | H | 0 | — |
| (1-A3-9) | Ir | 3 | 2,6-di-i-Pr-phenyl | H | H | H | formula (Dend-A-1) | H | H | 0 | — |

TABLE 7-continued
| formula | M¹ | n¹ | R²ᴬ | R³ᴬ | R⁴ᴬ | R²ᴮ | R³ᴮ | R⁴ᴮ | R⁵ᴮ | n² | A¹-G¹-A² |
|---|---|---|---|---|---|---|---|---|---|---|---|
| (1-A3-10) | Ir | 3 | formula (Dend-A-1) | H | H | H | H | H | H | 0 | — |
| (1-A3-11) | Ir | 3 | formula (Dend-A-5) | H | H | H | H | H | H | 0 | — |
| (1-A3-12) | Ir | 3 | formula (Dend-A-5) | H | H | H | formula (Dend-A-1) | H | H | 0 | — |
TABLE 8
| formula | M¹ | n¹ | R²ᴬ | R³ᴬ | R⁴ᴬ | R²ᴮ | R³ᴮ | R⁴ᴮ | R⁵ᴮ | n² | A¹-G¹-A² |
|---|---|---|---|---|---|---|---|---|---|---|---|
| (1-A3-13) | Ir | 2 | 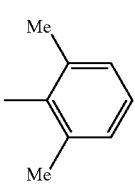 | H | H | H | formula (Dend-A-1) | H | H | 1 | 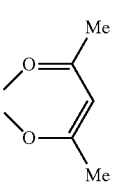 |
| (1-A3-14) | Ir | 2 | 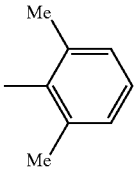 | H | H | H | H | formula (Dend-A-1) | H | 1 | 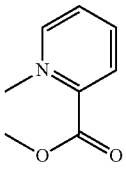 |
| (1-A3-15) | Ir | 2 | 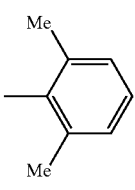 | H | H | H | formula (Dend-A-1) | H | H | 1 | 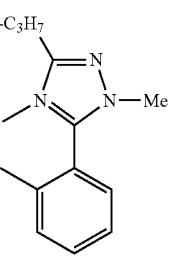 |
| (1-A3-16) | Ir | 2 | formula (Dend-A-5) | H | H | H | formula (Dend-A-1) | H | H | 1 | 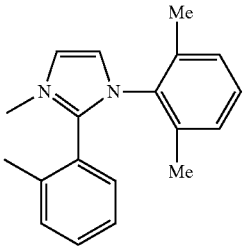 |

(1-A3-17)
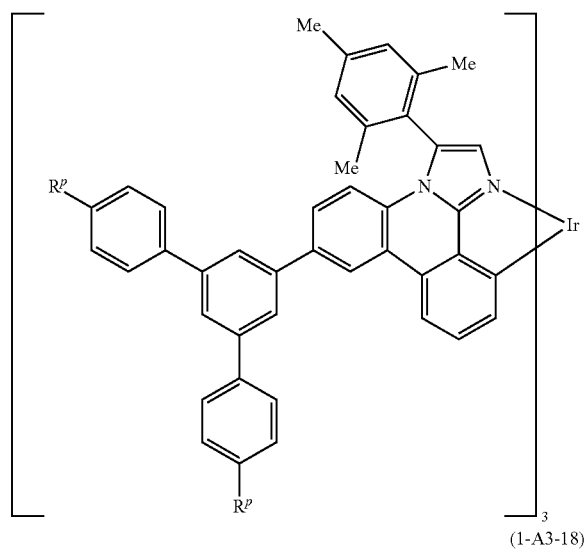

(1-A3-18)
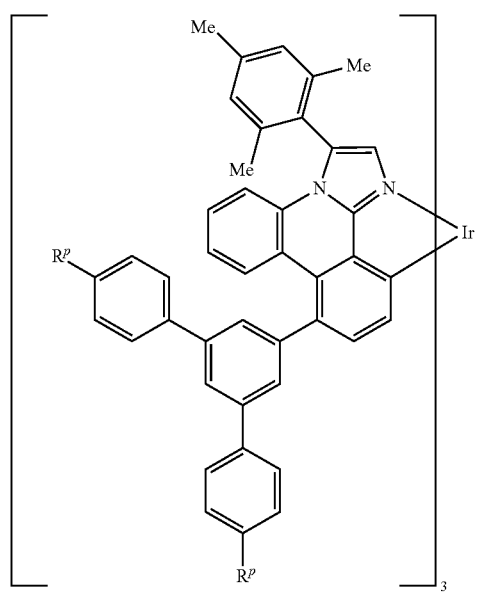

(1-A3-19)
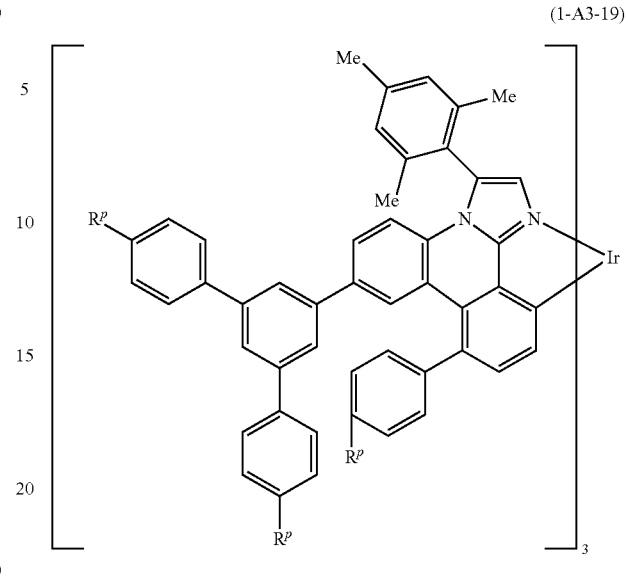

[wherein, $R^p$ represents the same meaning as described above.].

The phosphorescent compound (DB) includes, for example, phosphorescent compounds represented by the formulae (1-A1-1) to (1-A1-22), the formulae (1-A2-1) to (1-A2-15), the formulae (1-A3-1) to (1-A3-19) and the formulae (1-A-1) to (1-A-4), preferably phosphorescent compounds represented by the formulae (1-A1-1) to (1-A1-17), the formulae (1-A2-1) to (1-A2-15) and the formulae (1-A-1) to (1-A-4), more preferably phosphorescent compounds represented by the formulae (1-A1-1) to (1-A1-15) or the formulae (1-A2-1) to (1-A2-13), further preferably phosphorescent compounds represented by the formulae (1-A1-1) to (1-A1-15).

(1-A-1)
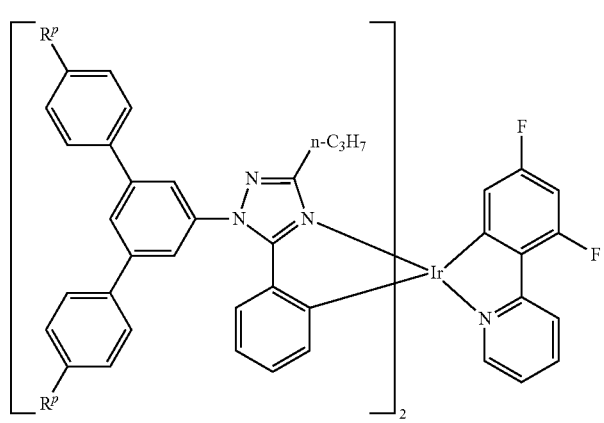

-continued
(1-A-2)
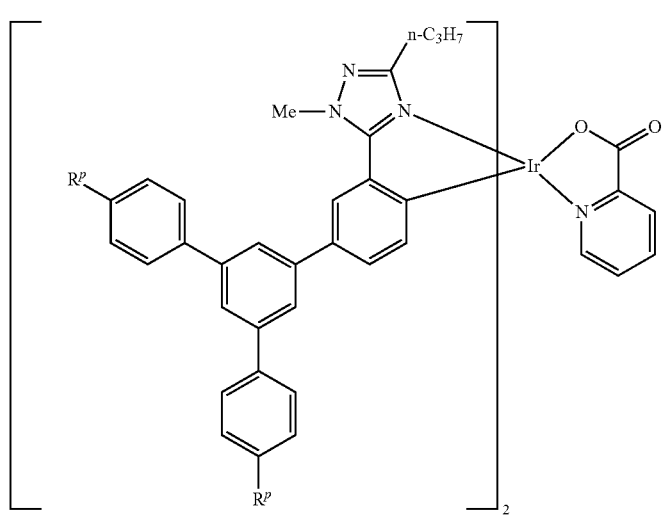
(1-A-3)
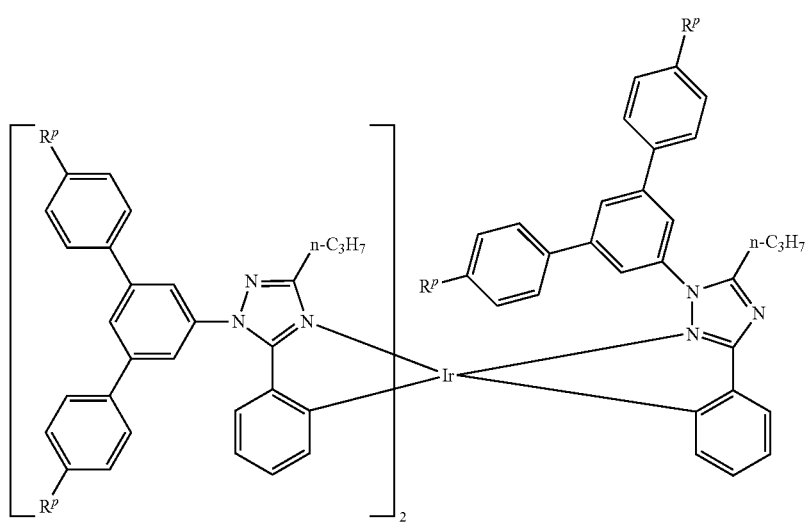
(1-A-4)
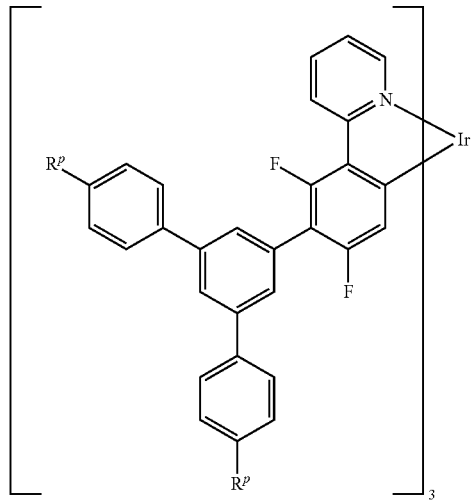

[wherein, $R^p$ represents the same meaning as described above.].

<Phosphorescent Compound (DGR)>

The phosphorescent compound (DGR) contained in the composition of the present invention is a phosphorescent compound having an emission spectrum the maximum peak wavelength of which is between 480 nm or more and less than 680 nm and having a dendron.

It is preferable that the phosphorescent compound (DGR) has an emission spectrum the maximum peak wavelength of which is between 500 nm or more and 630 nm or less from the standpoint of adjusting emission color (particularly, adjusting emission color to white) of a light emitting device obtained by using the composition of the present invention.

The phosphorescent compound (DGR) is preferably a phosphorescent compound represented by the formula (2).

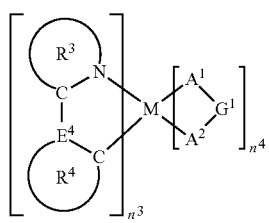

(2)

[wherein,

M represents a ruthenium atom, a rhodium atom, a palladium atom, an iridium atom or a platinum atom.

$n^3$ represents an integer of 1 or more, $n^4$ represents an integer of 0 or more and $n^3+n^4$ is 2 or 3. $n^3+n^4$ is 3 when M is a ruthenium atom, a rhodium atom or an iridium atom, and while $n^3+n^4$ is 2 when M is a palladium atom or a platinum atom.

$E^4$ represents a carbon atom or a nitrogen atom.

The ring $R^3$ represents a 6-membered aromatic heterocyclic ring, and this ring may have a substituent. When there are a plurality of substituents, they may be the same or different and may be combined together to form a ring together with atoms to which they are attached. When there are a plurality of the rings $R^3$, they may be the same or different.

The ring $R^4$ represents a 5-membered or 6-membered aromatic hydrocarbon ring or a 5-membered or 6-membered aromatic heterocyclic ring, and these rings may have a substituent. When there are a plurality of the substituents, they may be the same or different and may be combined together to form a ring together with atoms to which they are attached. When there are a plurality of the rings $R^4$, they may be the same or different. $E^4$ is a carbon atom when the ring $R^4$ is a 6-membered aromatic heterocyclic ring.

The substituent which the ring $R^3$ may have and the substituent which the ring $R^4$ may have may be combined together to form a ring together with atoms to which they are attached.

At least one ring selected from the group consisting of the ring $R^3$ and the ring $R^4$ has a dendron.

$A^1$-$G^1$-$A^2$ represents an anionic bidentate ligand, and $G^1$ represents an atomic group constituting a bidentate ligand together with $A^1$ and $A^2$. $A^1$ and $A^2$ each independently represent a carbon atom, an oxygen atom or a nitrogen atom and may be a carbon atom, an oxygen atom or a nitrogen atom constituting the ring. When there are a plurality of $A^1$-$G^1$-$A^2$, they may be the same or different.].

$E^4$ is preferably a carbon atom.

M is preferably an iridium atom or a platinum atom, more preferably an iridium atom since then the luminance life of a light emitting device obtained by using the composition of the present invention is more excellent.

When M is a ruthenium atom, a rhodium atom or an iridium atom, $n^3$ is preferably 2 or 3, more preferably 3.

When M is a palladium atom or a platinum atom, $n^4$ is preferably 2.

The ring $R^3$ is a 6-membered aromatic heterocyclic ring and substituents which this ring has may also be combined together to form a ring together with atoms to which they are attached. The ring $R^3$ is preferably a 6-membered aromatic heterocyclic ring having 1 or more and 4 or less nitrogen atoms as the constituent atom, more preferably a 6-membered aromatic heterocyclic ring having 1 or more and 2 or less nitrogen atoms as the constituent atom, further preferably a pyridine ring, a diazabenzene ring, a quinoline ring or an isoquinoline ring, particularly preferably a pyridine ring, a quinoline ring or an isoquinoline ring, and these rings may have a substituent.

The ring $R^4$ is a 5-membered or 6-membered aromatic hydrocarbon ring or a 5-membered or 6-membered aromatic heterocyclic ring and substituents which these rings have may also be combined together to form a ring together with atoms to which they are attached. The ring $R^4$ is preferably a 6-membered aromatic hydrocarbon ring or a 5-membered or 6-membered aromatic heterocyclic ring, more preferably a benzene ring, a naphthalene ring, a phenanthrene ring, a pyridine ring, a diazabenzene ring, a pyrrole ring, a furan ring or a thiophene ring, further preferably a benzene ring or a naphthalene ring, particularly preferably a benzene ring, and these rings may have a substituent.

"At least one ring selected from the group consisting of the ring $R^3$ and the ring $R^4$ has a dendron" denotes that a part or all of hydrogen atoms linking directly to a carbon atom or a hetero atom constituting at least one ring among the plurality of rings are substituted with a dendron. For example, when there are a plurality of the rings $R^3$ and the rings $R^4$ (namely, when $n^3$ is 2 or 3) in the formula (2), it may be permissible that at least one ring of the plurality of the rings $R^3$ and the plurality of the rings $R^4$ has a dendron.

The preferable range of the number of the dendron which at least one ring of the rings $R^3$ and the rings $R^4$ has is the same as the preferable range of the number of the dendron which at least one ring of the rings $R^1$ and the rings $R^2$ has described above.

When the dendron which at least one ring of the rings $R^3$ and the rings $R^4$ has is a group represented by the formula (Dend-A) or (Dend-B) and when $m^{DA1}$ is an integer of 1 or more, $Ar^{DA1}$ linking to the ring $R^3$ and/or the ring $R^4$ is preferably a phenyl group which may have a substituent, more preferably a group represented by the formula (ArDA-1).

When the dendron which at least one ring of the rings $R^3$ and the rings $R^4$ has is a group represented by the formula (Dend-A) or (Dend-B) and when $m^{DA1}$ is 0, $G^{DA1}$ linking to the ring $R^3$ and/or the ring $R^4$ is preferably a group obtained by removing from a benzene ring or a triazine ring which may have a substituent three hydrogen atoms linking directly to carbon atoms constituting the ring, more preferably a group obtained by removing from a benzene ring which may have a substituent three hydrogen atoms linking directly to carbon atoms constituting the ring.

When the dendron which at least one ring of the rings $R^3$ and the rings $R^4$ has is a group represented by the formula (Dend-A) or (Dend-B) and when $m^{DA1}$ is 0, $G^{DA1}$ linking to the ring $R^3$ and/or the ring $R^4$ is preferably a group represented by the formula (GDA-11) or (GDA-14), more preferably a group represented by the formula (GDA-11).

The dendron which at least one ring of the rings $R^3$ and the rings $R^4$ has is preferably a group represented by the formula (Dend-A1), (Dend-A3), (Dend-B1) or (Dend-B3), more preferably a group represented by the formula (Dend-A1), (Dend-A3) or (Dend-B1), further preferably a group represented by the formula (Dend-A1) or (Dend-A3).

The preferable range of the number of the dendron which the phosphorescent compound represented by the formula (2) has is the same as the preferable range of the number of the dendron which the phosphorescent compound represented by the formula (1) has described above.

The definition and examples of the substituent which the ring $R^3$ and the ring $R^4$ may have are the same as the definition and examples of the substituent which the ring $R^1$ and the ring $R^2$ may have described above.

The definition and examples of the anionic bidentate ligand represented by $A^1$-$G^1$-$A^2$ are the same as the definition and examples of the anionic bidentate ligand represented by $A^1$-$G^1$-$A^2$ in the phosphorescent compound represented by the formula (1) described above. Here, the anionic bidentate ligand represented by $A^1$-$G^1$-$A^2$ is different from the ligand of which number is defined by the subscript $n^3$.

The phosphorescent compound represented by the formula (2) is preferably a phosphorescent compound represented by the formulae (2-A1) to (2-A5), more preferably a phosphorescent compound represented by the formula (2-A1), (2-A2) or (2-A5).

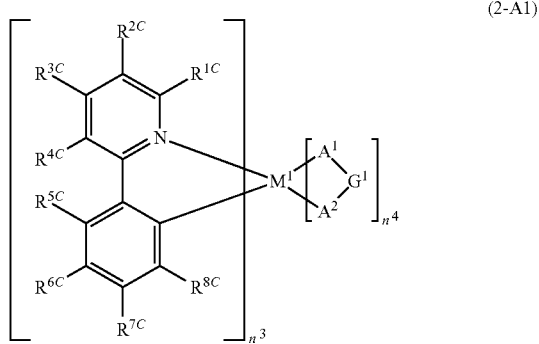

(2-A1)

[wherein,
$M^1$, $A^1$-$G^1$-$A^2$, $n^3$ and $n^4$ represent the same meaning as described above.

$R^{1C}$, $R^{2C}$, $R^{3C}$, $R^{4C}$, $R^{5C}$, $R^{6C}$, $R^{7C}$ and $R^{8C}$ each independently represent a hydrogen atom, an alkyl group, an alkoxy group, an aryl group, an aryloxy group, a monovalent heterocyclic group or a halogen atom, and these groups may have a substituent. When there are a plurality of $R^{1C}$, $R^{2C}$, $R^{3C}$, $R^{4C}$, $R^{5C}$, $R^{6C}$, $R^{7C}$ and $R^{8C}$, each of them may be the same or different. $R^{1C}$ and $R^{2C}$, $R^{2C}$ and $R^{3C}$, $R^{3C}$ and $R^{4C}$, $R^{4C}$ and $R^{5C}$, $R^{5C}$ and $R^{6C}$, $R^{6C}$ and $R^{7C}$, and $R^{7C}$ and $R^{8C}$ each may be combined together to form a ring together with carbon atoms to which they are attached.

At least one selected from the group consisting of $R^{1C}$, $R^{2C}$, $R^{3C}$, $R^{4C}$, $R^{5C}$, $R^{6C}$, $R^{7C}$ and $R^{8C}$ is a dendron.].

$R^{1C}$, $R^{2C}$, $R^{3C}$, $R^{4C}$, $R^{5C}$, $R^{6C}$, $R^{7C}$ and $R^{8C}$ are preferably a hydrogen atom, an alkoxy group, an alkyl group, an aryl group or a monovalent heterocyclic group, more preferably a hydrogen atom, an alkyl group, an aryl group or a monovalent heterocyclic group, and these groups may have a substituent. It is preferable that the aryl group and the monovalent heterocyclic group are a dendron.

When at least one selected from the group consisting of $R^{1C}$, $R^{2C}$, $R^{3C}$, $R^{4C}$, $R^{5C}$, $R^{6C}$, $R^{7C}$ and $R^{8C}$ is a dendron and when there are a plurality of $R^{1C}$, $R^{2C}$, $R^{3C}$, $R^{4C}$, $R^{5C}$, $R^{6C}$, $R^{7C}$ and $R^{8C}$ (namely, when $n^3$ is 2 or 3), it may be permissible that at least one of the plurality of $R^{1C}$, $R^{2C}$, $R^{3C}$, $R^{4C}$, $R^{5C}$, $R^{6C}$, $R^{7C}$ and $R^{8C}$ is a dendron.

The dendron is preferably a group represented by the formula (Dend-A1), (Dend-A3), (Dend-B1) or (Dend-B3), more preferably a group represented by the formula (Dend-A1), (Dend-A3) or (Dend-B1), further preferably a group represented by the formula (Dend-A1) or (Dend-A3).

$R^{1C}$, $R^{4C}$, $R^{5C}$ and $R^{8C}$ are preferably a hydrogen atom or an alkyl group, more preferably a hydrogen atom, and these groups may have a substituent.

$R^{2C}$, $R^{3C}$, $R^{6C}$ and $R^{7C}$ are preferably a hydrogen atom, an alkyl group, an aryl group or a monovalent heterocyclic group, more preferably a hydrogen atom, an aryl group or a monovalent heterocyclic group. The aryl group and the monovalent heterocyclic group are preferably a dendron.

It is preferable that at least one selected from the group consisting of $R^{2C}$, $R^{3C}$, $R^{6C}$ and $R^{7C}$ is a dendron, and it is more preferable that $R^{2C}$ or $R^{6C}$ is a dendron.

The phosphorescent compound represented by the formula (2-A1) is preferably a phosphorescent compound represented by the formula (2-A1-A).

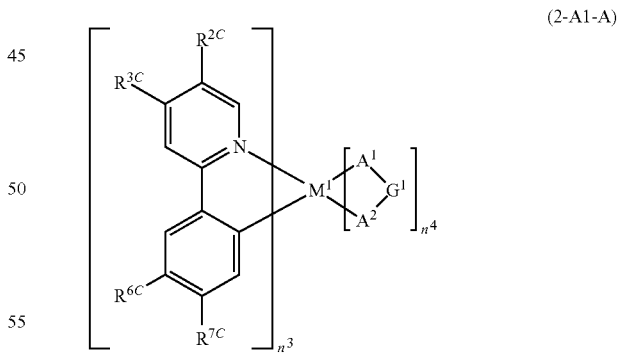

(2-A1-A)

[wherein, $M^1$, $A^1$-$G^1$-$A^2$, $n^3$, $n^4$, $R^{2C}$, $R^{3C}$, $R^{6C}$ and $R^{7C}$ represent the same meaning as described above.].

The phosphorescent compound represented by the formula (2-A1-A) includes, for example, phosphorescent compounds represented by the formulae (2-A1-A1) to (2-A1-A27), preferably phosphorescent compounds represented by the formulae (2-A1-A1) to (2-A1-A20).

TABLE 9

| formula | M¹ | n³ | R²C | R³C | R⁶C | R⁷C | n⁴ | A¹-G¹-A² |
|---|---|---|---|---|---|---|---|---|
| (2-A1-A1) | Ir | 3 | H | H | formula (Dend-A-8) | H | 0 | — |
| (2-A1-A2) | Ir | 3 | H | H | H | formula (Dend-A-8) | 0 | — |
| (2-A1-A3) | Ir | 3 | H | H | formula (Dend-A-1) | H | 0 | — |
| (2-A1-A4) | Ir | 3 | H | H | H | formula (Dend-A-1) | 0 | — |
| (2-A1-A5) | Ir | 3 | formula (Dend-A-1) | H | H | H | 0 | — |
| (2-A1-A6) | Ir | 3 | H | formula (Dend-A-1) | H | H | 0 | — |
| (2-A1-A7) | Ir | 3 | formula (Dend-A-12) | H | H | H | 0 | — |
| (2-A1-A8) | Ir | 3 | formula (Dend-A-14) | H | H | H | 0 | — |
| (2-A1-A9) | Ir | 3 | H | formula (Dend-A-14) | H | H | 0 | — |
| (2-A1-A10) | Ir | 3 | formula (Dend-A-14) | H | H | 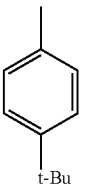 | 0 | — |
| (2-A1-A11) | Ir | 3 | formula (Dend-A-14) | H | formula (Dend-A-1) | H | 0 | — |
| (2-A1-A12) | Ir | 3 | formula (Dend-A-14) | H | H | formula (Dend-A-1) | 0 | — |
| (2-A1-A13) | Ir | 3 | H | H | formula (Dend-B-1) | H | 0 | — |
| (2-A1-A14) | Ir | 3 | formula (Dend-B-4) | H | H | H | 0 | — |
| (2-A1-A15) | Pt | 2 | H | H | formula (Dend-A-1) | H | 0 | — |
| (2-A1-A16) | Pt | 2 | formula (Dend-A-14) | H | H | H | 0 | — |

TABLE 10

| formula | M¹ | n³ | R²C | R³C | R⁶C | R⁷C | n⁴ | A¹-G¹-A² |
|---|---|---|---|---|---|---|---|---|
| (2-A1-A17) | Ir | 2 | H | H | formula (Dend-A-1) | H | 1 | 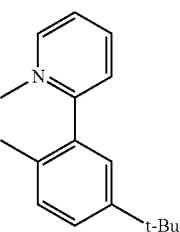 |
| (2-A1-A18) | Ir | 2 | H | H | formula (Dend-A-1) | H | 1 | 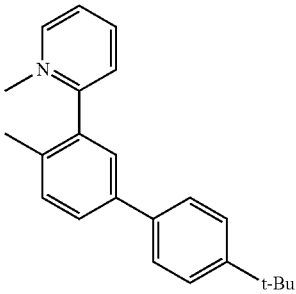 |

TABLE 10-continued

| formula | M¹ | n³ | $R^{2C}$ | $R^{3C}$ | $R^{6C}$ | $R^{7C}$ | n⁴ | A¹-G¹-A² |
|---|---|---|---|---|---|---|---|---|
| (2-A1-A19) | Ir | 2 | H | H | formula (Dend-A-1) | H | 1 | [structure] |
| (2-A1-A20) | Ir | 2 | formula (Dend-A-14) | H | H | H | 1 | [structure] |

TABLE 11

| formula | M¹ | n³ | $R^{2C}$ | $R^{3C}$ | $R^{6C}$ | $R^{7C}$ | n⁴ | A¹—G¹—A² |
|---|---|---|---|---|---|---|---|---|
| (2-A1-A21) | Ir | 3 | formula (Dend-A-14) | H | formula (Dend-A-9) | H | 0 | — |
| (2-A1-A22) | Ir | 3 | H | formula (Dend-A-9) | H | formula (Dend-A-8) | 0 | — |
| (2-A1-A23) | Ir | 3 | H | H | formula (Dend-A-19) | H | 0 | — |
| (2-A1-A24) | Ir | 3 | formula (Dend-B-1) | H | H | H | 0 | — |
| (2-A1-A25) | Ir | 3 | formula (Dend-B-4) | H | formula (Dend-B-6) | H | 0 | — |
| (2-A1-A26) | Pt | 2 | formula (Dend-A-1) | H | H | H | 0 | — |
| (2-A1-A27) | Pt | 2 | formula (Dend-A-14) | H | formula (Dend-A-9) | H | 0 | — |

(2-A2)

[wherein,

M¹, A¹-G¹-A², n³ and n⁴ represent the same meaning as described above.

$R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ each independently represent a hydrogen atom, an alkyl group, an alkoxy group, an aryl group, an aryloxy group, a monovalent heterocyclic group or a halogen atom or dendron, and these groups may have a substituent. When there are a plurality of $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$, each of them may be the same or different. $R^{9C}$ and $R^{10C}$, $R^{10C}$ and $R^{11C}$, $R^{11C}$ and $R^{12C}$, $R^{12C}$ and $R^{13C}$, $R^{13C}$ and $R^{14C}$, $R^{14C}$ and $R^{15C}$, $R^{15C}$ and $R^{16C}$, $R^{16C}$ and $R^{17C}$, and $R^{17C}$ and $R^{18C}$ each may be combined together to form a ring together with carbon atoms to which they are attached.

At least one selected from the group consisting of $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ is a dendron.].

$R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ are preferably a hydrogen atom, an alkoxy group, an alkyl group, an aryl group or a monovalent heterocyclic group, more preferably a hydrogen atom, an alkyl group, an aryl group or a monovalent heterocyclic group, and these groups may have a substituent. The aryl group and the monovalent heterocyclic group are preferably a dendron.

When at least one selected from the group consisting of $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ is a dendron and when there are a plurality of $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ (namely, when $n^3$ is 2 or 3), it may be permissible that at least one of the plurality of $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ is a dendron.

The dendron is preferably a group represented by the formula (Dend-A1), (Dend-A3), (Dend-B1) or (Dend-B3), more preferably a group represented by the formula (Dend-A1) or (Dend-B1), further preferably a group represented by the formula (Dend-A1).

$R^{9C}$, $R^{10C}$, $R^{11C}$, $R^{12C}$, $R^{13C}$ and $R^{14C}$ are preferably a hydrogen atom, an alkyl group or an aryl group, more preferably a hydrogen atom or an alkyl group, further preferably a hydrogen atom, and these groups may have a substituent.

$R^{15C}$, $R^{16C}$, $R^{17C}$ and $R^{18C}$ are preferably a hydrogen atom, an alkyl group, an aryl group or a monovalent heterocyclic group, more preferably a hydrogen atom, an aryl group or a monovalent heterocyclic group. It is preferable that the aryl group and the monovalent heterocyclic group are a dendron.

It is preferable that at least one selected from the group consisting of $R^{15C}$, $R^{16C}$, $R^{17C}$ and $R^{18C}$ is a dendron, it is more preferable that $R^{16C}$ or $R^{17C}$ is a dendron, it is further preferable that $R^{16C}$ is a dendron.

The phosphorescent compound represented by the formula (2-A2) includes, for example, phosphorescent compounds represented by the formulae (2-A2-1) to (2-A2-13), preferably phosphorescent compounds represented by the formulae (2-A2-1) to (2-A2-8).

TABLE 12

| formula | $M^1$ | $n^3$ | $R^{9C}$ to $R^{15C}$ | $R^{16C}$ | $R^{17C}$ | $R^{18C}$ | $n^4$ | $A^1$-$G^1$-$A^2$ |
|---|---|---|---|---|---|---|---|---|
| (2-A2-1) | Ir | 3 | H | formula (Dend-A-8) | H | H | 0 | — |
| (2-A2-2) | Ir | 3 | H | H | formula (Dend-A-8) | H | 0 | — |
| (2-A2-3) | Ir | 3 | H | formula (Dend-A-1) | H | H | 0 | — |
| (2-A2-4) | Ir | 3 | H |  | formula (Dend-A-1) | H | 0 | — |
| (2-A2-5) | Ir | 3 | H | formula (Dend-B-1) | H | H | 0 | — |
| (2-A2-6) | Ir | 2 | H | formula (Dend-A-1) | H | H | 1 | 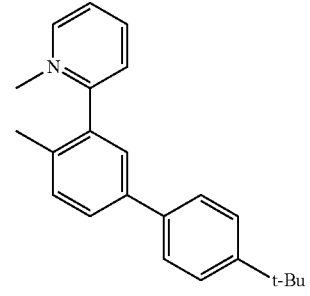 |
| (2-A2-7) | Ir | 1 | H | formula (Dend-A-1) | H | H | 2 | 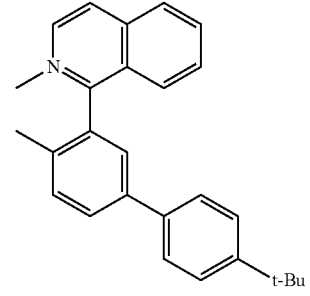 |
| (2-A2-8) | Pt | 2 | H | formula (Dend-A-1) | H | H | 0 | — |

TABLE 13

| formula | $M^1$ | $n^3$ | $R^{9C}$ | $R^{10C}$ | $R^{11C}$ | $R^{12C}$ | $R^{13C}$ | $R^{14C}$ to $R^{18C}$ | $n^4$ | $A^1$—$G^1$—$A^2$ |
|---|---|---|---|---|---|---|---|---|---|---|
| (2-A2-9) | Ir | 3 | H | formula (Dend-A-1) | H | H | H | H | 0 | — |
| (2-A2-10) | Ir | 3 | H | formula (Dend-A-14) | H | H | H | H | 0 | — |
| (2-A2-11) | Ir | 3 | H | H | formula (Dend-A-1) | H | H | H | 0 | — |
| (2-A2-12) | Ir | 3 | H | H | H | formula (Dend-A-1) | H | H | 0 | — |
| (2-A2-13) | Ir | 3 | H | H | H | H | formula (Dend-A-1) | H | 0 | — |

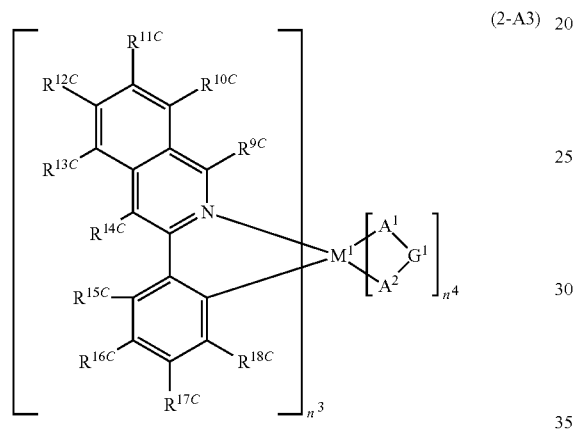

(2-A3)

[wherein, $M^1$, $A^1$-$G^1$-$A^2$, $n^3$, $n^4$, $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ represent the same meaning as described above.].

The phosphorescent compound represented by the formula (2-A3) includes, for example, phosphorescent compounds represented by the formulae (2-A3-1) to (2-A3-12), preferably phosphorescent compounds represented by the formulae (2-A3-1) to (2-A3-8).

TABLE 14

| formula | $M^1$ | $n^3$ | $R^{9C}$ to $R^{15C}$ | $R^{16C}$ | $R^{17C}$ | $R^{18C}$ | $n^4$ | $A^1$-$G^1$-$A^2$ |
|---|---|---|---|---|---|---|---|---|
| (2-A3-1) | Ir | 3 | H | formula (Dend-A-8) | H | H | 0 | — |
| (2-A3-2) | Ir | 3 | H | H | formula (Dend-A-8) | H | 0 | — |
| (2-A3-3) | Ir | 3 | H | formula (Dend-A-1) | H | H | 0 | — |
| (2-A3-4) | Ir | 3 | H | H | formula (Dend-A-1) | H | 0 | — |
| (2-A3-5) | Ir | 3 | H | formula (Dend-B-1) | H | H | 0 | — |

TABLE 14-continued
| formula | M¹ | n³ | R⁹ᶜ to R¹⁵ᶜ | R¹⁶ᶜ | R¹⁷ᶜ | R¹⁸ᶜ | n⁴ | A¹-G¹-A² |
|---|---|---|---|---|---|---|---|---|
| (2-A3-6) | Ir | 2 | H | formula (Dend-A-1) | H | H | 1 | 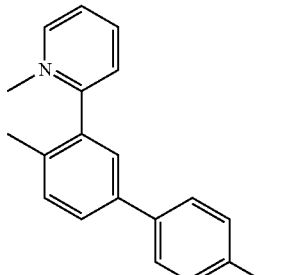 |
| (2-A3-7) | Ir | 1 | H | formula (Dend-A-1) | H | H | 2 | 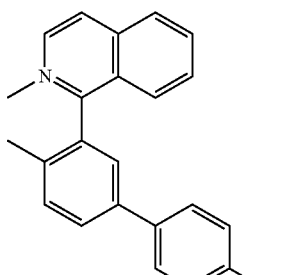 |
| (2-A3-8) | Pt | 2 | H | formula (Dend-A-1) | H | H | 0 | — |
TABLE 15
| formula | M¹ | n³ | R⁹ᶜ | R¹⁰ᶜ | R¹¹ᶜ | R¹²ᶜ | R¹³ᶜ | R¹⁴ᶜ to R¹⁸ᶜ | n⁴ | A¹—G¹—A² |
|---|---|---|---|---|---|---|---|---|---|---|
| (2-A3-9) | Ir | 3 | H | formula (Dend-A-1) | H | H | H | H | 0 | — |
| (2-A2-10) | Ir | 3 | H | H | formula (Dend-A-1) | H | H | H | 0 | — |
| (2-A3-11) | Ir | 3 | H | H | H | formula (Dend-A-1) | H | H | 0 | — |
| (2-A3-12) | Ir | 3 | H | H | H | H | formula (Dend-A-1) | H | 0 | — |

(2-A4)

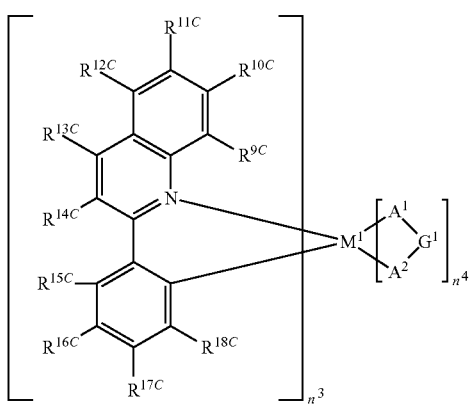

[wherein, $M^1$, $A^1$-$G^1$-$A^2$, $n^3$, $n^4$, $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ represent the same meaning as described above.].

The phosphorescent compound represented by the formula (2-A4) includes, for example, phosphorescent compounds represented by the formulae (2-A4-1) to (2-A4-12), preferably phosphorescent compounds represented by the formulae (2-A4-1) to (2-A4-8).

TABLE 16

| formula | $M^1$ | $n^3$ | $R^{9C}$ to $R^{15C}$ | $R^{16C}$ | $R^{17C}$ | $R^{18C}$ | $n^4$ | $A^1$-$G^1$-$A^2$ |
|---|---|---|---|---|---|---|---|---|
| (2-A4-1) | Ir | 3 | H | formula (Dend-A-8) | H | H | 0 | — |
| (2-A4-2) | Ir | 3 | H | H | formula (Dend-A-8) | H | 0 | — |
| (2-A4-3) | Ir | 3 | H | formula (Dend-A-1) | H | H | 0 | — |
| (2-A4-4) | Ir | 3 | H | H | formula (Dend-A-1) | H | 0 | — |
| (2-A4-5) | Ir | 3 | H | formula (Dend-B-1) | H | H | 0 | — |
| (2-A4-6) | Ir | 2 | H | formula (Dend-A-1) | H | H | 1 | ![pyridyl-biphenyl-tBu] |
| (2-A4-7) | Ir | 1 | H | formula (Dend-A-1) | H | H | 2 | ![isoquinolyl-biphenyl-tBu] |
| (2-A4-8) | Pt | 2 | H | formula (Dend-A-1) | H | H | 0 | — |

TABLE 17

| formula | $M^1$ | $n^3$ | $R^{9C}$ | $R^{10C}$ | $R^{11C}$ | $R^{12C}$ | $R^{13C}$ | $R^{14C}$ to $R^{18C}$ | $n^4$ | $A^1$—$G^1$—$A^2$ |
|---|---|---|---|---|---|---|---|---|---|---|
| (2-A4-9) | Ir | 3 | H | formula (Dend-A-1) | H | H | H | H | 0 | — |
| (2-A4-10) | Ir | 3 | H | H | formula (Dend-A-1) | H | H | H | 0 | — |
| (2-A4-11) | Ir | 3 | H | H | H | formula (Dend-A-1) | H | H | 0 | — |
| (2-A4-12) | Ir | 3 | H | H | H | H | formula (Dend-A-1) | H | 0 | — |

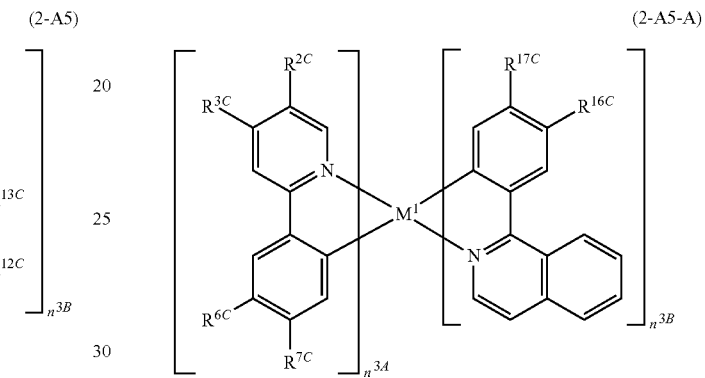

(2-A5)      (2-A5-A)

[wherein,
$M^1$, $A^1$-$G^1$-$A^2$, $R^{1C}$, $R^{2C}$, $R^{3C}$, $R^{4C}$, $R^{5C}$, $R^{6C}$, $R^{7C}$, $R^{8C}$, $R^{9C}$, $R^{10C}$, $R^{11C}$, $R^{12C}$, $R^{13C}$, $R^{14C}$, $R^{15C}$, $R^{16C}$, $R^{17C}$ and $R^{18C}$ represent the same meaning as described above.
$n^{3A}$ and $n^4$ each independently represent an integer of 1 or more, and $n^{3A}+n^{4A}$ is 2 or 3. $n^{3A}+n^{4A}$ is 3 when $M^1$ is an iridium atom, while $n^{3A}+n^{4A}$ is 2 when $M^1$ is a platinum atom.].

The phosphorescent compound represented by the formula (2-A5) is preferably a phosphorescent compound represented by the formula (2-A5-A).

The phosphorescent compound represented by the formula (2-A5-A) includes, for example, phosphorescent compounds represented by the formulae (2-A5-A1) to (2-A5-A10), preferably phosphorescent compounds represented by the formulae (2-A5-A1) to (2-A5-A6).

TABLE 18

| formula | $M^1$ | $n^{3A}$ | $R^{2C}$ | $R^{3C}$ | $R^{6C}$ | $R^{7C}$ | $n^{3B}$ | $R^{16C}$ | $R^{17C}$ |
|---|---|---|---|---|---|---|---|---|---|
| (2-A5-A1) | Ir | 2 | formula (Dend-A-14) | H | H | H | 1 | formula (Dend-A-1) | H |
| (2-A5-A2) | Ir | 2 | H | formula (Dend-A-14) | H | H | 1 | H | formula (Dend-A-1) |
| (2-A5-A3) | Ir | 2 | formula (Dend-A-14) | H | formula (Dend-A-1) | H | 1 | formula (Dend-A-1) | H |
| (2-A5-A4) | Ir | 2 | H | formula (Dend-A-14) | H | formula (Dend-A-1) | 1 | formula (Dend-A-1) | H |
| (2-A5-A5) | Ir | 1 | formula (Dend-A-14) | H | H | H | 2 | formula (Dend-A-1) | H |
| (2-A5-A6) | Pt | 2 | formula (Dend-A-14) | H | H | H | 1 | formula (Dend-A-1) | H |

TABLE 19

| formula | M¹ | $n^{3A}$ | $R^{2C}$ | $R^{3C}$ | $R^{6C}$ | $R^{7C}$ | $n^{3B}$ | $R^{16C}$ | $R^{17C}$ |
|---|---|---|---|---|---|---|---|---|---|
| (2-A5-A7) | Ir | 2 | formula (Dend-A-14) | H | formula (Dend-A-9) | H | 1 | formula (Dend-A-1) | H |
| (2-A5-A8) | Ir | 1 | formula (Dend-A-1) | H | H | H | 2 | formula (Dend-A-1) | H |
| (2-A5-A9) | Ir | 2 | H | formula (Dend-A-1) | H | H | 1 | H | formula (Dend-A-1) |
| (2-A5-A10) | Pt | 2 | formula (Dend-A-14) | H | formula (Dend-A-9) | H | 1 | formula (Dend-A-1) | H |

<Phosphorescent Compound (GR)>

The two or more phosphorescent compounds (GR) contained in the composition of the present invention are a phosphorescent compound having an emission spectrum the maximum peak wavelength of which is between 480 nm or more and less than 680 nm.

It is preferable that the phosphorescent compound (GR) has an emission spectrum the maximum peak wavelength of which is between 500 nm or more and 630 nm or less from the standpoint of adjusting emission color (particularly, adjusting emission color to white) of a light emitting device obtained by using the composition of the present invention.

The phosphorescent compound (GR) is preferably a phosphorescent compound represented by the formula (3):

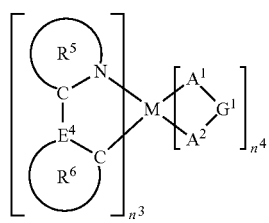

(3)

[wherein,

M represents a ruthenium atom, a rhodium atom, a palladium atom, an iridium atom or a platinum atom.

$n^3$ represents an integer of 1 or more, $n^4$ represents an integer of 0 or more, and $n^3+n^4$ is 2 or 3. $n^3+n^4$ is 3 when M is a ruthenium atom, a rhodium atom or an iridium atom, and while $n^3+n^4$ is 2 when M is a palladium atom or a platinum atom.

$E^4$ represents a carbon atom or a nitrogen atom.

The ring $R^5$ represents a 6-membered aromatic heterocyclic ring, and this ring may have a substituent. When there are a plurality of substituents, they may be the same or different and may be combined together to form a ring together with atoms to which they are attached. When there are a plurality of the rings $R^5$, they may be the same or different.

The ring $R^6$ represents a 5-membered or 6-membered aromatic hydrocarbon ring or a 5-membered or 6-membered aromatic heterocyclic ring, and these rings may have a substituent. When there are a plurality of substituents, they may be the same or different and may be combined together to form a ring together with atoms to which they are attached. When there are a plurality of rings $R^6$, they may be the same or different. $E^4$ is a carbon atom when the ring $R^6$ is a 6-membered aromatic heterocyclic ring.

The substituent which the ring $R^5$ has and the substituent which the ring $R^6$ has may be combined together to form a ring together with atoms to which they are attached.

$A^1$-$G^1$-$A^2$ represents an anionic bidentate ligand, and $G^1$ represents an atomic group constituting a bidentate ligand together with $A^1$ and $A^2$. $A^1$ and $A^2$ each independently represent a carbon atom, an oxygen atom or a nitrogen atom, and may be a carbon atom, an oxygen atom or a nitrogen atom constituting the ring. When there are a plurality of $A^1$-$G^1$-$A^2$, they may be the same or different.]

$E^3$ and $E^4$ are preferably a carbon atom.

M is preferably an iridium atom or a platinum atom, more preferably an iridium atom since then the luminance life of a light emitting device obtained by using the composition of the present invention is more excellent.

When M is a ruthenium atom, a rhodium atom or an iridium atom, $n^3$ is preferably 2 or 3, more preferably 3.

When M is a palladium atom or a platinum atom, $n^4$ is preferably 2.

The ring $R^5$ is a 6-membered aromatic heterocyclic ring and substituents which this ring has may also be combined together to form a ring together with atoms to which they are attached. The ring $R^5$ is preferably a 6-membered aromatic heterocyclic ring having 1 or more and 4 or less nitrogen atoms as the constituent atom, more preferably a 6-membered aromatic heterocyclic ring having 1 or more and 2 or less nitrogen atoms as the constituent atom, further preferably a pyridine ring, a diazabenzene ring, a quinoline ring or an isoquinoline ring, particularly preferably a pyridine ring, a quinoline ring or an isoquinoline ring, and these rings may have a substituent.

The ring $R^6$ is a 5-membered or 6-membered aromatic hydrocarbon ring or a 5-membered or 6-membered aromatic heterocyclic ring and substituents which these rings have may also be combined together to form a ring together with atoms to which they are attached. The ring $R^6$ is preferably a 6-membered aromatic hydrocarbon ring or a 5-membered or 6-membered aromatic heterocyclic ring, more preferably a benzene ring, a naphthalene ring, a fluorene ring, a phenanthrene ring, a dihydrophenanthrene ring, a pyridine ring, a diazabenzene ring, a pyrrole ring, a furan ring or a thiophene ring, further preferably a benzene ring, a naphthalene ring or a fluorene ring, particularly preferably a benzene ring, and these rings may have a substituent.

The definition and examples of the substituent which the ring $R^5$ and the ring $R^6$ may have are the same as the definition and examples of substituent which the ring $R^3$ and the ring $R^4$ may have described above.

It is preferable that at least one ring of the ring $R^5$ and the ring $R^6$ has an alkyl group or an aryl group as a substituent since then the phosphorescent compound represented by the formula (3) shows excellent dissolvability in an organic solvent.

The definition and examples of the anionic bidentate ligand represented by $A^1\text{-}G^1\text{-}A^2$ in the formula (3) are the same as the definition and examples of the anionic bidentate ligand represented by $A^1\text{-}G^1\text{-}A^2$ in the phosphorescent compound represented by the formula (2) described above. Here, the anionic bidentate ligand represented by $A^1\text{-}G^1\text{-}A^2$ is different from the ligand of which number is defined by the subscript $n^3$.

The phosphorescent compound represented by the formula (3) is preferably a phosphorescent compound represented by the formulae (3-A1) to (3-A4), more preferably a phosphorescent compound represented by the formula (3-A1) or (3-A2).

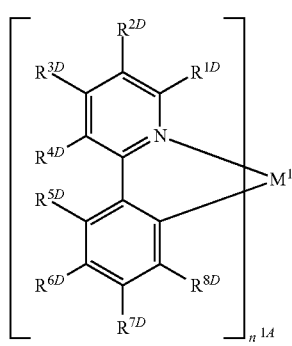

(3-A1)

[wherein,
$M^1$ and $n^{1A}$ represent the same meaning as described above.

$R^{1D}$, $R^{2D}$, $R^{3D}$, $R^{4D}$, $R^{5D}$, $R^{6D}$, $R^{7D}$ and $R^{8D}$ each independently represent a hydrogen atom, an alkyl group, an alkoxy group, an aryl group, an aryloxy group, a monovalent heterocyclic group or a halogen atom, and these groups may have a substituent. When there are a plurality of $R^{1D}$, $R^{2D}$, $R^{3D}$, $R^{4D}$, $R^{5D}$, $R^{6D}$, $R^{7D}$ and $R^{8D}$, each of them may be the same or different. $R^{1D}$ and $R^{2D}$, $R^{2D}$ and $R^{3D}$, $R^{3D}$ and $R^{4D}$, $R^{4D}$ and $R^{5D}$, $R^{5D}$ and $R^{6D}$, $R^{6D}$ and $R^{7D}$, and $R^{7D}$ and $R^{8D}$ each may be combined together to form a ring together with carbon atoms to which they are attached.].

$R^{1D}$, $R^{2D}$, $R^{3D}$, $R^{4D}$, $R^{5D}$, $R^{6D}$, $R^{7D}$ and $R^{8D}$ are preferably a hydrogen atom, an alkoxy group, an alkyl group, an aryl group or a monovalent heterocyclic group, more preferably a hydrogen atom, an alkyl group, an aryl group or a monovalent heterocyclic group, and these groups may have a substituent. The aryl group and the monovalent heterocyclic group may be the above-described dendron.

$R^{1D}$, $R^{4D}$, $R^{5D}$ and $R^{8D}$ are preferably a hydrogen atom or an alkyl group, more preferably a hydrogen atom, and these groups may have a substituent.

$R^{2D}$, $R^{3D}$, $R^{6D}$ and $R^{7D}$ are preferably a hydrogen atom, an alkyl group or an aryl group, and these groups may have a substituent.

The at least one selected from the group consisting of $R^{1D}$, $R^{2D}$, $R^{3D}$, $R^{4D}$, $R^{5D}$, $R^{6D}$, $R^{7D}$ and $R^{8D}$ is preferably an alkyl group or an aryl group, and these groups may have a substituent.

The at least one selected from the group consisting of $R^{2D}$, $R^{3D}$, $R^{6D}$ and $R^{7D}$ is preferably an alkyl group or an aryl group, and these groups may have a substituent.

The phosphorescent compound represented by the formula (3-A1) includes, for example, phosphorescent compounds represented by the formulae (3-A1-1) to (3-A1-11).

TABLE 20

| formula | M | $R^{1D}$ | $R^{2D}$ | $R^{3D}$ | $R^{4D}$ | $R^{5D}$ | $R^{6D}$ | $R^{7D}$ | $R^{8D}$ |
|---|---|---|---|---|---|---|---|---|---|
| (3-A1-1) | Ir | H | H | H | H | H | H | H | H |
| (3-A1-2) | Ir | H | H | H | H | H | n-$C_6H_{13}$ | H | H |
| (3-A1-3) | Ir | H | H | H | H | H | H | n-$C_8H_{17}$ | H |
| (3-A1-4) | Ir | H | H | H | H | Me | H | H | H |
| (3-A1-5) | Ir | H | Me | H | H | H | t-Bu | H | H |
| (3-A1-6) | Ir | H | H | Me | H | H | —⟨C6H4⟩—$R^p$ | H | H |
| (3-A1-7) | Ir | H | H | H | H | H | H | —⟨C6H4⟩—$R^p$ | H |
| (3-A1-8) | Ir | H | H | —⟨C6H4⟩—$R^p$ | H | H | —⟨C6H4⟩—$R^p$ | H | H |
| (3-A1-9) | Ir | H | H | H | H | H | (carbazole with $R^p$) | H | H |
| (3-A1-10) | Pt | H | H | H | H | H | H | H | H |
| (3-A1-11) | Pt | H | H | H | H | H | H | n-$C_6H_{13}$ | H |

[wherein, $R^p$ represents the same meaning as described above.].

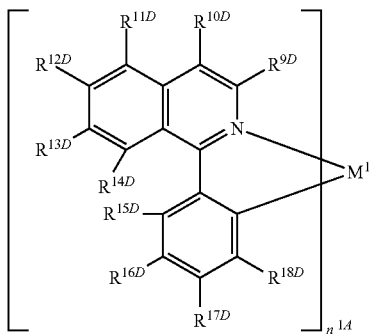

(3-A2)

[wherein, $M^1$ and $n^{1A}$ represent the same meaning as described above.

$R^{9D}, R^{10D}, R^{11D}, R^{12D}, R^{13D}, R^{14D}, R^{15D}, R^{16D}, R^{17D}$ and $R^{18D}$ each independently represent a hydrogen atom, an alkyl group, an alkoxy group, an aryl group, an aryloxy group, a monovalent heterocyclic group or a halogen atom, and these groups may have a substituent. When there are a plurality of $R^{9D}, R^{10D}, R^{11D}, R^{12D}, R^{13D}, R^{14D}, R^{15D}, R^{16D}, R^{17D}$ and $R^{18D}$, each of them may be the same or different. $R^{9D}$ and $R^{10D}, R^{10D}$ and $R^{11D}, R^{11D}$ and $R^{12D}, R^{12D}$ and $R^{13D}, R^{13D}$ and $R^{14D}, R^{14D}$ and $R^{15D}, R^{15D}$ and $R^{16D}, R^{16D}$ and $R^{17D}$, and $R^{17D}$ and $R^{18D}$ each may be combined together to form a ring together with carbon atoms to which they are attached.].

$R^{9D}, R^{10D}, R^{11D}, R^{12D}, R^{13D}, R^{14D}, R^{15D}, R^{16D}, R^{17D}$ and $R^{18D}$ are preferably a hydrogen atom, an alkoxy group, an alkyl group, an aryl group or a monovalent heterocyclic group, more preferably a hydrogen atom, an alkyl group, an aryl group or a monovalent heterocyclic group, and these groups may have a substituent. The aryl group and the monovalent heterocyclic group may be the above-described dendron.

$R^{9D}, R^{10D}, R^{11D}, R^{12D}, R^{13D}$ and $R^{14D}$ are preferably a hydrogen atom or an alkyl group, more preferably a hydrogen atom, and these groups may have a substituent.

$R^{15D}, R^{16D}, R^{17D}$ and $R^{18D}$ are preferably a hydrogen atom, an alkyl group or an aryl group, and these groups may have a substituent.

The at least one selected from the group consisting of $R^{9D}, R^{10D}, R^{11D}, R^{12D}, R^{13D}, R^{14D}, R^{15D}, R^{16D}, R^{17D}$ and $R^{18D}$ is preferably an alkyl group or an aryl group, and these groups may have a substituent.

The at least one selected from the group consisting of $R^{15D}, R^{16D}, R^{17D}$ and $R^{18D}$ is more preferably an alkyl group or an aryl group, and these groups may have a substituent. The at least one selected from the group consisting of $R^{16D}$ and $R^{17D}$ is further preferably an alkyl group or an aryl group, and these groups may have a substituent.

The phosphorescent compound represented by the formula (3-A2) includes, for example, phosphorescent compounds represented by the formulae (3-A2-1) to (3-A2-11).

TABLE 21

| formula | $M^1$ | $R^{9D}$ | $R^{10D}$ | $R^{11D}$ to $R^{14D}$ | $R^{15D}$ | $R^{16D}$ | $R^{17D}$ | $R^{18D}$ |
|---|---|---|---|---|---|---|---|---|
| (3-A2-1) | Ir | H | H | H | H | H | H | H |
| (3-A2-2) | Ir | H | H | H | H | n-C$_6$H$_{13}$ | H | H |
| (3-A2-3) | Ir | H | H | H | H | H | n-C$_6$H$_{13}$ | H |
| (3-A2-4) | Ir | H | H | H | Me | H | H | H |
| (3-A2-5) | Ir | H | H | H | H | t-Bu | H | H |
| (3-A2-6) | Ir | H | H | H | H | —⟨C$_6$H$_4$⟩—$R^p$ | H | H |
| (3-A2-7) | Ir | H | H | H | H | H | —⟨C$_6$H$_4$⟩—$R^p$ | H |
| (3-A2-8) | Ir | H | t-Bu | H | H | —⟨C$_6$H$_4$⟩—$R^p$ | H | H |
| (3-A2-9) | Ir | H | H | H | H | carbazole-3,6-diyl with $R^p$ groups | H | H |
| (3-A2-10) | Pt | H | H | H | H | H | H | H |
| (3-A2-11) | Pt | H | H | H | H | H | t-Bu | H |

[wherein, $R^p$ represents the same meaning as described above.].

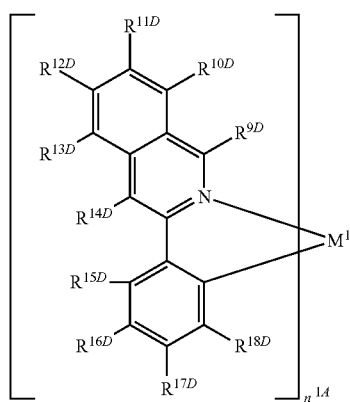

(3-A3)

[wherein, $M^1$, $n^{1A}$, $R^{9D}$, $R^{10D}$, $R^{11D}$, $R^{12D}$, $R^{13D}$, $R^{14D}$, $R^{15D}$, $R^{16D}$, $R^{17D}$ and $R^{18D}$ represent the same meaning as described above.].

The phosphorescent compound represented by the formula (3-A3) includes, for example, phosphorescent compounds represented by the formulae (3-A3-1) to (3-A3-11).

TABLE 22

| formula | $M^1$ | $R^{9D}$ | $R^{10D}$ | $R^{11D}$ to $R^{14D}$ | $R^{15D}$ | $R^{16D}$ | $R^{17D}$ | $R^{18D}$ |
|---|---|---|---|---|---|---|---|---|
| (3-A3-1) | Ir | H | H | H | H | H | H | H |
| (3-A3-2) | Ir | H | H | H | H | n-C$_6$H$_{13}$ | H | H |
| (3-A3-3) | Ir | H | H | H | H | H | n-C$_6$H$_{13}$ | H |
| (3-A3-4) | Ir | H | H | H | Me | H | H | H |
| (3-A3-5) | Ir | H | H | H | H | t-Bu | H | H |
| (3-A3-6) | Ir | H | H | H | H | —C$_6$H$_4$—$R^p$ | H | H |
| (3-A3-7) | Ir | H | H | H | H | H | —C$_6$H$_4$—$R^p$ | H |
| (3-A3-8) | Ir | H | t-Bu | H | H | —C$_6$H$_4$—$R^p$ | H | H |
| (3-A3-9) | Ir | H | H | H | H | 3,6-di-$R^p$-carbazol-9-yl | H | H |
| (A-A3-10) | Pt | H | H | H | H | H | H | H |
| (3-A3-11) | Pt | H | H | H | H | H | t-Bu | H |

[wherein, $R^p$ represents the same meaning as described above.].

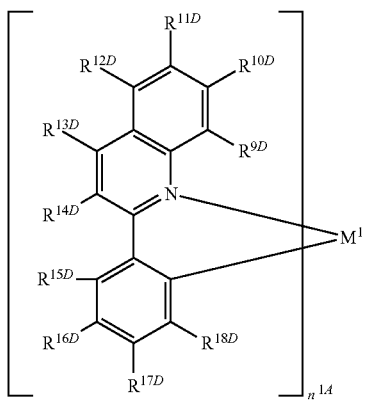

(3-A4)

[wherein, $M^1$, $n^{1A}$, $R^{9D}$, $R^{10D}$, $R^{11D}$, $R^{12D}$, $R^{13D}$, $R^{14D}$, $R^{15D}$, $R^{16D}$, $R^{17D}$ and $R^{18D}$ represent the same meaning as described above.].

The phosphorescent compound represented by the formula (3-A4) includes, for example, phosphorescent compounds represented by the formulae (3-A4-1) to (3-A4-11).

the present invention is a composition comprising a phosphorescent compound (DB) and two or more phosphorescent compounds (GR).

In the composition of the present invention, a phosphorescent compound (DB) may be contained singly, or two or more phosphorescent compounds (DB) may be contained. Further, in the composition of the present invention, a phosphorescent compound (DGR) may be contained singly, or two or more phosphorescent compounds (DGR) may be contained.

In the composition of the present invention, the phosphorescent compound (GR) may be a phosphorescent compound (DGR).

In the composition of the present invention, it is possible to adjust emission color and it is also possible to adjust emission color to white by adjusting the ratio of the content of a phosphorescent compound (DB) to the content of a phosphorescent compound (DGR).

Further, in the composition of the present invention, it is possible to adjust emission color and it is also possible to adjust emission color to white by adjusting the ratio of the content of a phosphorescent compound (DB) to the content of two or more phosphorescent compounds (GR).

The emission color of a light emitting device can be confirmed by measuring the emission chromaticity of a light emitting device and determining the chromaticity coordinate (CIE chromaticity coordinate). For white emission color, for

TABLE 23

| formula | $M^1$ | $R^{9D}$ | $R^{10D}$ | $R^{11D}$ to $R^{14D}$ | $R^{15D}$ | $R^{16D}$ | $R^{17D}$ | $R^{18D}$ |
|---|---|---|---|---|---|---|---|---|
| (3-A4-1) | Ir | H | H | H | H | H | H | H |
| (3-A4-2) | Ir | H | H | H | H | n-C$_6$H$_{13}$ | H | H |
| (3-A4-3) | Ir | H | H | H | H | H | n-C$_6$H$_{13}$ | H |
| (3-A4-4) | Ir | H | H | H | Me | H | H | H |
| (3-A4-5) | Ir | H | H | H | H | t-Bu | H | H |
| (3-A4-6) | Ir | H | H | H | H | —⟨⟩—$R^p$ | H | H |
| (3-A4-7) | Ir | H | H | H | H | H | —⟨⟩—$R^p$ | H |
| (3-A4-8) | Ir | H | t-Bu | H | H | —⟨⟩—$R^p$ | H | H |
| (3-A4-9) | Ir | H | H | H | H | carbazole with $R^p$ groups | H | H |
| (3-A4-10) | Pt | H | H | H | H | H | H | H |
| (3-A4-11) | Pt | H | H | H | H | H | t-Bu | H |

[wherein, $R^p$ represents the same meaning as described above.].

<Composition>

The composition of the present invention is a composition comprising a phosphorescent compound (DB) and a phosphorescent compound (DGR). Further, the composition of example, X in the chromaticity coordinate is in the range of 0.25 to 0.55 and Y in the chromaticity coordinate is in the range of 0.25 to 0.55, and it is preferable that X in the chromaticity coordinate is in the range of 0.28 to 0.45 and Y in the chromaticity coordinate is in the range of 0.28 to 0.45.

From the standpoint of adjusting emission color (particularly, adjusting emission color to white) of a light emitting device obtained by using the composition of the present invention, the content of a phosphorescent compound (DGR) is preferably 0.01 to 50 parts by weight, more preferably 0.05 to 30 parts by weight, further preferably 0.1 to 10 parts by weight, particularly preferably 0.5 to 5 parts by weight when the content of a phosphorescent compound (DB) is 100 parts by weight.

Further, from the standpoint of adjusting emission color (particularly, adjusting emission color to white) of a light emitting device obtained by using the composition of the present invention, the total content of two or more phosphorescent compounds (GR) is preferably 0.01 to 50 parts by weight, more preferably 0.05 to 30 parts by weight, further preferably 0.1 to 10 parts by weight, particularly preferably 0.5 to 5 parts by weight when the content of a phosphorescent compound (DB) is 100 parts by weight.

When two or more kinds of the phosphorescent compound (DGR) are contained in the composition of the present invention, it is preferable that the emission spectrum maximum peak wavelengths of at least two phosphorescent compounds (DGR) are different and its difference is preferably 10 nm or more, more preferably 30 nm or more, further preferably 50 nm or more, particularly preferably 80 nm or more, from the standpoint of adjusting emission color (particularly, adjusting emission color to white) of a light emitting device obtained by using the composition of the present invention.

When two or more kinds of the phosphorescent compound (DGR) are contained in the composition of the present invention and when the emission spectrum maximum peak wavelengths of at least two phosphorescent compounds (DGR) are different, the content of the phosphorescent compound (DGR) having the emission spectrum maximum peak wavelength at the longer side among the two compounds is usually 1 to 10000 parts by weight, and since a light emitting device obtained by using the composition of the present invention has excellent color reproducibility, preferably 10 to 1000 parts by weight, more preferably 20 to 200 parts by weight, when the content of the phosphorescent compound (DGR) having the emission spectrum maximum peak wavelength at the shorter side is 100 parts by weight.

Further, two or more kinds of the phosphorescent compound (GR) are contained in the composition of the present invention, it is preferable that the emission spectrum maximum peak wavelengths of at least two phosphorescent compounds (GR) are different and its difference is preferably 10 nm or more, more preferably 30 nm or more, further preferably 50 nm or more, particularly preferably 80 nm or more, from the standpoint of adjusting emission color (particularly, adjusting emission color to white) of a light emitting device obtained by using the composition of the present invention.

Further, when two or more kinds of the phosphorescent compound (GR) are contained in the composition of the present invention and when the emission spectrum maximum peak wavelengths of at least two phosphorescent compounds (GR) are different, the content of the phosphorescent compound (GR) having the emission spectrum maximum peak wavelength at the longer side among the two compounds is usually 1 to 10000 parts by weight, and since a light emitting device obtained by using the composition of the present invention has excellent color reproducibility, preferably 10 to 1000 parts by weight, more preferably 20 to 200 parts by weight, when the content of the phosphorescent compound (GR) having the emission spectrum maximum peak wavelength at the shorter side is 100 parts by weight.

The composition of the present invention may further contain at least one material selected from the group consisting of hole transporting materials, hole injection materials, electron transporting materials, electron injection materials, light emitting materials (different from the phosphorescent compound (DB), the phosphorescent compound (DGR) and the phosphorescent compound (GR)), antioxidants and solvents.

[Host Material]

When the composition of the present invention further contains a host material having at least one function selected from hole injectability, hole transportability, electron injectability and electron transportability, a light emitting device obtained by using the composition of the present invention has more excellent luminance life. In the composition of the present invention, a host material may be contained singly or two or more host materials may be contained.

When the composition of the present invention further contains a host material, the content of the host material is usually 1 to 99 parts by weight, preferably 10 to 90 parts by weight, more preferably 20 to 80 parts by weight, further preferably 50 to 70 parts by weight, when the total amount of the phosphorescent compound (DB), the phosphorescent compound (DGR) and/or the phosphorescent compound (GR) and the host material is 100 parts by weight.

It is preferable that the lowest excited triplet state ($T_1$) of the host material has energy level equal to or higher than the lowest excited triplet state ($T_1$) of the phosphorescent compound (DB) since then a light emitting device obtained by using the composition of the present invention has more excellent luminance life.

It is preferable that the host material shows solubility in a solvent which is capable of dissolving the phosphorescent compound (DB), and the phosphorescent compound (DGR) and/or the phosphorescent compound (GR) from the standpoint of producing a light emitting device obtained by using the composition of the present invention by a solution coating process.

The host materials are classified into low molecular weight compounds and polymer compounds.

[Low Molecular Weight Host]

Low molecular weight compounds used in the host material (hereinafter, referred to also as "low molecular weight host") include compounds having a carbazole skeleton such as 4,4'-bis(carbazol-9-yl)biphenyl (CBP), 1,3-bis(carbazol-9-yl)benzene (mCP) and the like; compounds having a triarylamine skeleton such as 1,1-bis[4-[N,N-di(p-tolyl)amino]phenyl]cyclohexane (TAPC), 4,4'-bis[N-(m-tolyl)-N-phenylamino]biphenyl (TPD), N,N'-di(1-naphthyl)-N,N'-diphenylbenzidine (NPB) and the like; compounds having a phenanthroline skeleton such as 2,9-dimethyl-4,7-diphenyl-1,10-phenanthroline (BCP) and the like; compounds having a triaryltriazine skeleton such as triphenyltriazine and the like; organosilicon compounds such as p-bis(triphenylsilyl)benzene (UGH2), 4,4'-bis(triphenylsilyl)biphenyl (BSB) and the like; compounds having an azole skeleton such as 1,3,5-tris(N-phenylbenzimidazole-2-yl)benzene (TPBI), 3-(biphenyl-4-yl)-5-(4-tert-butylphenyl)-4-phenyl-4H-1,2,4-triazole (t-Bu-TAZ), 2-(biphenyl-4-yl)-5-(4-tert-butylphenyl)-1,3,4-oxadiazole (PBD) and the like; and compounds having a combination of these skeletons. The compound having a combination of skeletons includes, for example, compounds having a carbazole skeleton and a triarylamine skeleton such as 4,4',4"-tris(carbazol-9-yl)triphenylamine (TCTA) and the like.

The low molecular weight host is preferably a compound represented by the formula (H-1).

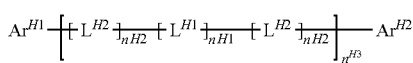 (H-1)

[wherein, $Ar^{H1}$ and $Ar^{H2}$ each independently represent an aryl group or a monovalent heterocyclic group, and these groups may have a substituent.

$n^{H1}$ and $n^{H2}$ each independently represent 0 or 1. When there are a plurality of $n^{H1}$, they may be the same or different. The plurality of $n^{H2}$ may be the same or different.

$n^{H3}$ represents an integer of 0 or more.

$L^{H1}$ represents an arylene group, a divalent heterocyclic group or a group represented by —[C($R^{H11}$)$_2$]$n^{H11}$-, and these groups may have a substituent. When there are a plurality of $L^{H1}$, they may be the same or different.

$n^{H11}$ represents an integer of 1 or more and 10 or less. $R^{H11}$ represents a hydrogen atom, an alkyl group, an alkoxy group, an aryl group or a monovalent heterocyclic group, and these groups may have a substituent. The plurality of $R^{H11}$ may be the same or different and may be combined together to form a ring together with carbon atoms to which they are attached.

$L^{H2}$ represents a group represented by —N(-$L^{H21}$-$R^{H21}$)—. When there are a plurality of $L^{H2}$, they may be the same or different.

$L^{H21}$ represents a single bond, an arylene group or a divalent heterocyclic group, and these groups may have a substituent. $R^{H21}$ represents a hydrogen atom, an alkyl group, an aryl group or a monovalent heterocyclic group, and these groups may have a substituent.].

$Ar^{H1}$ and $Ar^{H2}$ are preferably a phenyl group, a fluorenyl group, a spirobifluorenyl group, a pyridyl group, a pyrimidinyl group, a triazinyl group, a quinolinyl group, an isoquinolinyl group, a thienyl group, a benzothienyl group, a dibenzothienyl group, a furyl group, a benzofuryl group, a dibenzofuryl group, a pyrrolyl group, an indolyl group, an azaindolyl group, a carbazolyl group, an azacarbazolyl group, a diazacarbazolyl group, a phenoxazinyl group or a phenothiazinyl group, more preferably a phenyl group, a spirobifluorenyl group, a pyridyl group, a pyrimidinyl group, a triazinyl group, a dibenzothienyl group, a dibenzofuryl group, a carbazolyl group or an azacarbazolyl group, further preferably a phenyl group, a pyridyl group, a carbazolyl group or an azacarbazolyl group, particularly preferably a group represented by the formula (TDA-1) or (TDA-3) described above, especially preferably a group represented by the formula (TDA-3) described above, and these groups may have a substituent.

The substituent which $Ar^{H1}$ and $Ar^{H2}$ may have is preferably a halogen atom, an alkyl group, an alkoxy group, an aryl group or a monovalent heterocyclic group, more preferably an alkyl group or an alkoxy group, further preferably an alkyl group, and these groups may further have a substituent.

$n^{H1}$ is preferably 1. $n^{H2}$ is preferably 0.

$n^{H3}$ is usually an integer of 0 or more and 10 or less, preferably an integer of 0 or more and 5 or less, further preferably an integer of 1 or more and 3 or less, particularly preferably 1.

$n^{H11}$ is preferably an integer of 1 or more and 5 or less, more preferably an integer of 1 or more and 3 or less, further preferably 1.

$R^{H11}$ is preferably a hydrogen atom, an alkyl group, an aryl group or a monovalent heterocyclic group, more preferably a hydrogen atom or an alkyl group, and these groups may have a substituent.

$L^{H1}$ is preferably an arylene group or a divalent heterocyclic group.

$L^{H1}$ is preferably a group represented by the formulae (A-1) to (A-3), the formulae (A-8) to (A-10), the formulae (A-21) to (A-26), the formulae (A-30) to (A-41) or the formulae (A-44) to (A-54), more preferably a group represented by the formula (A-1), the formula (A-2), the formula (A-8), the formula (A-9), the formulae (A-21) to (A-24), the formulae (A-30) to (A-35) or the formulae (A-49) to (A-54), further preferably a group represented by the formula (A-1), the formula (A-2), the formula (A-8), the formula (A-9), the formula (A-22), the formula (A-24) or the formulae (A-30) to (A-35), particularly preferably a group represented by the formula (A-1), the formula (A-2), the formula (A-8), the formula (A-22), the formula (A-24), the formula (A-30), the formula (A-32) or the formula (A-34), especially preferably a group represented by the formula (A-1), the formula (A-2), the formula (A-22), the formula (A-24) or the formula (A-34).

The substituent which $L^{H1}$ may have is preferably a halogen atom, an alkyl group, an alkoxy group, an aryl group or a monovalent heterocyclic group, more preferably an alkyl group, an alkoxy group, an aryl group or a monovalent heterocyclic group, further preferably an alkyl group, an aryl group or a monovalent heterocyclic group, and these groups may further have a substituent.

$L^{H21}$ is preferably a single bond or an arylene group, more preferably a single bond, and this arylene group may have a substituent.

The definition and examples of the arylene group or divalent heterocyclic group represented by $L^{H2}$ are the same as the definition and examples of the arylene group or divalent heterocyclic group represented by $L^{H1}$.

$R^{H21}$ is preferably an aryl group or a monovalent heterocyclic group, and these groups may have a substituent.

The definition and examples of the aryl group and the monovalent heterocyclic group represented by $R^{H21}$ are the same as the definition and examples of the aryl group and the monovalent heterocyclic group represented by $Ar^{H1}$ and $Ar^{H2}$.

The definition and examples of the substituent which $R^{H21}$ may have are the same as the definition and examples of the substituent which $Ar^{H1}$ and $Ar^{h2}$ may have.

The compound represented by the formula (H-1) is preferably a compound represented by the formula (H-2):

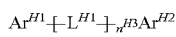 (H-2)

[wherein, $Ar^{H1}$, $Ar^{H2}$, $n^{H3}$ and $L^{H1}$ represent the same meaning as described above.].

As the compound represented by the formula (H-1), compounds represented by the following formulae (H-101) to (H-118) are exemplified.

(H-101) 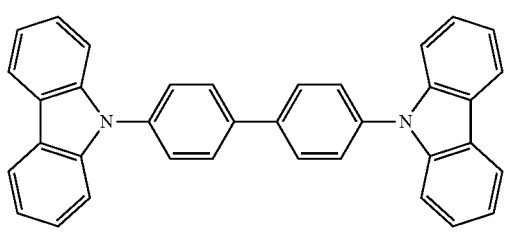
(H-102) 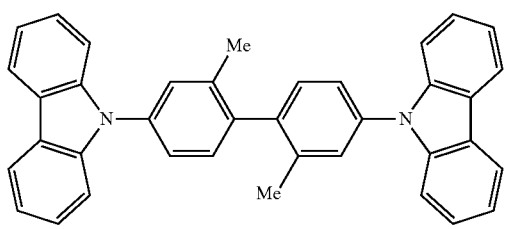
(H-103) 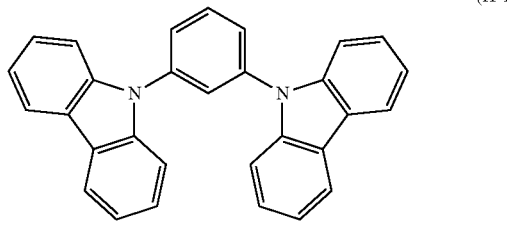
(H-104) 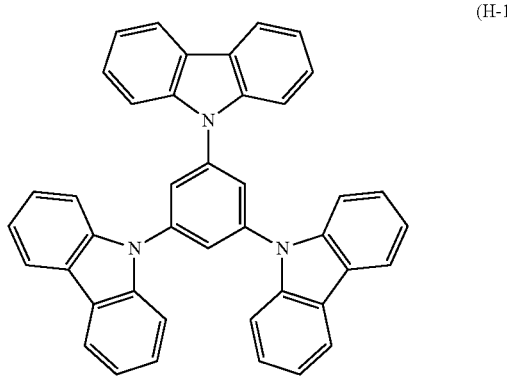
(H-105) 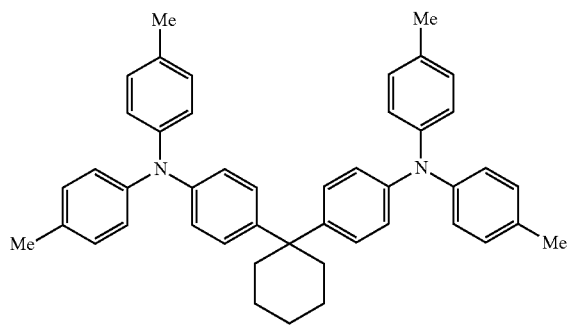
-continued
(H-106) 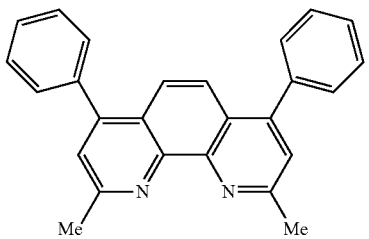
(H-107) 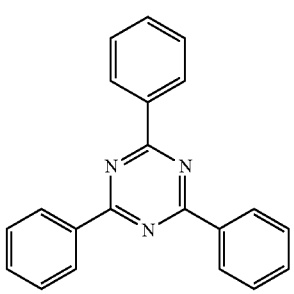
(H-108) 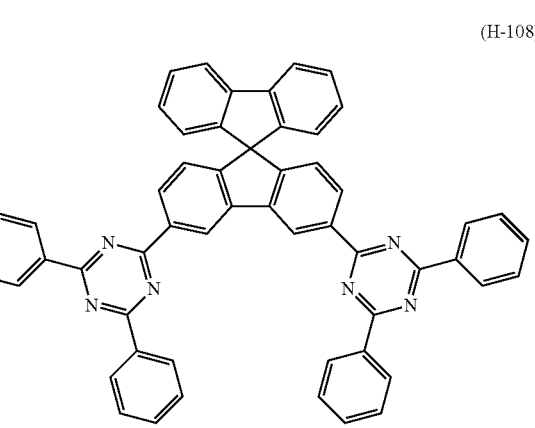
(H-109) 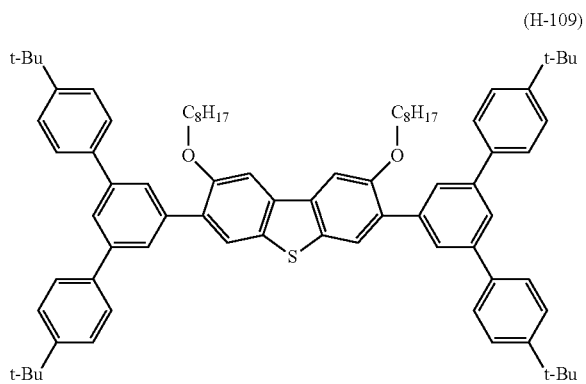

-continued (H-110)
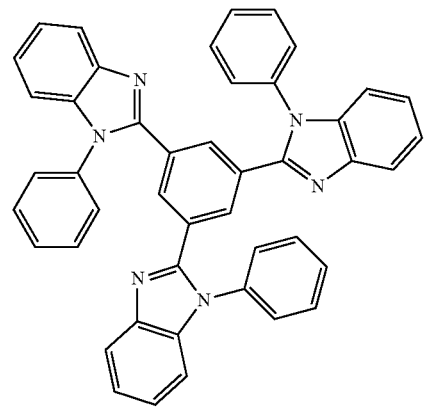

(H-111)

(H-112)
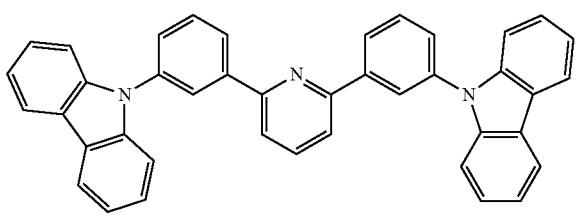

-continued (H-115)
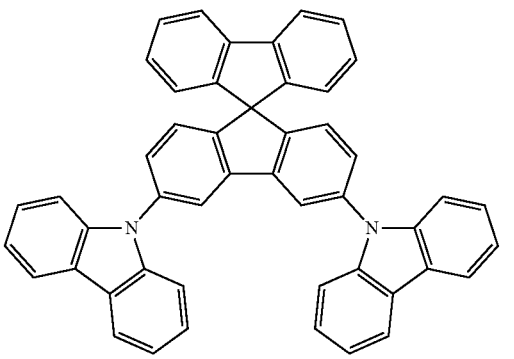

(H-116)
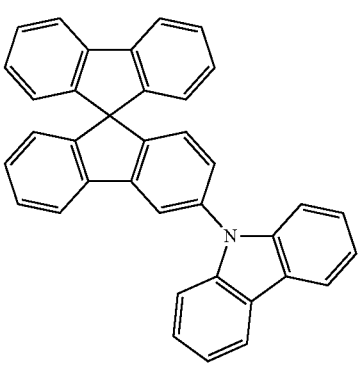

(H-117)
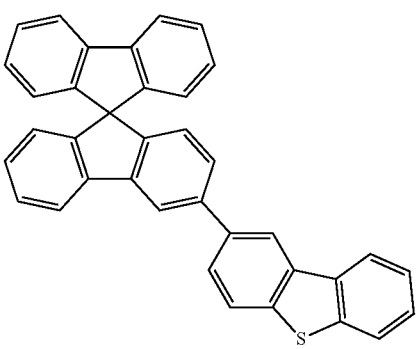

(H-118)
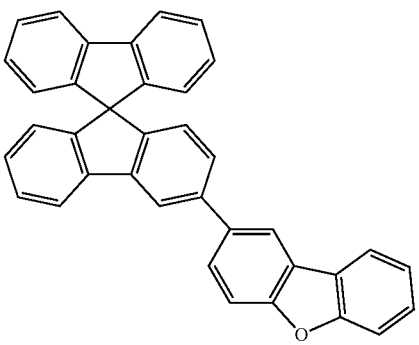

The polymer compound used as a host material includes, for example, polymer compounds as a hole transporting material described later and polymer compounds as an electron transporting material described later.

[Polymer Host]

The polymer compound which is preferable as a host compound (hereinafter, referred to also as "polymer host") will be explained.

(H-113)

(H-114)

The polymer host is preferably a polymer compound containing a constituent unit represented by the formula (Y):

[wherein, $Ar^{Y1}$ represents an arylene group, a divalent heterocyclic group or a divalent group in which at least one arylene group and at least one divalent heterocyclic group are bonded directly, and these groups may have a substituent.].

The arylene group represented by $Ar^{Y1}$ is more preferably a group represented by the formula (A-1), the formula (A-2), the formulae (A-6) to (A-10), the formula (A-19) or the formula (A-20), further preferably a group represented by the formula (A-1), the formula (A-2), the formula (A-7), the formula (A-9) or the formula (A-19), and these groups may have a substituent.

The divalent heterocyclic group represented by $Ar^{Y1}$ is more preferably a group represented by the formulae (A-21) to (A-24), the formulae (A-30) to (A-35), the formulae (A-38) to (A-41), the formula (A-53) or the formula (A-54), further preferably a group represented by the formula (A-24), the formula (A-30), the formula (A-32), the formula (A-34) or the formula (A-53), and these groups may have a substituent.

The more preferable range and the further preferable range of the arylene group and the divalent heterocyclic group in the divalent group obtained by directly bonding at least one arylene group and at least one divalent heterocyclic group represented by $Ar^{Y1}$ are the same as the more preferable range and the further preferable range of the arylene group and the divalent heterocyclic group represented by $Ar^{Y1}$ described above.

"The divalent group obtained by directly bonding at least one arylene group and at least one divalent heterocyclic group" includes, for example, groups represented by the following formulae, and these may have a substituent.

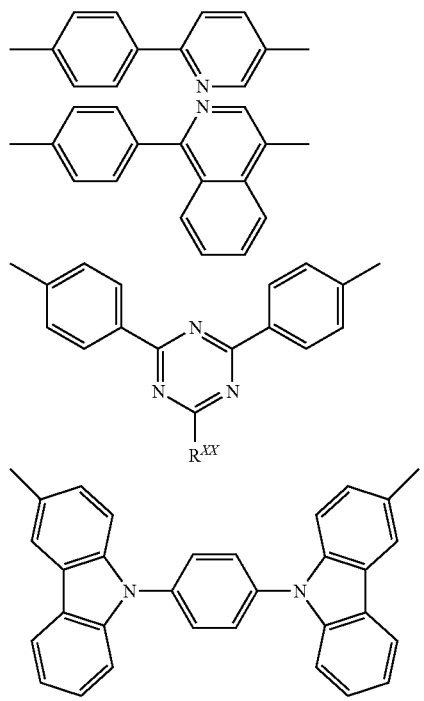

[wherein, $R^{XX}$ represents a hydrogen atom, an alkyl group, an aryl group or a monovalent heterocyclic group, and these groups may have a substituent.].

$R^{XX}$ is preferably an alkyl group or an aryl group, and these groups may have a substituent.

The substituent which the group represented by $Ar^{Y1}$ may have is preferably an alkyl group or an aryl group, and these groups may further have a substituent.

The constituent unit represented by the formula (Y) includes, for example, constituent units represented by the formulae (Y-1) to (Y-13), and preferable from the standpoint of the luminance life of a light emitting device obtained by using a composition containing a polymer host, a phosphorescent compound (DB), and a phosphorescent compound (DGR) and/or a phosphorescent compound (GR) are constituent units represented by the formula (Y-1), (Y-2) or (Y-3), preferable from the standpoint of electron transportability are constituent units represented by the formulae (Y-4) to (Y-7), and preferable from the standpoint of hole transportability are constituent units represented by the formulae (Y-8) to (Y-10).

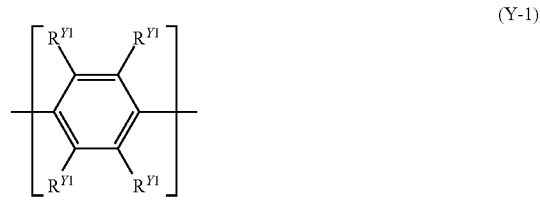

[wherein, $R^{Y1}$ represents a hydrogen atom, an alkyl group, an alkoxy group, an aryl group or a monovalent heterocyclic group, and these groups may have a substituent. The plurality of $R^{Y1}$ may be the same or different, and adjacent $R^{Y1}$ may be combined together to form a ring together with carbon atoms to which they are attached.].

$R^{Y1}$ is preferably a hydrogen atom, an alkyl group or an aryl group, and these groups may have a substituent.

The constituent unit represented by the formula (Y-1) is preferably a constituent unit represented by the formula (Y-1').

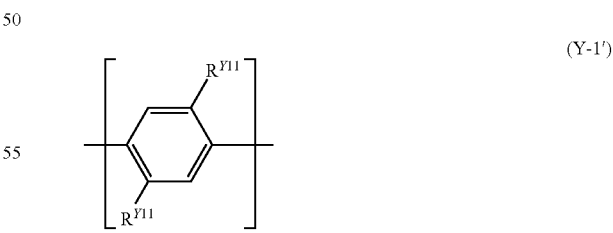

[wherein, $R^{Y11}$ represents an alkyl group, an alkoxy group, an aryl group or a monovalent heterocyclic group, and these groups may have a substituent. The plurality of $R^{Y1}$ may be the same or different.].

$R^{Y11}$ is preferably an alkyl group or an aryl group, more preferably an alkyl group, and these groups may have a substituent.

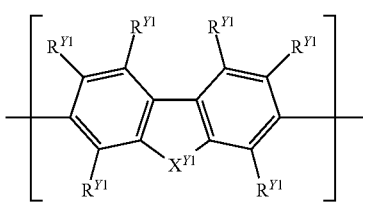 (Y-2)

[wherein, $R^{Y1}$ represents the same meaning as described above. $X^{Y1}$ represents a group represented by —C($R^{Y2}$)$_2$—, —C($R^{Y2}$)=C($R^{Y2}$)— or C($R^{Y2}$)$_2$—C($R^{Y2}$)$_2$—. $R^{Y2}$ represents a hydrogen atom, an alkyl group, an alkoxy group, an aryl group or a monovalent heterocyclic group, and these groups may have a substituent. The plurality of $R^{Y2}$ may be the same or different, and these $R^{Y2}$ may be combined together to form a ring together with carbon atoms to which they are attached.].

$R^{Y2}$ is preferably an alkyl group, an aryl group or a monovalent heterocyclic group, more preferably an alkyl group or an aryl group, and these groups may have a substituent.

Regarding the combination of two $R^{Y2}$ in the group represented by —C($R^{Y2}$)$_2$— in $X^{Y1}$, it is preferable that the both are an alkyl group, the both are an aryl group, the both are a monovalent heterocyclic group, or one is an alkyl group and the other is an aryl group or a monovalent heterocyclic group, it is more preferable that one is an alkyl group and the other is an aryl group, and these groups may have a substituent. The two groups $R^{Y2}$ may be combined together to form a ring together with atoms to which they are attached, and when the groups $R^{Y2}$ form a ring, the group represented by —C($R^{Y2}$)$_2$— is preferably a group represented by the formulae (Y-A1) to (Y-A5), more preferably a group represented by the formula (Y-A4), and these groups may have a substituent.

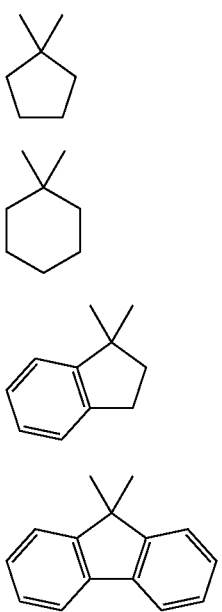

(Y-A1)

(Y-A2)

(Y-A3)

(Y-A4)

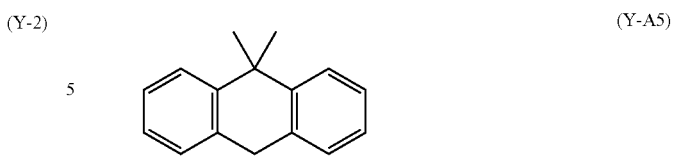 (Y-A5)

Regarding the combination of two $R^{Y2}$ in the group represented by —C($R^{Y2}$)=C($R^{Y2}$)— in $X^{Y1}$, it is preferable that the both are an alkyl group, or one is an alkyl group and the other is an aryl group, and these groups may have a substituent.

Four $R^{Y2}$ in the group represented by —C($R^{Y2}$)$_2$—C($R^{Y2}$)$_2$— in $X^{Y1}$ are preferably an alkyl group which may have a substituent. The plurality of $R^{Y2}$ may be combined together to form a ring together with atoms to which they are attached, and when the groups $R^{Y2}$ form a ring, the group represented by —C($R^{Y2}$)$_2$—C($R^{Y2}$)$_2$— is preferably a group represented by the formulae (Y-B1) to (Y-B5), more preferably a group represented by the formula (Y-B3), and these groups may have a substituent.

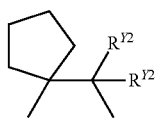 (Y-B1)

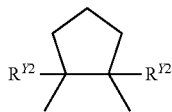 (Y-B2)

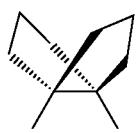 (Y-B3)

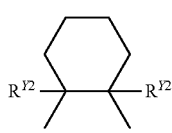 (Y-B4)

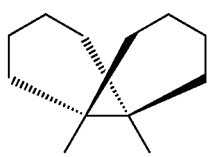 (Y-B5)

[wherein, $R^{Y2}$ represents the same meaning as described above.].

The constituent unit represented by the formula (Y-2) is preferably a constituent unit represented by the formula (Y-2').

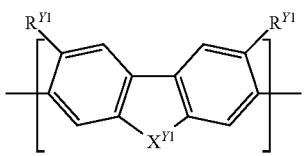
(Y-2')

[wherein, $R^{Y1}$ and $X^{Y1}$ represent the same meaning as described above.].

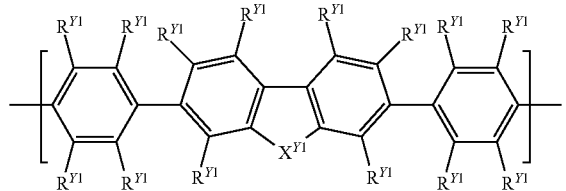
(Y-3)

[wherein, $R^{Y1}$ and $X^{Y1}$ represent the same meaning as described above.].

The constituent unit represented by the formula (Y-3) is preferably a constituent unit represented by the formula (Y-3').

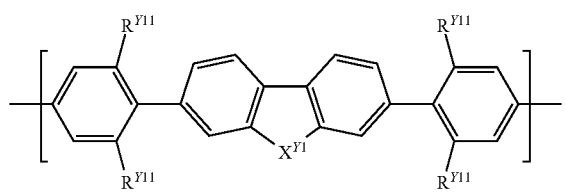
(Y-3')

[wherein, $R^{Y11}$ and $X^{Y1}$ represent the same meaning as described above.].

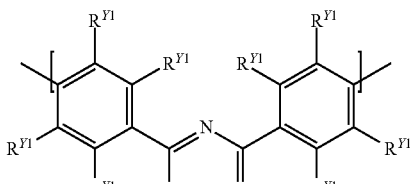
(Y-4)

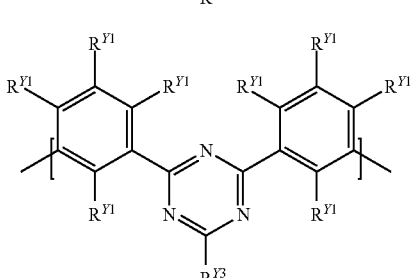
(Y-5)

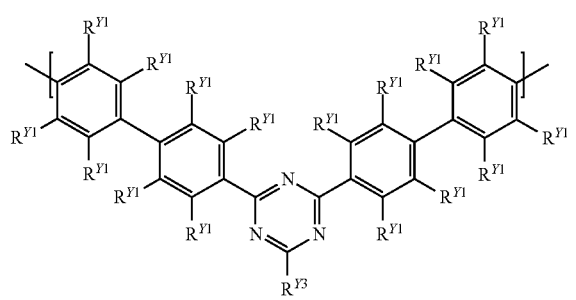
(Y-6)

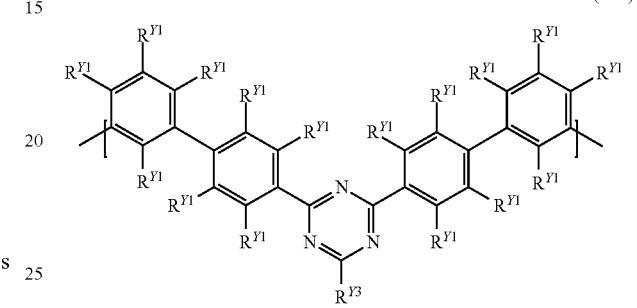
(Y-7)

[wherein, $R^{Y1}$ represents the same meaning as described above. $R^{Y3}$ represents a hydrogen atom, an alkyl group, an alkoxy group, an aryl group or a monovalent heterocyclic group, and these groups may have a substituent.].

$R^{Y3}$ is preferably an alkyl group, an alkoxy group, an aryl group or a monovalent heterocyclic group, more preferably an aryl group, and these groups may have a substituent.

The constituent unit represented by the formula (Y-4) is preferably a constituent unit represented by the formula (Y-4'), and the constituent unit represented by the formula (Y-6) is preferably a constituent unit represented by the formula (Y-6').

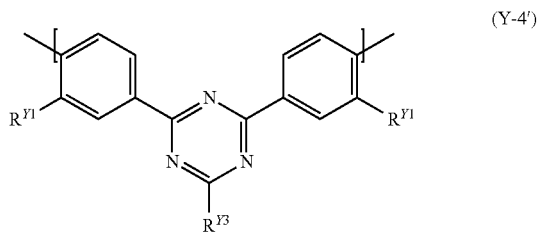
(Y-4')

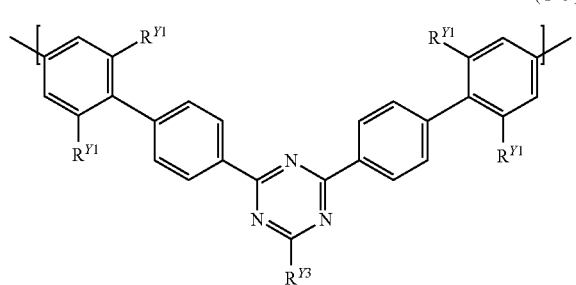
(Y-6')

[wherein, $R^{Y1}$ and $R^{Y3}$ represent the same meaning as described above.].

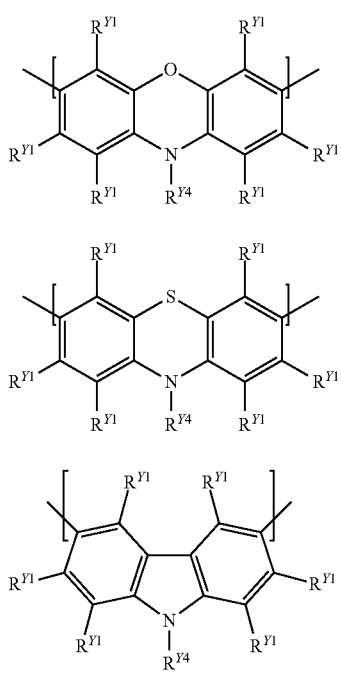

(Y-8)

(Y-9)

(Y-10)

[wherein, $R^{Y1}$ represents the same meaning as described above. $R^{Y4}$ represents a hydrogen atom, an alkyl group, an alkoxy group, an aryl group or a monovalent heterocyclic group, and these groups may have a substituent.].

$R^{Y4}$ is preferably an alkyl group, an alkoxy group, an aryl group or a monovalent heterocyclic group, more preferably an aryl group, and these groups may have a substituent.

The constituent unit represented by the formula (Y) includes, for example, a constituent unit composed of an arylene group represented by the formulae (Y-101) to (Y-130), a constituent unit composed of a divalent heterocyclic group represented by the formulae (Y-201) to (Y-207), and a constituent unit composed of a divalent group obtained by directly bonding at least one arylene group and at least one divalent heterocyclic group represented by the formulae (Y-301) to (Y-308).

(Y-101)

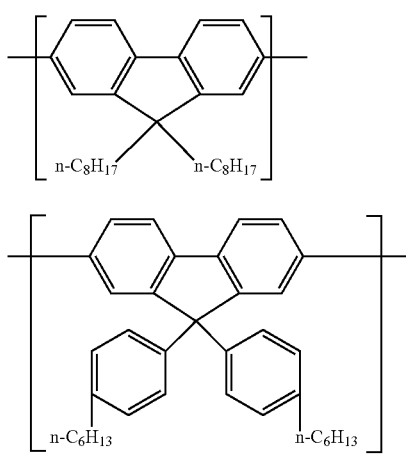

(Y-102)

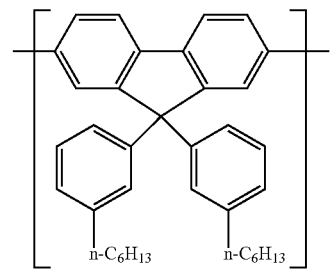

(Y-103)

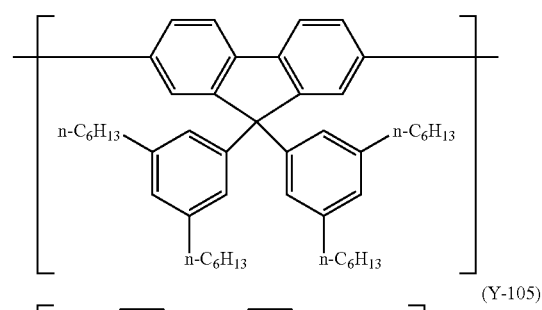

(Y-104)

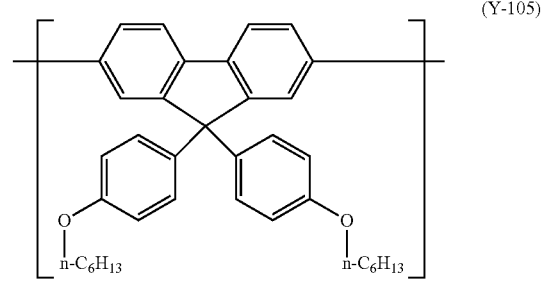

(Y-105)

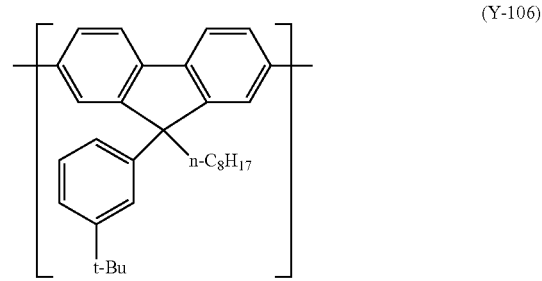

(Y-106)

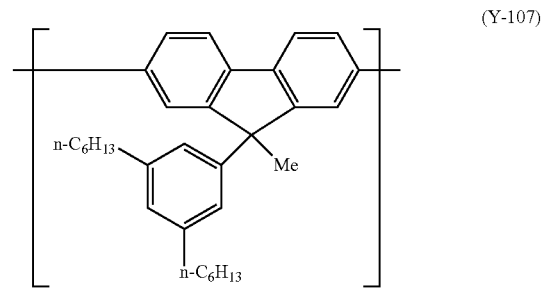

(Y-107)

(Y-108)

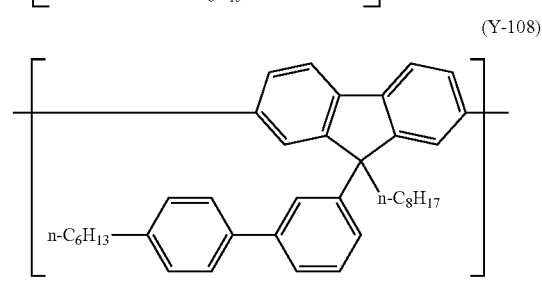

(Y-109) 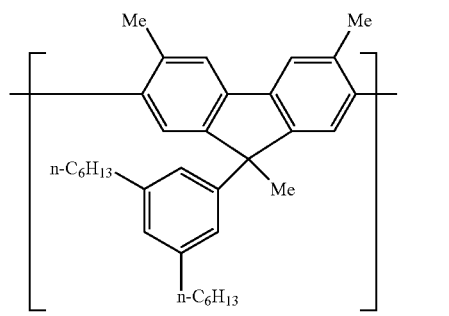
(Y-110) 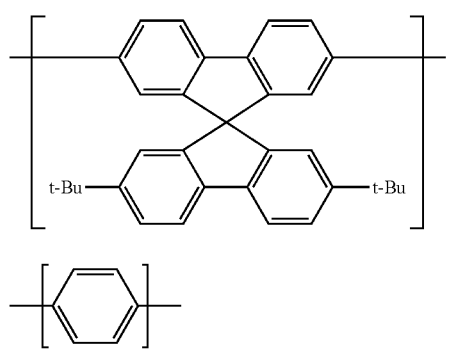
(Y-111) 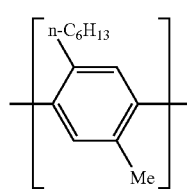
(Y-112) 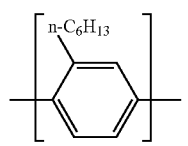
(Y-113) 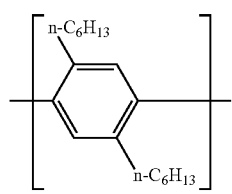
(Y-114) 
(Y-115) 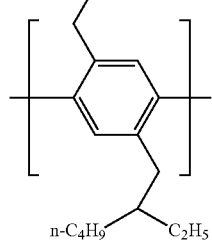
(Y-116) 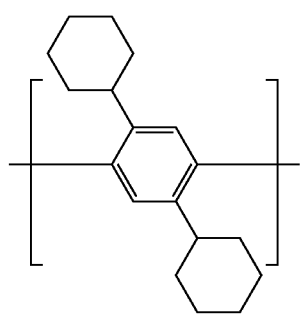
(Y-117) 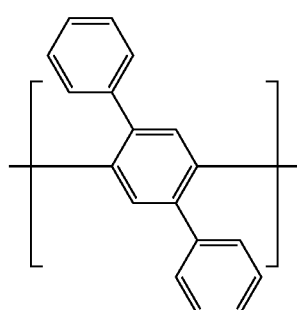
(Y-118) 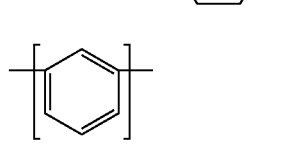
(Y-119) 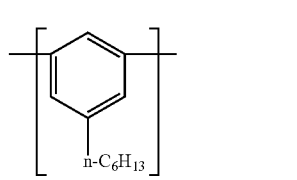
(Y-120) 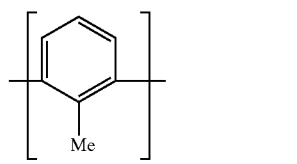
(Y-121) 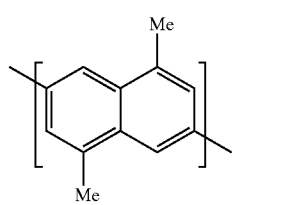
(Y-122) 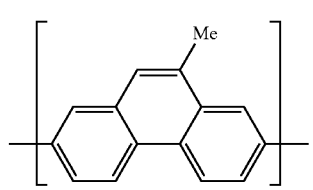

-continued
(Y-123) 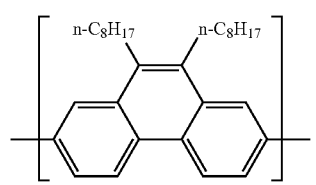
(Y-124) 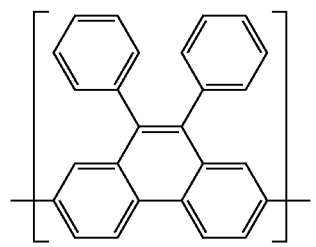
(Y-125) 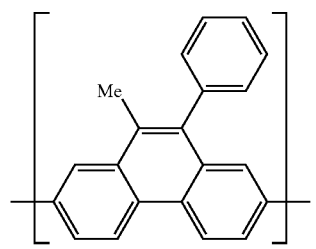
(Y-126) 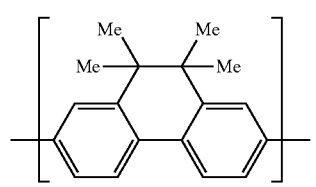
(Y-127) 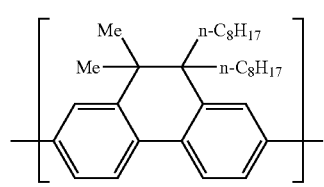
(Y-128) 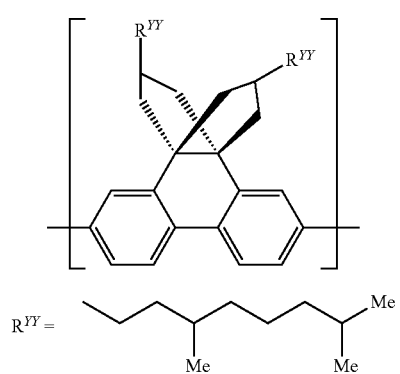
-continued
(Y-129) 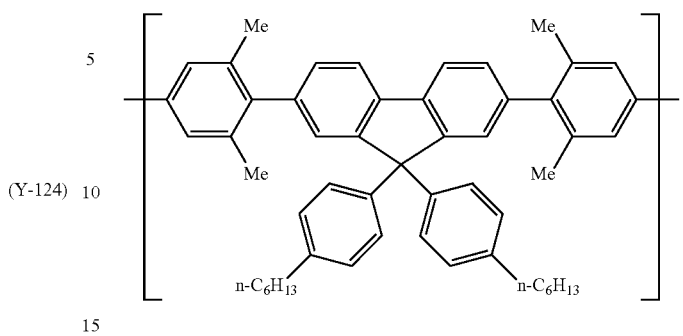
(Y-130) 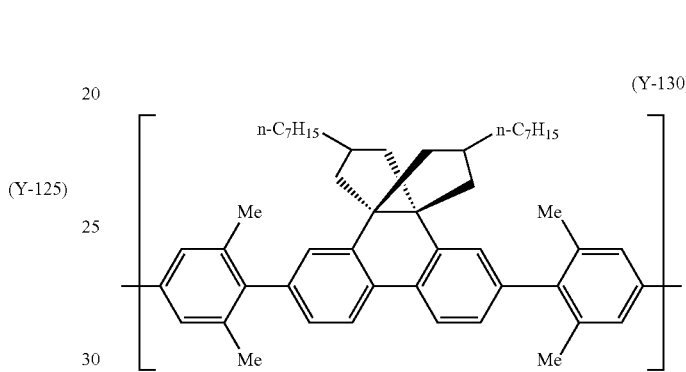
(Y-201) 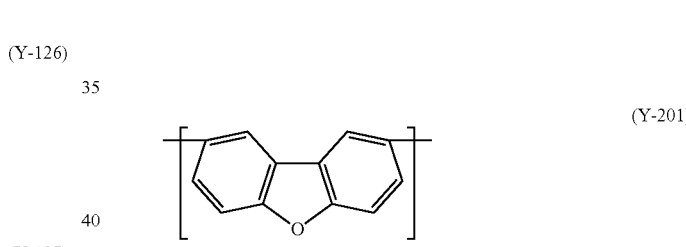
(Y-202) 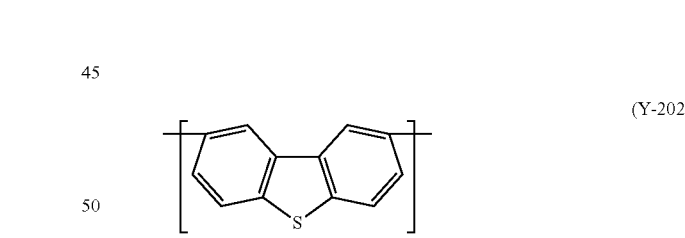
(Y-203) 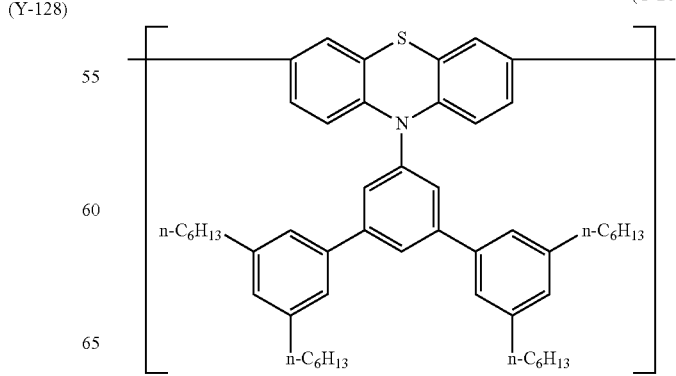

-continued
(Y-204)
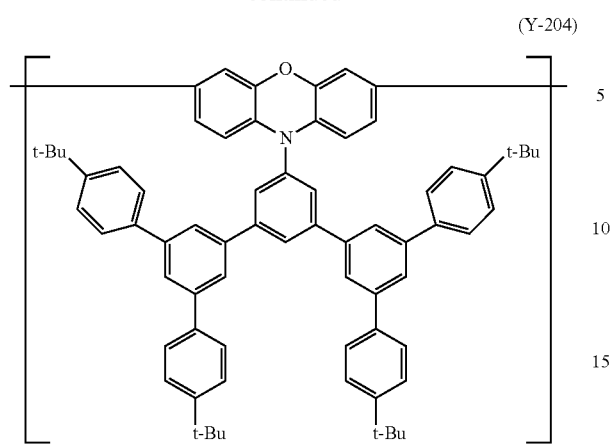
(Y-205)
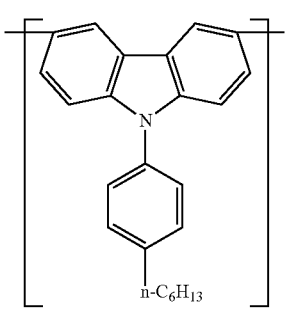
(Y-206)
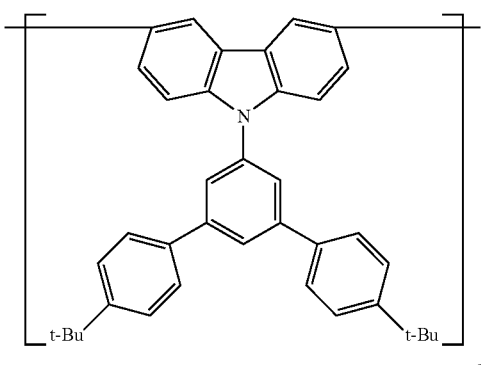
(Y-207)
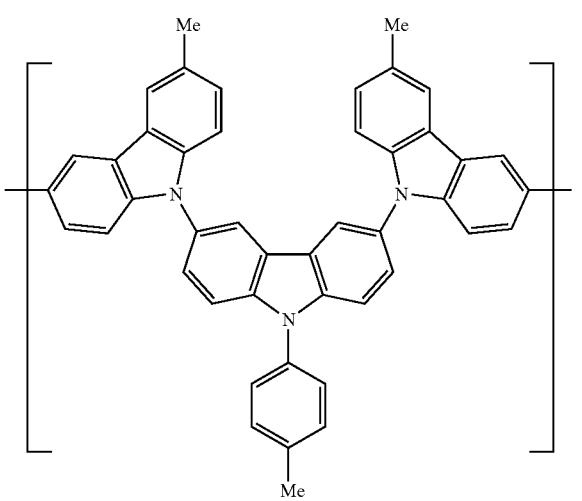
-continued
(Y-301)
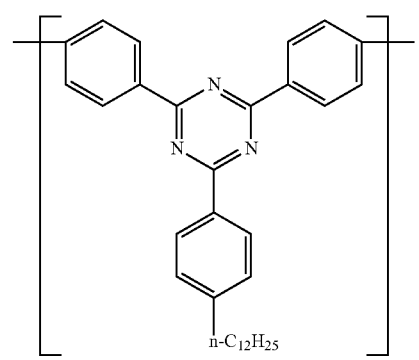
(Y-302)
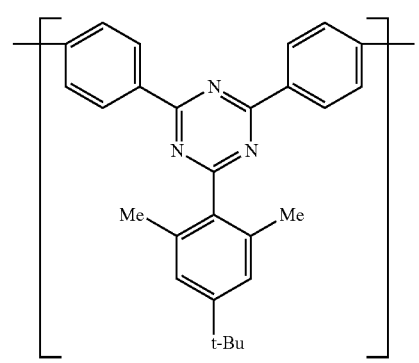
(Y-303)
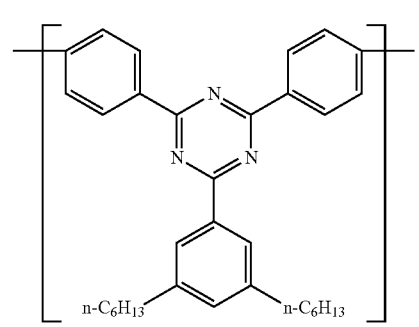
(Y-304)
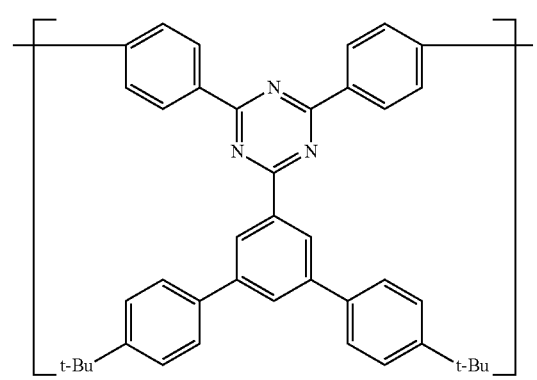

-continued

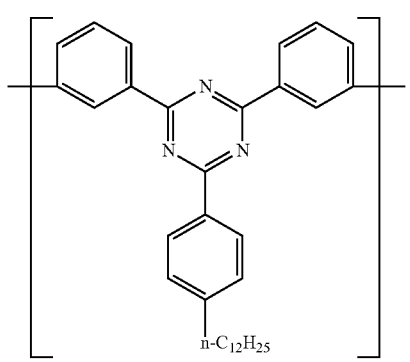
(Y-305)

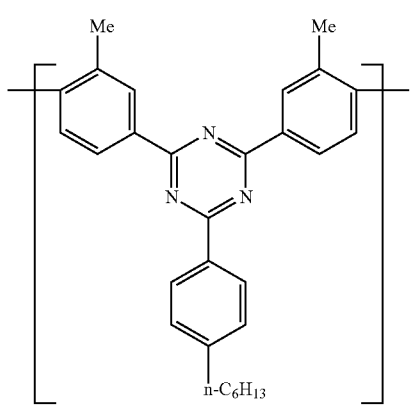
(Y-306)

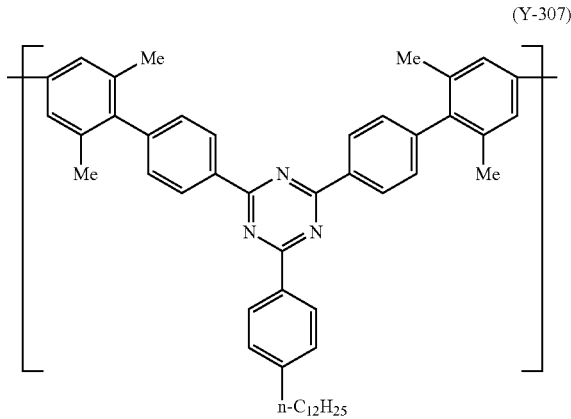
(Y-307)

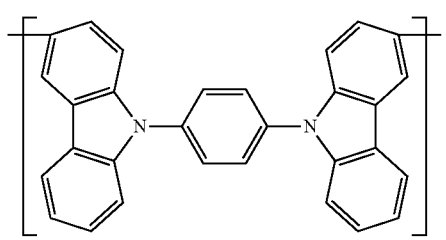
(Y-308)

The amount of the constituent unit represented by the formula (Y) in which Ar$^{Y1}$ is an arylene group is preferably 0.5 to 95 mol %, more preferably 30 to 90 mol % with respect to the total amount of constituent units contained in a polymer host, since the luminance life of a light emitting device obtained by using a composition containing a polymer host, a phosphorescent compound (DB), and a phosphorescent compound (DGR) and/or a phosphorescent compound (GR) is more excellent.

The amount of the constituent unit represented by the formula (Y) in which Ar$^{Y1}$ is a divalent heterocyclic group or a divalent group obtained by directly bonding at least one arylene group and at least one divalent heterocyclic group is preferably 0.5 to 50 mol %, more preferably 5 to 30 mol % with respect to the total amount of constituent units contained in a polymer host, since the charge transportability of a light emitting device obtained by using a composition containing a polymer host, a phosphorescent compound (DB), and a phosphorescent compound (DGR) and/or a phosphorescent compound (GR) is excellent.

The constituent unit represented by the formula (Y) may be comprised only singly or two or more units thereof may be comprised in the polymer host.

It is preferable that the polymer host further contains a constituent unit represented by the following formula (X), since then hole transportability is excellent.

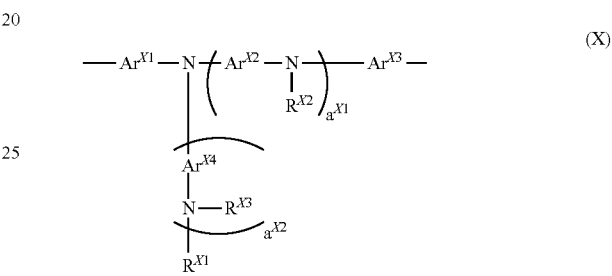
(X)

[wherein a$^{X1}$ and a$^{X2}$ each independently represent an integer of 0 or more.

Ar$^{X1}$ and Ar$^{X3}$ each independently represent an arylene group or a divalent heterocyclic group, and these groups may have a substituent.

Ar$^{X2}$ and Ar$^{X4}$ each independently represent an arylene group, a divalent heterocyclic group or a divalent group in which at least one arylene group and at least one divalent heterocyclic group are bonded directly, and these groups may have a substituent.

R$^{X1}$, R$^{X2}$ and R$^{X3}$ each independently represent a hydrogen atom, an alkyl group, an aryl group or a monovalent heterocyclic group, and these groups may have a substituent.].

a$^{X1}$ is more preferably 2 or less, more preferably 1, because the luminance life of a light emitting device obtained by using a composition containing a polymer host, a phosphorescent compound (DB), and a phosphorescent compound (DGR) and/or a phosphorescent compound (GR) is excellent.

a$^{X2}$ is more preferably 2 or less, more preferably 0, because the luminance life of a light emitting device obtained by using a composition containing a polymer host, a phosphorescent compound (DB), and a phosphorescent compound (DGR) and/or a phosphorescent compound (GR) is excellent.

R$^{X1}$, R$^{X2}$ and R$^{X3}$ are preferably an alkyl group, an aryl group or monovalent heterocyclic group, more preferably an aryl group, and these groups may have a substituent.

The arylene group represented by Ar$^{X1}$ and Ar$^{X3}$ is more preferably a group represented by the formula (A-1) or the formula (A-9)℃, further preferably a group represented by the formula (A-1), and these groups may have a substituent.

The divalent heterocyclic group represented by Ar$^{X1}$ and Ar$^{X3}$ is more preferably a group represented by the formula (A-21), the formula (A-22) or the formulae (A-27) to (A-46), and these groups may have a substituent.

$Ar^{X1}$ and $Ar^{X3}$ are preferably an arylene group which may have a substituent.

The arylene group represented by $Ar^{X2}$ and $Ar^{X4}$ is more preferably a group represented by the formula (A-1), the formula (A-6), the formula (A-7), the formulae (A-9) to (A-11) or the formula (A-19), and these groups may have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group obtained by directly bonding at least one arylene group and at least one divalent heterocyclic group represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group obtained by directly bonding at least one arylene group and at least one divalent heterocyclic group represented by $Ar^{X2}$ and $Ar^{X4}$ includes the same groups as the divalent group obtained by directly bonding at least one arylene group and at least one divalent heterocyclic group represented by $Ar^{Y1}$ in the formula (Y).

$Ar^{X2}$ and $Ar^{X4}$ are preferably an arylene group which may have a substituent.

The substituent which the group represented by $Ar^{X1}$ to $Ar^{X4}$ and $R^{X1}$ to $R^{X3}$ may have is preferably an alkyl group or an aryl group, and these groups may further have a substituent.

The constituent unit represented by the formula (X) is preferably a constituent unit represented by the formulae (X-1) to (X-7), more preferably a constituent unit represented by the formulae (X-1) to (X-6), further preferably a constituent unit represented by the formulae (X-3) to (X-6).

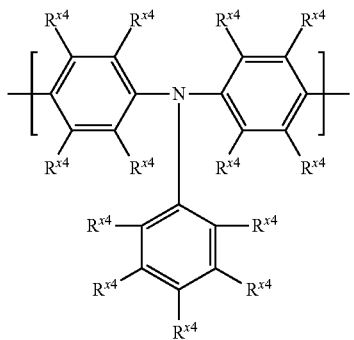
(X-1)

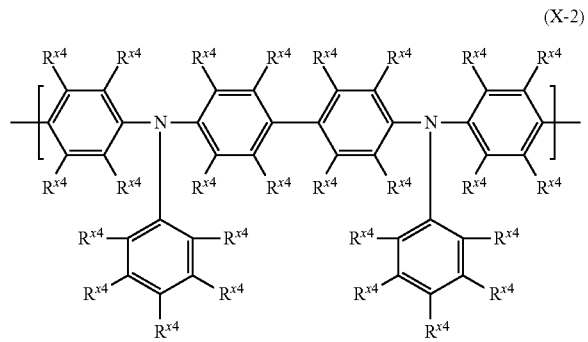
(X-2)

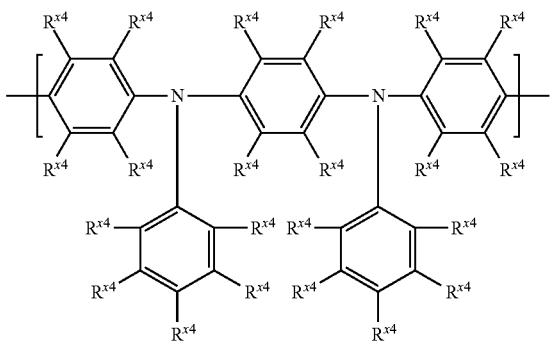
(X-3)

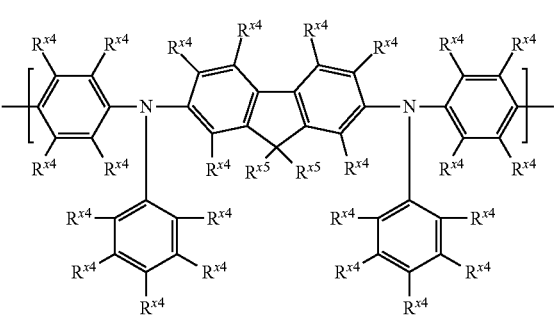
(X-4)

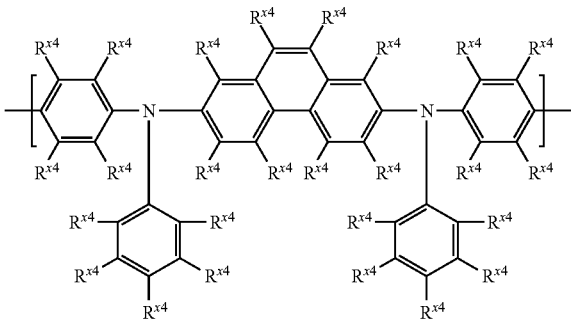
(X-5)

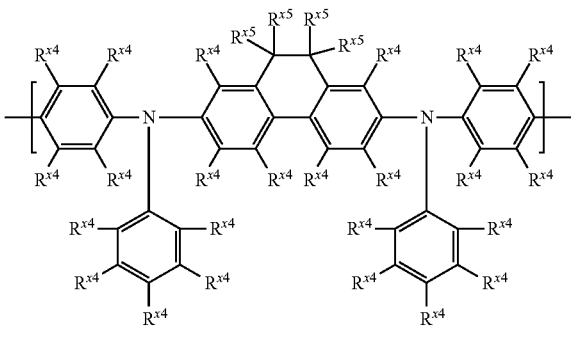
(X-6)

(X-7)

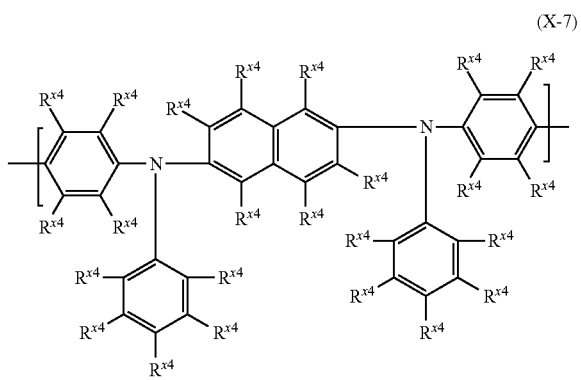

[wherein, $R^{X4}$ and $R^{X5}$ each independently represent a hydrogen atom, an alkyl group, an alkoxy group, an aryl group, an aryloxy group, a halogen atom, a monovalent heterocyclic group or a cyano group, and these groups may have a substituent. The plurality of $R^{X4}$ may be the same or different. The plurality of $R^{X5}$ may be the same or different, and adjacent groups $R^{X5}$ may be combined together to form a ring together with carbon atoms to which they are attached.].

The amount of the constituent unit represented by the formula (X) is preferably 0.1 to 50 mol %, more preferably 1 to 40 mol %, further preferably 5 to 30 mol % with respect to the total amount of constituent units contained in a polymer host, since hole transportability is excellent.

The constituent unit represented by the formula (X) includes, for example, constituent units represented by the formulae (X1-1) to (X1-19), preferably constituent units represented by the formulae (X1-1) to (X1-14).

(X1-1)

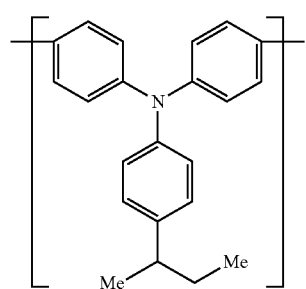

(X1-2)

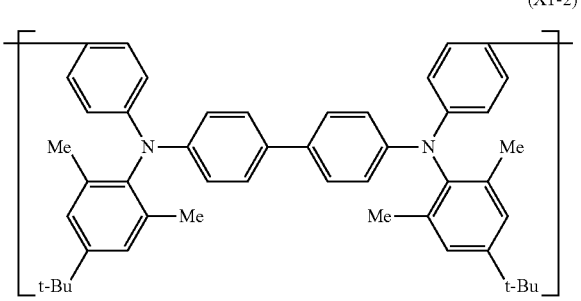

(X1-3)

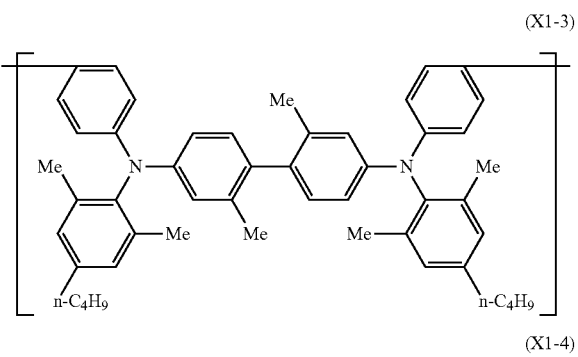

(X1-4)

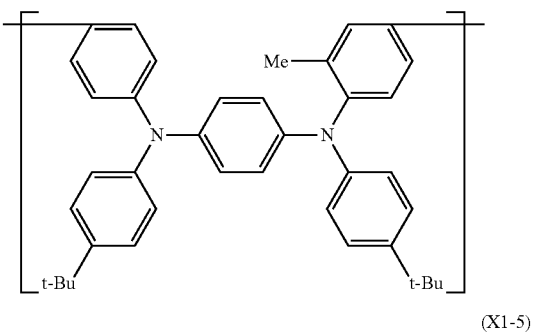

(X1-5)

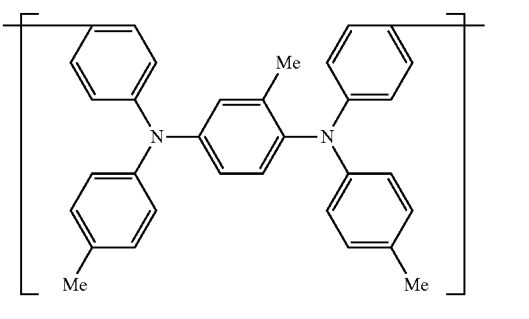

(X1-6)

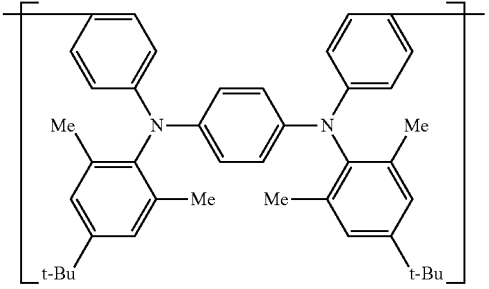

(X1-7)

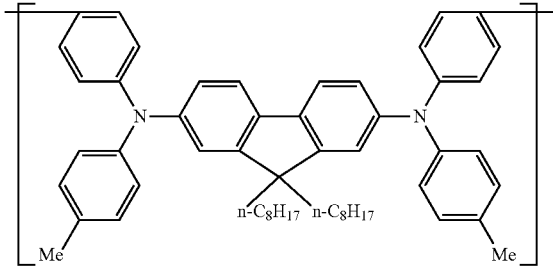

(X1-8)
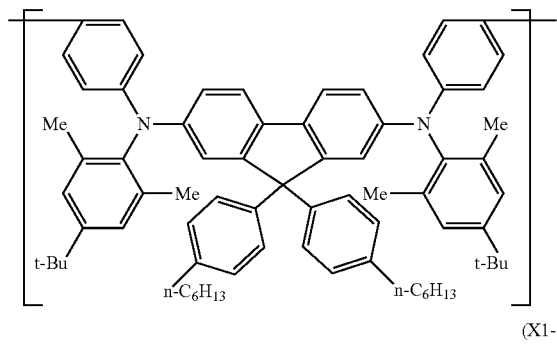
(X1-9)
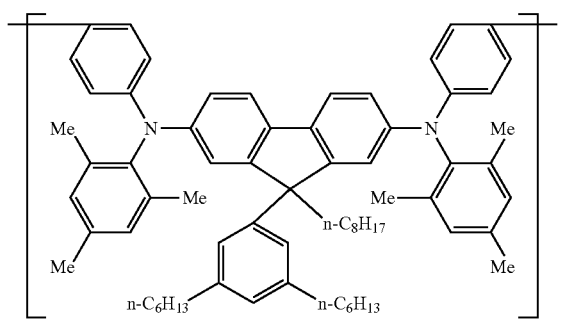
(X1-10)
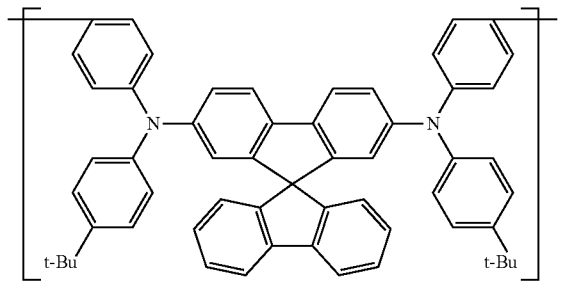
(X1-11)
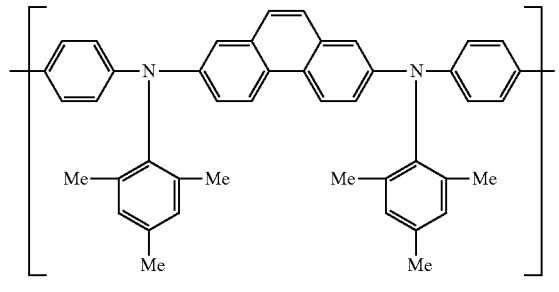
(X1-12)
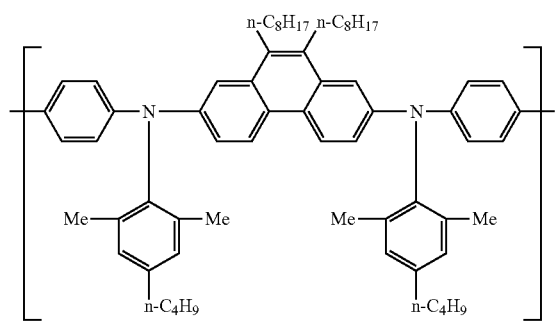
(X1-13)
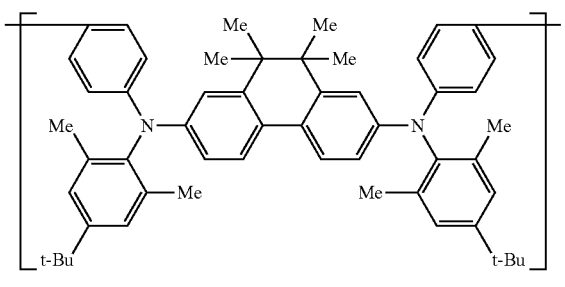
(X1-14)
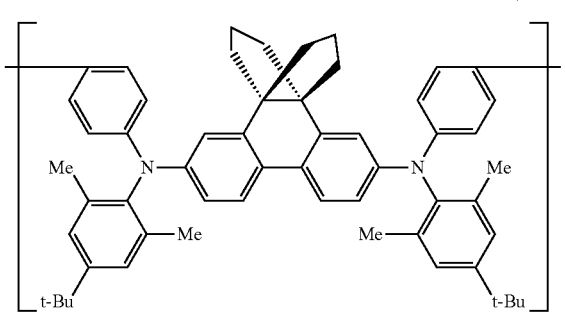
(X1-15)
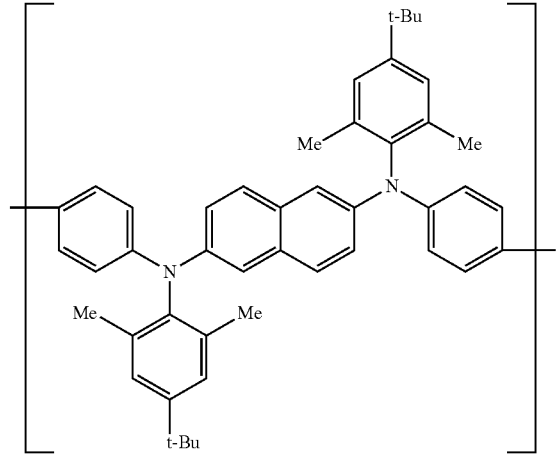
(X1-16)
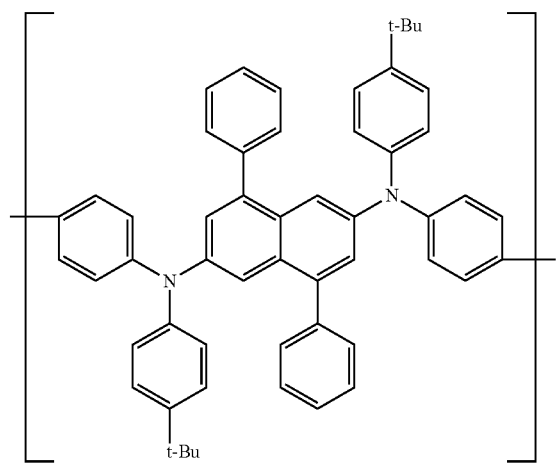

-continued (X1-17)

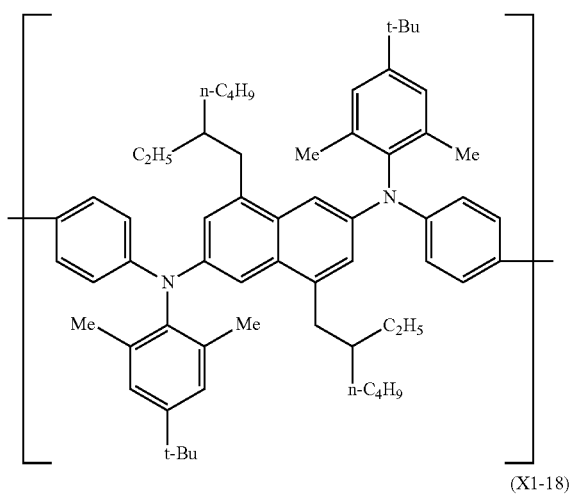

(X1-18)

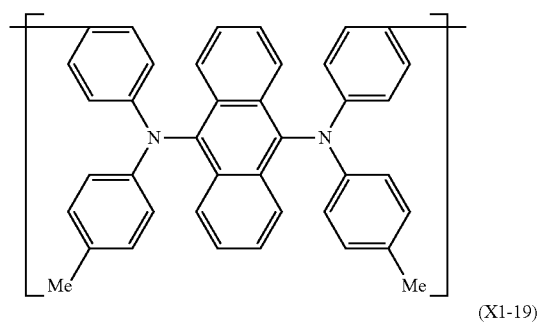

(X1-19)

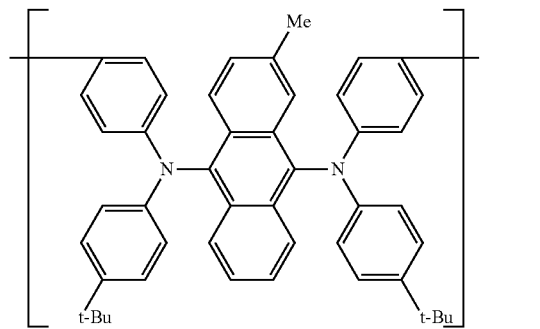

The constituent unit represented by the formula (X) may be comprised only singly or two or more units thereof may be comprised in the polymer host.

Examples of the polymer host include polymer compounds P-1 to P-6 in "Table 24" below. Here, "other" constituent unit denotes a constituent unit other than the constituent unit represented by the formula (Y) and the constituent unit represented by the formula (X).

TABLE 24

| polymer compound | constituent unit and mole fraction thereof | | | | |
|---|---|---|---|---|---|
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | other t |
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.8 | 0.1 to 99.8 | 0 | 0.1 to 99.8 | 0 to 30 |
| P-4 | 0.1 to 99.8 | 0 | 0.1 to 99.8 | 0.1 to 99.8 | 0 to 30 |
| P-5 | 0.1 to 99.8 | 0.1 to 99.8 | 0.1 to 99.8 | 0 | 0 to 30 |
| P-6 | 0.1 to 99.7 | 0.1 to 99.7 | 0.1 to 99.7 | 0.1 to 99.7 | 0 to 30 |

[In the table, p, q, r, s and t represent the mole fraction of each constituent unit. p+q+r+s+t=100, and 100≤p+q+r+s≤70. Other constituent unit denotes a constituent unit other than the constituent unit represented by the formula (Y) and the constituent unit represented by the formula (X).].

The polymer host may be any of a block copolymer, a random copolymer, an alternative copolymer or a graft copolymer, and may also be another embodiment, and is preferably a copolymer obtained by copolymerizing a plurality of raw material monomers, from the above-described standpoint.

<Method of Producing Polymer Host>

Next, the method of producing the polymer host will be explained.

The polymer host can be produced, for example, by condensation-polymerizing at least one compound selected from the group consisting of a compound represented by the formula (M-Y1), a compound represented by the formula (M-Y2) and a compound represented by the formula (M-X). In the present specification, compounds used for production of the polymer host are collectively called "raw material monomer" in some cases.

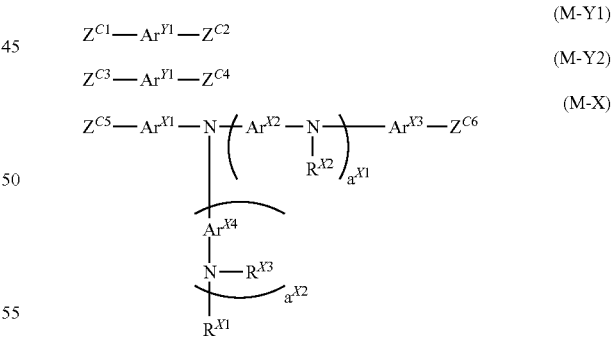

[wherein $Ar^{Y1}$, $Ar^{X1}$ to $Ar^{X4}$, $R^{X1}$, $R^{X2}$, $R^{X3}$, $a^{X1}$ and $a^{X2}$ represent the same meaning as described above, and $Z^{C1}$ to $Z^{C6}$ each independently represent a group selected from the Group A of substituent and Group B of substituent.].

For example, if $Z^{C1}$, $Z^{C2}$, $Z^{C5}$ and $Z^{C6}$ are groups selected from Group A of substituent, $Z^{C3}$ and $Z^{C4}$ are groups selected from Group B of substituent.

For example, if $Z^{C1}$, $Z^{C2}$, $Z^{C5}$ and $Z^{C6}$ are groups selected from Group B of substituent, $Z^{C3}$ and $Z^{C4}$ are groups selected from Group A of substituent.

<Group A of Substituent>

A chlorine atom, a bromine atom, an iodine atom, and a group represented by O—S(=O)$_2$R$^{C1}$ (wherein R$^{C1}$ represents an alkyl group or an aryl group, and these groups may have a substituent.).

<Group B of Substituent>

A group represented by —B(OR$^{C2}$)$_2$ (wherein R$^{C2}$ represents a hydrogen atom, an alkyl group or an aryl group, and these groups may have a substituent, and a plurality of R$^{C2}$ may be the same or different, and may be combined together to form a ring structure together with an oxygen atom to which they are attached.);

a group represented by —BF$_3$Q' (wherein Q' represents Li, Na, K, Rb or Cs.);

a group represented by —MgY' (wherein Y' represents a chlorine atom, a bromine atom or an iodine atom.);

a group represented by —ZnY" (wherein Y" represents a chlorine atom, a bromine atom or an iodine atom.); and a group represented by —Sn(R$^{C3}$)$_3$ (wherein R$^{C3}$ represents a hydrogen atom, an alkyl group or an aryl group, and these groups may have a substituent, and a plurality of R$^{C3}$ may be the same or different, and may be combined together to form a ring structure together with a tin atom to which they are attached.).

As the group represented by —B(OR$^{C2}$)$_2$, groups represented by the following formulae are exemplified.

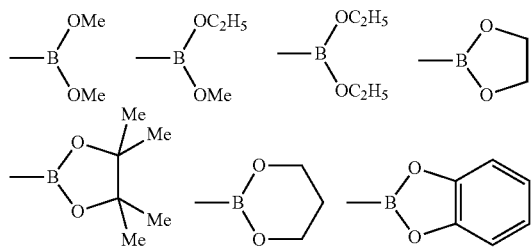

The compound having a group selected from Group A of substituent and the compound having a group selected from Group B of substituent undergo condensation polymerization by a known coupling reaction to give mutual bonding of carbon atoms linking the group selected from Group A of substituent and the group selected from Group B of substituent. Therefore, when a compound A having two groups selected from Group A of substituent and a compound B having two groups selected from Group B of substituent are subjected to a known coupling reaction, a condensed polymer of the compound A and the compound B can be obtained by condensation polymerization.

The condensation polymerization is usually carried out in the presence of a catalyst, a base and a solvent, and if necessary, it may be carried out in the coexistence of a phase transfer catalyst.

The catalyst includes, for example, catalysts composed of a transition metal complex such as palladium complexes such as dichlorobis(triphenylphosphine)palladium, dichlorobis(tris-o-methoxyphenylphosphine)palladium, palladium [tetrakis(triphenylphosphine)], [tris(dibenzylideneacetone)]dipalladium, palladium acetate and the like, nickel complexes such as nickel[tetrakis(triphenylphosphine)], [1,3-bis(diphenylphosphino)propane]dichloronickel, [bis(1,4-cyclooctadiene)]nickel and the like, and if necessary, further, a ligand such as triphenylphosphine, tri-o-tolylphosphine, tri(tert-butylphosphine), tricyclohexylphosphine, diphenylphosphinopropane, bipyridyl and the like. The catalyst may be used singly or two or more catalysts may be used in combination.

The use amount of the catalyst is usually 0.00001 to 3 molar equivalent in terms of the amount of the transition metal with respect to the sum of the number of moles of raw material monomers.

The base includes, for example, inorganic bases such as sodium carbonate, potassium carbonate, cesium carbonate, potassium fluoride, cesium fluoride, tripotassium phosphate and the like; and organic bases such as tetrabutylammonium fluoride, tetrabutylammonium hydroxide and the like. The base may be used singly or two or more bases may be used in combination.

The phase transfer catalyst includes, for example, tetrabutylammonium chloride, tetrabutylammonium bromide and the like. The phase transfer catalyst may be used singly or two or more phase transfer catalysts may be used in combination.

The use amount of the base is usually 0.001 to 100 molar equivalent with respect to the sum of the number of moles of raw material monomers.

The use amount of the phase transfer catalyst is usually 0.001 to 100 molar equivalent with respect to the sum of the number of moles of raw material monomers.

The solvent includes, for example, organic solvents such as toluene, xylene, mesitylene, tetrahydrofuran, 1,4-dioxane, dimethoxyethane, N,N-dimethylacetamide, N,N-dimethylformamide and the like, and water. The solvent may be used singly or two or more solvents may be used in combination.

The use amount of the solvent is usually 10 to 100000 parts by weight with respect to 100 parts by weight of the total amount of raw material monomers.

The reaction temperature of condensation polymerization is usually −100 to 200° C. The reaction time is usually 1 hour or longer.

The post treatment of the polymerization reaction is conducted by known methods, such as a method of removing water-soluble impurities by liquid separation and a method in which the reaction solution resulting from the polymerization reaction is added to a lower alcohol such as methanol and a precipitate deposited is collected by filtration and dried, that are applied individually or in combination. When the polymer host has a low purity, the polymer host can be purified by a usual method, such as recrystallization, reprecipitation, continuous extraction by a Soxhlet extractor and column chromatography.

The composition containing a phosphorescent compound (DB), a phosphorescent compound (DGR) and/or a phosphorescent compound (GR), and a solvent (hereinafter, referred to as "ink" in some cases) is suitable for fabrication of a light emitting device using a printing method such as an inkjet print method, a nozzle print method and the like.

The viscosity of the ink may be adjusted depending on the kind of the printing method, and when a solution goes through a discharge apparatus such as in an inkjet print method and the like, the viscosity is preferably in the range of 1 to 20 mPa·s at 25° C. for preventing curved aviation and clogging in discharging.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-decane, bicyclohexyl and the like; ketone solvents such as acetone, methylethylketone, cyclohexanone, benzophenone, acetophenone and the like; ester solvents such as ethyl acetate, butyl acetate, ethylcellosolve acetate, methyl benzoate, phenyl acetate and the like; polyhydric alcohols such as ethylene glycol, glycerin, 1,2-hexanediol and the like and derivatives thereof; alcohol solvents such as isopropanol, cyclohexanol and the like; sulfoxide solvents such as dimethyl sulfoxide and the like; and amide solvents such as N-methyl-2-pyrrolidone, N,N-dimethylformamide and the like. These solvents may be used singly or two or more of them may be used in combination.

In the ink, the compounding amount of the above-described solvent is usually 1000 to 100000 parts by weight, preferably 2000 to 20000 parts by weight with respect to 100 parts by weight when the total amount of a phosphorescent compound (DB), and a phosphorescent compound (DGR) and/or a phosphorescent compound (GR) is 100 parts by weight.

[Hole Transporting Material]

The hole transporting material is classified into low molecular weight compounds and polymer compounds, and polymer compounds are preferable, polymer compounds having a crosslink group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone and the like, preferably fullerene.

In the composition of the present invention, the compounding amount of the hole transporting material is usually 1 to 400 parts by weight, preferably 5 to 150 parts by weight when the total amount of a phosphorescent compound (DB), and a phosphorescent compound (DGR) and/or a phosphorescent compound (GR) is 100 parts by weight.

The hole transporting material may be used singly or two or more hole transporting materials may be used in combination.

[Electron Transporting Material]

The electron transporting material is classified into low molecular weight compounds and polymer compounds. The electron transporting material may have a crosslink group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight when the total amount of a phosphorescent compound (DB), and a phosphorescent compound (DGR) and/or a phosphorescent compound (GR) is 100 parts by weight.

The electron transporting material may be used singly or two or more electron transporting materials may be used in combination.

[Hole Injection Material and Electron Injection Material]

The hole injection material and the electron injection material are each classified into low molecular weight compounds and polymer compounds. The hole injection material and the electron injection material may have a crosslink group.

The low molecular weight compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer containing a group represented by the formula (X) in the side chain or main chain, and the like.

In the composition of the present invention, the compounding amounts of the hole injection material and the electron injection material are each usually 1 to 400 parts by weight, preferably 5 to 150 parts by weight when the total amount of a phosphorescent compound (DB), and a phosphorescent compound (DGR) and/or a phosphorescent compound (GR) is 100 parts by weight.

The hole injection material and the electron injection material may each be used singly or two or more of them may be used in combination.

[Ion Dope]

When the hole injection material or the electron injection material contains an electrically conductive polymer, the electric conductivity of the electrically conductive polymer is preferably $1 \times 10^{-5}$ S/cm to $1 \times 10^3$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

[Light Emitting Material]

The light emitting material (the light emitting material is different from the phosphorescent compound (DB), the phosphorescent compound (DGR) and the phosphorescent compound (GR)) is classified into low molecular weight compounds and polymer compounds. The light emitting material may have a crosslink group.

The low molecular weight compound includes, for example, naphthalene and derivatives thereof, anthracene and derivatives thereof, perylene and derivatives thereof, and, triplet light emitting complexes having iridium, platinum or europium as the center metal.

The polymer compound includes, for example, polymer compounds comprising a phenylene group, a naphthalenediyl group, an anthracenediyl group, a fluorenediyldiyl group, a phenanthrenediyl group, a dihydrophenanthrenediyl group, a group represented by the formula (X), a carbazolediyl group, a phenoxazinediyl group, a phenothiazinediyl group, an anthracenediyl group, a pyrenediyl group and the like.

The triplet light emitting complex includes, for example, metal complexes listed below.

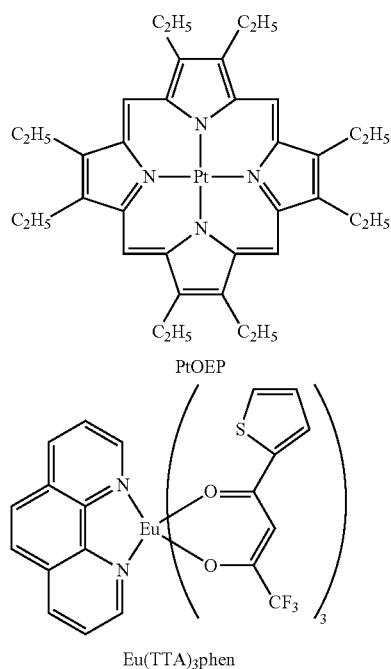

PtOEP

Eu(TTA)₃phen

In the composition of the present invention, the compounding amount of the light emitting material is usually 0.1 to 400 parts by weight when the total amount of a phosphorescent compound (DB), and a phosphorescent compound (DGR) and/or a phosphorescent compound (GR) is 100 parts by weight.

[Antioxidant]

The antioxidant may advantageously be one which is soluble in the same solvent as for the composition of the present invention and does not disturb light emission and charge transportation, and the examples thereof include phenol antioxidants and phosphorus-based antioxidants.

In the composition of the present invention, the compounding amount of the antioxidant is usually 0.001 to 10 parts by weight when the total amount of a phosphorescent compound (DB), and a phosphorescent compound (DGR) and/or a phosphorescent compound (GR) is 100 parts by weight.

<Film>

The film comprises the composition of the present invention.

The film includes also an insolubilized film obtained by insolubilizing the composition of the present invention in a solvent by cross-linkage. The insolubilized film is a film obtained by crosslinking the composition of the present invention by external stimulation such as heat, light irradiation and the like. The insolubilized film can be suitably used for lamination of a light emitting device since the film is substantially insoluble in a solvent.

The heating temperature for crosslinking the film is usually 25 to 300° C., and since the external quantum yield is improved, preferably 50 to 250° C., more preferably 150 to 200° C.

The kind of light used in light irradiation for crosslinking the film includes, for example, ultraviolet light, near-ultraviolet light and visible light.

The film is suitable as a light emitting layer in a light emitting device.

The film can be fabricated, for example, by a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method or a nozzle coat method, using the ink.

The thickness of the film is usually 1 nm to 10 μm.

<Light Emitting Device>

The light emitting device of the present invention is a light emitting device obtained by using the composition of the present invention, and may be one in which compounds contained in the composition of the present invention are intramolecularly or intermolecularly cross-linked, or one in which compounds contained in the composition of the present invention are intramolecularly and intermolecularly cross-linked.

The constitution of the light emitting device of the present invention has, for example, electrodes consisting of an anode and a cathode, and a layer obtained by using the composition of the present invention disposed between the electrodes.

[Layer Constitution]

The layer obtained by using the composition of the present invention is usually at least one selected from a light emitting layer, a hole transporting layer, a hole injection layer, an electron transporting layer and an electron injection layer, preferably a light emitting layer. These layers contain a light emitting material, a hole transporting material, a hole injection material, an electron transporting material and an electron injection material, respectively. These layers can be formed by the same method as the above-described film fabrication using inks prepared by dissolving a light emitting material, a hole transporting material, a hole injection material, an electron transporting material and an electron injection material, respectively, in the solvent described above.

The light emitting device has a light emitting layer between an anode and a cathode. The light emitting device of the present invention preferably has at least one of a hole injection layer and a hole transporting layer between an anode and a light emitting layer from the standpoint of hole injectability and hole transportability, and preferably has at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the composition of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslink group to avoid dissolution of the materials in the solvent. After forming the layers using the materials having a crosslink group, the layers can be insolubilized by crosslinking the crosslink group.

Methods of forming respective layers such as a light emitting layer, a hole transporting layer, an electron transporting layer, a hole injection layer, an electron injection layer and the like in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer may be controlled in view of external quantum yield and device life.

[Substrate/Electrode]

The substrate in the light emitting device may advantageously be a substrate on which an electrode can be formed and which does not chemically change in forming an organic layer, and is a substrate made of a material such as, for example, glass, plastic, silicon and the like. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO), indium.zinc.oxide and the like; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

[Use]

For obtaining planar light emission using a light emitting device, it may be advantageous that a planar anode and a planar cathode are disposed so as to overlap. For obtaining light emission in the form of pattern, there are a method in which a mask having a window in the form of pattern is placed on the surface of a planer light emitting device, a method in which a layer intending a non-luminous part is formed extremely thickly to give substantially no emission, and a method in which an anode or a cathode or both electrodes are formed in the form of pattern. By forming a pattern by any of these methods and by disposing several electrodes so that independent ON/OFF is possible, a segment type display capable of displaying numbers and letters, simple marks and the like is obtained. For obtaining a dot matrix display, it may be advantageous that both an anode and a cathode are formed in the form of stripe and disposed so as to cross. Partial color display and multi-color display are made possible by a method in which several kinds of polymer compounds showing different emission colors are painted separately and a method of using a color filter or a fluorescence conversion filter. The dot matrix display can be passively driven, or actively driven combined with TFT and the like. These displays can be used in computers, television sets, portable terminals, cellular telephones, car navigations, video camera view finders and the like. The planar light emitting device is of self-emission and thin type, and can be suitably used as a planer light source for backlight of a liquid display, or as a planar light source for illumination. If a flexible substrate is used, it can be used also as a curved light source and a curved display.

EXAMPLES

The present invention will be illustrated further in detail by examples below, but the present invention is not limited to these examples.

In the present examples, the polystyrene-equivalent number average molecular weight (Mn) and the polystyrene-equivalent weight average molecular weight (Mw) of a polymer compound were measured by size exclusion chromatography (SEC) (manufactured by Shimadzu Corp., trade name: LC-10Avp). SEC measurement conditions are as described below.

[Measurement Condition]

The polymer compound to be measured was dissolved in tetrahydrofuran at a concentration of about 0.05 wt %, and 10 μL of the solution was injected into SEC. As the mobile phase of SEC, tetrahydrofuran was used and allowed to flow at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

Measurement of LC-MS was carried out according to the following method.

A measurement sample was dissolved in chloroform or tetrahydrofuran so as to give a concentration of about 2 mg/mL, and about 1 μL of the solution was injected into LC-MS (manufactured by Agilent Technologies, trade name: 1100LCMSD). As the mobile phase of LC-MS, acetonitrile and tetrahydrofuran were used while changing the ratio thereof and allowed to flow at a flow rate of 0.2 mL/min. As the column, L-column 2 ODS (3 μm) (manufactured by Chemicals Evaluation and Research Institute, internal diameter: 2.1 mm, length: 100 mm, particle size: 3 μm) was used.

Measurement of NMR was carried out according to the following method.

Five to ten milligrams (5 to 10 mg) of a measurement sample was dissolved in about 0.5 mL of deuterated chloroform ($CDCl_3$), deuterated tetrahydrofuran (THF-d8) or deuterated methylene chloride ($CD_2Cl_2$), and measurement was performed using an NMR apparatus (manufactured by Varian, Inc., trade name: MERCURY 300) or an NMR apparatus (manufactured by Bruker corporation, trade name: Avance III 600).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise state. In this operation, the compound to be measured was dissolved in tetrahydrofuran or chloroform so as to give a concentration of 0.01 to 0.2 wt %, and depending on the concentration, 1 to 10 μL of the solution was injected into HPLC. As the mobile phase of HPLC, acetonitrile and tetrahydrofuran were used and allowed to flow at a flow rate of 1 mL/min as gradient analysis of acetonitrile/tetrahydrofuran=100/0 to 0/100 (volume ratio). As the column, Kaseisorb LC ODS 2000 (manufactured by Tokyo Chemical Industry Co., Ltd.) or an ODS column having an equivalent performance was used. As the detector, a photo diode array detector (manufactured by Shimadzu Corp., trade name: SPD-M20A) was used.

In the present examples, the emission spectrum maximum peak wavelength of a phosphorescent compound was measured by a spectrophotometer (manufactured by JASCO Corporation, FP-6500) at room temperature. A phosphorescent compound was dissolved in xylene at a concentration of about $0.8 \times 10^{-4}$ wt % and the resultant xylene solution was used as a sample. As the excitation light, UV light having a wavelength of 325 nm was used.

Synthesis Example 1

Synthesis of Compound B1

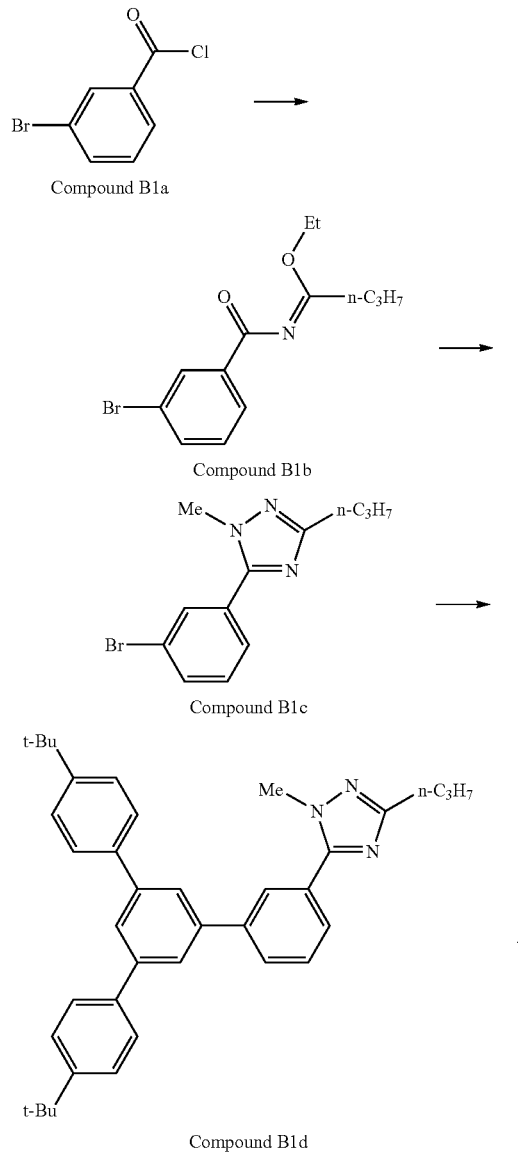

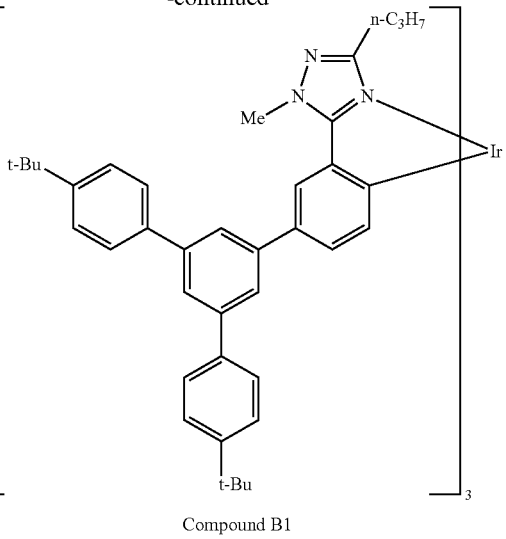

Compound B1

In a reaction vessel, a compound B1a (6.92 g, 31.5 mmol) and ethyl butyrimidate hydrochloride (4.95 g, 32.6 mmol) were weighed, and 150 mL of chloroform was added and the mixture was placed under a nitrogen gas atmosphere. Thereafter, 20 mL of a chloroform solution containing triethylamine (8.0 mL, 60 mmol) was dropped into there, and the mixture was stirred at room temperature under a nitrogen gas atmosphere for 15 hours. The resultant solution was concentrated before suspending in dichloromethane, and the suspension was taken into a separating funnel and washed. The resultant oil layer was concentrated and dried, to obtain 9.47 g of a compound B1b as a colorless liquid. The results of $^1$H-NMR analysis are shown below.

$^1$H-NMR (400 MHz/CDCl$_3$): δ (ppm)=8.14 (t, 1H), 7.93 (dd, 1H), 7.65-7.63 (m, 1H), 7.31 (t, 1H), 4.29 (q, 2H), 2.36 (t, 2H), 1.60 (td, 2H), 1.37 (t, 3H), 0.88 (t, 3H).

In a reaction vessel, the compound B1b (9.0 g, 30 mmol) was dissolved in 100 mL of chloroform, then, the atmosphere in the reaction vessel was turned into a nitrogen gas atmosphere. Thereafter, 15 mL of a chloroform solution containing methylhydrazine (1.52 g, 33 mmol) and 0.6 mL of water was dropped, and the mixture was stirred at room temperature under a nitrogen gas atmosphere for 7 hours. Into the resultant reaction solution, 100 mL of water was poured, and the solution was taken into a separating funnel and washed. The resultant oil layer was recovered, concentrated, and allowed to pass through a silica gel column. It was separated and purified using a mixed solvent of dichloromethane and ethyl acetate, to obtain 5.8 g (21 mmol) of a compound B1c as a pale yellow liquid with a yield of 69%. The results of $^1$H-NMR analysis are shown below.

$^1$H-NMR (400 MHz/CDCl$_3$): δ (ppm)=7.85 (d, 1H), 7.60 (m, 2H), 7.37 (dd, 1H), 3.93 (s, 3H), 2.72 (t, 2H), 1.81 (m, 2H), 1.01 (t, 3H).

In a reaction vessel, the compound B1c (1.3 g, 4.6 mmol), 3,5-di(4-tert-butylphenyl)phenylboronic acid pinacol ester (2200 mg, 4.7 mmol) and sodium carbonate (1250 mg, 11.6 mmol) were weighed, 5 mL of ethanol, 10 mL of water and 10 mL of toluene were added, then, the atmosphere in the reaction vessel was turned into a nitrogen gas atmosphere. Thereafter, tetrakistriphenylphosphinopalladium(0) (260 mg, 0.23 mmol) was added, and the mixture was again placed under a nitrogen gas atmosphere. The resultant reaction mixture was heated at 80° C. for 15 hours. After standing to cool, water and toluene were poured and washing was performed. The resultant oil layer was recovered, then, concentrated, to obtain a coarse product. The resultant coarse product was allowed to pass through a silica gel column and separated and purified with a mixed solvent of dichloromethane and ethyl acetate. As a white powder, 2.18 g (4.0 mmol) of a compound B1d was obtained with a yield of 88%. The results of $^1$H-NMR analysis are shown below.

$^1$H-NMR (400 MHz/(CD$_3$)$_2$CO): δ (ppm)=8.19 (t, 1H), 7.98 (dt, 1H), 7.93 (d, 2H), 7.91 (t, 1H), 7.80 (t, 1H), 7.77 (dt, 4H), 7.66 (t, 1H), 7.54 (dt, 4H), 4.01 (s, 3H), 2.63 (t, 2H), 1.76 (td, 2H), 1.36 (s, 18H), 0.98 (t, 3H).

In a reaction vessel, iridium chloride (226 mg, 0.64 mmol) and the compound B1d (760 mg, 1.4 mmol) were weighed, and 2 mL of water and 6 mL of 2-butoxyethanol were added, then, the atmosphere in the reaction vessel was turned into a nitrogen gas atmosphere, and the mixture was refluxed with heating for 17 hours. After standing to cool, water and dichloromethane were poured, and the resultant oil layer was washed. The resultant oil layer was concentrated and dried, to obtain 840 mg of a yellow brown solid. In a reaction vessel, the resultant yellow brown solid (840 mg) and the compound B1d (1300 mg, 2.4 mmol) were weighed, the gas in the reaction vessel was turned into an argon gas atmosphere, then, silver trifluorosulfonate (165 mg, 0.64 mmol) was added. Thereafter, 1.25 mL of diethylene glycol dimethyl ester was added, and the mixture was refluxed with heating under an argon gas atmosphere for 15 hours. After standing to cool, dichloromethane was poured, and the resultant suspension was filtrated under suction. The resultant filtrate was taken into a separating funnel and washed, and the resultant oil layer was recovered, then, concentrated, to obtain a coarse product. The resultant coarse product was allowed to pass through a silica gel column and separated and purified with a mixed solvent of dichloromethane and ethyl acetate. The resultant yellow solid was recrystallized using a mixed solvent of dichloromethane and methanol, then, recrystallized using a mixed solvent of dichloromethane and hexane. As a yellow powder, 850 mg (0.48 mmol) of a compound B1 was obtained with a yield of 73%. The results of $^1$H-NMR analysis are shown below.

$^1$H-NMR (400 MHz/CDCl$_3$): δ (ppm)=7.82 (d, 3H), 7.75 (d, 6H), 7.72 (d, 3H), 7.62 (d, 12H), 7.48 (d, 12H), 7.20 (dd, 3H), 6.87 (d, 3H), 4.27 (s, 9H), 2.26 (ddd, 3H), 1.96 (ddd, 3H), 1.37 (s, 54H), 1.05 (m, 6H), 0.73 (t, 9H).

The compound B1 showed an emission spectrum maximum peak wavelength of 475 nm.

Synthesis Example 2

Synthesis of Compound B2

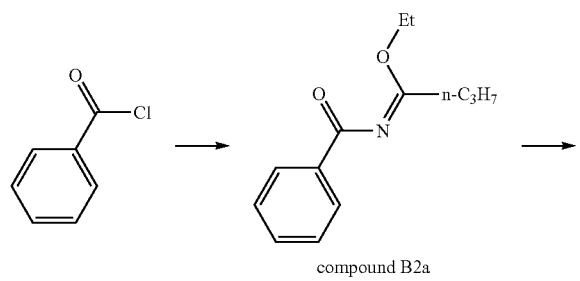

compound B2a

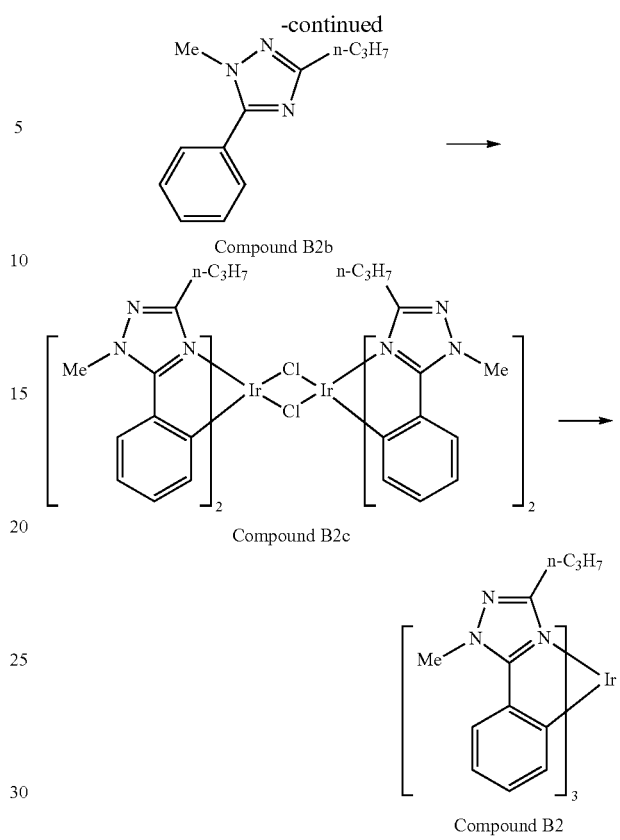

In a reaction vessel, benzoyl chloride (3 mL, 26 mmol) and ethyl butyrimidate hydrochloride (3.9 g, 26 mmol) were weighed, and dissolved in 300 mL of chloroform, and the mixture was placed under a nitrogen gas atmosphere. Thereafter, 25 mL of a chloroform solution of triethylamine (7.2 mL, 52 mmol) was dropped, and the mixture was stirred at room temperature under a nitrogen gas atmosphere. After 15 hours, the solvent chloroform was concentrated before suspending in 200 mL of water, and this suspension was extracted with dichloromethane. The resultant solution was concentrated under reduced pressure, to obtain a compound B2a (5.3 g, 24 mmol) as a pale yellow liquid.

In a reaction vessel, the compound B2a (5.3 g, 24 mmol) was dissolved into 200 mL of chloroform and the solution was placed under a nitrogen gas atmosphere. Into this, 25 mL of a chloroform solution containing methylhydrazine (1.2 mL, 26 mmol) and 0.5 mL of water was dropped at room temperature under a nitrogen gas atmosphere. After dropping, the mixture was stirred for 15 hours at room temperature under a nitrogen gas atmosphere, and 100 mL of water was added to stop the reaction. The reaction solution was transferred onto a separating funnel, washed with water, then, the oil layer was recovered and concentrated. The coarse product was allowed to pass through a silica gel column, and purified with a mixed solvent of dichloromethane and ethyl acetate. The eluent was concentrated, to obtain 2.9 g of a compound B2b as a colorless liquid with a yield of 60%. The results of $^1$H-NMR analysis are shown below.

$^1$H-NMR (400 MHz/CDCl$_3$): δ (ppm)=7.75 (m, 3H), 7.66 (m, 2H), 3.93 (s, 3H), 2.73 (t, 2H), 1.82 (hex, 2H), 1.02 (t, 3H).

In a reaction vessel, iridium chloride (350 mg, 1.0 mmol) and the compound B2b (440 mg, 2.2 mmol) were weighed, and 10 mL of 2-ethoxyethanol and 5 mL of water were added, then, the mixture was placed under a nitrogen gas atmosphere, and refluxed with heating for 15 hours. After standing to cool, the solvent was concentrated, and to the residue were added water and dichloromethane, and the oil layer was washed. The oil layer was recovered, concentrated and dried, to obtain 660 mg of a compound B2c as a yellow oily substance.

In a reaction vessel, the compound B2c (625 mg, 0.5 mmol) and the compound B2b (1.0 g, 5.0 mmol) were weighed, and 260 mg of silver trifluoromethanesulfonate was added, and the gas in the reaction system was purged with an argon gas. After reacting with heating at 165° C. for 15 hours, the reaction solution was allowed to cool, and 15 mL of dichloromethane was poured. The suspension was filtrated under suction, then, allowed to pass through a silica gel column and separated and purified with a mixed solvent of dichloromethane and ethyl acetate. As a yellow powder, a compound B2 (630 mg) was obtained with a yield of 80%. The results of $^1$H-NMR analysis are shown below.

$^1$H-NMR (400 MHz/CDCl$_3$): δ (ppm)=7.50 (d, 3H), 6.88 (t, 3H), 6.80 (t, 3H), 6.63 (d, 3H), 4.11 (s, 9H), 2.18 (hep, 3H), 1.87 (hep, 3H), 1.38-1.30 (m, 3H), 1.18-1.10 (m, 3H), 0.68 (t, 9H).

The compound B2 showed an emission spectrum maximum peak wavelength of 450 nm.

Synthesis Example 3

Synthesis of Compound B3b

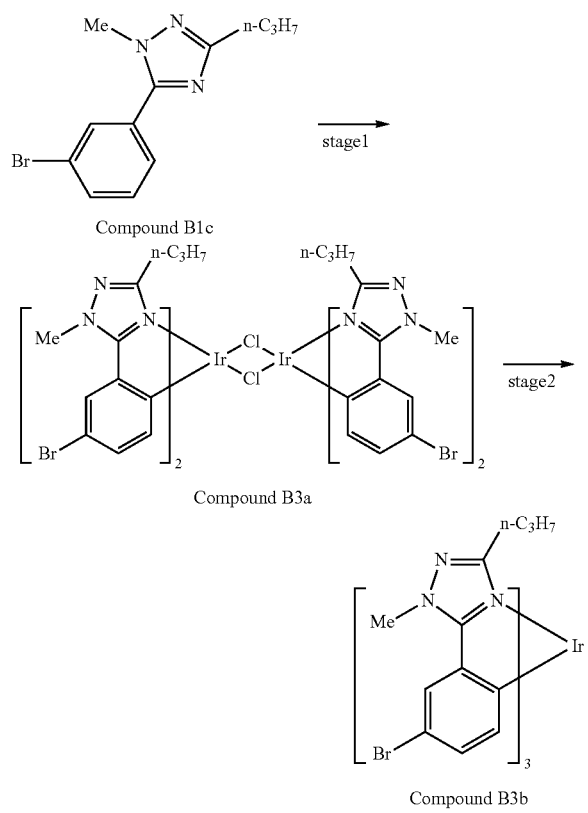

Compound B1c

Compound B3a

Compound B3b

<Stage 1>

The atmosphere in a reaction vessel was turned into a nitrogen gas atmosphere, then, iridium chloride tri-hydrate (20 g) and a compound B1c (39.7 g) synthesized according to a method described in Synthesis Example 1 were added, and further, ethoxyethanol (794 mL) previously bubbled with an argon gas and water (265 mL) previously bubbled with an argon gas were added, and the mixture was further bubbled with an argon gas for 20 minutes while stirring, to remove dissolved oxygen. Thereafter, this was stirred under reflux for 22 hours while heating using an oil bath of 125° C., to obtain a reaction solution. The resultant reaction solution was cooled down to room temperature, then, water (794 g) was added, the mixture was vigorously stirred, and the deposited precipitate was taken out as a solid by filtration, and the resultant solid was washed with water (300 mL) and hexane (300 mL) in this order, and dried under reduced pressure at 50° C., to obtain a compound B3a (40.6 g) as a yellow powder. The resultant compound B3a had a purity according to HPLC of 98.24%.

<Stage 2>

The atmosphere in a reaction vessel was turned into a nitrogen gas atmosphere, then, the compound B3a (40.6 g), a compound B1c (95.3 g) synthesized according to a method described in Synthesis Example 1, diethylene glycol dimethyl ether (567 mL) and silver trifluoroacetate (29.2 g) were added, and further, the mixture was bubbled with a nitrogen gas for 20 minutes while stirring, to remove dissolved oxygen. Thereafter, this was stirred for 22 hours while heating using an oil bath of 170° C., to obtain a reaction solution. The resultant reaction solution was cooled, then, the solid was removed by filtration, and to the resultant filtrate was added water (567 g) and the mixture was stirred, and the deposited precipitate was collected as a solid by filtration. The resultant solid was washed with water (200 mL) once, further with methanol (200 mL) twice, and dried under reduced pressure, to obtain a yellow solid (64.6 g, purity: 96.2%). The resultant yellow solid was dissolved in dichloromethane, the solution was allowed to pass through a silica gel column (amount of silica gel: 292 g), and the resultant solution was concentrated, to obtain a mixture containing the intended substance (58.7 g, purity: 96.3%) as a yellow solid. The resultant mixture was purified by recrystallization (with a mixed solvent of dichloromethane and methanol), and further purified by recrystallization (with a mixed solvent of dichloromethane and ethyl acetate), to obtain a coarse product (48.7 g). To the resultant coarse product was added ethyl acetate (487 mL), and the mixture was stirred under reflux with heating, then, methanol (487 mL) was dropped, and the mixture was cooled down to room temperature to cause generation of a solid which was then collected by filtration. The resultant solid was washed with methanol, dried under reduced pressure, to obtain a compound B3b (48.03 g). The resultant compound B3b had a purity according to HPLC of 99.4%.

LCMS (APPI: pos): calcd [C36H39Br3IrN9]=1027.05, found [C36H39Br3IrN9+H+]=1028.1

Synthesis Example 4

Synthesis of Compound S1

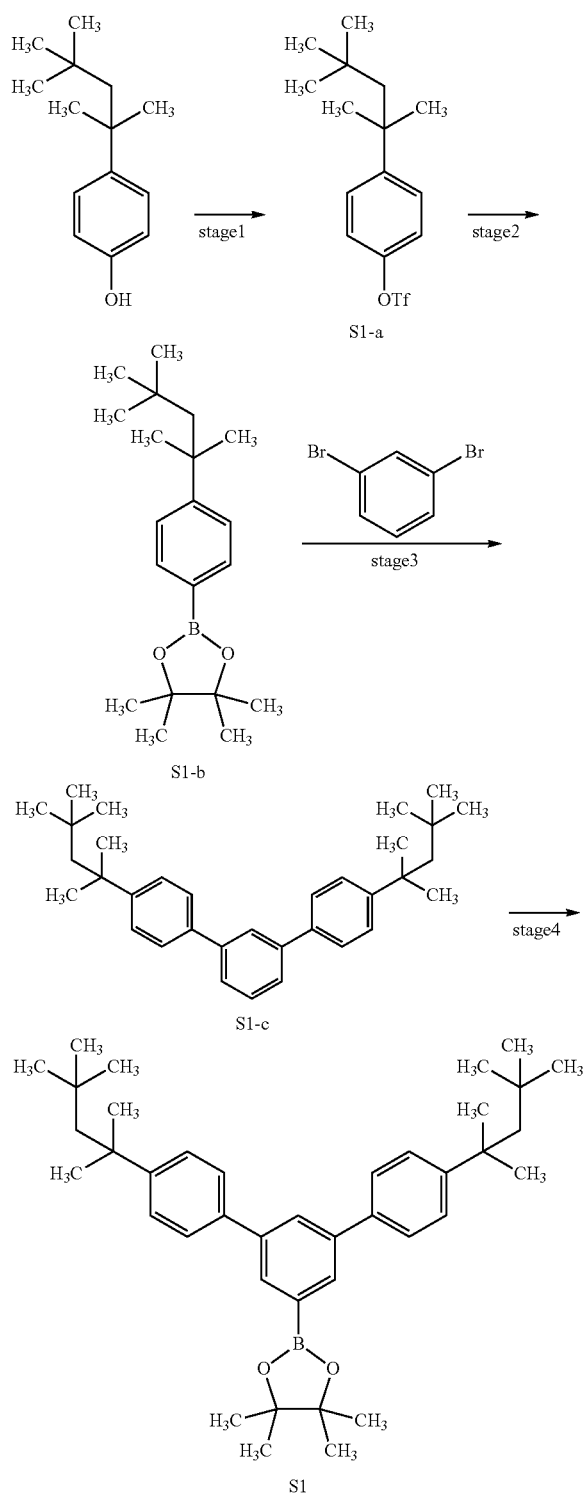

<Stage 1>

The atmosphere in a reaction vessel was turned into a nitrogen gas stream, then, 4-tert-octylphenol (250.00 g, manufactured by Aldrich), N,N-dimethyl-4-aminopyridine (177.64 g) and dichloromethane (3100 mL) were added, and this mixture was cooled down to 5° C. with ice. Thereafter, trifluoromethanesulfonic anhydride (376.06 g) was dropped into this over a period of 45 minutes. After completion of dropping, the mixture was stirred for 30 minutes under ice cool, then, returned to room temperature and further stirred for 15 hours. To the resultant reaction mixture was added hexane (3100 mL), and this reaction mixture was filtrated using 410 g of silica gel, and further, the silica gel was washed with a mixed solvent (2.5 L) of hexane/dichloromethane (1/1 (by volume)). The resultant filtrate and the wash solution were concentrated, to obtain a compound S1-a (410.94 g) as a colorless oil. The resultant compound S1-a had a purity according to HPLC of 99.5% or more.

<Stage 2>

The atmosphere in a reaction vessel was turned into a nitrogen gas stream, then, the compound S1-a (410.94 g), bis(pinacolato)diboron (338.47 g), potassium acetate (237.83 g), 1,4-dioxane (2600 mL), palladium acetate (4.08 g) and tricyclohexylphosphine (10.19 g) were added, and the mixture was refluxed for 2 hours. After cooling down to room temperature, the resultant reaction mixture was filtrated and the filtrate was collected, and further, the filtrated substance was washed with 1,4-dioxane (2.5 L), and the resultant filtrate and the wash solution were concentrated. The resultant residue was dissolved into a mixed solvent of hexane/dichloromethane (1/1 (by volume)), and the solution was filtrated using 770 g silica gel, and further, the silica gel was washed with a mixed solvent (2.5 L) of hexane/dichloromethane (1/1 (by volume)). The resultant filtrate and the wash solution were concentrated, and to the resultant residue was added methanol (1500 mL), and the mixture was ultrasonically cleaned for 30 minutes. Thereafter, this was filtrated to obtain a compound S1-b (274.27 g). The filtrate and the wash solution were concentrated, and methanol was added, and the mixture was ultrasonically cleaned and filtrated, and such an operation was repeated, to obtain a compound S1-b (14.29 g). The total yielded amount of the resultant compound S1-b was 288.56 g.

<Stage 3>

The atmosphere in a reaction vessel was turned into a nitrogen gas stream, then, 1,3-dibromobenzene (102.48 g), the compound S1-b (288.56 g), toluene (2100 mL), a 20 wt % tetraethyl ammonium hydroxide aqueous solution (962.38 g) and bis(triphenylphosphine)palladium(II) dichloride (3.04 g) were added, and the mixture was refluxed for 7 hours. After cooling down to room temperature, the aqueous layer and the organic layer were separated, and the organic layer was collected. To this aqueous layer was added toluene (1 L), and the organic layer was further extracted. The resultant organic layers were combined, and this mixture was washed with a mixed aqueous solution of distilled water/saturated saline (1.5 L/1.5 L). The resultant organic layer was filtrated through 400 g silica gel, and further, the silica gel was washed with toluene (2 L). The resultant solution was concentrated, and the resultant residue was dissolved in hexane. This solution was purified by silica gel column chromatography. Impurities were eluted with a developing solvent hexane, then, developed with a mixed solvent of hexane/dichloromethane (10/1 (by volume)). The each resultant fraction was concentrated under reduced pressure to remove the solvent, obtaining a colorless crystalline compound S1-c (154.08 g, HPLC purity: 99.1%) and a coarse compound S1-c (38.64 g, LC purity: 83%). This coarse compound S1-c was column-purified again under the same developing conditions, and the solvent was distilled off under reduced pressure, to obtain a compound S1-c (28.4 g, LC purity: 99.6%). The total yielded amount the resultant compound S1-c was 182.48 g.

<Stage 4>

The atmosphere in a reaction vessel was turned into a nitrogen gas stream, then, the compound S1-c (182, 48 g), bis(pinacolato)diboron (112.09 g), 4,4'-di-tert-butyl-2,2'-dipyridyl (3.23 g), cyclohexane (2000 mL) and bis(1,5-cyclooctadiene)di-μ-methoxydiiridium(I) (3.99 g) were added, and the mixture was refluxed for 2 hours. After cooling with air down to room temperature, silica gel (220 g) was added over a period of 20 minutes while stirring the resultant reaction mixture. The resultant suspension was filtrated through 440 g of silica gel, and further, the silica gel was washed with dichloromethane (2 L), and the solution was concentrated. To the resultant residue were added methanol (1100 mL) and dichloromethane (110 mL), and the mixture was refluxed for 1 hour. After cooling down to room temperature, this was filtrated. The resultant filtrated substance was washed with methanol (500 mL), and the resultant solid was dried, to obtain a compound S1 (220.85 g).

$^1$H-NMR (CDCl$_3$, 300 MHz): δ (ppm)=8.00 (s, 2H), 7.92 (s, 1H), 7.60 (d, J=8.5 Hz, 4H), 7.44 (d, J=8.5 Hz, 4H), 1.78 (s, 4H), 1.41 (s, 12H), 1.37 (s, 12H), 0.75 (s, 18H).

Synthesis Example 5

Synthesis of Compound S2

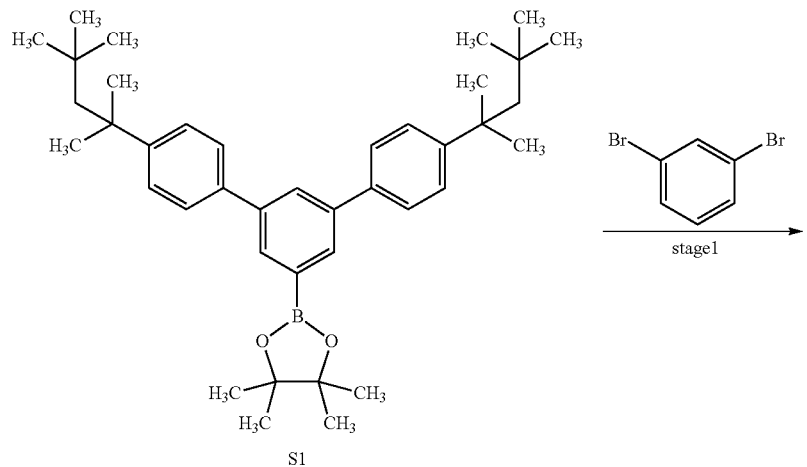

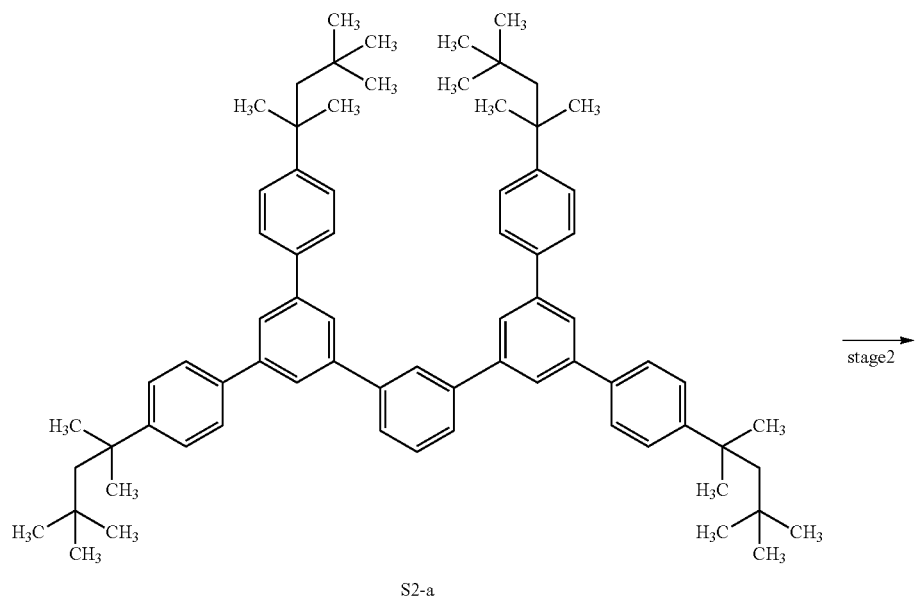

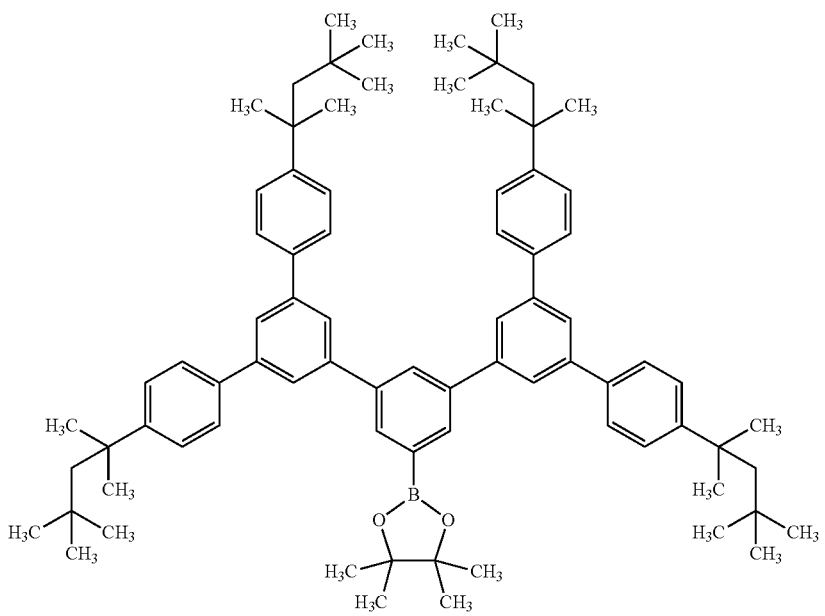

S2

<Stage 1>

The atmosphere in a reaction vessel was turned into a nitrogen gas stream, then, the compound S1 (91.49 g), m-dibromobenzene (17.70 g) and toluene (478 mL) were added, and the mixture was bubbled with a nitrogen gas for 20 minutes. Thereafter, to this were added a 20 wt % tetraethyl ammonium hydroxide aqueous solution (166 mL) and bis(triphenylphosphine)palladium(II) dichloride (0.26 g), and the mixture was refluxed for 6.5 hours. After cooling down to room temperature, the organic layer was separated from the resultant reaction solution, and this organic layer was washed with water (300 mL) and saturated saline (300 mL) in this order. The resultant organic layer was dried over sodium sulfate, then, the solvent was distilled off under reduced pressure. The resultant residue was dissolved into a mixed solvent of hexane/chloroform (20/1 (by volume)), and the solution was purified by silica gel column chromatography, and concentrated under reduced pressure, to remove the solvent. To the resultant residue were added methanol (845 mL) and chloroform (56 mL), and the mixture was refluxed for 30 minutes. The resultant solution was cooled to obtain a precipitate which was then filtrated and dried, to obtain a compound S2-a (74.40 g).

<Stage 2>

The atmosphere in a reaction vessel was turned into a nitrogen gas stream, then, the compound S2-a (74.40 g), bis(pinacolato)diboron (21.13 g), 4,4'-di-tert-butyl-2,2'-dipyridyl (609 mg), cyclohexane (734 mL) and bis(1,5-cyclooctadiene)di-μ-methoxydiiridium(I) (752 mg) were added, and the mixture was refluxed for 8 hours. After cooling with air down to room temperature, then, to the resultant reaction solution was added silica gel (83.93 g), and it was purified by silica gel column chromatography (developing solvent: a mixed solvent of dichloromethane/acetonitrile (100/1 (by volume))). Thereafter, the solvent was distilled off under reduced pressure, and the resultant residue was dissolved in toluene (420 mL), and this solution was heated at 50° C. Thereafter, acetonitrile (839 mL) was dropped into this, and the deposited solid was filtrated. The resultant solid was refluxed in a mixed solvent of hexane/acetonitrile (1/1 (by volume)) for 30 minutes, then, cooled down to room temperature and the precipitate was collected by filtration, and dried, to obtain a compound S2 (68.53 g).

$^1$H-NMR (CDCl$_3$, 300 MHz): δ (ppm)=8.14 (d, J=1.8 Hz, 2H), 8.09 (m, 1H), 7.85 (d, J=1.6 Hz, 4H), 7.82 (m, 2H), 7.64 (d, J=8.5 Hz, 8H), 7.48 (d, J=8.5 Hz, 8H), 1.79 (s, 8H), 1.42 (s, 24H), 1.39 (s, 12H), 0.77 (s, 36H).

Synthesis Example 6

Synthesis of Compound B3

Compound B3b
+
Compound S2
→

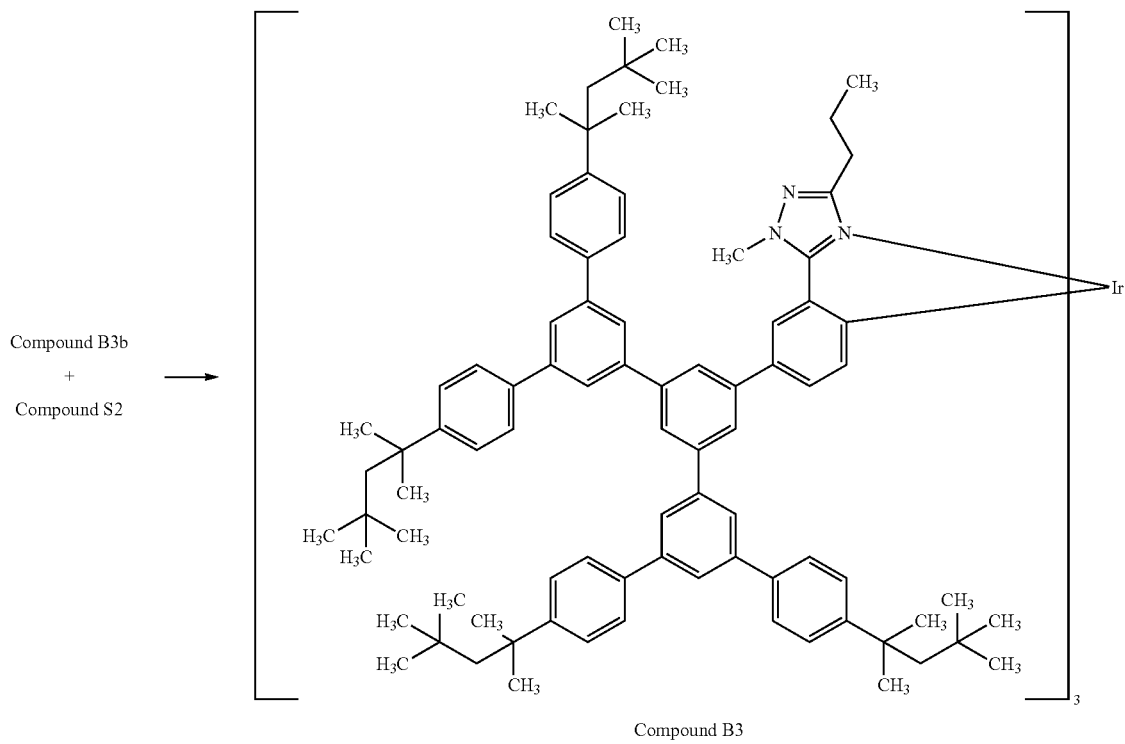

Compound B3

The atmosphere in a reaction vessel was turned into a nitrogen gas stream, then, the compound B3b (2.50 g) and the compound S2 (8.89 g) were added, and this mixture was dissolved in tetrahydrofuran (200 mL) at room temperature. Thereafter, to this were added a 20 wt % tetraethyl ammonium hydroxide aqueous solution (12.51 g) and tetrakis(triphenylphosphine)palladium(0) (56.1 mg), and the mixture was refluxed for 23 hours while shielding light. After cooling down to room temperature, the resultant reaction mixture was poured into distilled water (200 mL), and the mixture was extracted with toluene (150 mL). The resultant organic layer was washed with distilled water (200 mL) and saturated saline (350 mL) in this order. The resultant organic layer was dried over sodium sulfate, then, filtrated and the filtrate was concentrated. The resultant residue was purified by silica gel column chromatography (a mixed solvent of hexane/ethyl acetate=10/1 (by volume)) and concentrated under reduced pressure, to remove the solvent. To the resultant residue were added toluene (115 mL) and acetonitrile (655 mL), and the mixture was heated at 50° C. for 1 hour while shielding light. Thereafter, this was filtrated, and dried under reduced pressure, to obtain a compound B3 (7.07 g).

$^1$H-NMR (CD$_2$Cl$_2$, 300 MHz): δ (ppm)=8.00 (m, 9H), 7.95-7.93 (m, 15H), 7.87 (s, 6H), 7.67 (d, 24H), 7.47 (d, 24H), 7.31 (d, 3H), 6.97 (d, 3H), 4.29 (s, 9H), 2.31-2.21 (m, 3H), 2.02-1.92 (m, 3H), 1.77 (s, 24H), 1.51-1.19 (m, 78H), 0.78-0.71 (m, 117H).

The compound B3 showed an emission spectrum maximum peak wavelength of 472 nm.

Synthesis Example 7

Synthesis of Compound S3-5

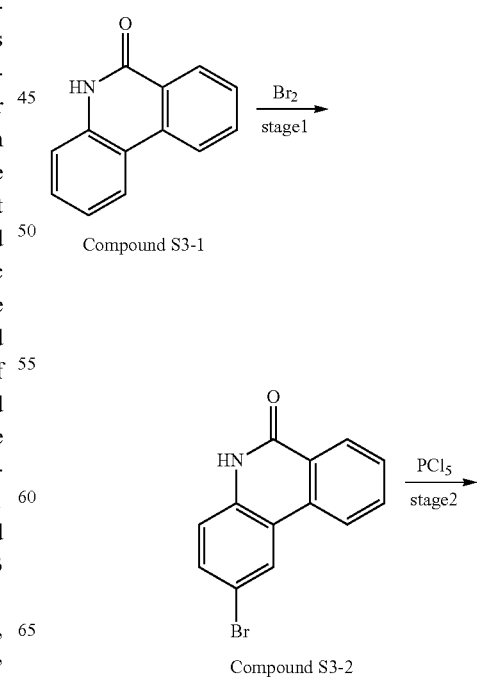

Compound S3-1

Compound S3-2

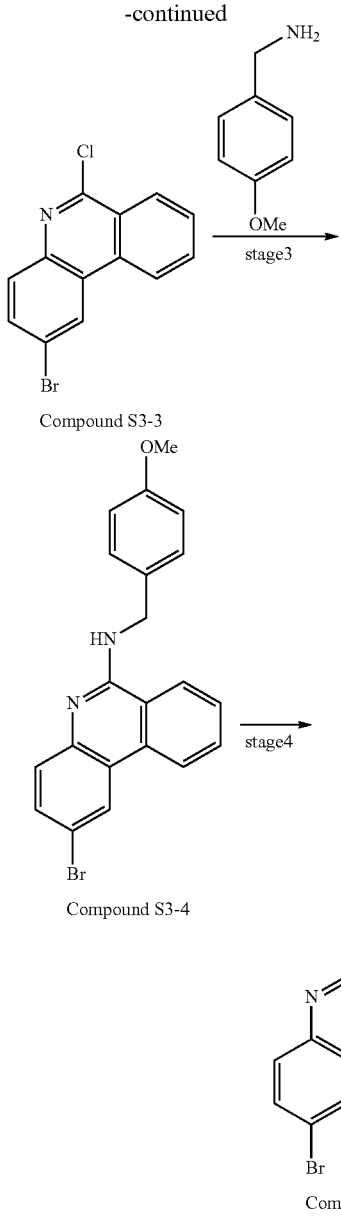

Compound S3-3

Compound S3-4

Compound S3-5

<Stage 1>

The atmosphere in a reaction vessel was turned into a nitrogen gas atmosphere, then, the compound S3-1 (750 g) and acetic acid (7.5 L) were added, and the mixture was cooled by an ice bath. Into this, bromine (365 mL) was dropped, then, the mixture was stirred for 16 hours at room temperature. Thereafter, ion-exchange water (15 L) cooled by an ice bath was added, and the mixture was stirred for 30 minutes, then, the deposited solid was collected by filtration. The resultant solid was washed with a 10 wt % sodium thiosulfate aqueous solution (4 L) and ion-exchange water (4 L) in series, then, dried under reduced pressure, to obtain a compound S3-2 (990 g, yield: 94%, white solid).

$^1$H-NMR (DMSO-$d_6$, 400 MHz): δ (ppm)=7.29 (d, 1H), 7.64 (dd, 1H), 7.67-7.69 (m, 1H), 7.83-7.87 (m, 1H), 8.31 (dd, 1H), 8.56 (d, 1H), 8.58 (d, 1H), 11.80 (s, 1H).

<Stage 2>

The atmosphere in a reaction vessel was turned into a nitrogen gas atmosphere, then, phosphorus pentachloride (958 g), a compound S3-2 (1200 g) synthesized according to the above-described method and phosphoryl chloride (7.2 L) were added, and the mixture was stirred for 16 hours at 95° C. The resultant reaction solution was concentrated under reduced pressure, then, ion-exchange water (8.5 L) cooled by an ice bath was added, and the mixture was stirred for 1 hour, then, the deposited solid was collected by filtration. The resultant solid was washed with ion-exchange water, then, dried under reduced pressure, to obtain a compound S3-3 (1120 g, yield: 87%).

$^1$H-NMR (DMSO-$d_6$, 400 MHz): δ (ppm)=7.91-7.95 (m, 3H), 8.03-8.07 (m, 1H), 8.42 (d, 1H), 8.96 (d, 1H), 9.04 (s, 1H).

<Stage 3>

The atmosphere in a reaction vessel was turned into a nitrogen gas atmosphere, then, a compound S3-3 (1580 g) synthesized according to the above-described method, 4-methoxybenzylamine (2220 g), N,N-diisopropylethylamine (2.79 L) and n-butanol (15 L) were added, and the mixture was stirred for 24 hours at 135° C. The resultant reaction solution was cooled down to room temperature, then, filtrated. The resultant residue was washed with methanol, then, dried under reduced pressure, to obtain a compound S3-4 (1800 g, yield: 84%).

$^1$H-NMR (DMSO-$d_6$, 400 MHz): δ (ppm)=3.70 (s, 3H), 4.77 (s, 2H), 6.87 (d, 2H), 7.38 (d, 2H), 7.47-7.49 (m, 1H), 7.60-7.84 (m, 3H), 8.25-8.29 (m, 1H), 8.42-8.44 (m, 1H), 8.64-8.71 (m, 2H).

<Stage 4>

The atmosphere in a reaction vessel was turned into a nitrogen gas atmosphere, then, the compound S3-4 (1200 g), trifluoroacetic acid (7.2 L) and dichloromethane (7.2 L) were added, and the mixture was stirred for 24 hours at 60° C. Thereafter, the mixture was cooled down to room temperature, and concentrated under reduced pressure. To this was added ethyl acetate (8 L), and the resultant organic layer was washed with a 10 wt % sodium thiosulfate aqueous solution (4 L) and ion-exchange water (4 L) in series, then, concentrated under reduced pressure. The resultant residue was washed with 2-methoxy-2-methylpropane (2 L), then, dried under reduced pressure, to obtain a compound S3-5 (600 g, yield: 72%).

Synthesis Example 8

Synthesis of Compound S3-9

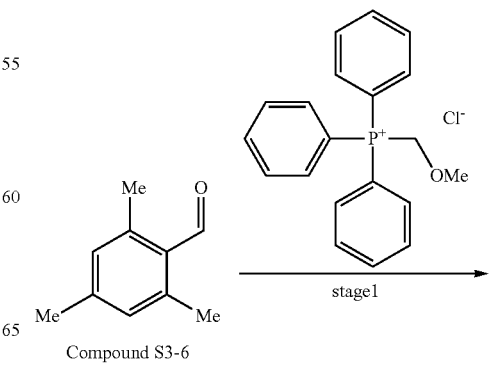

Compound S3-6

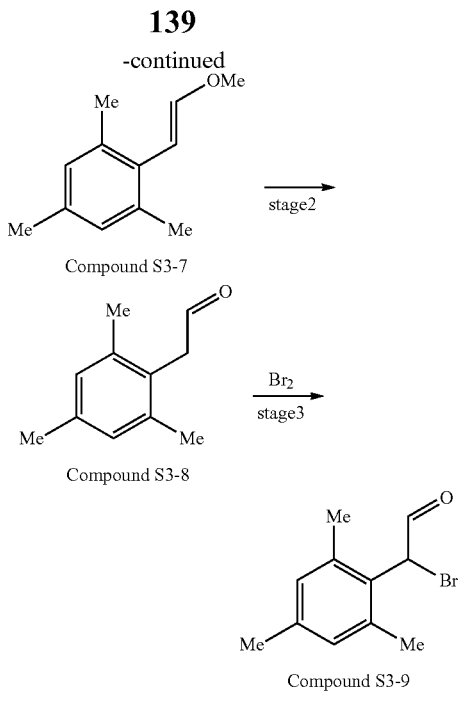

Compound S3-7

Compound S3-8

Compound S3-9

<Stage 1>

The atmosphere in a reaction vessel was turned into a nitrogen gas atmosphere, then, (methoxymethyl)triphenylphosphonium chloride (1730 g) and tetrahydrofuran (5 L) were added, and the mixture was cooled down to −78° C. To this was added a tetrahydrofuran solution (1M, 5 L) of lithiumbis(trimethylsilyl)amide, then, the temperature was raised up to 0° C. Thereafter, the resultant reaction solution was stirred for 30 minutes at 0° C., then, cooled down to −78° C. To this, a compound S3-6 (300 g) dissolved in tetrahydrofuran (5 L) was added, then, the mixture was heated up to room temperature and stirred for 16 hours at room temperature. To this was added an ammonium chloride aqueous solution, then, the mixture was extracted with ethyl acetate twice. The resultant organic layer was dried over anhydrous sodium sulfate, then, filtrated and the filtrate was concentrated under reduced pressure, to obtain a solid. The resultant solid was purified by silica gel column chromatography (hexane/ethyl acetate), and dried under reduced pressure, to obtain a compound S3-7 (350 g).

<Stage 2>

The atmosphere in a reaction vessel was turned into a nitrogen gas atmosphere, then, a compound S3-7 (700 g) synthesized according to the above-described method, concentrated hydrochloric acid (2.1 L), ion-exchange water (3.3 L) and 1,4-dioxane (2.1 L) were added, and the mixture was stirred for 12 hours at 100° C. Thereafter, 1,4-dioxane was distilled off under reduced pressure, and the resultant aqueous layer was extracted with ethyl acetate twice. The resultant organic layer was washed with a saturated sodium chloride aqueous solution, and dried over anhydrous sodium sulfate, then, filtrated and the filtrate was concentrated under reduced pressure, to obtain a solid. The resultant solid was purified by silica gel column chromatography (hexane/ethyl acetate), and dried under reduced pressure, to obtain a compound S3-8 (280 g).

$^1$H-NMR (CDCl$_3$, 300 MHz): δ (ppm)=2.26 (s, 6H), 2.28 (s, 3H), 3.73 (d, 2H), 6.92 (s, 2H), 9.66 (t, 1H).

<Stage 3>

The atmosphere in a reaction vessel was turned into a nitrogen gas atmosphere, then, a compound S3-8 (400 g) synthesized according to the above-described method, dichloromethane (3.3 L) and 1,4-dioxane (6.2 L) were added. To this, bromine (127 mL) dissolved in dichloromethane (3.3 L) was added, and the mixture was stirred for 2 hours at room temperature. To this was added a sodium thiosulfate aqueous solution, and the mixture was extracted with dichloromethane and ion-exchange water. The resultant organic layer was dried over anhydrous sodium sulfate, then, filtrated and the filtrate was concentrated under reduced pressure, to obtain a compound S3-9 (620 g).

$^1$H-NMR (CDCl$_3$, 300 MHz): δ (ppm)=2.27 (s, 3H), 2.29 (s, 6H), 5.76 (s, 1H), 6.90 (s, 2H), 9.72 (s, 1H).

Synthesis Example 9

Synthesis of Compound B4

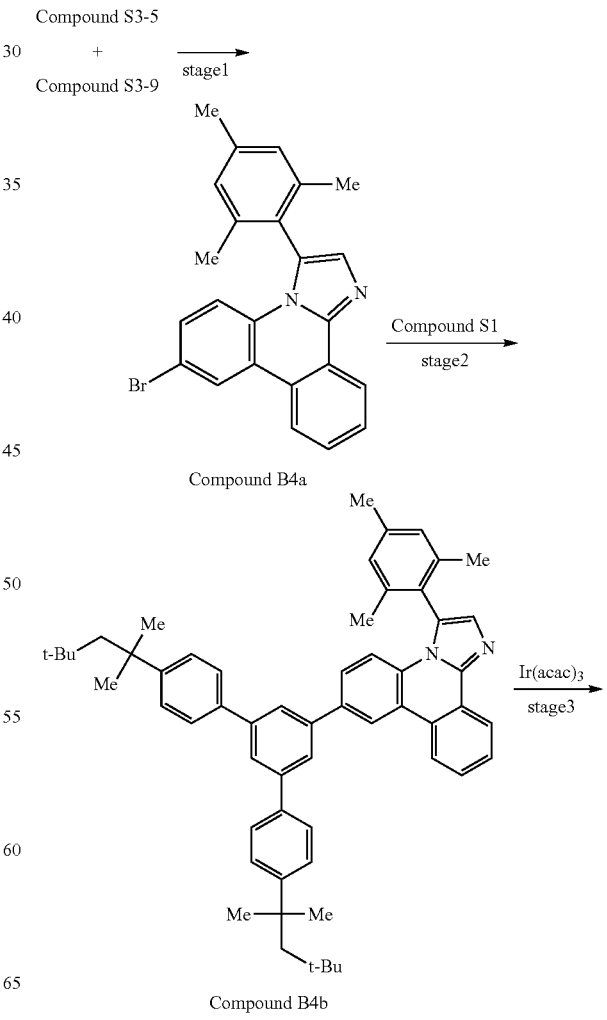

Compound B4a

Compound B4b

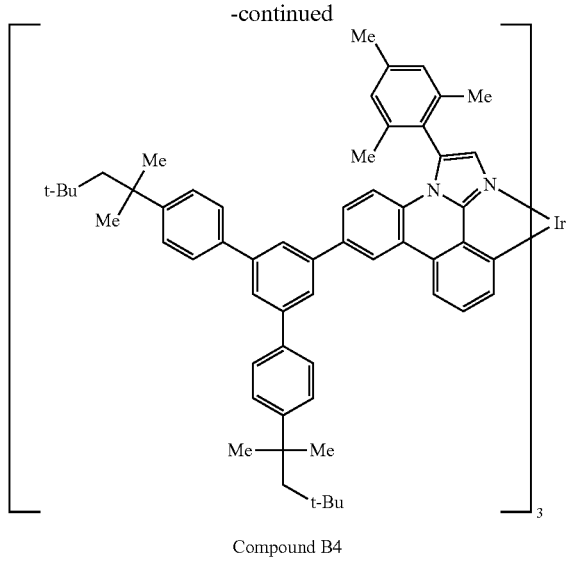

Compound B4

<Stage 1>
(Synthesis of Coarse Product B4a-1)

The atmosphere in a reaction vessel was turned into a nitrogen gas atmosphere, then, a compound S3-5 (702 g) synthesized according to the above-described method, the compound S3-9 (620 g) and 2-propanol (6.2 L) were added, and the mixture was stirred for 24 hours at 95° C. To this were added sodium hydrogen carbonate (430 g) and diglyme (6.2 L), and the mixture was stirred for 48 hours at 140° C. Thereafter, the mixture was cooled down to room temperature, to this was added ion-exchange water (10 L), and the mixture was stirred for 1 hour, then, the deposited solid was collected by filtration. The resultant solid was purified by silica gel column chromatography (hexane/ethyl acetate), then, dried under reduced pressure, to obtain a coarse product B4a-1.

(Synthesis of Coarse Product B4a-2)

The atmosphere in a reaction vessel was turned into a nitrogen gas atmosphere, then, a compound S3-5 (450 g) synthesized according to the above-described method, a compound S3-9 (400 g) synthesized according to the above-described method and 2-propanol (4.0 L) were added, and the mixture was stirred for 24 hours at 95° C. To this were added sodium hydrogen carbonate (280 g) and diglyme (4.0 L), and the mixture was stirred for 48 hours at 140° C. Thereafter, the mixture was cooled down to room temperature, to this was added ion-exchange water (10 L), and the mixture was stirred for 1 hour, then, the deposited solid was collected by filtration. The resultant solid was purified by silica gel column chromatography (hexane/ethyl acetate), and dried under reduced pressure, to obtain a coarse product B4a-2.

(Synthesis of Compound B4a)

The coarse product B4a-1 and the coarse product B4a-2 were mixed. The resultant mixture was recrystallized using a mixed solvent of toluene and hexane, then, dried under reduced pressure, to obtain a compound B4a (520 g). The resultant compound B4a had a purity according to HPLC of 99.5% or more.

$^1$H-NMR (CDCl$_3$, 400 MHz): δ (ppm)=2.03 (s, 6H), 2.43 (s, 3H), 7.07 (s, 2H), 7.22 (d, 1H), 7.35 (dd, 1H), 7.38 (s, 1H), 7.66-7.74 (m, 2H), 8.33 (d, 1H), 8.58 (d, 1H), 8.76 (d, 1H).

<Stage 2>

The atmosphere in a reaction vessel was turned into a nitrogen gas atmosphere, then, the compound B4a (10.0 g), the compound S1 (16.8 g) and toluene (150 mL) were added, and the mixture was bubbled with a nitrogen gas for 1 hour, then, heated at 85° C. To this were added tris(dibenzylideneacetone)dipalladium(0) (Pd$_2$(dba)$_3$) (0.11 g) and 2-dicyclohexylphosphino-2',6'-dimethoxybiphenyl (SPhos) (0.099 g), then, further, a 20 wt % tetraethyl ammonium hydroxide aqueous solution (70 mL) was added, and the mixture was stirred for 24 hours at 105° C. The resultant reaction solution was cooled down to room temperature, then, extracted with dichloromethane, and the resultant organic layer was concentrated under reduced pressure, to obtain a solid. The resultant solid was purified by silica gel column chromatography (hexane/ethyl acetate), and dried under reduced pressure, to obtain a compound B4b (17.6 g, yield: 93-%). The resultant compound B4b had a purity according to HPLC of 99.5% or more.

$^1$H-NMR (CDCl$_3$, 600 MHz): δ (ppm)=8.78 (d, 1H), 8.76 (s, 1H), 8.52 (d, 1H), 7.85 (s, 1H), 7.83 (s, 2H), 7.72-7.67 (m, 2H), 7.64 (d, 4H), 7.60 (d, 1H), 7.49 (d, 4H), 7.44 (d, 1H), 7.40 (s, 1H), 7.09 (s, 2H), 2.44 (s, 3H), 2.08 (s, 6H), 1.81 (s, 4H), 1.43 (s, 12H), 0.78 (s, 18H).

<Stage 3>

The atmosphere in a reaction vessel was turned into a nitrogen gas atmosphere, then, the compound B4b (5.10 g), tris(2,4-pentanedionato)iridium(III) (Ir(acac)$_3$) (0.708 g) and tridecane (1.5 mL) were added, and the mixture was stirred for 3 days at 260 to 280° C. The resultant reaction solution was cooled down to room temperature, then, purified by silica gel column chromatography (hexane/dichloromethane), to obtain a yellow solid. The resultant yellow solid was recrystallized using a mixed solvent of dichloromethane and methanol, then, dried under reduced pressure at 50° C. for 24 hours, to obtain a compound B4 (2.06 g, yield: 49%). The resultant compound B4 had a purity according to HPLC of 99.0%.

$^1$H-NMR (CDCl$_3$, 600 MHz): δ (ppm)=8.77 (s, 3H), 7.82 (s, 9H), 7.80 (d(broad), 3H), 7.63 (d, 12H), 7.53 (d, 3H), 7.48 (d, 12H), 7.24 (d, 3H), 7.21 (t, 3H), 7.16 (s(broad), 3H), 7.03 (s, 3H), 6.99 (s, 3H), 6.85 (s, 3H), 2.39 (s, 9H), 2.10 (s, 9H), 1.90 (s, 9H), 1.80 (s, 12H), 1.42 (s, 36H), 0.77 (s, 54H).

The compound B4 showed an emission spectrum maximum peak wavelength of 472 nm.

Synthesis Example 10

Synthesis of Compound B5

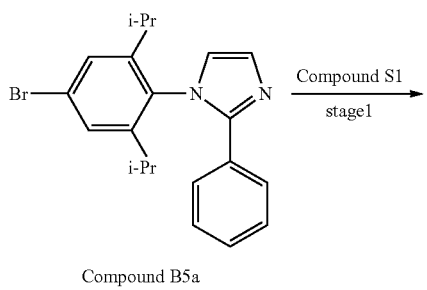

Compound B5a

-continued

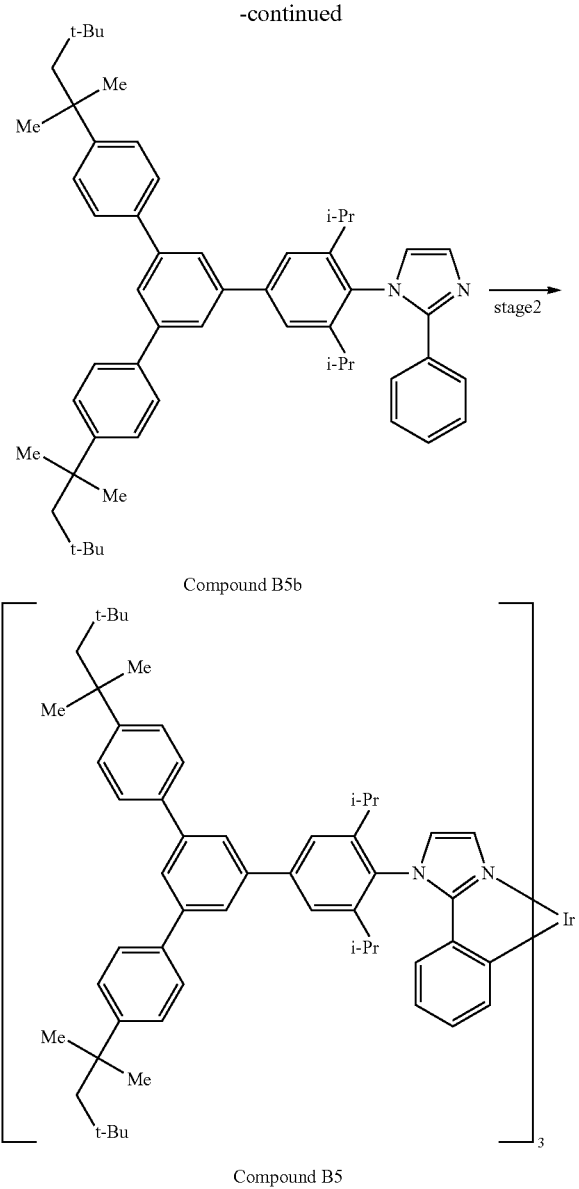

Compound B5b

Compound B5

<Stage 1>

The atmosphere in a reaction vessel was turned into an argon gas atmosphere, then, a compound B5a (9.9 g) synthesized according to U.S. Unexamined Patent Application Publication No. 2011/0057559, the compound S1 (15 g), 2-dicyclohexylphosphino-2',6'-dimethoxybiphenyl (0.11 g), tris(dibenzylideneacetone)dipalladium (0.12 g), a 20 wt % tetraethylammonium aqueous solution (20 mL), toluene (200 mL) and ethanol (50 mL) were added, and the mixture was stirred for 18 hours under reflux with heating. Thereafter, the mixture was cooled down to room temperature, and toluene was added and extraction was performed. The resultant organic layer was washed using ion-exchange water, then, concentrated under reduced pressure, to obtain a solid. The resultant solid was purified by silica gel chromatography (ethyl acetate/hexane), and further, recrystallized using a mixed solvent of toluene and acetonitrile, then, dried under reduced pressure, to obtain a compound B5b (17 g, yield: 90%).

<Stage 2>

The atmosphere in a reaction vessel was turned into an argon gas atmosphere, then, the compound B5b (10 g), iridium chloride hydrate (2.2 g), 2-ethoxyethanol (120 mL) and water (40 mL) were added, and the mixture was stirred for 14 hours under reflux with heating. Thereafter, the mixture was cooled down to room temperature, and methanol was added, to find generation of a precipitate. The resultant precipitate was filtrated, and the resultant solid was washed with methanol, then, dried under reduced pressure, to obtain an intermediate B5 (10 g, yellow powder).

The atmosphere in a reaction vessel was turned into an argon gas atmosphere, then, the intermediate B5 (9.5 g), silver trifluoromethanesulfonate (31 g), dichloromethane (100 mL) and methanol (30 mL) were added, and the mixture was stirred overnight at room temperature. The deposited precipitate was filtrated, then, the resultant filtrate was concentrated under reduced pressure. Thereafter, to this were added the compound B5b (7.8 g), 2,6-lutidine (6.7 mL) and diethylene glycol dimethyl ether (180 mL), and the mixture was stirred overnight under reflux with heating. Thereafter, the mixture was cooled down to room temperature, and a mixed solvent of ion-exchange water and methanol was added, and the deposited precipitate was filtrated. The resultant solid was purified by silica gel chromatography (dichloromethane/hexane), and further, recrystallized using a mixed solvent of toluene and acetonitrile, then, dried under reduced pressure, to obtain a compound B5 (1.2 g, yield: 6.5%).

$^1$H-NMR (600 MHz, $(CD_3)_2CO$-$d_6$): δ (ppm)=8.01-7.97 (m, 9H), 7.91 (d, 6H), 7.81 (d, 12H), 7.59 (d, 12H), 7.25 (s, 3H), 6.92-6.89 (m, 6H), 6.57 (t, 3H), 5.87-5.81 (m, 6H), 2.89-2.86 (m, 3H), 2.52-2.48 (m, 3H), 1.87 (s, 12H), 1.42 (s, 36H), 1.38 (d, 9H), 1.16 (d, 9H), 1.12 (d, 9H), 1.07 (d, 9H), 0.80 (54H).

The compound B5 showed an emission spectrum maximum peak wavelength of 471 nm.

A compound B6 was purchased from Luminescense Technology.

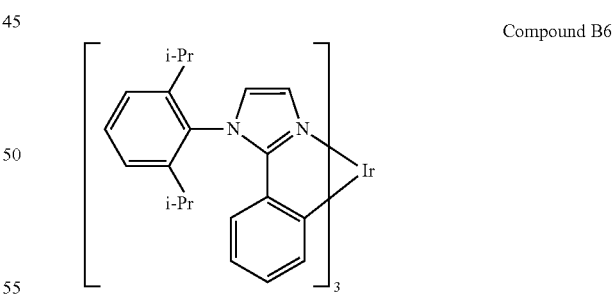

Compound B6

The compound B6 showed an emission spectrum maximum peak wavelength of 470 nm.

Synthesis Example 11

Synthesis of Compound G1

A compound G1 was synthesized according to a method described in JP-A No. 2006-188673.

Compound G1

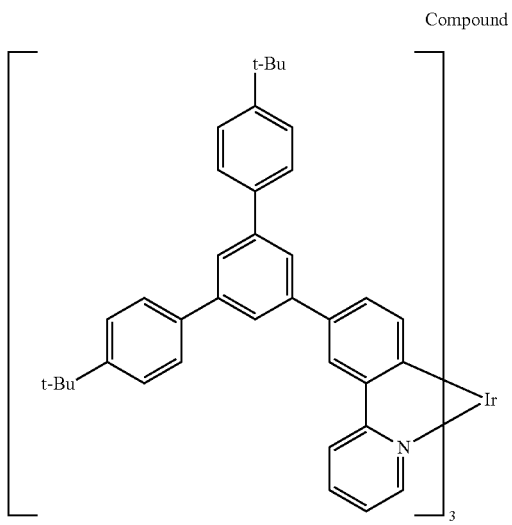

The compound G1 showed an emission spectrum maximum peak wavelength of 514 nm.

Synthesis Example 12

Synthesis of Compound G2

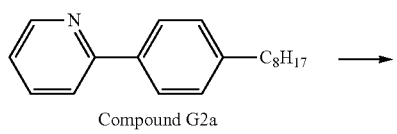

Compound G2a

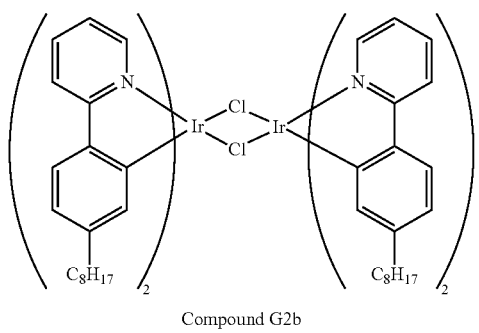

Compound G2b

-continued

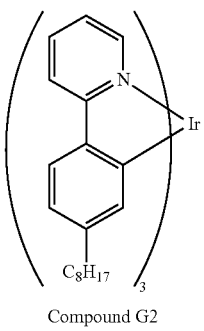

Compound G2

Into a reaction vessel were added a compound G2a (20.00 g, 74.79 mmol) synthesized according to a method described in JP-A No. 2005-99481 and iridium chloride trihydrate (11.93 g, 33.83 mmol), and the gas in the reaction vessel was purged with an argon gas. Thereafter, to this were added 2-ethoxyethanol (180 mL) and water (60 mL), the atmosphere in the reaction vessel was turned into an argon gas stream, then, the mixture was refluxed at 101 to 102° C. for 20 hours. After standing to cool, the resultant mixture was separated by filtration. The resultant residue was washed with water (400 mL), methanol (200 mL) and hexane (200 mL) in this order, then, dried, to obtain a compound G2b (22.49 g).

Into a reaction vessel were added the compound G2b (22.49 g, 14.79 mmol) and the compound G2a (19.77 g, 73.95 mmol), and the gas in the reaction vessel was purged with an argon gas. Thereafter, to this were added diglyme (128 mL) and silver trifluoromethanesulfonate (7.60 g, 29.58 mmol), and the atmosphere in the reaction vessel was turned into an argon gas stream, then, the mixture was stirred for 5 hours at 148 to 150° C. Thereafter, to this was added silver trifluoromethanesulfonate (7.60 g, 29.58 mmol), further, the mixture was stirred for 12 hours. After standing to cool, to the resultant reaction mixture was added water (600 mL), and the generated precipitate was separated by filtration. The resultant precipitate was dissolved in toluene (500 mL), then, filtrated. The resultant filtrate was dried over magnesium sulfate, then, filtrated and concentrated, to distill off the solvent. The resultant residue was dissolved in a mixed solvent composed of hexane and toluene (hexane/toluene=3/1 (by volume)), and purified by silica gel column chromatography, thereafter, the solvent was distilled off. The resultant residue was washed with methanol (200 mL), then, dried. The resultant solid was crystallized using a mixed solvent composed of toluene and acetonitrile (toluene/acetonitrile=1.0/4.8 (by volume)), and the resultant crystal was separated by filtration. The resultant solid was washed with methanol, then, dried, to obtain a compound G2 (14.30 g, 14.42 mmol).

$^1$H NMR (300 MHz, CDCl$_3$): δ (ppm)=0.88 (m, 9H), 1.22 (m, 30H), 1.44 (m, 6H), 2.35 (t, J=7.5 Hz, 6H), 6.69 (m, 6H), 6.78 (t, J=6.0 Hz, 3H), 7.47 (m, 9H), 7.77 (d, J=6.0 Hz, 3H).

LC-MS (APCI, positive) m/z: 992 ([M+H]$^+$)

The compound G2 showed an emission spectrum maximum peak wavelength of 508 nm.

Synthesis Example 13

Synthesis of Compound G3

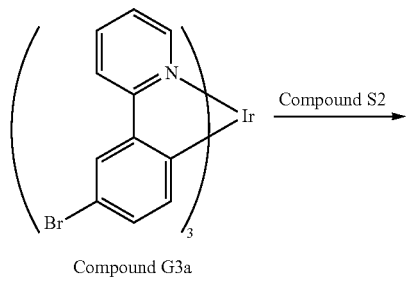

Compound G3a

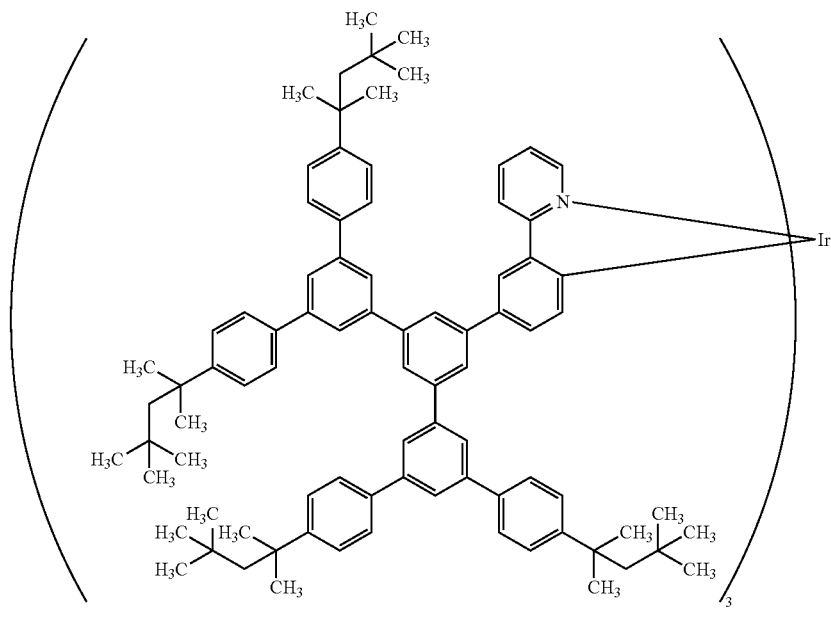

Compound G3

The atmosphere in a reaction vessel was turned into a nitrogen gas stream, then, a compound G3a (8.00 g) synthesized according to a method described in JP-A No. 2004-531485, the compound S2 (39.83 g) and tetrahydrofuran (640 mL) were added, and the mixture was bubbled with nitrogen for 20 minutes. Thereafter, to this were added a 20 wt % tetraethyl ammonium hydroxide aqueous solution (13.22 g) and tetrakis(triphenylphosphine)palladium(0) (1.244 g), and the mixture was refluxed for 41 hours. After cooling down to room temperature, to the resultant reaction solution were added water (1500 mL) and toluene (1500 mL) and the organic layer was separated, and the resultant organic layer was washed with water (1500 mL) three times. The resultant organic layer was dried over sodium sulfate, then, concentrated. The resultant residue was dissolved in a mixed solvent of toluene/hexane ((20/1 (by volume)), purified by silica gel column chromatography, and the solvent was removed under reduced pressure. The resultant residue was dissolved in toluene (350 mL), and this was heated at 50° C. Into the resultant solution, acetonitrile (700 mL) was dropped, to cause deposition of a solid. The resultant solid was filtrated, and washed with methanol (100 mL). To the resultant solid were added hexane (350 mL) and acetonitrile (350 mL), and this was refluxed for 30 minutes. After cooling down to room temperature, the resultant solid was filtrated, and washed with acetonitrile (100 mL). The resultant solid was dried under reduced pressure, to obtain a compound G3 (31.29 g) represented by the above-described formula.

$^1$H-NMR (CD$_2$Cl$_2$, 300 MHz): δ (ppm)=8.16-8.13 (m, 6H), 8.04 (m, 6H), 7.99 (m, 3H), 7.95 (s, 12H), 7.86 (m, 6H), 7.76-7.65 (m, 30H), 7.47 (d, 24H), 7.37 (d, 3H), 7.15 (d, 3H), 7.05-7.00 (m, 3H), 1.77 (s, 24H), 1.37 (s, 72H), 0.72 (s, 108H).

The compound G3 showed an emission spectrum maximum peak wavelength of 514 nm.

Synthesis Example 14

Synthesis of Compound G4

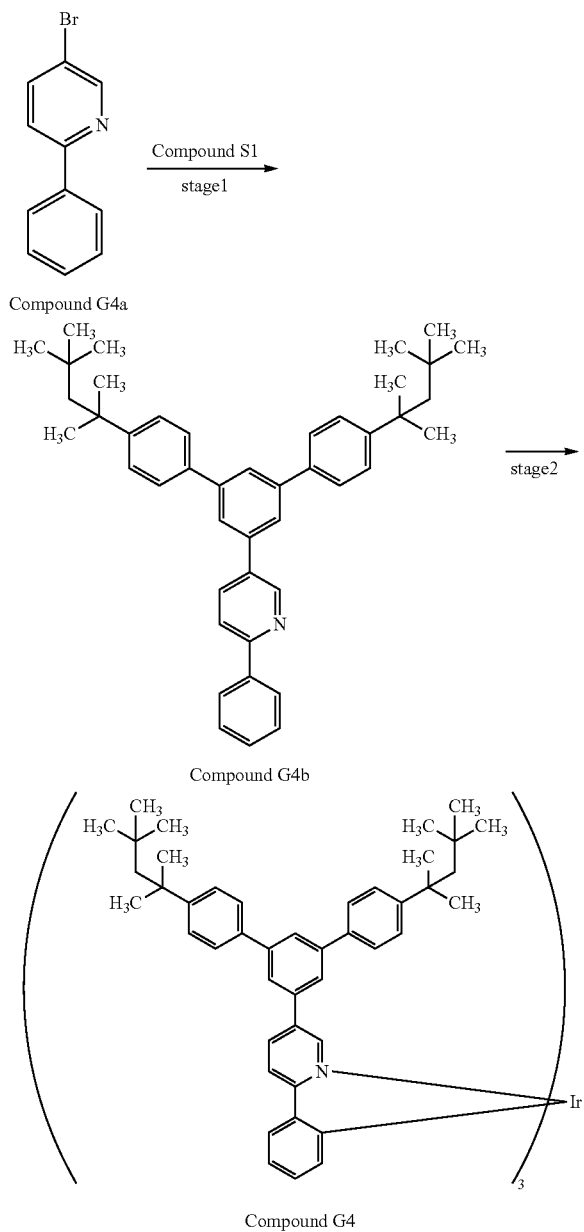

<Stage 1>

The atmosphere in a reaction vessel was turned into an argon gas atmosphere, then, a compound G4a (36.17 g) synthesized according to a method described in JP-A No. 2008-179617, the compound S1 (94.20 g), toluene (1545 mL), a 20 wt % tetraethyl ammonium hydroxide aqueous solution (341.28 g) and tetrakis(triphenylphosphine)palladium(0) (8.927 g) were added, and the mixture was stirred for 4 hours at 80° C. After cooling down to room temperature, to the resultant reaction solution was added water (1545 mL), and the organic layer was extracted. The resultant organic layer was washed with water (1545 mL) twice, and with saline (1545 mL) once. The resultant organic layer was filtrated using 188 g of silica gel. The resultant filtrate was concentrated under reduced pressure. To the resultant residue were added toluene (235 g) and methanol (1174 g), and the mixture was heated at 60° C. for 30 minutes. Thereafter, this was cooled down to 5° C. by an ice bath, to cause deposition of a solid. The resultant solid was filtrated, and washed with cold methanol. The resultant solid was dried under reduced pressure, to obtain a compound G4b (82.0 g) represented by the above-described formula.

<Stage 2>

The atmosphere in a reaction vessel was turned into a nitrogen gas atmosphere, then, iridium chloride trihydrate (11.51 g) and ion-exchange water (114 mL) were added, and these were dissolved by heating at 50° C. Into another reaction vessel having a nitrogen gas atmosphere were added the compound G4b (43.80 g), 2-ethoxyethanol (792 mL) and ion-exchange water (57 mL), and the mixture was stirred for 1 hour with heating at 100° C. Thereafter, into this solution, an iridium chloride aqueous solution (total amount) prepared previously was dropped slowly. After completion of dropping, the mixture was stirred for 15 hours at 120° C. After cooling down to room temperature, to the resultant reaction mixture was added methanol (207 g), and the mixture was filtrated. The resultant solid was washed with methanol (207 g) four times, and with hexane (115 g) once. The resultant solid was dried under reduced pressure, to obtain an intermediate G4 (42.88 g).

The atmosphere in a reaction vessel was turned into a nitrogen gas atmosphere, then, the intermediate G4 (7.61 g), the compound G4b (16.05 g), silver trifluoromethanesulfonate (1.63 g) and diethylene glycol dimethyl ether (79 mL) were added, and the mixture was stirred for 16 hours at 160° C. After cooling down to room temperature, to the resultant reaction mixture was added methanol (304 mL), and the generated precipitate was filtrated. The resultant precipitate was purified by silica gel column chromatography (a mixed solvent of hexane/toluene=4/6.5 (by volume)), and the solvent was removed under reduced pressure. The resultant residue (8.05 g) was dissolved in dichloromethane (80 mL), and to this solution was added methanol (80 mL). The generated precipitate was collected by filtration, and this was dried under reduced pressure, to obtain a compound G4 (6.25 g).

$^1$H-NMR (CD$_2$Cl$_2$, 300 MHz): δ (ppm)=8.09 (m, 3H), 8.01 (s, 6H), 7.84 (m, 3H), 7.72 (d, 3H), 7.57 (m, 6H), 7.42 (d, 12H), 7.19 (d, 12H), 7.03 (d, 3H), 6.96-6.86 (m, 6H), 1.65 (s, 12H), 1.24 (s, 36H), 0.63 (s, 54H).

The compound G4 showed an emission spectrum maximum peak wavelength of 545 nm.

Synthesis Example 15

Synthesis of Compound R1

A compound R1 was synthesized according to a method described in JP-A No. 2006-188673.

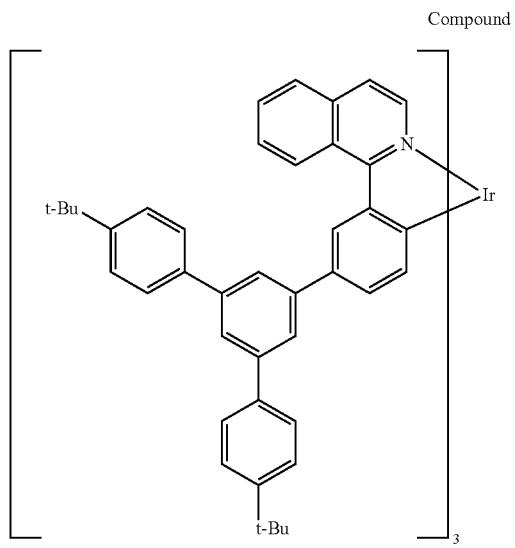

Compound R1

The compound R1 showed an emission spectrum maximum peak wavelength of 619 nm.

Synthesis Example 16

Synthesis of Compound R2

A compound R2 was synthesized according to a method described in JP-A No. 2011-105701.

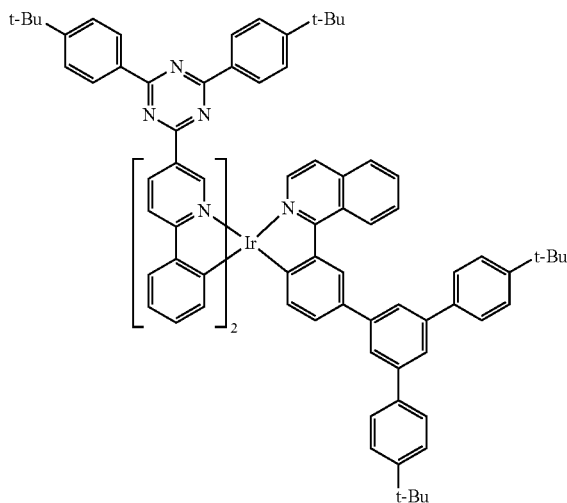

Compound R2

The compound R2 showed an emission spectrum maximum peak wavelength of 611 nm.

Synthesis Example 17

Synthesis of Compound R3

A compound R3 was synthesized according to a method described in International Publication WO 2002/44189.

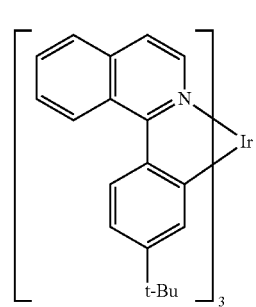

Compound R3

The compound R3 showed an emission spectrum maximum peak wavelength of 617 nm.

Synthesis Example 18

Synthesis of Compound R4

A compound R4 was synthesized according to a method described in JP-A No. 2008-179617.

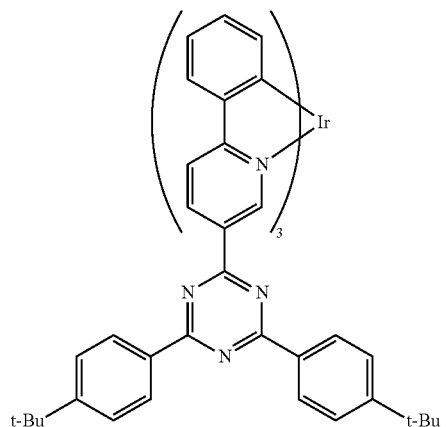

Compound R4

The compound R4 showed an emission spectrum maximum peak wavelength of 594 nm.

Synthesis Example 19
Synthesis of Compound R5
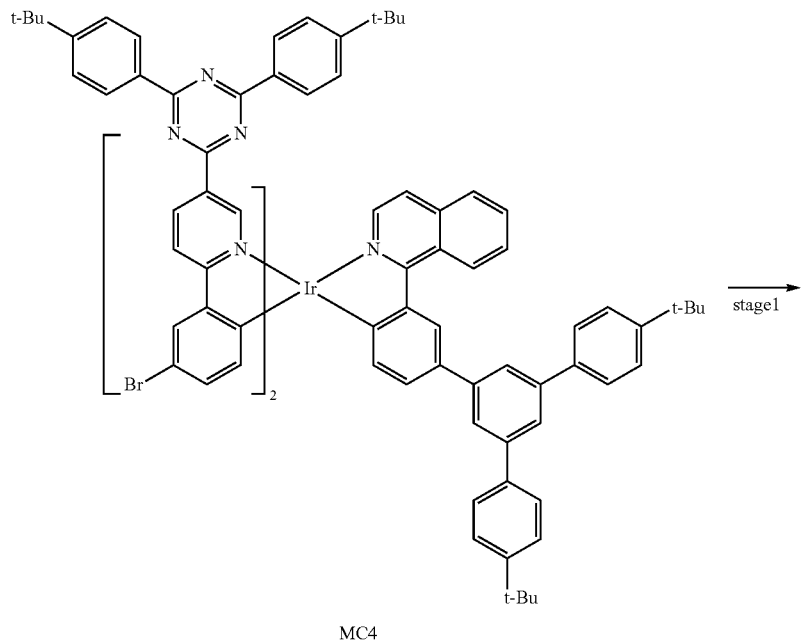
MC4
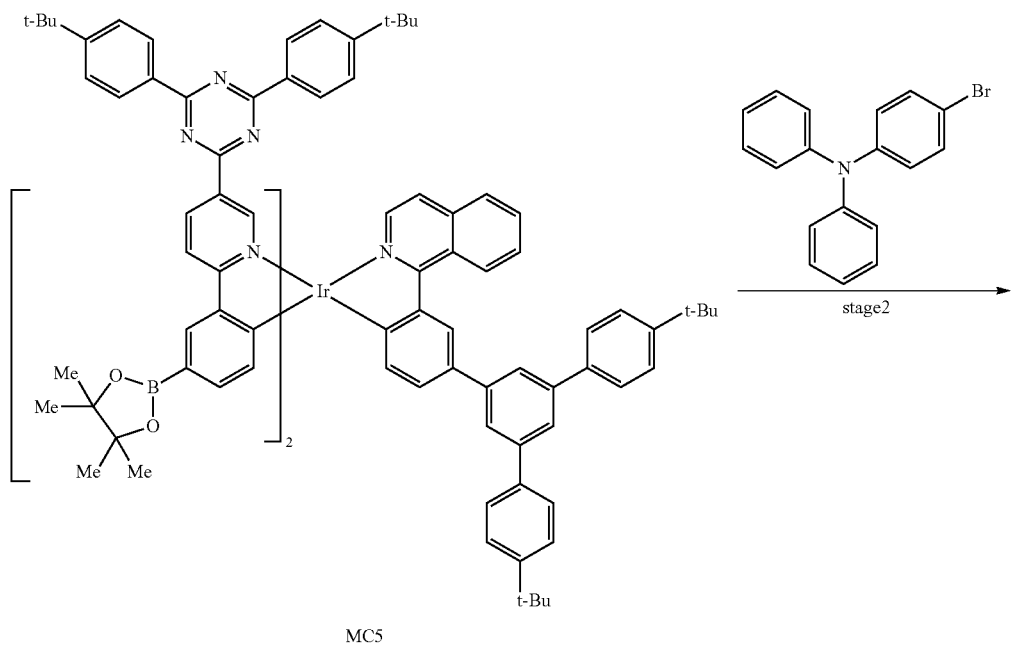
MC5

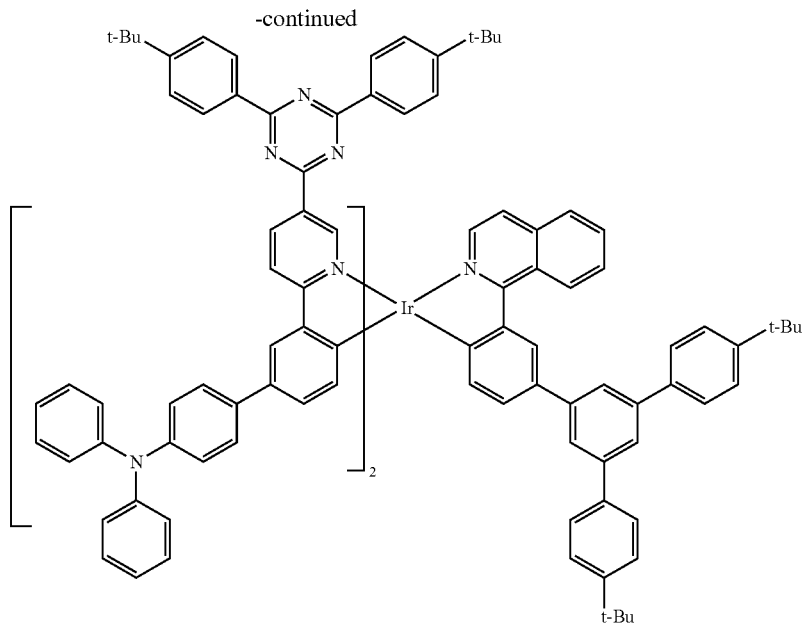

Compound R5

<Stage 1>

The atmosphere in a light-shielded reaction vessel was turned into an argon gas atmosphere, then, a compound MC4 (381 mg) synthesized according to a method described in JP-A No. 2011-105701, bis(pinacolato)diboron (157 mg, 0.62 mmol), [1,1'-bis(diphenylphosphino)ferrocene]palladium(II) dichloride dichloromethane adduct (PdCl$_2$(dppf).CH$_2$Cl$_2$, 20 mg, 0.024 mmol), potassium acetate (118 mg, 1.2 mmol) and tetrahydrofuran (13 mL) were added, and the mixture was stirred for 11 hours under reflux with heating. Thereafter, the mixture was cooled down to room temperature, toluene (10 mL) was added and the mixture was concentrated under reduced pressure to distill off the solvent, obtaining a solid. The resultant solid was purified by silica gel column chromatography (hexane/toluene), to obtain a fraction containing the intended substance. The resultant fraction was concentrated, and the resultant solid was washed with methanol, then, dried under reduced pressure at 50° C. overnight, to obtain a compound MC5 (187 mg) as a red solid. The yield was 47%. The resultant compound MC5 showed a HPLC area percentage value (detection wavelength: UV 254 nm) of 99.9% or more.

MALDI-TOF/MS (positive): m/z=1984 [M]$^+$ $^1$H-NMR (300 MHz, CDCl$_3$): δ (ppm)=9.25 (s, 1H), 9.09 (m, 3H), 8.89 (d, 1H), 8.53 (s, 1H), 8.36 (m, 5H), 8.27 (m, 7H), 7.86 (m, 1H), 7.81 (d, 1H), 7.76 (s, 2H), 7.64 (m, 7H), 7.42 (m, 13H), 7.14-7.30 (m, 4H), 7.07 (t, 2H), 1.38 (s, 18H), 1.35 (s, 30H), 1.31 (s, 12H), 1.24 (s, 18H).

<Stage 2>

The atmosphere in a light-shielded reaction vessel was turned into an argon gas atmosphere, then, the compound MC5 (140 mg), 4-bromotriphenylamine (51 mg), tetrakis(triphenylphosphine)palladium(0) (5.6 mg), tetrahydrofuran (9 mL) and a 20 wt % tetraethyl ammonium hydroxide aqueous solution (258 mg) were added, and the mixture was stirred for 8 hours under reflux with heating. Thereafter, the mixture was cooled down to room temperature, toluene (10 mL) was added and the mixture was concentrated under reduced pressure to distill off the solvent, obtaining a solid. The resultant solid was purified by silica gel column chromatography (hexane/toluene), to obtain a fraction containing the intended substance. The resultant fraction was concentrated, and the resultant solid was purified again by silica gel column chromatography (hexane/chloroform), to obtain a fraction containing the intended substance. The resultant fraction was concentrated, and the resultant solid was washed with methanol, then, dried under reduced pressure at 50° C. overnight, to obtain the intended compound R5 (130 mg) as a red solid. The yield was 84%. The resultant compound R5 showed a HPLC area percentage value (detection wavelength: UV 254 nm) of 99.0% or more.

MALDI-TOF/MS (positive): m/z=2219 [M]$^+$ $^1$H-NMR (600 MHz, THF-d$_8$): δ (ppm)=9.49 (s, 1H), 9.33 (s, 1H), 9.26 (d, 1H), 9.23 (m, 1H), 9.03 (d, 1H), 8.70 (s, 1H), 8.60 (d, 1H), 8.56 (d, 1H), 8.43 (d, 4H), 8.39 (d, 4H), 8.22 (s, 1H), 8.19 (s, 1H), 8.08 (m, 1H), 8.07 (d, 1H), 7.85 (s, 2H), 7.73 (m, 3H), 7.69 (d, 1H), 7.66 (d, 4H), 7.60 (d, 2H), 7.58 (d, 2H), 7.51 (m, 8H), 7.47 (d, 4H), 7.32 (d, 1H), 7.24 (m, 10H), 7.15 (m, 3H), 7.09 (m, 12H), 6.98 (m, 4H), 1.42 (s, 18H), 1.36 (s, 18H), 1.27 (s, 18H)

The compound R5 showed an emission spectrum maximum peak wavelength of 615 nm.

Synthesis Example 20

Synthesis of Compound MC2

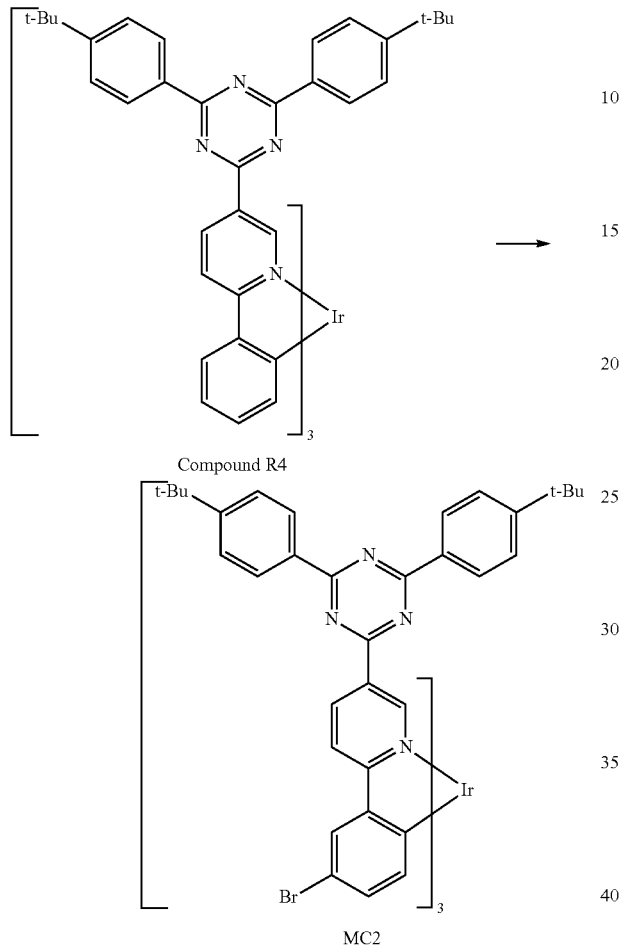

Compound R4

MC2

The atmosphere in a light-shielded reaction vessel was turned into a nitrogen gas atmosphere, then, a compound R4 (38 g) synthesized according to a method described in JP-A No. 2008-179617, N-bromosuccinimide (12.1 g) and chloroform (1800 mL) were added, and the mixture was stirred for 24 hours at room temperature. The resultant reaction mixture was allowed to pass through a filtering apparatus paved with silica gel, to remove solid components. The resultant filtrate was concentrated under reduced pressure to distill off the solvent, obtaining a solid. The resultant solid was purified by silica gel column chromatography (chloroform/hexane=1/3), to obtain a fraction containing the intended substance. The resultant fraction was concentrated, and purified by performing recrystallization (dichloromethane/hexane) three times, and dried under reduced pressure at 50° C. overnight, to obtain a compound MC2 (22.1 g) as a red solid. The yield was 51%. The resultant compound MC2 showed a HPLC area percentage value (detection wavelength: UV 254 nm) of 99.4%.

LC/MS (APCI-posi): m/z=1920 [M+H]$^+$ $^1$H-NMR (300 MHz/CD$_2$Cl$_2$): δ (ppm=) 9.31 (d, 3H), 9.26 (dd, 3H), 8.38 (d, 12H), 8.22 (d, 3H), 7.96 (d, 3H), 7.43 (d, 12H), 7.00 (dd, 3H), 6.82 (d, 3H), 1.23 (s, 54H).

Synthesis Example 21

Synthesis of Compound R6

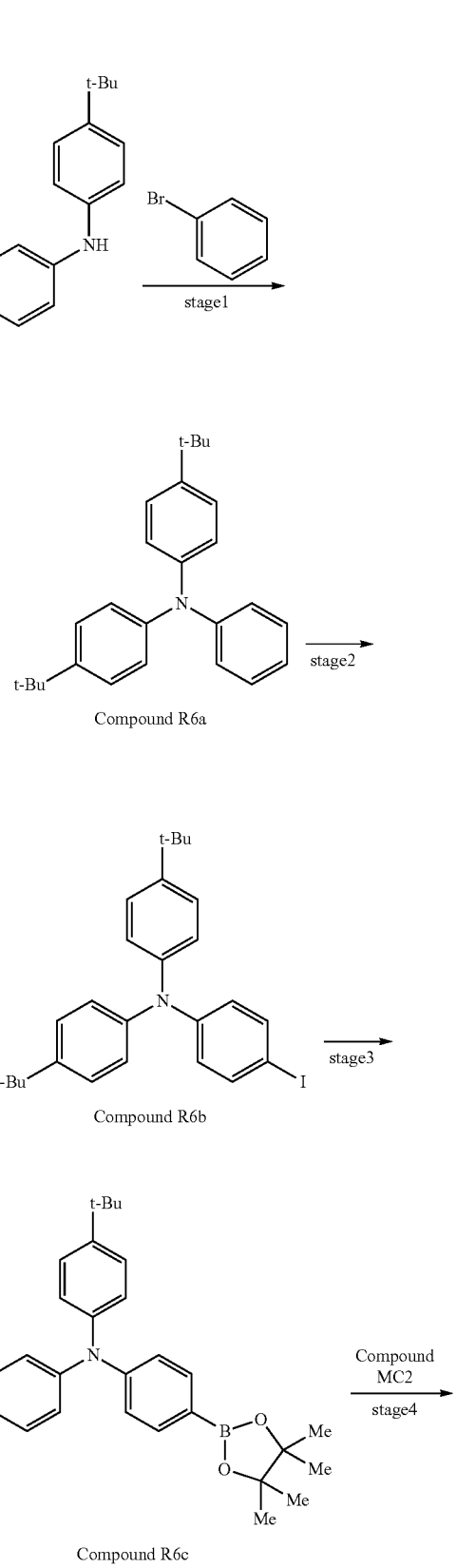

Compound R6a

Compound R6b

Compound R6c

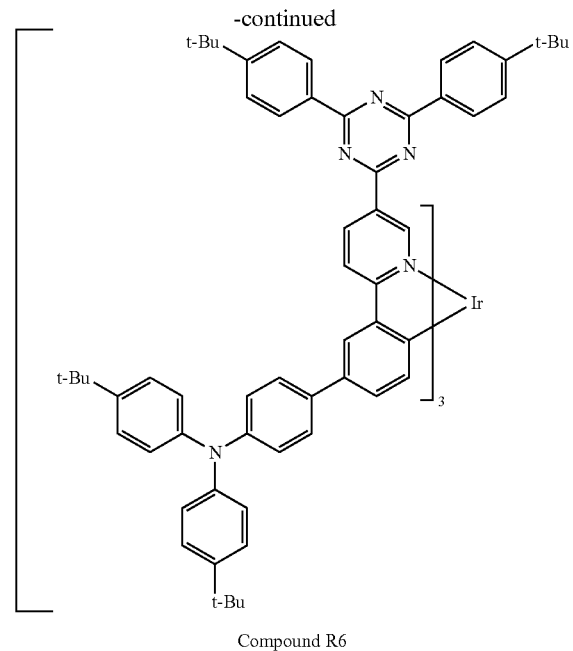

Compound R6

<Stage 1>

The atmosphere in a reaction vessel was turned into an argon gas atmosphere, then, bis(4-tert-butylphenyl)amine (98.5 g), tris(dibenzylideneacetone)dipalladium(0) (3.21 g), tri-tert-butylphosphine tetrafluoroborate salt (4.06 g), sodium-tert-butoxide (67.3 g) and toluene (665 mL) were added, and the mixture was heated at 80° C. while stirring. Thereafter, into this, bromobenzene (57.1 g) dissolved in toluene (55 mL) was dropped, and the mixture was stirred for 4 hours at 85° C. The resultant reaction mixture was diluted with toluene (680 mL), then, hot-filtrated, to remove a solid. To the resultant filtrate were added activated white earth (35 g) and activated alumina (35 g), and the mixture was stirred for 15 hours at 90° C., then, hot-filtrated, to remove a solid. The resultant filtrate was concentrated under reduced pressure, to remove the solvent, obtaining a solid. The resultant solid was purified by performing recrystallization (hexane/ethanol) twice, and dried under reduced pressure at 50° C. overnight, to obtain the intended compound R6a (99 g) as a solid. The yield was 79%. The resultant compound R6a showed a HPLC area percentage value (detection wavelength: UV 254 nm) of 99.9% or more.

<Stage 2>

The atmosphere in a light-shielded reaction vessel was turned into an argon gas atmosphere, then, the compound R6a (71.5 g), N-iodosuccinimide (49.5 g) and N,N-dimethylformamide (800 mL) were added, and the mixture was heated at 30° C. while stirring. Thereafter, into this, trifluoroacetic acid (11.4 g) was dropped, and the mixture was stirred for 4 hours at 50° C. Thereafter, the mixture was cooled using an ice bath, and ion-exchange water (800 mL) and a 10 wt % sodium chloride aqueous solution (200 mL) were dropped, to obtain a solid. The resultant solid was dissolved in toluene (1 L), then, the solution was washed twice using ion-exchange water (800 mL), to obtain an organic layer. The resultant organic layer was dried over anhydrous sodium sulfate, then, concentrated under reduced pressure to distill off the solvent, obtaining a solid. The resultant solid was dried under reduced pressure at 50° C. overnight, then, purified by performing recrystallization (chloroform/methanol), and dried under reduced pressure at 50° C. overnight, to obtain the intended compound R6b (84 g) as a solid. The yield was 87%. The resultant compound R6b showed a HPLC area percentage value (detection wavelength: UV 254 nm) of 99.4%.

<Stage 3>

The atmosphere in a light-shielded reaction vessel was turned into a nitrogen gas atmosphere, then, the compound R6b (7.5 g) and tetrahydrofuran (80 mL) were added. Thereafter, into this, isopropylmagnesium chloride (2 mol/L, 15 mL) dissolved in tetrahydrofuran was dropped, and the mixture was stirred for 1 hour at room temperature. Thereafter, the mixture was cooled using an ice bath, and 2-isopropoxy-4,4,5,5-tetramethyl-1,3,2-dioxaborolane (6.4 mL) was added, and the mixture was stirred for 5 minutes. Thereafter, the ice bath was removed, and the mixture was stirred for 3 hours while raising temperature slowly up to room temperature. Thereafter, the mixture was cooled again using an ice bath, then, the mixture was extracted using a mixed solvent of ethyl acetate (90 mL) and toluene (30 mL), and the resultant organic layer was washed with 15 wt % saline (50 mL) twice, to obtain an organic layer. The resultant organic layer was dried over anhydrous sodium sulfate, then, concentrated under reduced pressure to distill off the solvent, obtaining a solid. The resultant solid was purified by performing recrystallization (chloroform/methanol) twice, and dried under reduced pressure at 50° C. overnight, to obtain the intended compound R6c (5.5 g) as a white solid. The yield was 74%. The resultant compound R6c showed a HPLC area percentage value (detection wavelength: UV 254 nm) of 99.5% or more.

TLC/MS (DART positive): m/z=484 [M+H]$^+$

<Stage 4>

The atmosphere in a light-shielded reaction vessel was turned into a nitrogen gas atmosphere, then, the compound MC2 (5.0 g), the compound R6c (4.4 g), tetrakis(triphenylphosphine)palladium(0) (360 mg), a 20 wt % tetraethyl ammonium hydroxide aqueous solution (20 mL) and tetrahydrofuran (210 mL) were added, and the mixture was stirred for 24 hours under reflux with heating. Thereafter, the mixture was cooled down to room temperature, and toluene (400 mL) and ion-exchange water (400 mL) were added and extraction was performed, to obtain an organic layer. The resultant organic layer was washed with ion-exchange water twice, and with 5 wt % saline once, to obtain an organic layer. The resultant organic layer was dried over anhydrous sodium sulfate, then, concentrated under reduced pressure to distill off the solvent, obtaining a solid. The resultant solid was purified by performing recrystallization (toluene/isopropanol), and dried under reduced pressure at 50° C. overnight, to obtain a compound R6 (3.9 g) as a red solid. The yield was 55%. The resultant compound R6 showed a HPLC area percentage value (detection wavelength: UV 254 nm) of 99.5% or more.

$^1$H-NMR (300 MHz/CD$_2$Cl$_2$): δ (ppm)=9.41 (d, 3H), 9.21 (dd, 3H), 8.39 (d, 12H), 8.26 (d, 3H), 7.96 (s, 3H), 7.45 to 7.38 (m, 18H), 7.27 (dd, 12H), 7.23 to 7.16 (m, 6H), 6.96 (d, 18H), 1.30 (s, 54H), 1.22 (s, 54H).

LC/MS (APCI positive): m/z=2751 [M+H]$^+$

The compound R6 showed an emission spectrum maximum peak wavelength of 619 nm.

Synthesis Example 22

Synthesis of Compound M1

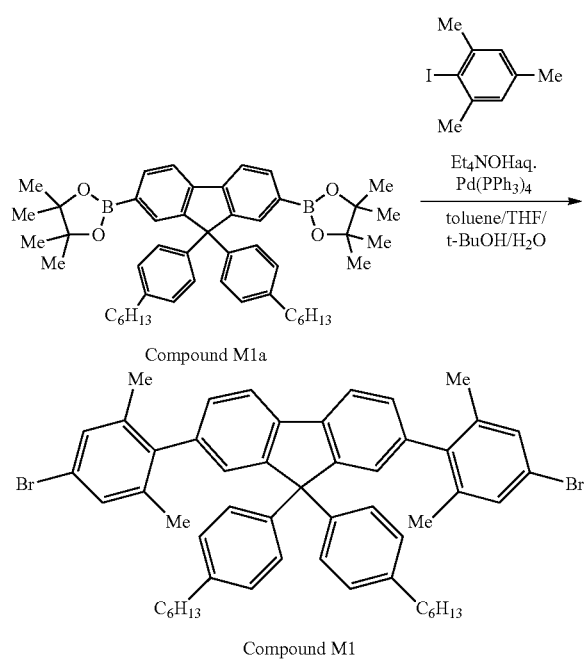

Compound M1a

Compound M1

Into a 300 mL three-necked flask were added a compound M1a (7.4 g, 10 mmol) synthesized according to a method described in International Publication WO 2012/086671, 2-iodo-5-bromom-xylene (9.3 g, 30 mmol) and tetrakistriphenylphosphinepalladium(0) (0.23 g, 0.04 mmol), and the gas in the three-necked flask was purged with an argon gas. Thereafter, toluene (60 mL), tetrahydrofuran (30 mL), tert-butanol (40 mL) and ion-exchange water (20 mL) which had been each previously bubbled with an argon gas for 10 minutes to remove dissolved oxygen were added at room temperature, thereafter, a 20 wt % tetraethyl ammonium hydroxide aqueous solution (30 g, 8 mmol) was further added, and the mixture was stirred for 12 hours at 50° C. To the resultant reaction solution were added ion-exchange water and toluene, and the mixture was stirred, allowed to stand still, then, separated. The resultant organic layer was dried over anhydrous sodium sulfate, and an inorganic salt was separated by filtration. The solvent was distilled off from the resultant filtrate under reduced pressure, then, acetonitrile was added, and the mixture was stirred for 30 minutes at 70° C., cooled down to room temperature, and the deposited solid was taken out by filtration. The resultant solid was purified by medium-pressure silica gel column chromatography (hexane/chloroform=15/1 (v/v (denoting volume ratio, the same shall apply hereinafter))), and further purified by recrystallization (chloroform/acetonitrile=4/7 (v/v)), and dried under reduced pressure, to obtain the intended compound M1 (4.72 g) as a white solid. The yield was 55%. The resultant compound M1 showed a HPLC area percentage value of 99.99% or more.

$^1$H-NMR (300 MHz, CDCl$_3$): δ (ppm)=7.82 (d, 2H), 7.23 (m, 4H), 7.17 (s, 2H), 7.12-7.07 (m, 6H), 6.99-6.95 (m, 4H), 2.52 (t, 4H), 1.95 (s, 12H), 1.59-1.45 (m, 4H), 1.32-1.18 (m, 12H), 0.85 (t, 6H).

LC/MS (ESI-MS (posi)): 850 [M]$^+$

Synthesis Example 23

Synthesis of Compound M2

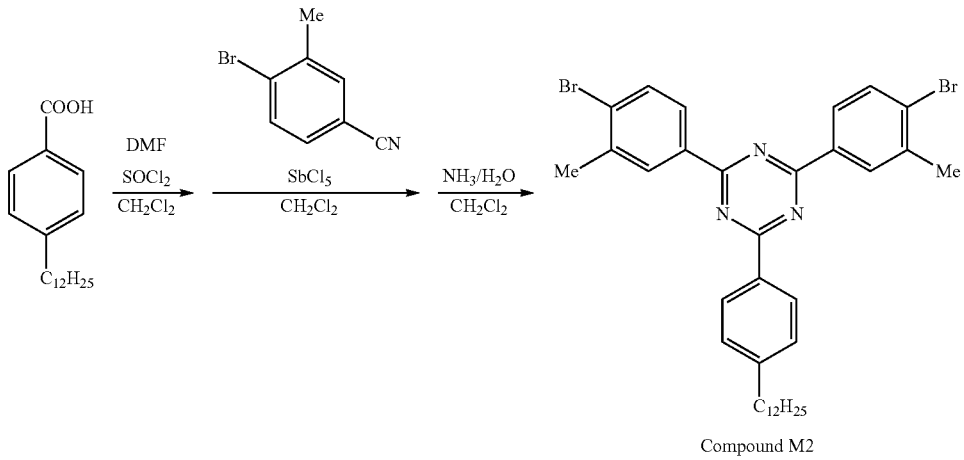

Compound M2

The gas in a reaction vessel was purged with an argon gas, then, 4-dodecylbenzoic acid (14.52 g), dichloromethane (90 mL), thionyl chloride (6.00 g) and N,N'-dimethylformamide (about 60 mg) were stirred for 1 hour under reflux with heating, then, Molecular Sieves 3A (manufactured by Wako Pure Chemical Industries, Ltd., 30 g) was added, and the mixture was cooled down to 0° C. by an ice bath. Thereafter, antimony pentachloride (14.7 g) was dropped over a period of 10 minutes, and the mixture was stirred for 1 hour at 0° C. Thereafter, 4-bromo-3-methylbenzonitrile (19.6 g, 100 mmol) dissolved in dichloromethane (60 mL) was dropped at the same temperature over a period of 1 hour. Thereafter, the mixture was stirred for 30 minutes at room temperature, and stirred for 2 hours under reflux with heating. Thereafter, the mixture was cooled down to −15° C., and a 25 wt % ammonia aqueous solution (22 g) was dropped. Thereafter, the mixture was stirred for 1 hour at room temperature, and allowed to stand still at room temperature. Thereafter, chloroform (500 mL) was added, and the mixture was stirred for 1 hour while heating at 45° C., then, solid components were removed by hot filtration, and the resultant filtrate was washed with ion-exchange water (200 mL) four times, dried over anhydrous sodium sulfate, and the resultant solid was separated by filtration, then, the resultant solid was concentrated under reduced pressure, to obtain an orange oily substance. The resultant orange oily substance was purified by conducting recrystallization (chloroform/ethanol), medium-pressure silica gel column chromatography (hexane/chloroform=96/4 (v/v)), recrystallization (chloroform/hexane), recrystallization (ethyl acetate) and recrystallization (chloroform/hexane, carried out twice) in series, and the resultant solid was dried under reduced pressure, to obtain the intended compound M2 (8.42 g) as a white solid. The resultant compound showed a HPLC area percentage value of 99.6% or more.

$^1$H-NMR (300 MHz, THF-ds): δ (ppm)=8.63 (d, 4H), 8.43 (d, 2H), 7.73 (d, 2H), 7.40 (d, 2H), 2.76 (t, 2H), 2.55 (s, 6H), 1.71 (m, 2H), 1.31 (m, 18H), 0.90 (t, 3H).

$^{13}$C-NMR (75 MHz, THF-de): δ (ppm)=173.7, 172.9, 150.3, 140.2, 137.6, 135.5, 134.6, 132.9, 131.7, 131.0, 130.7, 129.8, 38.0, 34.0, 33.3, 31.8, 31.74, 31.72, 31.71, 31.6, 31.43, 31.41, 24.7, 24.3, 15.6.

Synthesis Example 24

Synthesis of Compound M3

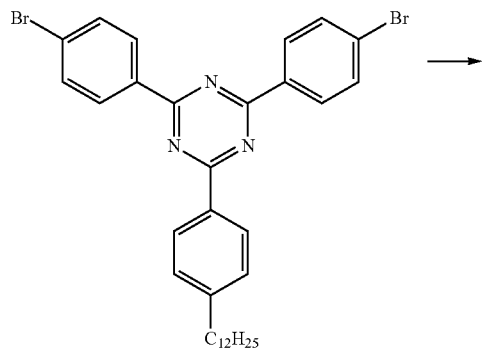

Compound M3a

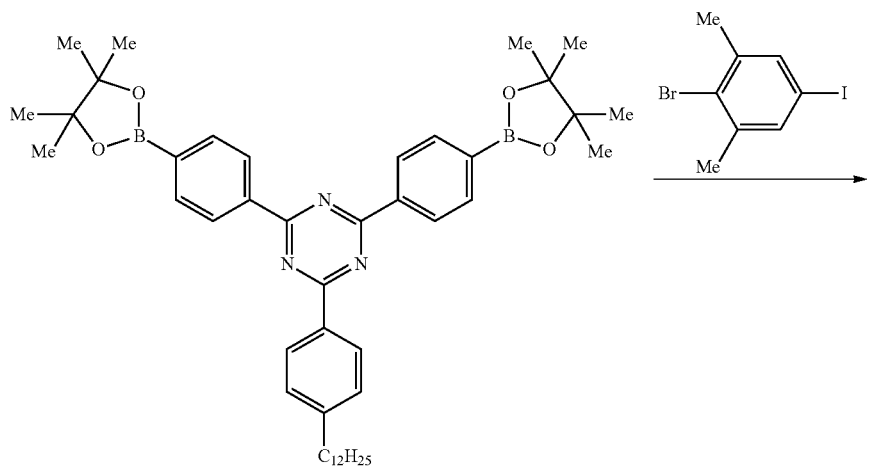

Compound M3b

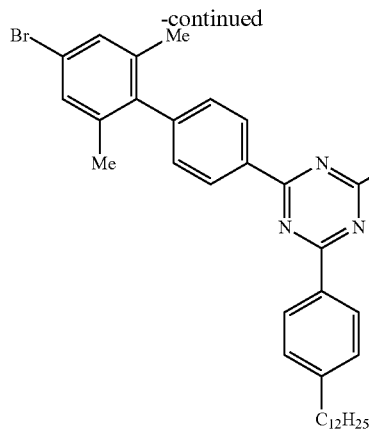

Compound M3

The gas in a reaction vessel was turned into an argon gas atmosphere, then, a mixture of a compound M3a (41.77 g, 120 mmol) synthesized according to a method described in JP-A No. 2010-189630, bis(pinacol)diboron (91.9 g, 362 mmol), [1,1'-bis(diphenylphosphino)ferrocene]dichloropalladium(II)-dichloromethane complex (1:1) (Pd(dppf)Cl$_2$.CH$_2$Cl$_2$, CAS number 95464-05-4, manufactured by Sigma-Aldrich Co. LLC, 5.096 g, 6.24 mmol), potassium acetate (70.67 g, 720 mmol) and 1,4-dioxane (commercially available dehydrated product, 500 mL) was stirred for about 8 hours while heating by an oil bath of 80° C., then, the mixture was diluted with toluene (500 mL) and allowed to pass through Celite and a silica gel pad to remove insoluble materials, then, the solvent was distilled off, to obtain a solid. To the resultant solid was added methanol (750 mL), and the mixture was thoroughly stirred, then, a solid was taken out by filtration, and dried under reduced pressure, to obtain a solid (57 g). The resultant solid was dissolved in hexane, activated carbon was added, and the mixture was stirred for 1 hour while heating in a 60° C. oil bath, then, insoluble materials were removed by filtration through Celite, then, the solvent was distilled off, to obtain a white solid. To the resultant solid was added methanol (750 mL), and the mixture was stirred for 1 hour while heating at 50° C., then, cooled down to room temperature, then, the deposited solid was taken out by filtration, and dried under reduced pressure, to obtain a compound M3b (40.59 g). Yield: 76%. The resultant compound M3b showed a HPLC area percentage value (UV 254 nm) of 99.9% or more.

$^1$H-NMR (300 MHz, CDCl$_3$): δ (ppm)=8.75 (d, 4H), 8.68 (d, 2H), 8.06 (d, 4H), 7.39 (d, 2H), 2.73 (t, 2H), 1.71-1.60 (m, 2H), 1.50-1.20 (m, 42H), 0.88 (t, 3H).

TLC/MS (DART, posi): [M+H]$^+$=730.49

The gas in a reaction vessel was turned into an argon gas atmosphere, then, a mixture of the compound M3b (25.54 g, 35 mmol), 5-iodo-2-bromo-m-xylene (32.65 g, 105 mmol), toluene (210 mL), tert-butanol (140 mL), tetrahydrofuran (105 mL), ion-exchange water (70 mL), a 20 wt % tetraethyl ammonium hydroxide aqueous solution (103.1 g, 140 mmol) and tetrakis(triphenylphosphine)palladium(0) (2.45 g, 2.12 mmol) was stirred for 40 hours while heating in an oil bath set at 40° C., then, cooled down to room temperature, and toluene (140 mL) and ion-exchange water (140 mL) were added, and an organic layer was obtained by liquid separation. The resultant organic layer was washed with 5 wt % saline, then, dried over anhydrous magnesium sulfate, and the resultant solid was removed by filtration, then, concentrated under reduced pressure to distill off the solvent, obtaining a brown oily substance (37 g). The resultant brown oily substance was diluted with toluene, then, allowed to pass through a silica gel short column, and concentrated under reduced pressure to distill off the solvent, obtaining a yellow oily substance. The resultant yellow oily substance was purified by medium-pressure silica gel column chromatography (hexane), and a fraction containing the intended substance was concentrated under reduced pressure, then, purified by recrystallization (a mixed solvent of toluene and methanol), and the resultant solid was dried under reduced pressure, to obtain a compound M3 (6.15 g). The yield was 21%. The resultant compound M3 showed a HPLC area percentage value of 99.9% or more.

$^1$H-NMR (300 MHz, CD$_2$Cl$_2$): δ (ppm)=8.86 (d, J=8.3 Hz, 4H), 8.72 (d, J=8.3 Hz, 2H), 7.43 (d, J=8.3 Hz, 2H), 7.37 (d, J=8.3 Hz, 4H), 7.32 (s, 4H), 2.75 (t, J=7.7 Hz, 2H), 2.07 (s, 12H), 1.75-1.66 (mult, 2H), 1.42-1.22 (mult, 18H), 0.88 (t, J=6.6 Hz, 3H).

TLC/MS (DART, posi): [M+H]$^+$=842.27

Synthesis Example 25

Synthesis of Polymer Compound HTL-1

A polymer compound HTL-1 was synthesized according to a method described in International Publication WO 2011/049241 using a compound M4 synthesized according to a method described in International Publication WO 2002/045184, a compound M5 synthesized according to a method described in International Publication WO 2002/045184 and a compound M6 synthesized according to a method described in International Publication WO 2011/049241.

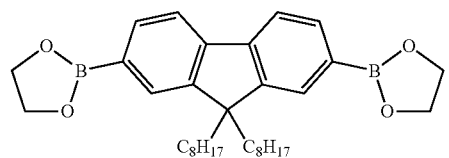

Compound M4

Compound M5

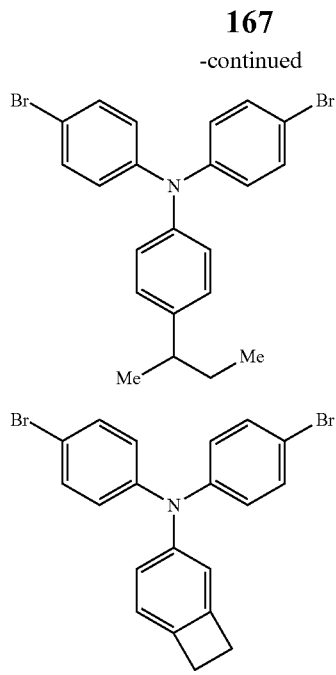

Compound M6

The polystyrene-equivalent number average molecular weight and weight average molecular weight of the polymer compound HTL-1 were Mn=8.9×10$^4$ and Mw=4.2×10$^5$, respectively.

The polymer compound HTL-1 is a copolymer constituted of a constituent unit derived from the compound M4, a constituent unit derived from the compound M5 and a constituent unit derived from the compound M6 at a molar ratio of 50:42.5:7.5 according to the theoretical values calculated from the amounts of the charged raw materials.

Synthesis Example 26

Synthesis of Polymer Compound HTL-2

A polymer compound HTL-2 was synthesized according to a method described in JP-A No. 2011-174062 using a compound M7 synthesized according to a method described in JP-A No. 2011-174062, a compound M8 synthesized according to a method described in International Publication WO 2002/045184, a compound M9 synthesized according to a method described in International Publication WO 2005/049546 and a compound M10 synthesized according to a method described in JP-A No. 2008-106241.

Compound M7

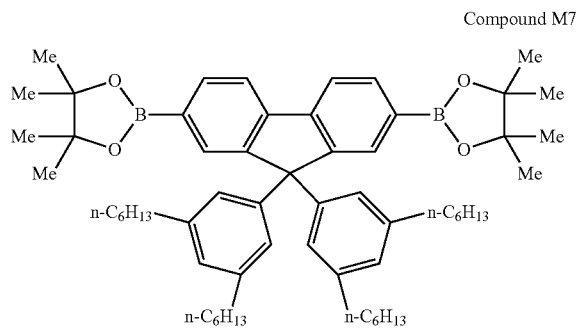

Compound M8

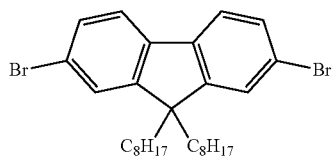

Compound M9

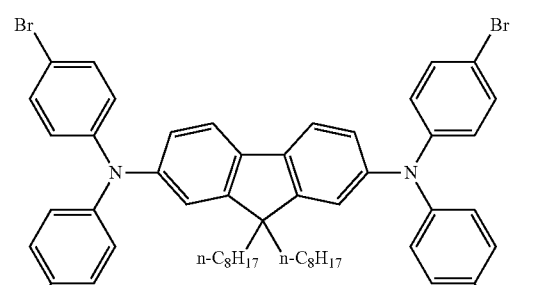

Compound M10

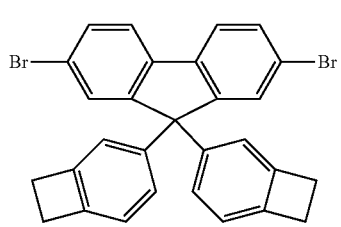

The polystyrene-equivalent number average molecular weight and weight average molecular weight of the polymer compound HTL-2 were Mn=7.8×10$^4$ and Mw=2.6×10$^5$, respectively.

The polymer compound HTL-2 is a copolymer constituted of a constituent unit derived from the compound M7, a constituent unit derived from the compound M8, a constituent unit derived from the compound M9 and a constituent unit derived from the compound M10 at a molar ratio of 50:12.5:30:7.5 according to the theoretical values calculated from the amounts of the charged raw materials.

Synthesis Example 27

Synthesis of Polymer Compound HP-1

The atmosphere in a reaction vessel was turned into a nitrogen gas atmosphere, then, a mixture of a compound M11 (2.4290 g) synthesized according to a method described in JP-A No. 2010-189630, the compound M1 (2.4940 g), the compound M2 (1.2936 g) and toluene (94 mL) was heated at about 80° C., then, bis[tris(2-methoxyphenyl)phosphine]palladium dichloride (8.56 mg) and a 20 wt % tetraethyl ammonium hydroxide aqueous solution (17.2 g) were added, and the mixture was stirred for about 9 hours under argon reflux.

Compound M11

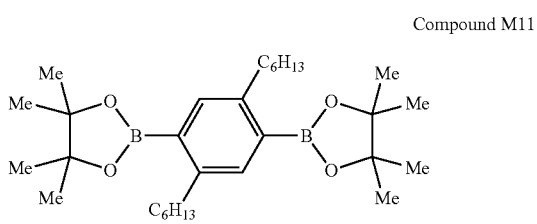

Thereafter, phenylboronic acid (0.1201 g), bis[tris(2-methoxyphenyl)phosphine]palladium dichloride (4.30 mg) and a 20 wt % tetraethyl ammonium hydroxide aqueous solution (17.2 g) were added, and further, the mixture was stirred for about 14 hours under argon reflux. Thereafter, a solution prepared by dissolving sodium N,N-diethyldithiocarbamate trihydrate (1.37 g) in ion-exchange water (26 mL) was added, and the mixture was stirred for about 2 hours while heating at 85° C. The resultant organic layer was washed with 3.6 wt % hydrochloric acid twice, with 2.5 wt % ammonia water twice, and with ion-exchange water six times in series. The resultant organic layer was dropped into methanol to cause generation of a precipitate which was then collected by filtration and dried, to obtain a solid. The resultant solid was dissolved in toluene, and the solution was allowed to pass through a silica gel column and an alumina column through which toluene had previously passed. The resultant solution was dropped into methanol to cause precipitation, and the precipitate was collected by filtration and dried, to obtain a polymer compound HP-1 (3.769 g). The polystyrene-equivalent number average molecular weight and weight average molecular weight of the polymer compound HP-1 were Mn=8.2×10$^4$ and Mw=2.4×10$^5$.

The polymer compound HP-1 is a copolymer constituted of a constituent unit derived from the compound M11, a constituent unit derived from the compound M1 and a constituent unit derived from the compound M2 at a molar ratio of 50:30:20 according to the theoretical values calculated from the amounts of the charged raw materials.

Synthesis Example 28

Synthesis of Polymer Compound HP-2

The atmosphere in a reaction vessel was turned into a nitrogen gas atmosphere, then, a mixture of the compound M11 (1.9934 g), the compound M1 (1.7739 g), the compound M3 (1.6200 g) and toluene (84 mL) was heated at about 80° C., then, bis[tris(2-methoxyphenyl)phosphine] palladium dichloride (7.11 mg) and a 20 wt % tetraethyl ammonium hydroxide aqueous solution (14.1 g) were added, and the mixture was stirred for about 4 hours under argon reflux. Thereafter, phenylboronic acid (0.0985 g), bis[tris(2-methoxyphenyl)phosphine]palladium dichloride (3.52 mg) and a 20 wt % tetraethyl ammonium hydroxide aqueous solution (14.1 g) were added, and further, the mixture was stirred for about 19 hours under argon reflux. Thereafter, a solution prepared by dissolving sodium N,N-diethyldithiocarbamate trihydrate (1.13 g) in ion-exchange water (21 mL) was added, and the mixture was stirred for about 2 hours while heating at 85° C. The resultant organic layer was washed with 3.6 wt % hydrochloric acid twice, with 2.5 wt % ammonia water twice, and with ion-exchange water six times in series. The resultant organic layer was dropped into methanol to cause generation of a precipitate which was then collected by filtration and dried, to obtain a solid. The resultant solid was dissolved in toluene, and the solution was allowed to pass through a silica gel column and an alumina column through which toluene had previously passed. The resultant solution was dropped into methanol to cause precipitation, and the precipitate was collected by filtration and dried, to obtain a polymer compound HP-2 (3.210 g). The polystyrene-equivalent number average molecular weight and weight average molecular weight of the polymer compound HP-2 were Mn=9.8×10$^4$ and Mw=2.7×10$^5$.

The polymer compound HP-2 is a copolymer constituted of a constituent unit derived from the compound M11, a constituent unit derived from the compound M1 and a constituent unit derived from the compound M3 at a molar ratio of 50:26:24 according to the theoretical values calculated from the amounts of the charged raw materials.

Synthesis Example 29

Synthesis of Polymer Compound ETL-1

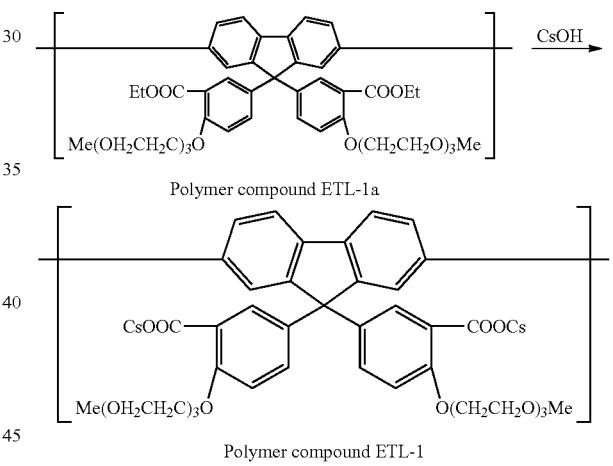

Polymer compound ETL-1a

Polymer compound ETL-1

(Synthesis of Polymer Compound ETL-1a)

A polymer compound ETL-1a was synthesized according to a method described in JP-A No. 2012-33845 using a compound M12 and a compound M13 synthesized according to a method described in the same publication.

Compound M12

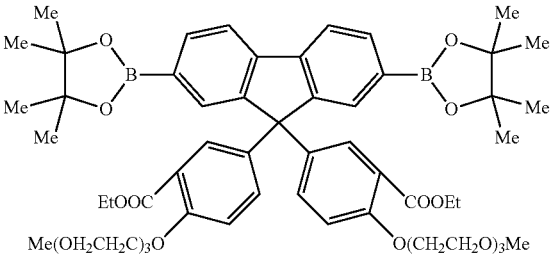

Compound M13

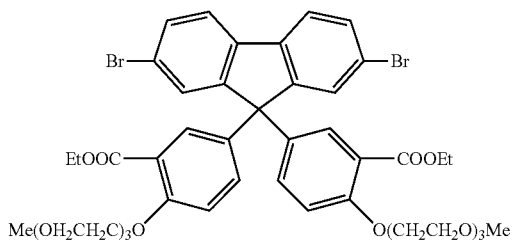

The polymer compound ETL-1a had a molecular weight Mn of $5.2 \times 10^4$.

The polymer compound ETL-1a is a copolymer constituted of a constituent unit derived from the compound M12 and a constituent unit derived from the compound M13 at a molar ratio of 50:50 according to the theoretical values calculated from the amounts of the charged raw materials.
(Synthesis of Polymer Compound ETL-1)

The atmosphere in a reaction vessel was turned into an inert gas atmosphere, then, the polymer compound ETL-1a (200 mg), tetrahydrofuran (20 mL) and ethanol (20 mL) were added, and the mixture was heated at 55° C. Cesium hydroxide (200 mg) dissolved in water (2 mL) was added into this, and the mixture was stirred for 6 hours at 55° C. Thereafter, the mixture was cooled down to room temperature, then, concentrated under reduced pressure, to obtain a solid. The resultant solid was washed with water, then, dried under reduced pressure, to obtain a polymer compound ETL-1 (150 mg, pale yellow solid). According to the NMR spectrum of the resultant polymer compound ETL-1, it was confirmed that a signal ascribable to an ethyl group of an ethyl ester portion of the polymer compound ETL-1a had completely disappeared.

Example D1

Fabrication and Evaluation of Light Emitting Device D1

(Fabrication of Light Emitting Device D1)
(Formation of Anode and Hole Injection Layer)

A glass substrate was attached with an ITO film with a thickness of 45 nm by a sputtering method, to form an anode. On the anode, a polythiophene-sulfonic acid type hole injection agent AQ-1200 (manufactured by Plextronics) was spin-coated to form a film at a thickness of 50 nm, which was then heated on a hot plate at 170° C. for 15 minutes under an air atmosphere, to form a hole injection layer.
(Formation of Hole Transporting Layer)

The polymer compound HTL-1 was dissolved in xylene at a concentration of 0.6 wt %. Using the resultant xylene solution, a film was formed at a thickness of 20 nm on the hole injection layer by a spin coat method, and under a nitrogen gas atmosphere, the formed film was heated at 180° C. for 60 minutes on a hot plate, to form a hole transporting layer.
(Formation of Light Emitting Layer)

The polymer compound HP-1, the compound B1 and the compound R1 (polymer compound HP-1/compound B1/compound R1=59.6 wt %/40 wt %/0.4 wt %) were dissolved in xylene at a concentration of 1.2 wt %. Using the resultant xylene solution, a film was formed at a thickness of 60 nm on the hole transporting layer by a spin coat method, and under a nitrogen gas atmosphere, the formed film was heated at 130° C. for 10 minutes, to a form light emitting layer.
(Formation of Cathode)

A substrate carrying a light emitting layer formed thereon was placed in a vapor deposition machine, the pressure was reduced to $1.0 \times 10^{-4}$ Pa or lower, then, as a cathode, sodium fluoride was vapor-deposited at a thickness of about 4 nm on the light emitting layer, then, aluminum was vapor-deposited at a thickness of about 80 nm on the sodium fluoride layer. After vapor deposition, sealing with a glass substrate was performed to fabricate a light emitting device D1.
(Evaluation of Light Emitting Device)

Voltage was applied to the light emitting device D1, to observe EL light emission. The current value was set at 0.25 mA, then, the device was driven at constant current and the required time until the emission luminance reached 50% of the initial luminance (luminance half life) was measured. The results are shown in Table 25.

The chromaticity CIE (x, y) at 1000 cd/m² of the light emitting device D1 was (0.32, 0.33).

Comparative Example CD1

Fabrication and Evaluation of Light Emitting Device CD1

A light emitting device CD1 was fabricated in the same manner as in Example D1 excepting that the polymer compound HP-1, the compound B2 and the compound R3 (polymer compound HP-1/compound B2/compound R3=59.6 wt %/40 wt %/0.4 wt %) were used instead of the polymer compound HP-1, the compound B1 and the compound R1 (polymer compound HP-1/compound B1/compound R1=59.6 wt %/40 wt %/0.4 wt %) in Example D1.

Voltage was applied to the light emitting device CD1, to observe EL light emission. The device was driven at constant electric current at a current value of 0.25 mA and the luminance half life was measured. The results are shown in Table 25.

The chromaticity CIE (x, y) at 1000 cd/m² of the light emitting device CD1 was (0.44, 0.31).

Comparative Example CD2

Fabrication and Evaluation of Light Emitting Device CD2

A light emitting device CD2 was fabricated in the same manner as in Example D1 excepting that the polymer compound HP-1, the compound B2 and the compound R1 (polymer compound HP-1/compound B2/compound R1=59.6 wt %/40 wt %/0.4 wt %) were used instead of the polymer compound HP-1, the compound B1 and the compound R1 (polymer compound HP-1/compound B1/compound R1=59.6 wt %/40 wt %/0.4 wt %) in Example D1.

Voltage was applied to the light emitting device CD2, to observe EL light emission. The device was driven at constant electric current at a current value of 0.25 mA and the luminance half life was measured. The results are shown in Table 25.

The chromaticity CIE (x, y) at 1000 cd/m² of the light emitting device CD2 was (0.45, 0.31).

TABLE 25

| light emitting device | composition | light emitting layer composition ratio (wt %) | luminance half life (hr) |
|---|---|---|---|
| Example D1 | D1 | HP-1/B1/R1 | 59.6/40/0.4 | 9.8 |
| Comparative Example CD1 | CD1 | HP-1/B2/R3 | 59.6/40/0.4 | 0.9 |
| Comparative Example CD2 | CD2 | HP-1/B2/R1 | 59.6/40/0.4 | 1.3 |

Example D2

Fabrication and Evaluation of Light Emitting Device D2

A light emitting device D2 was fabricated in the same manner as in Example D1 excepting that the polymer compound HP-1, the compound B1, the compound G1 and the compound R1 (polymer compound HP-1/compound B1/compound G1/compound R1=59 wt %/40 wt %/0.6 wt %/0.4 wt %) were used instead of the polymer compound HP-1, the compound B1 and the compound R1 (polymer compound HP-1/compound B1/compound R1=59.6 wt %/40 wt %/0.4 wt %) in Example D1.

Voltage was applied to the light emitting device D2, to observe EL light emission. The device was driven at constant electric current at a current value of 0.25 mA and the luminance half life was measured. The results are shown in Table 26.

The chromaticity CIE (x, y) at 1000 cd/m$^2$ of the light emitting device D2 was (0.32, 0.44).

Comparative Example CD3

Fabrication and Evaluation of Light Emitting Device CD3

A light emitting device CD3 was fabricated in the same manner as in Example D1 excepting that the polymer compound HP-1, the compound B2, the compound G2 and the compound R3 (polymer compound HP-1/compound B2/compound B2/compound R3=59 wt %/40 wt %/0.6 wt %/0.4 wt %) were used instead of the polymer compound HP-1, the compound B1 and the compound R1 (polymer compound HP-1/compound B1/compound R1=59.6 wt %/40 wt %/0.4 wt %) in Example D1.

Voltage was applied to the light emitting device CD3, to observe EL light emission. The device was driven at constant electric current at a current value of 0.25 mA and the luminance half life was measured. The results are shown in Table 26.

The chromaticity CIE (x, y) at 1000 cd/m$^2$ of the light emitting device CD3 was (0.35, 0.53).

TABLE 26

| light emitting device | composition | light emitting layer composition ratio (wt %) | luminance half life (hr) |
|---|---|---|---|
| Example D2 | D2 | HP-1/B1/G1/R1 | 59/40/0.6/0.4 | 15.4 |
| Comparative Example CD3 | CD3 | HP-1/B2/G2/R3 | 59/40/0.6/0.4 | 1.8 |

Example D3

Fabrication and Evaluation of Light Emitting Device D3

(Fabrication of Light Emitting Device D3)
(Formation of Anode and Hole Injection Layer)

A glass substrate was attached with an ITO film with a thickness of 45 nm by a sputtering method, to form an anode. On the anode, a polythiophene-sulfonic acid type hole injection agent AQ-1200 (manufactured by Plextronics) was spin-coated to form a film at a thickness of 35 nm, which was then heated on a hot plate at 170° C. for 15 minutes under an air atmosphere, to form a hole injection layer.

(Formation of Hole Transporting Layer)

The polymer compound HTL-2 was dissolved in xylene at a concentration of 0.7 wt %. Using the resultant xylene solution, a film was formed at a thickness of 20 nm on the hole injection layer by a spin coat method, and under a nitrogen gas atmosphere, the formed film was heated at 180° C. for 60 minutes on a hot plate, to form a hole transporting layer.

(Formation of Light Emitting Layer)

The polymer compound HP-2, the compound B1, the compound G1 and the compound R2 (polymer compound HP-2/compound B1/compound G1/compound R2=62.05 wt %/37.5 wt %/0.25 wt %/0.2 wt %) were dissolved in xylene at a concentration of 1.7 wt %. Using the resultant xylene solution, a film was formed at a thickness of 75 nm on the hole transporting layer by a spin coat method, and under a nitrogen gas atmosphere, the formed film was heated at 130° C. for 10 minutes to form a light emitting layer.

(Formation of Cathode)

A substrate carrying a light emitting layer formed thereon was placed in a vapor deposition machine, the pressure was reduced to 1.0×10$^{-4}$ Pa or lower, then, as a cathode, sodium fluoride was vapor-deposited at a thickness of about 4 nm on the light emitting layer, then, aluminum was vapor-deposited at a thickness of about 80 nm on the sodium fluoride layer. After vapor deposition, sealing with a glass substrate was performed to fabricate a light emitting device D3.

(Evaluation of Light Emitting Device)

Voltage was applied to the light emitting device D3, to observe EL light emission. The device was driven at constant electric current at a current value of 0.25 mA and the luminance half life was measured. The results are shown in Table 27.

The chromaticity CIE (x, y) at 1000 cd/m$^2$ of the light emitting device D3 was (0.30, 0.36).

Example D4

Fabrication and Evaluation of Light Emitting Device D4

A light emitting device D4 was fabricated in the same manner as in Example D3 excepting that the polymer compound HP-2, the compound B1, the compound G1 and the compound R2 (polymer compound HP-2/compound B1/compound G1/compound R2=61.95 wt %/37.5 wt %/0.25 wt %/0.3 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D4, to observe EL light emission. The device was driven at constant electric current at a current value of 0.25 mA and the luminance half life was measured. The results are shown in Table 27.

The chromaticity CIE (x, y) at 1000 cd/m² of the light emitting device D4 was (0.33, 0.36).

Example D5

Fabrication and Evaluation of Light Emitting Device D5

A light emitting device D5 was fabricated in the same manner as in Example D3 excepting that the polymer compound HP-2, the compound B1, the compound G1 and the compound R2 (polymer compound HP-2/compound B1/compound G1/compound R2=61.95 wt %/37.1 wt %/0.45 wt %/0.5 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D5, to observe EL light emission. The device was driven at constant electric current at a current value of 0.25 mA and the luminance half life was measured. The results are shown in Table 27.

The chromaticity CIE (x, y) at 1000 cd/m² of the light emitting device D5 was (0.38, 0.38).

Example D6

Fabrication and Evaluation of Light Emitting Device D6

A light emitting device D6 was fabricated in the same manner as in Example D3 excepting that the polymer compound HP-2, the compound B1, the compound G1 and the compound R2 (polymer compound HP-2/compound B1/compound G1/compound R2=61.95 wt %/37.7 wt %/0.15 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D6, to observe EL light emission. The device was driven at constant electric current at a current value of 0.25 mA and the luminance half life was measured. The results are shown in Table 27.

The chromaticity CIE (x, y) at 1000 cd/m² of the light emitting device D6 was (0.30, 0.34).

Example D7

Fabrication and Evaluation of Light Emitting Device D7

A light emitting device D7 was fabricated in the same manner as in Example D3 excepting that the polymer compound HP-2, the compound B1, the compound G1 and the compound R2 (polymer compound HP-2/compound B1/compound G1/compound R2=61.95 wt %/37.4 wt %/0.25 wt %/0.4 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D7, to observe EL light emission. The device was driven at constant electric current at a current value of 0.25 mA and the luminance half life was measured. The results are shown in Table 27.

The chromaticity CIE (x, y) at 1000 cd/m² of the light emitting device D7 was (0.36, 0.36).

Example D8

Fabrication and Evaluation of Light Emitting Device D8

A light emitting device D9 was fabricated in the same manner as in Example D3 excepting that the polymer compound HP-2, the compound B1, the compound G1 and the compound R3 (polymer compound HP-2/compound B1/compound G1/compound R3=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D8, to observe EL light emission. The device was driven at constant electric current at a current value of 0.25 mA and the luminance half life was measured. The results are shown in Table 28.

The chromaticity CIE (x, y) at 1000 cd/m² of the light emitting device D8 was (0.37, 0.38).

Example D9

Fabrication and Evaluation of Light Emitting Device D9

A light emitting device D9 was fabricated in the same manner as in Example D3 excepting that the polymer compound HP-2, the compound B1, the compound G1 and the compound R1 (polymer compound HP-2/compound B1/compound G1/compound R1=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D9, to observe EL light emission. The device was driven at constant electric current at a current value of 0.25 mA and the luminance half life was measured. The results are shown in Table 28.

The chromaticity CIE (x, y) at 1000 cd/m² of the light emitting device D9 was (0.28, 0.39).

Example D10

Fabrication and Evaluation of Light Emitting Device D10

A light emitting device D10 was fabricated in the same manner as in Example D3 excepting that the polymer compound HP-2, the compound B3, the compound G3 and the compound R1 (polymer compound HP-2/compound B3/compound G3/compound R1=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D10, to observe EL light emission. The device was driven at constant electric current at a current value of 0.25 mA and the luminance half life was measured. The results are shown in Table 28.

The chromaticity CIE (x, y) at 1000 cd/m² of the light emitting device D10 was (0.24, 0.33).

Example D11

Fabrication and Evaluation of Light Emitting Device D11

A light emitting device D11 was fabricated in the same manner as in Example D3 excepting that the polymer compound HP-2, the compound B1, the compound G4 and the compound R1 (polymer compound HP-2/compound B1/compound G4/compound R1=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D11, to observe EL light emission. The device was driven at constant electric current at a current value of 0.25 mA and the luminance half life was measured. The results are shown in Table 29.

The chromaticity CIE (x, y) at 1000 cd/m² of the light emitting device D11 was (0.26, 0.35).

Example D12

Fabrication and Evaluation of Light Emitting Device D12

A light emitting device D12 was fabricated in the same manner as in Example D3 excepting that the polymer compound HP-2, the compound B1, the compound G4 and the compound R2 (polymer compound HP-2/compound B1/compound G4/compound R2=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D12, to observe EL light emission. The device was driven at constant electric current at a current value of 0.25 mA and the luminance half life was measured. The results are shown in Table 29.

The chromaticity CIE (x, y) at 1000 cd/m² of the light emitting device D12 was (0.30, 0.34).

Example D13

Fabrication and Evaluation of Light Emitting Device D13

A light emitting device D13 was fabricated in the same manner as in Example D3 excepting that the polymer compound HP-2, the compound B1, the compound G4 and the compound R5 (polymer compound HP-2/compound B1/compound G4/compound R5=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D13, to observe EL light emission. The device was driven at constant electric current at a current value of 0.25 mA and the luminance half life was measured. The results are shown in Table 29.

The chromaticity CIE (x, y) at 1000 cd/m² of the light emitting device D13 was (0.28, 0.35).

Example D14

Fabrication and Evaluation of Light Emitting Device D14

A light emitting device D14 was fabricated in the same manner as in Example D3 excepting that the polymer compound HP-2, the compound B1, the compound G4 and the compound R6 (polymer compound HP-2/compound B1/compound G4/compound R6=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D14, to observe EL light emission. The device was driven at constant electric current at a current value of 0.25 mA and the luminance half life was measured. The results are shown in Table 29.

The chromaticity CIE (x, y) at 1000 cd/m² of the light emitting device D14 was (0.28, 0.35).

Example D15

Fabrication and Evaluation of Light Emitting Device D15

A light emitting device D15 was fabricated in the same manner as in Example D3 excepting that the polymer compound HP-2, the compound B1, the compound G4 and the compound R4 (polymer compound HP-2/compound B1/compound G4/compound R4=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D15, to observe EL light emission. The device was driven at constant electric current at a current value of 0.25 mA and the luminance half life was measured. The results are shown in Table 29.

The chromaticity CIE (x, y) at 1000 cd/m² of the light emitting device D15 was (0.32, 0.37).

Example D16

Fabrication and Evaluation of Light Emitting Device D16

A light emitting device D16 was fabricated in the same manner as in Example D3 excepting that polymer the compound HP-2, the compound B4, the compound G1 and the compound R1 (polymer compound HP-2/compound B4/compound G1/compound R1=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device D16, to observe EL light emission. The device was driven at constant electric current at a current value of 0.25 mA and the luminance half life was measured. The results are shown in Table 29.

The chromaticity CIE (x, y) at 1000 cd/m² of the light emitting device D16 was (0.28, 0.42).

Comparative Example CD4

Fabrication and Evaluation of Light Emitting Device CD4

A light emitting device CD4 was fabricated in the same manner as in Example D3 excepting that the polymer compound HP-2, the compound B2, the compound G1 and the compound R3 (polymer compound HP-2/compound B2/compound G1/compound R3=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device CD4, to observe EL light emission. The device was driven at constant electric current at a current value of 0.25 mA and the luminance half life was measured. The results are shown in Table 28.

The chromaticity CIE (x, y) at 1000 cd/m² of the light emitting device CD4 was (0.49, 0.40).

Comparative Example CD5

Fabrication and Evaluation of Light Emitting Device CD5

A light emitting device CD5 was fabricated in the same manner as in Example D3 excepting that the polymer compound HP-2, the compound B2, the compound G2 and the compound R1 (polymer compound HP-2/compound B2/compound G2/compound R1=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device CD5, to observe EL light emission. The device was driven at constant electric current at a current value of 0.25 mA and the luminance half life was measured. The results are shown in Table 28.

The chromaticity CIE (x, y) at 1000 cd/m² of the light emitting device CD5 was (0.37, 0.46).

Comparative Example CD6

Fabrication and Evaluation of Light Emitting Device CD6

A light emitting device CD6 was fabricated in the same manner as in Example D3 excepting that the polymer compound HP-2, the compound B2, the compound G2 and the compound R3 (polymer compound HP-2/compound B2/compound G1/compound R3=62.05 wt %/37.5 wt %/0.25 wt %/0.2 wt %) were used instead of the polymer compound HP-2, the compound B1, the compound G1 and the compound R2 (polymer compound HP-2/compound B1/compound G1/compound R2=62.05 wt %/37.5 wt %/0.25 wt %/0.2 wt %) in Example D3.

Voltage was applied to the light emitting device CD6, to observe EL light emission. The device was driven at constant electric current at a current value of 0.25 mA and the luminance half life was measured. The results are shown in Table 28.

The chromaticity CIE (x, y) at 1000 cd/m² of the light emitting device CD6 was (0.42, 0.41).

TABLE 27

| light emitting device | light emitting layer composition | composition ratio (wt %) | luminance half life (hr) |
|---|---|---|---|
| Example D3 | HP-2/ B1/G1/R2 | 62.05/ 37.5/0.25/0.2 | 16.6 |
| Example D4 | HP-2/ B1/G1/R2 | 61.95/ 37.5/0.25/0.3 | 18.8 |
| Example D5 | HP-2/ B1/G1/R2 | 61.95/ 37.1/0.45/0.5 | 30.0 |
| Example D6 | HP-2/ B1/G1/R2 | 61.95/ 37.7/0.15/0.2 | 14.3 |
| Example D7 | HP-2/ B1/G1/R2 | 61.95/ 37.4/0.25/0.4 | 24.0 |

TABLE 28

| light emitting device | light emitting layer composition | composition ratio (wt %) | luminance half life (hr) |
|---|---|---|---|
| Example D8 | HP-2/ B1/G1/R3 | 62.05/ 37.5/0.25/0.2 | 19.0 |
| Example D9 | HP-2/ B1/G1/R1 | 62.05/ 37.5/0.25/0.2 | 13.8 |
| Example D10 | HP-2/ B3/G3/R1 | 62.05/ 37.5/0.25/0.2 | 43.3 |
| Comparative Example CD4 | HP-2/ B2/G1/R3 | 62.05/ 37.5/0.25/0.2 | 5.9 |
| Comparative Example CD5 | HP-2/ B2/G2/R1 | 62.05/ 37.5/0.25/0.2 | 4.8 |
| Comparative Example CD6 | HP-2/ B2/G2/R3 | 62.05/ 37.5/0.25/0.2 | 3.4 |

TABLE 29

| light emitting device | light emitting layer composition | composition ratio (wt %) | luminance half life (hr) |
|---|---|---|---|
| Example D11 | HP-2/ B1/G4/R1 | 62.05/ 37.5/0.25/0.2 | 10.3 |
| Example D12 | HP-2/ B1/G4/R2 | 62.05/ 37.5/0.25/0.2 | 10.1 |
| Example D13 | HP-2/ B1/G4/R5 | 62.05/ 37.5/0.25/0.2 | 9.5 |
| Example D14 | HP-2/ B1/G4/R6 | 62.05/ 37.5/0.25/0.2 | 8.6 |

TABLE 29-continued

| light emitting device | light emitting layer composition | composition ratio (wt %) | luminance half life (hr) |
|---|---|---|---|
| Example D15 | HP-2/ B1/G4/R4 | 62.05/ 37.5/0.25/0.2 | 9.2 |
| Example D16 | HP-2/ B4/G1/R1 | 62.05/ 37.5/0.25/0.2 | 21.6 |

Example D17

Fabrication and Evaluation of Light Emitting Device D17

(Fabrication of Light Emitting Device D17)
(Formation of Anode and Hole Injection Layer)
A glass substrate was attached with an ITO film with a thickness of 45 nm by a sputtering method, to form an anode. On the anode, a polythiophene-sulfonic acid type hole injection agent AQ-1200 (manufactured by Plextronics) was spin-coated to form a film at a thickness of 35 nm, which was then heated on a hot plate at 170° C. for 15 minutes under an air atmosphere, to form a hole injection layer.
(Formation of Hole Transporting Layer)
The polymer compound HTL-2 was dissolved in xylene at a concentration of 0.7 wt %. Using the resultant xylene solution, a film was formed at a thickness of 20 nm on the hole injection layer by a spin coat method, and under a nitrogen gas atmosphere, the formed film was heated at 180° C. for 60 minutes on a hot plate, to form a hole transporting layer.
(Formation of Light Emitting Layer)
The low molecular weight compound HM-1 (manufactured by Luminescense Technology), the compound B5, the compound G1 and the compound R1 (low molecular weight compound HM-1/compound B5/compound G1/compound R1=62.05 wt %/37.5 wt %/0.25 wt %/0.2 wt %) were dissolved in toluene at a concentration of 1.7 wt %. Using the resultant xylene solution, a film was formed at a thickness of 75 nm on the hole transporting layer by a spin coat method, and under a nitrogen gas atmosphere, the formed film was heated at 130° C. for 10 minutes, to form a light emitting layer.

Low molecular weight compound HM-1

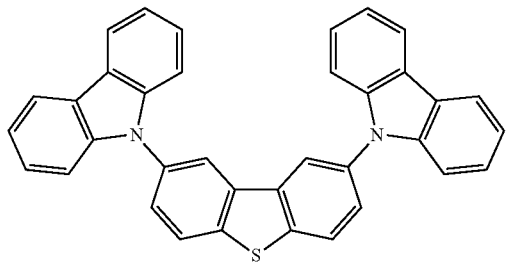

(Formation of Electron Transporting Layer)
The polymer compound ETL-1 was dissolved in 2,2,3,3,4,4,5,5-octafluoro-1-pentanol at a concentration of 0.25 wt %. Using the resultant 2,2,3,3,4,4,5,5-octafluoro-1-pentanol solution, a film was formed at a thickness of 10 nm on light emitting layer by a spin coat method, and under a nitrogen gas atmosphere, the formed film was heated at 130° C. for 10 minutes, to form an electron transporting layer.
(Formation of Cathode)
A substrate carrying an electron transporting layer formed thereon was placed in a vapor deposition machine, the pressure was reduced to $1.0 \times 10^{-4}$ Pa or lower, then, as a cathode, sodium fluoride was vapor-deposited at a thickness of about 4 nm on the light emitting layer, then, aluminum was vapor-deposited at a thickness of about 80 nm on the sodium fluoride layer. After vapor deposition, sealing with a glass substrate was performed, to fabricate a light emitting device D17.
(Evaluation of Light Emitting Device)
Voltage was applied to the light emitting device D17, to observe EL light emission. The device was driven at constant electric current at a current value of 0.25 mA and the luminance half life was measured. The results are shown in Table 30.
The chromaticity CIE (x, y) at 1000 cd/m² of the light emitting device D17 was (0.27, 0.43).

TABLE 30

| light emitting device | light emitting layer composition | composition ratio (wt %) | luminance half life (hr) |
|---|---|---|---|
| Example D17 | HM-1/ B5/G1/R1 | 62.05/ 37.5/0.25/0.2 | 309 |

Example D18

Fabrication and Evaluation of Light Emitting Device D18

A light emitting device D18 was fabricated in the same manner as in Example D17 excepting that the low molecular weight compound HM-1, the compound B4, the compound G1 and the compound R1 (low molecular weight compound HM-1/compound B4/compound G1/compound R1=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.
Voltage was applied to the light emitting device D18, to observe EL light emission. The device was driven at constant electric current at a current value of 0.25 mA, and the time until luminance reached 85% of the initial luminance was measured. The results are shown in Table 31.
The chromaticity CIE (x, y) at 1000 cd/m² of the light emitting device D18 was (0.29, 0.35).

Example D19

Fabrication and Evaluation of Light Emitting Device D19

A light emitting device D19 was fabricated in the same manner as in Example D17 excepting that the low molecular weight compound HM-1, the compound B4, the compound G4 and the compound R1 (low molecular weight compound HM-1/compound B4/compound G4/compound R1=62.05 wt %/37.5 wt %/0.25 wt %/0.2 wt %) were used instead of the low molecular weight compound HM-1, the compound B5, the compound G1 and compound R1 (low molecular weight compound HM-1/compound B5/compound G1/compound R1=62.05 wt %/37.5 wt %/0.25 wt %/0.2 wt %) in Example D17.

Voltage was applied to the light emitting device D19, to observe EL light emission. The device was driven at constant electric current at a current value of 0.25 mA, and the time until luminance reached 85% of the initial luminance was measured. The results are shown in Table 31.

The chromaticity CIE (x, y) at 1000 cd/m² of the light emitting device D19 was (0.32, 0.37).

Example D20

Fabrication and Evaluation of Light Emitting Device D20

A light emitting device D20 was fabricated in the same manner as in Example D17.

Voltage was applied to the light emitting device D20, to observe EL light emission. The device was driven at constant electric current at a current value of 0.25 mA, and the time until luminance reached 85% of the initial luminance was measured. The results are shown in Table 31.

The chromaticity CIE (x, y) at 1000 cd/m² of the light emitting device D20 was (0.27, 0.43).

Example D21

Fabrication and Evaluation of Light Emitting Device D21

A light emitting device D21 was fabricated in the same manner as in Example D17 excepting that the low molecular weight compound HM-1, the compound B5, the compound G4 and the compound R1 (low molecular weight compound HM-1/compound B5/compound G4/compound R1=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device D21, to observe EL light emission. The device was driven at constant electric current at a current value of 0.25 mA, and the time until luminance reached 85% of the initial luminance was measured. The results are shown in Table 31.

The chromaticity CIE (x, y) at 1000 cd/m² of the light emitting device D21 was (0.30, 0.42).

Comparative Example CD7

Fabrication and Evaluation of Light Emitting Device CD7

A light emitting device CD7 was fabricated in the same manner as in Example D17 excepting that the low molecular weight compound HM-1, the compound B6, the compound G2 and the compound R3 (low molecular weight compound HM-1/compound B6/compound G2/compound R3=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device CD7, to observe EL light emission. The device was driven at constant electric current at a current value of 0.25 mA, and the time until luminance reached 85% of the initial luminance was measured. The results are shown in Table 31.

The chromaticity CIE (x, y) at 1000 cd/m² of the light emitting device CD7 was (0.35, 0.25).

TABLE 31

| | light emitting device | light emitting layer composition | composition ratio (wt %) | luminance life (hr) |
|---|---|---|---|---|
| Example D18 | D18 | HM-1/B4/G1/R1 | 62.05/37.5/0.25/0.2 | 3.6 |
| Example D19 | D19 | HM-1/B4/G4/R1 | 62.05/37.5/0.25/0.2 | 5.4 |
| Example D20 | D20 | HM-1/B5/G1/R1 | 62.05/37.5/0.25/0.2 | 36.4 |
| Example D21 | D21 | HM-1/B5/G4/R1 | 62.05/37.5/0.25/0.2 | 44.9 |
| Comparative Example CD7 | CD7 | HM-1/B6/G2/R3 | 62.05/37.5/0.25/0.2 | 1.0 |

Example D22

Fabrication and Evaluation of Light Emitting Device D22

A light emitting device D22 was fabricated in the same manner as in Example D17 excepting that the low molecular weight compound HM-2 (manufactured by Luminescense Technology), the compound B5, the compound G1 and the compound R1 (low molecular weight compound HM-2/compound B5/compound G1/compound R1=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

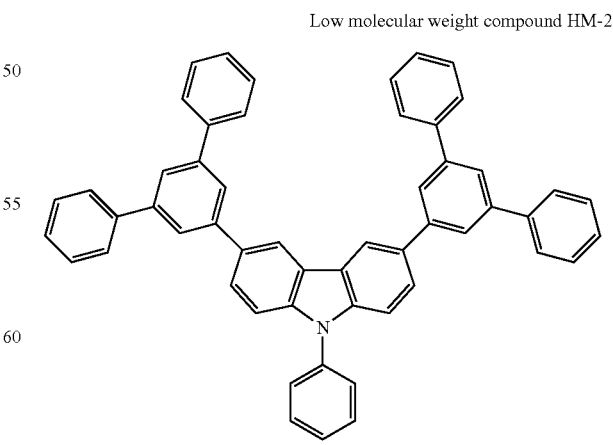

Low molecular weight compound HM-2

Voltage was applied to the light emitting device D22, to observe EL light emission. The device was driven at constant electric current at a current value of 0.25 mA, and the time until luminance reached 85% of the initial luminance was measured. The results are shown in Table 32. The chromaticity CIE (x, y) at 1000 cd/m² of the light emitting device D22 was (0.27, 0.43).

Comparative Example CD8

Fabrication and Evaluation of Light Emitting Device CD8

A light emitting device CD8 was fabricated in the same manner as in Example D17 excepting that the low molecular weight compound HM-2, the compound B6, the compound G2 and the compound R3 (low molecular weight compound HM-2/compound B6/compound G2/compound R3=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device CD8, to observe EL light emission. The device was driven at constant electric current at a current value of 0.25 mA, and the time until luminance reached 85% of the initial luminance was measured. The results are shown in Table 32.

The chromaticity CIE (x, y) at 1000 cd/m² of the light emitting device CD8 was (0.35, 0.25).

TABLE 32

| | light emitting device | light emitting layer | | luminance life (hr) |
|---|---|---|---|---|
| | | composition | composition ratio (wt %) | |
| Example D22 | D22 | HM-2/ B5/G1/R1 | 62.05/ 37.5/0.25/0.2 | 19.6 |
| Comparative Example CD8 | CD8 | HM-2/ B6/G2/R3 | 62.05/ 37.5/0.25/0.2 | 8.5 |

Example D23

Fabrication and Evaluation of Light Emitting Device D23

A light emitting device D23 was fabricated in the same manner as in Example D17 excepting that the low molecular weight compound HM-1, the compound B1, the compound G4 and the compound R1 (low molecular weight compound HM-1/compound B1/compound G4/compound R1=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device D23, to observe EL light emission. The device was driven at constant electric current at a current value of 0.25 mA, and the time until luminance reached 60% of the initial luminance was measured. The results are shown in Table 33.

The chromaticity CIE (x, y) at 1000 cd/m² of the light emitting device D23 was (0.31, 0.34).

Comparative Example CD9

Fabrication and Evaluation of Light Emitting Device CD9

A light emitting device CD9 was fabricated in the same manner as in Example D17 excepting that the low molecular weight compound HM-1, the compound B2, the compound G2 and the compound R3 (low molecular weight compound HM-1/compound B2/compound G2/compound R3=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device CD9, to observe EL light emission. The device was driven at constant electric current at a current value of 0.25 mA, and the time until luminance reached 60% of the initial luminance was measured. The results are shown in Table 33.

The chromaticity CIE (x, y) at 1000 cd/m² of the light emitting device CD9 was (0.43, 0.34).

TABLE 33

| | light emitting device | light emitting layer | | luminance life (hr) |
|---|---|---|---|---|
| | | composition | composition ratio (wt %) | |
| Example D23 | D23 | HM-1/ B1/G4/R1 | 62.05/ 37.5/0.25/0.2 | 15.2 |
| Comparative Example CD9 | CD9 | HM-1/ B2/G2/R3 | 62.05/ 37.5/0.25/0.2 | 5.1 |

Example D24

Fabrication and Evaluation of Light Emitting Device D24

A light emitting device D24 was fabricated in the same manner as in Example D17 excepting that the polymer compound HP-2, the compound B1, the compound G4 and the compound R1 (polymer compound HP-2/compound B1/compound G4/compound R1=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device D24, to observe EL light emission. The device was driven at constant electric current at a current value of 0.25 mA and the luminance half life was measured. The results are shown in Table 34.

The chromaticity CIE (x, y) at 1000 cd/m² of the light emitting device D24 was (0.27, 0.37).

Comparative Example CD10

Fabrication and Evaluation of Light Emitting Device CD10

A light emitting device CD10 was fabricated in the same manner as in Example D17 excepting that the polymer compound HP-2, the compound B2, the compound G2 and the compound R3 (polymer compound HP-2/compound B2/compound G2/compound R3=62.05 wt %/37.5 wt %/0.25 wt %/0.2 wt %) were used instead of the low molecular weight compound HM-1, the compound B5, the compound G1 and the compound R1 (low molecular weight compound HM-1/compound B5/compound G1/compound R1=62.05 wt %/37.5 wt %/0.25 wt %/0.2 wt %) in Example D17.

Voltage was applied to the light emitting device CD10, to observe EL light emission. The device was driven at constant electric current at a current value of 0.25 mA and the luminance half life was measured. The results are shown in Table 34.

The chromaticity CIE (x, y) at 1000 cd/m² of the light emitting device CD10 was (0.49, 0.39).

TABLE 34

| light emitting device | light emitting layer composition | composition ratio (wt %) | luminance half life (hr) |
|---|---|---|---|
| Example D24 | HP-2/ B1/G4/R1 | 62.05/ 37.5/0.25/0.2 | 20.4 |
| Comparative Example CD10 | HP-2/ B2/G2/R3 | 62.05/ 37.5/0.25/0.2 | 3.7 |

INDUSTRIAL APPLICABILITY

According to the present invention, a composition which is useful for production of a light emitting device excellent in luminance life can be provided.

The invention claimed is:

1. A composition comprising a first phosphorescent compound (DB) having an emission spectrum whose maximum peak wavelength is from 400 nm to less than 480 nm and having a dendron, a second phosphorescent compound (DGR) having an emission spectrum whose maximum peak wavelength is from 480 nm to less than 680 nm and having a dendron and a compound represented by the formula (H-1),
   wherein the first phosphorescent compound (DB) is a phosphorescent compound represented by the formula (1-A):

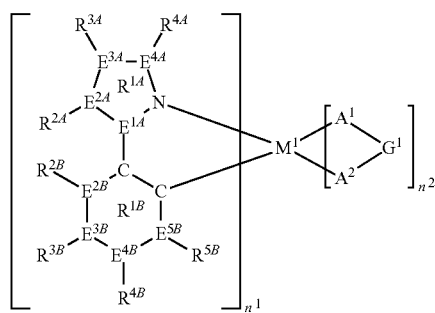

(1-A)

wherein
   $M^1$ represents an iridium atom or a platinum atom,
   $n^1$ represents an integer of 1 to 3, $n^2$ represents an integer of 0 to 2, and $n^1+n^2$ is 2 or 3, and $n^1+n^2$ is 3 when $M^1$ is an iridium atom, while $n^1+n^2$ is 2 when $M^1$ is a platinum atom,
   $E^{1A}$, $E^{2A}$, $E^{3A}$, $E^{4A}$, $E^{2B}$, $E^{3B}$, $E^{4B}$ and $E^{5B}$ each independently represent a nitrogen atom or a carbon atom, wherein each $E^{1A}$, $E^{2A}$, $E^{3A}$, $E^{4A}$, $E^{2B}$, $E^{3B}$, $E^{4B}$ and $E^{5B}$ may be the same or different, when $E^{2A}$ is a nitrogen atom, $R^{2A}$ may be either present or not present, when $E^{3A}$ is a nitrogen atom, $R^{3A}$ may be either present or not present, when $E^{4A}$ is a nitrogen atom, $R^{4A}$ may be either present or not present, when $E^{2B}$ is a nitrogen atom, $R^{2B}$ is not present, when $E^{3B}$ is a nitrogen atom, $R^{3B}$ is not present, when $E^{4B}$ is a nitrogen atom, $R^{4B}$ is not present, and when $E^{5B}$ is a nitrogen atom, $R^{5B}$ is not present,
   $R^{2A}$, $R^{3A}$, $R^{4A}$, $R^{2B}$, $R^{3B}$, $R^{4B}$ and $R^{5B}$ each independently represent a hydrogen atom, an alkyl group, an alkoxy group, an aryl group, an aryloxy group, a monovalent heterocyclic group or a halogen atom, and these groups may have a substituent, and when there are a plurality of $R^{2A}$, $R^{3A}$, $R^{4A}$, $R^{2B}$, $R^{3B}$, $R^{4B}$ and $R^{5B}$, each of them may be the same or different, and $R^{2A}$ and $R^{3A}$, $R^{3A}$ and $R^{4A}$, $R^{2A}$ and $R^{2B}$, $R^{2B}$ and $R^{3B}$, $R^{3B}$ and $R^{4B}$, and $R^{4B}$ and $R^{5B}$ each may be combined together to form a ring together with atoms to which they are attached,
   at least one selected from the group consisting of $R^{2A}$, $R^{3A}$, $R^{4A}$, $R^{2B}$, $R^{3B}$, $R^{4B}$ and $R^{5B}$ is a dendron,
   the ring $R^{1A}$ represents a triazole ring or a diazole ring, wherin one or two of $E^{1A}$, $E^{2A}$, $E^{3A}$, and $E^{4A}$ are nitrogen atoms,
   the ring $R^{1B}$ represents a benzene ring, a pyridine ring or a pyrimidine ring, wherein at least two of $E^{2B}$, $E^{3B}$, $E^{4B}$ and $E^{5B}$ are carbon atoms, and
   $A^1$-$G^1$-$A^2$ represents an anionic bidentate ligand, and $G^1$ represents an atomic group constituting a bidentate ligand together with $A^1$ and $A^2$, and $A^1$ and $A^2$ each independently represent a carbon atom, an oxygen atom or a nitrogen atom and may be a carbon atom, an oxygen atom or a nitrogen atom constituting the ring, and when there are a plurality of $A^1$-$G^1$-$A^2$, they may be the same or different:

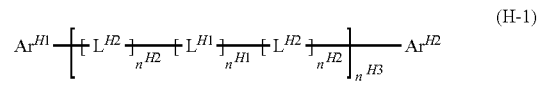

(H-1)

wherein
   $Ar^{H1}$ and $Ar^{H2}$ each independently represent an aryl group or a monovalent heterocyclic group, and these groups may have a substituent,
   $n^{H1}$ represents 1, $n^{H2}$ represents 0 or 1, and the plurality of $n^{H2}$ may be the same or different,
   $n^{H3}$ represents 1,
   $L^{H1}$ represents a divalent heterocyclic group represented by the formula (A-32), (A-33), (A-34) or (A-35),
   $L^{H2}$ represents a group represented by —N(-$L^{H21}$-$R^{H21}$)—, and when there are a plurality of $L^{H2}$, they may be the same or different, and
   $L^{H21}$ represents a single bond, an arylene group or a divalent heterocyclic group, and these groups may have a sub stituent, and $R^{H21}$ represents a hydrogen atom, an alkyl group, an aryl group or a monovalent heterocyclic group, and these groups may have a substituent:

189 / 190

(A-32)
(A-33)
(A-34)
(A-35)

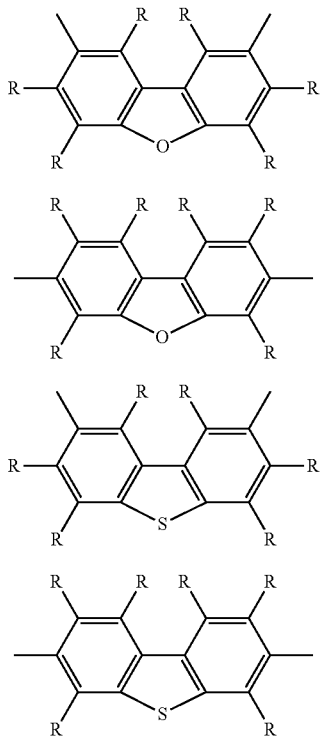

wherein
R represents a hydrogen atom, an alkyl group, an aryl group or a monovalent heterocyclic group, and the plurality of R may be the same or different.

2. The composition according to claim 1, wherein the phosphorescent compound represented by the formula (1-A) is a phosphorescent compound represented by the formula (1-A1), (1-A2) or (1-A3):

(1-A1)

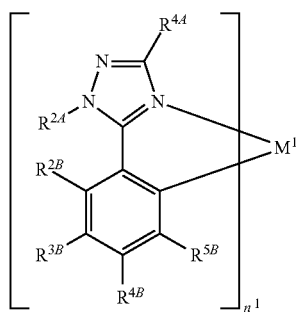

(1-A2)

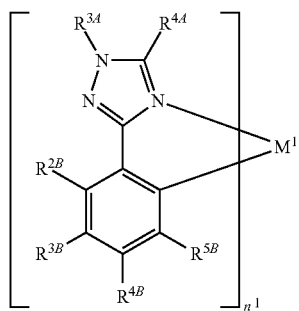

(1-A3)

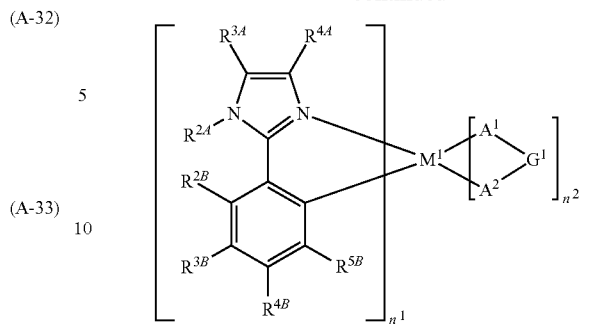

wherein
$n^{1A}$ is 2 or 3, and $n^{1A}$ is 3 when $M^1$ is iridium atom, while $n^{1A}$ is 2 when $M^1$ is a platinum atom.

3. The composition according to claim 1, wherein the second phosphorescent compound (DGR) is a phosphorescent compound represented by the formula (2):

(2)

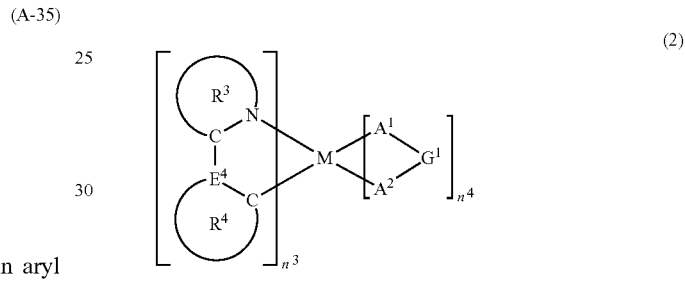

wherein
M represents a ruthenium atom, a rhodium atom, a palladium atom, an iridium atom or a platinum atom,
$n^3$ represents an integer of 1 to 3, $n^4$ represents an integer of 0 to 2 and $n^3+n^4$ is 2 or 3, and $n^3+n^4$ is 3 when M is a ruthenium atom, a rhodium atom or an iridium atom, while $n^3+n^4$ is 2 when M is a palladium atom or a platinum atom,
$E^4$ represents a carbon atom or a nitrogen atom,
the ring $R^3$ represents a 6-membered aromatic heterocyclic ring, and this ring may have a sub stituent, and when there are a plurality of substituents, they may be the same or different and may be combined together to form a ring together with atoms to which they are attached, and when there are a plurality of rings $R^3$, they may be the same or different,
the ring $R^4$ represents a 5-membered or 6-membered aromatic hydrocarbon ring or a 5-membered or 6-membered aromatic heterocyclic ring, and these rings may have a substituent, and when there are a plurality of the substituents, they may be the same or different and may be combined together to form a ring together with atoms to which they are attached, and when there are a plurality of the rings $R^4$, they may be the same or different, and $E^4$ is a carbon atom when the ring $R^4$ is a 6-membered aromatic heterocyclic ring,
the substituent which the ring $R^3$ may have and the substituent which the ring $R^4$ may have may be combined together to form a ring together with atoms to which they are attached,
at least one ring selected from the group consisting of the ring $R^3$ and the ring $R^4$ has a dendron, and $A^1$-$G^1$-$A^2$ represents an anionic bidentate ligand, and $G^1$ represents an atomic group constituting a bidentate ligand together with $A^1$ and $A^2$, and $A^1$ and $A^2$ each independently represent a carbon atom, an oxygen atom or a nitrogen atom and may be a carbon atom, an oxygen atom or a nitrogen atom constituting the ring, and when there are a plurality of $A^1$-$G^1$-$A^2$, they may be the same or different.

4. The composition according to claim 3, wherein the ring $R^3$ is a pyridine ring, a diazabenzene ring, a quinoline ring or an isoquinoline ring.

5. The composition according to claim 1, wherein at least one of the first phosphorescent compound (DB) and the second phosphorescent compound (DGR) has a dendron represented by the formula (Dend-A) or (Dend-B):

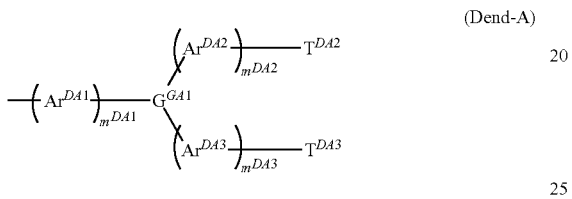

(Dend-A)

wherein
$m^{DA1}$, $m^{DA2}$ and $m^{DA3}$ each independently represent an integer of 0 or more,
$G^{DA1}$ represents a nitrogen atom, an aromatic hydrocarbon group or a heterocyclic group and these groups may have a substituent,
$Ar^{DA1}$, $Ar^{DA2}$ and $Ar^{DA3}$ each independently represent an arylene group or a divalent heterocyclic group and these groups may have a substituent, and when there are a plurality of $Ar^{DA1}$, $Ar^{DA2}$ and $Ar^{DA3}$, each of them may be the same or different, and
$T^{DA2}$ and $T^{DA3}$ each independently represent an aryl group or a monovalent heterocyclic group and these groups may have a substituent,

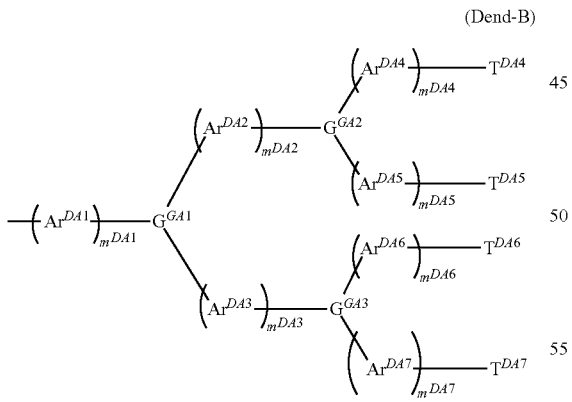

(Dend-B)

wherein
$m^{DA1}$, $m^{DA2}$, $m^{DA3}$, $m^{DA4}$, $m^{DA5}$, $m^{DA6}$ and $m^{DA7}$ each independently represent an integer of 0 or more,
$G^{DA1}$, $G^{DA2}$ and $G^{DA3}$ each independently represent a nitrogen atom, an aromatic hydrocarbon group or a heterocyclic group and these groups may have a substituent,
$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group and these groups may have a substituent, and when there are a plurality of $Ar^{DA1}$, $Ar^{DA2}$, $Ar^{DA3}$, $A^{DA4}$, $Ar^{DA5}$, $Ar^{DA6}$ and $Ar^{DA7}$, each of them may be the same or different, and
$T^{DA4}$, $T^{DA5}$, $T^{DA6}$ and $T^{DA7}$ each independently represent an aryl group or a monovalent heterocyclic group and these groups may have a substituent.

6. The composition according to claim 5, wherein the formula (Dend-A) is a group represented by the following formula (Dend-A1), (Dend-A2), (Dend-A3) or (Dend-A4):

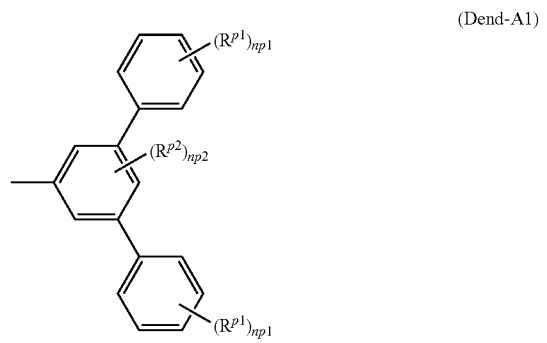

(Dend-A1)

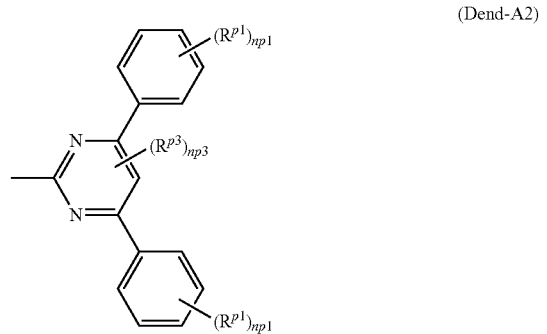

(Dend-A2)

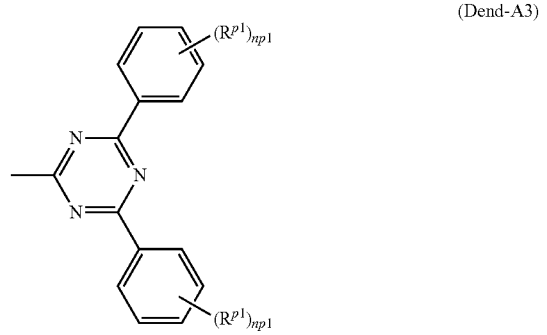

(Dend-A3)

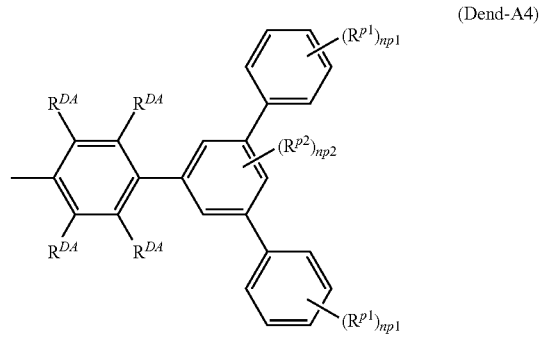

(Dend-A4)

wherein $R^{p1}$, $R^{p2}$ and $R^{p3}$ each independently represent an alkyl group, an alkoxy group or a halogen atom, and when there are a plurality of $R^{p1}$ and $R^{p2}$, each of them may be the same or different, $R^{DA}$ represents a hydrogen atom, an alkyl group, an alkoxy group, an aryl group or a monovalent heterocyclic group and these groups may have a substituent, and when there are a plurality of $R^{DA}$, they may be the same or different, and np1 represents an integer of 0 to 5, np2 represents an integer of 0 to 3, and np3 represents 0 or 1, and a plurality of np1 may be the same or different.

7. The composition according to claim 5, wherein the formula (Dend-B) is a group represented by the following formula (Dend-B1), (Dend-B2) or (Dend-B3):

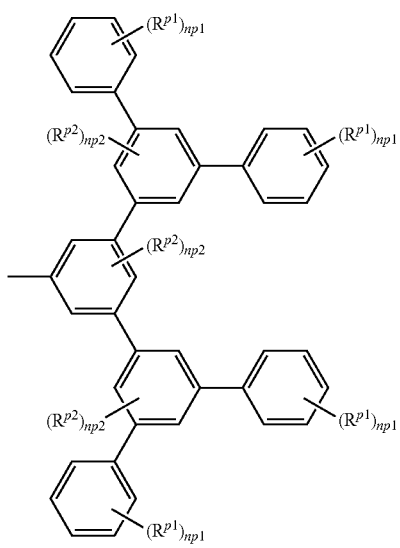

(Dend-B1)

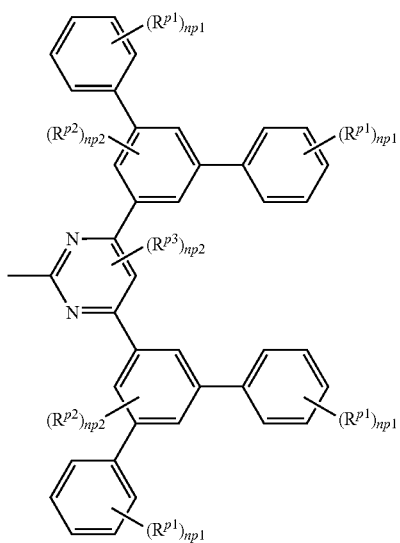

(Dend-B2)

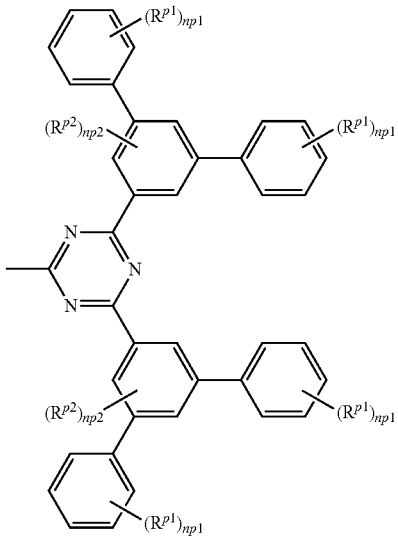

(Dend-B3)

wherein $R^{p1}$, $R^{p2}$ and $R^{p3}$ each independently represent an alkyl group, an alkoxy group or a halogen atom, and when there are a plurality of $R^{p1}$ and $R^{p2}$, each of them may be the same or different, and np1 represents an integer of 0 to 5, np2 represents an integer of 0 to 3, and np3 represents 0 or 1, and a plurality of np1 may be the same or different.

8. The composition according claim 1, further comprising at least one material selected from the group consisting of hole transporting materials, electron transporting materials, light emitting materials, antioxidants and solvents.

9. A composition comprising a first phosphorescent compound (DB) having an emission spectrum whose maximum peak wavelength is from 400 nm to less than 480 nm and having a dendron, at least two second phosphorescent compounds (GR) having an emission spectrum whose maximum peak wavelength is from 480 nm to less than 680 nm and a compound represented by the formula (H-1), wherein the first phosphorescent compound (DB) is a phosphorescent compound represented by the formula (1-A):

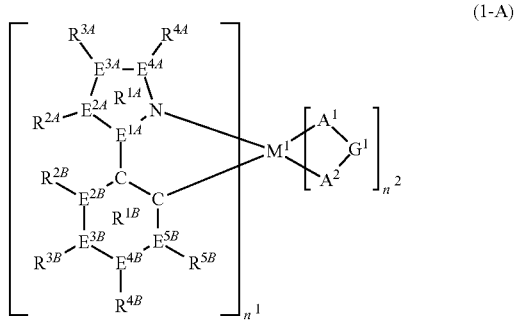

(1-A)

wherein $M^1$ represents an iridium atom or a platinum atom, $n^1$ represents an integer of 1 to 3, $n^2$ represents an integer of 0 to 2, and $n^1+n^2$ is 2 or 3, and $n^1+n^2$ is 3 when $M^1$ is an iridium atom, while $n^1+n^2$ is 2 when $M^1$ is a platinum atom, $E^{1A}$, $E^{2A}$, $E^{3A}$, $E^{4A}$, $E^{2B}$, $E^{3B}$, $E^{4B}$ and $E^{5B}$ each independently represent a nitrogen atom or a carbon atom, wherein each $E^{1A}$, $E^{2A}$, $E^{3A}$, $E^{4A}$, $E^{2B}$, $E^{3B}$, $E^{4B}$ and $E^{5B}$ may be the same or different, when $E^{2A}$ is a nitrogen atom, $R^{2A}$ may be either present or not present, when $E^{3A}$ is a nitroggen atom, $R^{3A}$ may be either present or not present, when $E^{4A}$ is a nitrogen atom, $R^{4A}$ may be either present or not present, when $E^{2B}$ is a nitrogen atom, $R^{2B}$ is not present, when $E^{3B}$ is a nitrogen atom, $R^{3B}$ is not present, when $E^{4B}$ is a nitrogen atom, $R^{4B}$ is not present, and when $E^{5B}$ is a nitrogen atom, $R^{5B}$ is not present, $R^{2A}$, $R^{3A}$, $R^{4A}$, $R^{2B}$, $R^{3B}$, $R^{4B}$ and $R^{5B}$ each independently represent a hydrogen atom, an alkyl group, an alkoxy group, an aryl group, an aryloxy group, a monovalent heterocyclic group or a halogen atom, and these groups may have a substituent, and when there are a plurality of $R^{2A}$, $R^{3A}$, $R^{4A}$, $R^{2B}$, $R^{3B}$, $R^{4B}$ and $R^{5B}$, each of them may be the same or different, and $R^{2A}$ and $R^{3A}$, $R^{3A}$ and $R^{4A}$, $R^{2A}$ and $R^{2B}$, $R^{2B}$ and $R^{3B}$, $R^{3B}$ and $R^{4B}$, and $R^{4B}$ and $R^{5B}$ each may be combined together to form a ring together with atoms to which they are attached, at least one selected from the group consisting of $R^{2A}$, $R^{3A}$, $R^{4A}$, $R^{2B}$, $R^{3B}$, $R^{4B}$ and $R^{5B}$ is a dendron, the ring $R^{1A}$ represents a triazole ring or a diazole ring constituted of a nitrogen atom, $E^{1A}$, $E^{2A}$, $E^{3A}$ and $E^{4A}$ are nitrogen atoms, the ring $R^{1B}$ represents a benzene ring, a pyridine ring or a pyrimidine ring, wherein at least two of $E^{2B}$, $E^{3B}$, $E^{4B}$ and $E^{5B}$ are carbon atoms, and $A^1$-$G^1$-$A^2$ represents an anionic bidentate ligand, and $G^1$ represents an atomic group constituting a bidentate ligand together with $A^1$ and $A^2$, and $A^1$ and $A^2$ each independently represent a carbon atom, an oxygen atom or a nitrogen atom and may be a carbon atom, an oxygen atom or a nitrogen atom constituting the ring, and when there are a plurality of $A^1$-$G^1$-$A^2$, they may be the same or different:

(H-1)

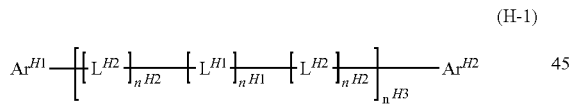

wherein $Ar^{H1}$ and $Ar^{H2}$ each independently represent an aryl group or a monovalent heterocyclic group, and these groups may have a substituent, $n^{H1}$ represents 1, $n^{H2}$ represents 0 or 1, and the plurality of $n^{H2}$ may be the same or different, $n^{H3}$ represents 1, $L^{H1}$ represents a divalent heterocyclic group represented by the formula (A-32), (A-33), (A-34) or (A-35), $L^{H2}$ represents a group represented by —N(-$L^{H21}$-$R^{H21}$)—, and when there are a plurality of $L^{H2}$, they may be the same or different, and $L^{H21}$ represents a single bond, an arylene group or a divalent heterocyclic group, and these groups may have a substituent, and $R^{H21}$ represents a hydrogen atom, an alkyl group, an aryl group or a monovalent heterocyclic group, and these groups may have a substituent:

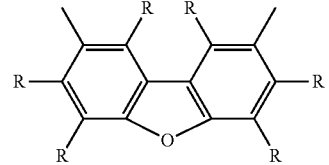

(A-32)

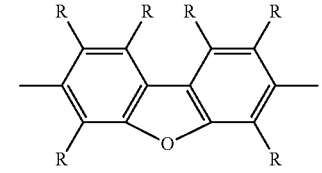

(A-33)

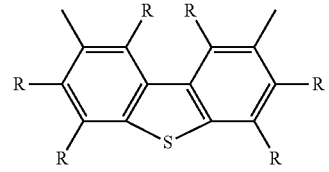

(A-34)

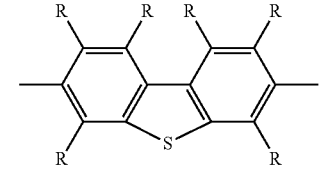

(A-35)

wherein
R represents a hydrogen atom, an alkyl group, an aryl group or a monovalent heterocyclic group, and the plurality of R may be the same or different.

10. The composition according to claim 9, wherein the at least two second phosphorescent compounds (GR) are phosphorescent compounds represented by the formula (3):

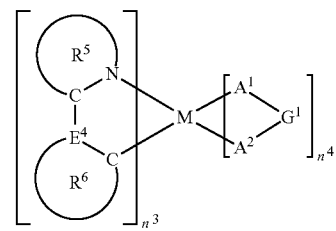

(3)

wherein
M represents a ruthenium atom, a rhodium atom, a palladium atom, an iridium atom or a platinum atom, $n^3$ represents an integer of 1 to 3, $n^4$ represents an integer of 0 to 2, and $n^3$+$n^4$ is 2 or 3, and $n^3$+$n^4$ is 3 when M is a ruthenium atom, a rhodium atom or an iridium atom, while $n^3$+$n^4$ is 2 when M is a palladium atom or a platinum atom, $E^4$ represents a carbon atom or a nitrogen atom, the ring $R^5$ represents a 6-membered aromatic heterocyclic ring, and this ring may have a substituent, and when there are a plurality of substituents, they may be the same or different and may be combined together to form a ring together with atoms to which they are attached, and when there are a plurality of rings $R^5$, they may be the same or different, the ring $R^6$ represents a 5-membered or 6-membered aromatic hydrocarbon ring or a 5-membered or 6-membered aromatic heterocyclic ring, and these rings may have a substituent, and when there are a plurality of substituents, they may be the same or different and may be combined together to form a ring together with atoms to which they are attached, and when there are a plurality of rings $R^6$, they may be the same or different, and $E^4$ is a carbon atom when the ring $R^6$ is a 6-membered aromatic heterocyclic ring, the substituent which the ring $R^5$ has and the substituent which the ring $R^6$ has may be combined together to form a ring together with atoms to which they are attached, and $A^1$-$G^1$-$A^2$ represents an anionic bidentate ligand, and $G^1$ represents an atomic group constituting a bidentate ligand together with $A^1$ and $A^2$, and $A^1$ and $A^2$ each independently represent a carbon atom, an oxygen atom or a nitrogen atom, and may be a carbon atom, an oxygen atom or a nitrogen atom constituting the ring, and when there are a plurality of $A^1$-$G^1$-$A^2$, they may be the same or different.

11. A light emitting device obtained by using the composition according to claim 1.

* * * * *